US011515363B2

United States Patent
Kwak et al.

(10) Patent No.: US 11,515,363 B2
(45) Date of Patent: Nov. 29, 2022

(54) DISPLAY APPARATUS

(71) Applicant: Samsung Electronics Co., Ltd., Suwon-si (KR)

(72) Inventors: Seungyeon Kwak, Suwon-si (KR); Byungjoon Kang, Seoul (KR); Hyungjun Kim, Suwon-si (KR); Myungsun Sim, Suwon-si (KR); Kum Hee Lee, Suwon-si (KR); Banglin Lee, Suwon-si (KR); Sunghun Lee, Hwaseong-si (KR); Byoungki Choi, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 116 days.

(21) Appl. No.: 17/194,372

(22) Filed: Mar. 8, 2021

(65) Prior Publication Data
US 2022/0093689 A1 Mar. 24, 2022

(30) Foreign Application Priority Data
Sep. 18, 2020 (KR) .................. 10-2020-0120523

(51) Int. Cl.
*H01L 27/32* (2006.01)
*H01L 51/50* (2006.01)
*H01L 51/00* (2006.01)

(52) U.S. Cl.
CPC ........ *H01L 27/322* (2013.01); *H01L 51/0087* (2013.01); *H01L 51/502* (2013.01); *H01L 51/504* (2013.01); *H01L 51/5024* (2013.01)

(58) Field of Classification Search
CPC . H01L 27/322; H01L 51/0087; H01L 51/502; H01L 51/5024; H01L 51/504;
(Continued)

(56) References Cited

U.S. PATENT DOCUMENTS 10,520,765 B2 12/2019 Chung
10,944,068 B2 3/2021 Cho et al.
(Continued)

FOREIGN PATENT DOCUMENTS

KR 1020150047401 A 5/2015
KR 1020170034055 A 3/2017
(Continued)

OTHER PUBLICATIONS

English Abstract of KR 1020190136737.

*Primary Examiner* — Donald L Raleigh
(74) *Attorney, Agent, or Firm* — Cantor Colburn LLP

(57) ABSTRACT

A display apparatus includes: an organic light emitting diode (OLED) structure including in which at least one blue light-emitting unit and at least one green light-emitting unit are stacked to provide incident light in which the blue incident light and the green incident light are mixed; a first pixel, a second pixel, and a third pixel disposed on the OLED structure; color conversion layers disposed on at least two of the first, the second, or the third pixels, and including quantum dots for converting the mixed incident from the OLED structure into light of a predetermined color; and first, second, and third color filters disposed on the first, the second, and the third pixels, respectively, to absorb or block light of a predetermined wavelength band, wherein a conversion value of an area of a spectrum in a wavelength region of 380 nanometers to 780 nanometers of the green incident light with respect to a difference between a wavelength at the maximum transmittance of the second color filter and the medial wavelength of the incident green light (Δλ) may be 3.6 or greater and 13 or less.

16 Claims, 16 Drawing Sheets

(58) Field of Classification Search
CPC ......... H01L 2251/5369; H01L 2251/55; H01L 27/3209; H01L 51/5016; H01L 51/5278; G02B 5/201
See application file for complete search history.

(56) References Cited

U.S. PATENT DOCUMENTS

2017/0194535 A1    7/2017   Park et al.
2020/0251040 A1    8/2020   Lee et al.

FOREIGN PATENT DOCUMENTS

| KR | 1020190000759 A | 1/2019 |
| KR | 1020190136737 A | 12/2019 |

DISPLAY APPARATUS

CROSS-REFERENCE TO RELATED APPLICATION

This application claims priority to Korean Patent Application No. 10-2020-0120523, filed on Sep. 18, 2020, in the Korean Intellectual Property Office, and all the benefits accruing therefrom under 35 U.S.C. § 119, the disclosure of which is incorporated by reference herein in its entirety.

BACKGROUND

1. Field

The present disclosure relates to a display apparatus.

2. Description of Related Art

A display apparatus is used to visually communicate data and information. A display apparatus may be used as a display unit for a small product such as a mobile phone or for commercial equipment, or as a display unit for a large product such as a television. A display apparatus includes a plurality of pixels that emit light by receiving an electrical signal resulting in an image. Each pixel includes a light-emitting element. For example, in the case of an organic light-emitting display apparatus, the light-emitting element is an organic light-emitting diode (OLED). In general, an organic light-emitting display apparatus includes a thin film transistor and an organic light-emitting diode positioned on a substrate whereby the organic light-emitting diode emits light.

In an OLED type display apparatus including a plurality of quantum dot color conversion elements and color filters, a blue-OLED structure, a white-OLED structure, or a green-OLED structure may be used as an incident light source.

SUMMARY

Provided are display apparatuses having high performance.

Provided are display apparatuses in which incident green light and incident blue light are used as a light source that is provided with an organic light emitting diode (OLED), and a plurality of quantum dot color conversion elements and a plurality of color filter elements are used.

Provided are display apparatuses having high luminous efficiency and high color reproducibility by using incident green light from an OLED unit.

Additional aspects will be set forth in part in the description which follows and, in part, will be apparent from the description, or may be learned by practice of the presented embodiments of the disclosure.

According to an aspect of an embodiment, a display apparatus includes:

an organic light emitting diode (OLED) structure including at least one blue light-emitting unit configured to emit blue incident light and at least one green light-emitting unit configured to emit green incident light are stacked to provide incident light in which the blue incident light and the green incident light are mixed; a first pixel, a second pixel, and a third pixel disposed on the OLED structure and respectively configured to emit a first color light, a second color light, and a third color light;

at least two color conversion layers each separately disposed on at least two of the first, the second, or the third pixels, and including quantum dots for converting the mixed incident light from the OLED structure into light of a predetermined color; and first, second, and third color filters disposed on the first, the second, and the third pixels, respectively, to absorb or block light of a predetermined wavelength band, wherein a conversion value (R) of an area of a spectrum in a wavelength region of 380 nanometers to 780 nanometers of the green incident light with respect to a difference between a maximum transmittance wavelength of the second color filter and the medial wavelength of the green incident light (Δλ) is 3.6 or greater and 13 or less, wherein, the area of the spectrum is determined according to Equation 1 below, $$\text{Area} = \int_{380}^{780} f(x)\,dx \approx \sum_{n=1}^{n-1} \frac{1}{2}(x_{n+1} - x_n)[f(x_{n+1}) + f(x_n)] \quad \text{Equation 1}$$

$$(x_1 = 380 \text{ nm}, x_n = 780 \text{ nm})$$

in Equation 1, f(x) is a spectrum of the green incident light in which the maximum value of the light intensity is normalized to 1, and the medial wavelength is a wavelength dividing the area of the spectrum of the green incident light into two equal halves, and the conversion value is determined according to Equation 3.

$$R = \text{Area}/\Delta\lambda \quad \text{Equation 3}$$

The OLED structure may have a tandem structure.

The OLED structure may include a first blue light-emitting unit, a green light-emitting unit, and a second blue light-emitting unit sequentially stacked, and the green light-emitting unit may be disposed between the first and second blue light-emitting units.

The display apparatus may further include a first charge generation layer disposed between the first blue light-emitting unit and the green light-emitting unit, and a second charge generation layer disposed between the green light-emitting unit and the second blue light-emitting unit.

The green light-emitting unit may include an organic material-based green light-emitting layer, and the green light-emitting layer may include a thermally activated delayed fluorescence (TADF) dopant.

The green light-emitting unit may include an organic material-based green light emitting layer, the green light-emitting layer may include a phosphorescent dopant, and the phosphorescent dopant may satisfy T1(dopant)≤S1(dopant) ≤T1(dopant)+0.5 eV, where T1 (dopant) is a triplet energy level in eV and S1 (dopant) is a singlet energy level in eV of the phosphorescent dopant.

The phosphorescent dopant may be an organometallic compound including iridium Ir.

The phosphorescent dopant may be an organometallic compound including platinum Pt, osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au.

The phosphorescent dopant may be an organometallic compound having a square-planar coordination structure.

The phosphorescent dopant may include a metal M and an organic ligand, and the metal M and the organic ligand may form one, two or three cyclometallated rings in the organometallic compound.

The phosphorescent dopant may include a metal M and a four-coordinate organic ligand capable of forming 3 or 4 cyclometallated rings, the metal M may include platinum Pt, osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au, and the four-coordinate organic ligand may include a benzimidazole group or a pyridine group.

The first color filter may be a blue cut filter, and the second color filter may be a blue and green cut filter.

The first color filter may be an absorption-type green color filter, and the second color filter may be an absorption-type red color filter.

The third color filter may be a green cut filter or an absorption-type blue color filter.

The display apparatus may further include a fourth pixel, and the fourth pixel is configured to emit a color different from that of the first, the second, and the third pixels.

The fourth pixel may be a blank region.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
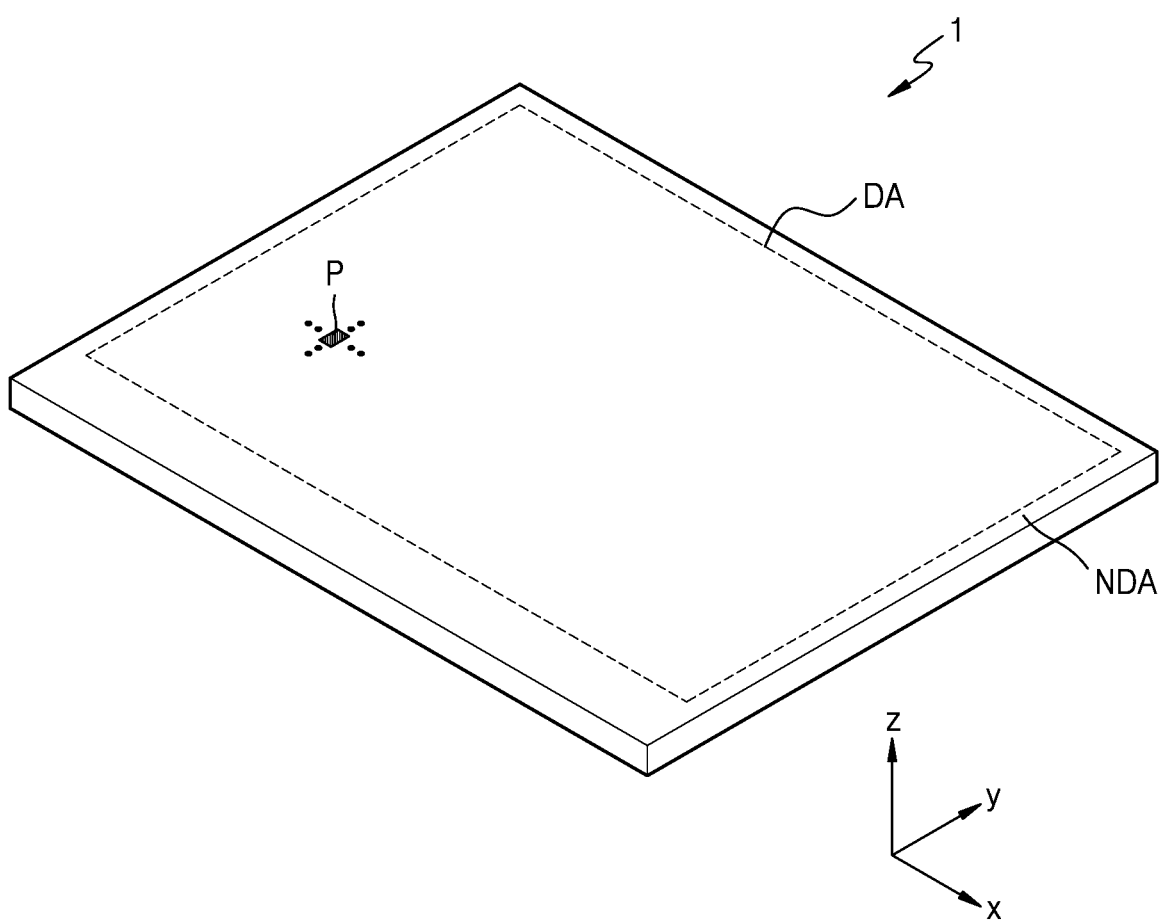
FIG. 1 is a schematic perspective view of a display apparatus according to an embodiment.

The display apparatuses according to embodiments will be described in detail with reference to the accompanying drawings. In the drawings, widths and thicknesses of layers and regions may be exaggerated for clarity and convenience of explanation of the specification. Like reference numerals refer to like elements throughout the specification.

The advantages, features, and methods of achieving the advantages may be clear when referring to the embodiments described below together with the drawings. However, the disclosure may have different forms and should not be construed as being limited to the descriptions set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. Hereafter, the disclosure will be described more fully with reference to the accompanying drawings, in which embodiments of the disclosure are shown. In describing the disclosure with reference to drawings, like reference numerals are used for elements that are substantially identical or correspond to each other, and the descriptions thereof will not be repeated.

In the following descriptions, it will be understood that, although the terms "first", "second", etc., may be used to describe various elements, components, regions, layers, and/or sections, these elements, components, regions, layers, and/or sections, should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The term "substituted" refers to the replacement of a hydrogen in a compound, for example, a hydrogen on a ring carbon or an amine hydrogen, with deuterium, —F, —Cl, —Br, —I, —SF$_5$, a hydroxyl group, a cyano group, a nitro group, an amidino group, a hydrazine group, a hydrazone group, a carboxylic acid group or salt thereof, a sulfonic acid group or salt thereof, a phosphoric acid group or salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ hetero-cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic heterocondensed polycyclic group.

When a certain embodiment may be implemented differently, a specific process order may be performed differently from the described order. For example, two consecutively described processes may be performed substantially at the same time or performed in an order opposite to the described order.

In the following embodiments, when a film, a region, a constituent element, etc. are connected, it may include a case when a film, a region, a constituent element is directly connected or/and a case when the film, the region, and the components are indirectly connected by intervening another film, a region, a constituent element therebetween. For example, in the specification, when a film, a region, a constituent element, etc. are electrically connected, it may represent when a film, region, constituent element, etc. are directly electrically connected, and/or another film, region, component, etc. are indirectly electrically connected by intervening another film, region, constituent element, etc. there between.

The x-axis, y-axis, and z-axis are not limited to three axes on a Cartesian coordinate system, and may be interpreted in a broad sense including the Cartesian coordinate system. For example, the x-axis, y-axis, and z-axis may be orthogonal to each other, but may refer to different directions that are not orthogonal to each other.

FIG. 1 is a schematic perspective view of a display apparatus 1 according to an embodiment.

Referring to FIG. 1, the display apparatus 1 includes a display area DA where an image is implemented and a non-display area NDA where an image is not implemented. The display apparatus 1 may provide an image to the outside by using light emitted from the display area DA.

In FIG. 1, the display apparatus 1 depicts a display area DA as a quadrangle, but the present embodiment is not limited thereto. The shape of the display area DA may be a circle, an ellipse, or a polygon, such as a triangle or a pentagon. Also, although it is depicted that the display apparatus 1 of FIG. 1 has a shape of flat-panel display apparatus in a flat form, the display apparatus 1 may be implemented in various forms, such as a flexible, foldable, and rollable display apparatus. Although not shown, the display apparatus 1 may include a component (not shown). The component may be located on one side of a first substrate 100 (refer to FIG. 2) to correspond to the display area DA or the non-display area NDA. Hereinafter, as a component according to an embodiment, the display apparatus 1 including a color filter, a color conversion layer, and an organic light emitting diode (OLED) structure as a light-emitting unit will be described.

Figure 2:
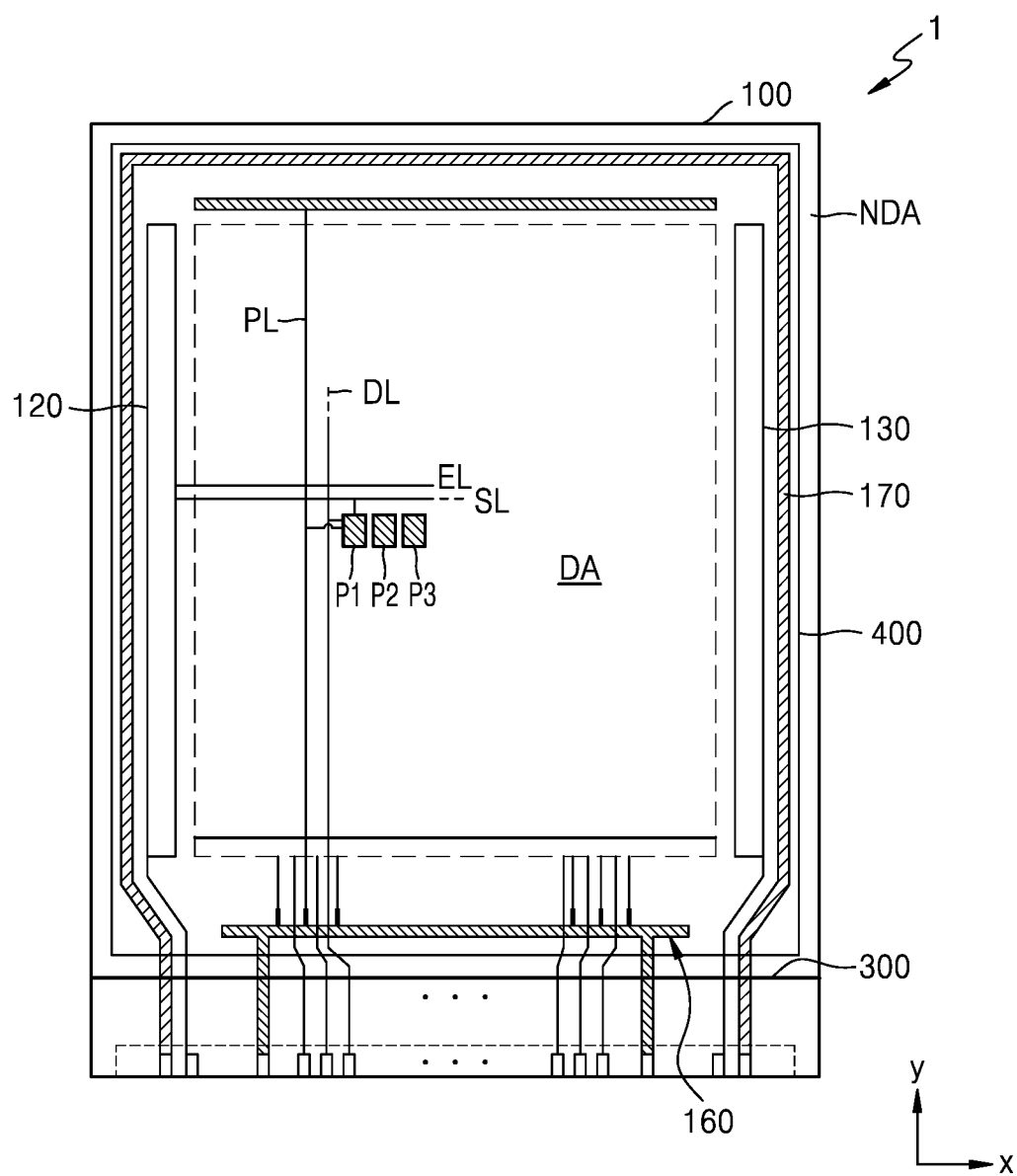
FIG. 2 is a schematic plan view of a display apparatus according to an embodiment.

FIG. 2 is a schematic plan view of the display apparatus 1 according to an embodiment.

Referring to FIG. 2, the display apparatus 1 may include a plurality of pixels P1, P2, and P3 disposed in the display area DA of the first substrate 100. Each of the plurality of pixels P1, P2, and P3 may emit, for example, red light, green light, blue light, or white light. Hereinafter, in the present specification, each of the pixels P1, P2, and P3 may refer to a sub-pixel each emitting a different color, and each of the pixels P1, P2, and P3 may be one of, for example, a red R sub-pixel, a green G sub-pixel, and a blue B sub-pixel.

Figure 3:
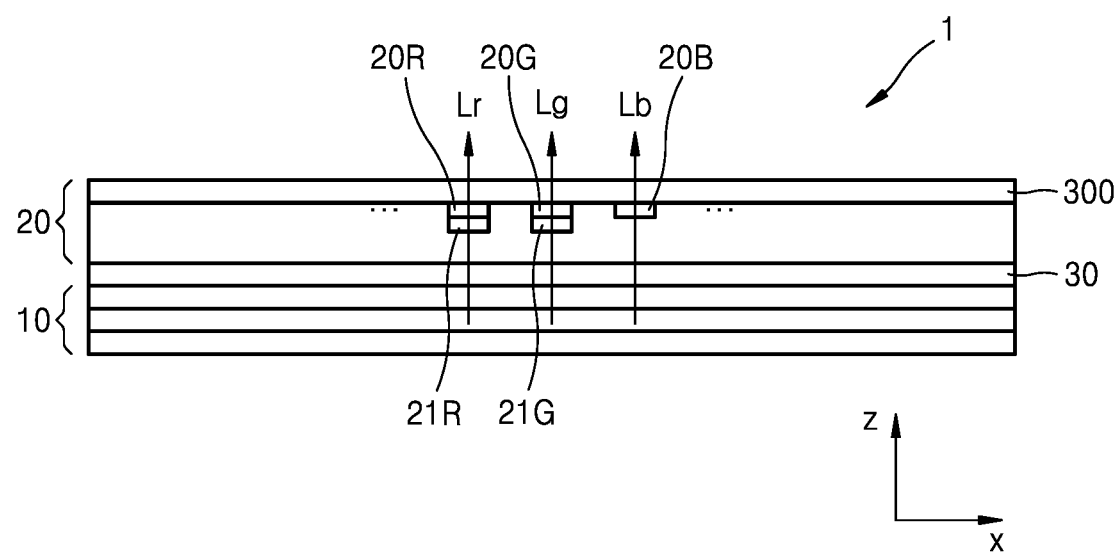
FIG. 3 is a schematic cross-sectional view of a display apparatus according to an embodiment.

A second substrate 300 may be provided on the first substrate 100. The second substrate 300 may face the first substrate 100 and constituent elements formed on the first substrate 100 are disposed between the first substrate 100 and the second substrate 300. As depicted in FIG. 3, color filters 20R, 20G, and 20B and color conversion layers 21R and 21G may be disposed on the second substrate 300 to form a color conversion unit 20.

The display area DA may be covered by a thin film encapsulation layer 400 to protect the display components from outside air or moisture, etc. Because an OLED is vulnerable to external factors, such as moisture and oxygen, the reliability of the display apparatus 1 may be improved by sealing the pixels P1, P2, and P3 as well as other OLED components with the thin film encapsulation layer 400. In this way, when the thin film encapsulation layer 400 is provided as described above, the thickness of the display apparatus 1 may be reduced and, at the same time, the flexibility may be improved.

As shown in FIG. 1, the pixels P1, P2, and P3 may be electrically connected to outer circuits disposed in the non-display area NDA. In the non-display area NDA, a first scan driving circuit 120, a second scan driving circuit 130, a data driving circuit (not shown), a first power supply wiring 160, and a second power supply wiring 170 may be disposed.

The first scan driving circuit 120 may provide a scan signal to each of the pixels P1, P2, and P3 through a scan line SL. The first scan driving circuit 120 may provide an emission control signal to each pixel through an emission control line EL. The second scan driving circuit 130 may be disposed in parallel with the first scan driving circuit 120 with the display area DA therebetween.

A control signal generated by a controller may be transmitted to the first and second scan driving circuits 120 and 130 respectively through a printed circuit board. The controller may provide first and second power voltages ELVDD and ELVSS to the first and second power supply wirings 160 and 170, respectively. The first power voltage ELVDD may be provided to each of the pixels P1, P2, and P3 through a driving voltage line PL connected to the first power supply line 160, and the second power voltage ELVSS may be provided to counter electrodes of each of the pixels P1, P2, and P3 connected to the second power supply line 170.

The data driving circuit is electrically connected to a data line DL. A data signal of the data driving circuit may be provided to each of the pixels P1, P2, and P3 through the data line DL.

FIG. 3 is a schematic cross-sectional view of a display apparatus 1 according to an embodiment.

Referring to FIG. 3, the display apparatus 1 includes an OLED structure 10 and a color conversion unit 20 with a surface proximate to a surface of the OLED structure 10. The first pixel P1, the second pixel P2, and the third pixel P3 may be pixels that emit light of first, second, and third colors Lr, Lg, and Lb, respectively, on the first substrate 100. For example, the first pixel P1 may emit red light as the first color light Lr, the second pixel P2 may emit green light as the second color light Lg, and the third pixel P3 may emit blue light as the third color light Lb.

The OLED structure 10 may be disposed under the first pixel P1, the second pixel P2, and the third pixel P3. The OLED structure 10 may be referred to as a light source OLED. The OLED structure 10 may include a stacked structure of at least one blue light-emitting unit and at least one green light-emitting unit.

The color conversion unit 20 may include the color filters 20R, 20G, and 20B and the color conversion layers 21R and 21G. Incident light emitted from the OLED structure 10 may be emitted as the first color light Lr, the second color light Lg, and the third color light Lb, respectively, after passing through the color filters 20R, 20G, and 20B, respectively, and the color conversion layers 21R and 21G.

The color filters 20R, 20G, and 20B and the color conversion layers 21R and 21G may be located directly on the second substrate 300. The term "directly located on the second substrate 300" denotes that the color conversion unit 20 is formed by directly forming the color filters 20R, 20G, 20B on the second substrate 300. Afterwards, the OLED structure 10 and the color conversion unit 20 may be bonded together in a state that the color filters 20R, 20G, and 20B, respectively, and the color conversion layers 21R and 21G, face the first pixel P1, the second pixel P2, and the third pixel P3. FIG. 3 shows that the OLED structure 10 and the color conversion unit 20 are bonded through an adhesive layer 30. The adhesive layer 30 may be, for example, an optical clear adhesive (OCA), but is not limited thereto. As an alternative embodiment, the adhesive layer 30 may be omitted.

Figure 4:
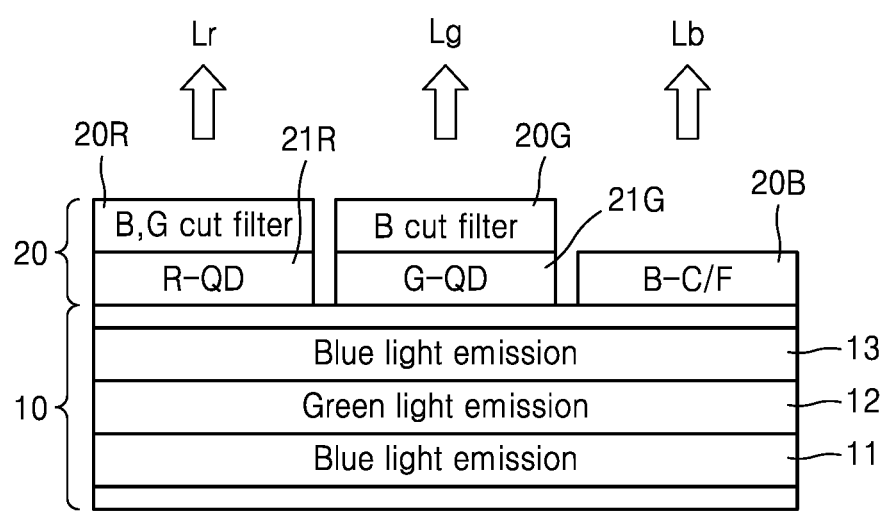
FIG. 4 is an enlarged cross-sectional view illustrating a portion of a display apparatus according to an embodiment.
Figure 5:
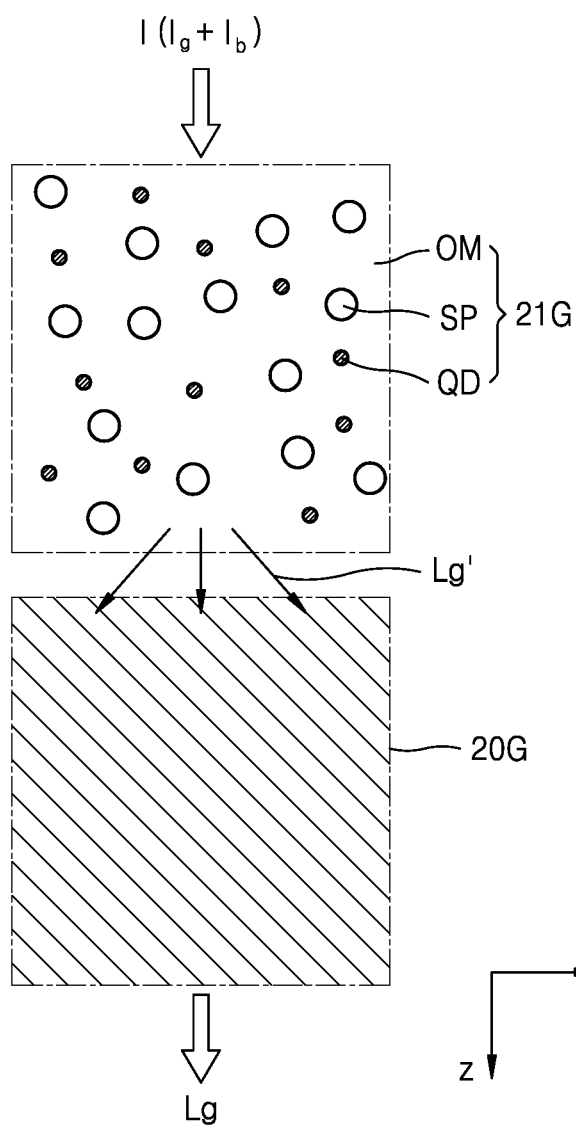
FIG. 5 is an enlarged schematic view of a color conversion layer and a color filter according to an embodiment.

FIG. 4 is an enlarged schematic cross-sectional view illustrating a part of the display apparatus 1 according to an embodiment. FIG. 5 is an enlarged view of a color conversion layer and a color filter according to an embodiment.

Referring to FIGS. 4 and 5, the OLED structure 10 may be referred to as a light source OLED. The OLED structure 10 may include a stacked structure in which at least one of blue light-emitting units 11 or 13 (both are present in FIG. 4) and at least one green light-emitting unit 12. The blue light-emitting units 11 and 13 may emit blue incident light $I_b$ having a peak wavelength band in a range of about 440 nanometers (nm) to about 500 nm or in a range of about 450 nm to about 480 nm, and the green light emitting unit 12 may emit green incident light $I_g$ having a peak wavelength band in a range of about 500 nm to about 550 nm or in a range of about 510 nm to about 540 nm. Accordingly, the OLED structure 10 may emit incident light I in which blue incident light $I_b$ and green incident light $I_g$ are mixed. The blue light-emitting units 11 and 13 may include a blue fluorescent material and/or a blue phosphorescent material. The green light emitting unit 12 may include a green fluorescent material and/or a green phosphorescent material.

For example, as depicted in FIG. 4, the OLED structure 10 may include the first blue light-emitting unit 11, the green light-emitting unit 12, and the second blue light-emitting unit 13. As an example, the green light-emitting unit 12 may be disposed between the first blue light-emitting unit 11 and the second blue light-emitting unit 13. The green light-emitting unit 12 and the second blue light-emitting unit 13 may be sequentially stacked on the first blue light emitting unit 11. Since the lifetime of each of the blue light-emitting units 11 and 13 may be less than that of the green light-emitting unit 12, it may be advantageous to use two or more blue light-emitting units 11 and 13 and a smaller number of the green light-emitting units 12 than the number of the blue light-emitting units 11 and 13. When luminous efficiency, lifespan, and performance are considered, one green light-emitting unit 12 may be used between the two blue light-emitting units 11 and 13. However, the configuration of the OLED structure 10 may be variously changed. Moreover, one of the first blue light-emitting unit 11, or the second blue light-emitting unit 13, may independently include a blue fluorescent emitting compound (which may include a TADF emitting compound) or a blue phosphorescent emitting compound.

As shown in FIG. 4, the OLED structure 10 may have a tandem structure. In this case, a first charge generation layer (not shown) may be provided between the first blue light-emitting unit 11 and the green light-emitting unit 12. Also, a second charge generation layer (not shown) may be provided between the green light-emitting unit 12 and the second blue light-emitting unit 13. The tandem structure and the first and second charge generation layers will be described in detail with reference to FIG. 6.

Referring to FIG. 4, the color conversion unit 20 may be provided on a surface of the OLED structure 10. The color conversion unit 20 may further include a first color conversion layer 21R including a first quantum dot QD for red conversion, a second color conversion layer 21G including a second quantum dot QD for green conversion, a first color filter 20R provided on the first color conversion layer 21R, a second color filter 20G provided on the second color conversion layer 21G, and a third color filter 20B. Here, although a third color conversion layer 21B including a third quantum dot QD for blue conversion is not shown, it is obvious that it may be added as needed.

Referring to FIG. 5, as an example, incident light I in which blue incident light $I_b$ emitted from the first and second blue light-emitting units 11 and 13, and green incident light $I_g$ emitted from the second blue light-emitting unit 13, are mixed and may be converted into second color light Lg through sequentially passing through the second color conversion layer 21G and the second color filter 20G. The second color conversion layer 21G may include scattering particles SP, quantum dots QD, and a photosensitive polymer OM. In one embodiment, the incident light I is scattered by the scattering particles SP. Because light has linearity, more light may excite the quantum dots QD by scattering light through the scattering particles SP, thereby increasing the color conversion rate.

Light scattered by the scattering particles SP may be converted into second color light by the quantum dots QD included in the second color conversion layer 21G. For example, the quantum dots QD included in the second color conversion layer 21G are excited by the incident light I, and thus, may emit second intermediate light Lg' having a wavelength greater than that of blue light in a relatively distributive manner.

As an example, the wavelength of light generated from the quantum dot (QD) may be determined by a size, material, or structure of particles (quantum dots). Specifically, when light having a wavelength greater than an energy band interval is incident on the quantum dots QD, the quantum dots QD are excited by absorbing the energy of the incident light and then emit light of a specific wavelength. In this case, as the size of the quantum dots (QD) decreases, light of a relatively short wavelength, for example, blue light or green light may be generated, and as the size of the quantum dots QD increases, light of a relatively long wavelength, for example, red light may be generated. Accordingly, light of various colors may be implemented according to the size of the quantum dots QD. Quantum dots QD that may emit green light may be referred to as green quantum dot particles, and quantum dots QD that may emit red light may be referred to as red quantum dot particles. For example, the green quantum dots QD may be particles having a width (diameter) in a range of about 2 nm to about 3 nm, and the red light quantum dots QD may be particles having a width (diameter) in a range of about 5 nm to about 6 nm. An emission wavelength may be controlled not only by the size (diameter) of the quantum dots (QD), but also by the constituent materials and structures.

The second intermediate light Lg' converted by the second color conversion layer 21G may enter the second color filter 20G. The second color filter 20G according to an embodiment may block a wavelength of a blue region remaining in the second intermediate light Lg' that has passed through the second color conversion layer 21G. Accordingly, the second color light Lg that has passed through the second color filter 20G may include only light of a predetermined wavelength band, that is, green light.

The second color filter 20G according to an embodiment may be a blue-cut filter. Accordingly, color control/filtering characteristics may be improved by the second color filter 20G. The second color filter 20G according to an embodiment may be, for example, a distributed Bragg reflector (DBR) structure. A DBR structure that transmits or reflects only a desired wavelength band may be formed by repeatedly stacking two material layers (dielectrics) having different refractive indices but controlling the thickness and the number of layers of the material layers. For example, the reflectance or transmittance of a desired wavelength band may be increased by repeatedly stacking a $SiO_2$ layer and a $TiO_2$ layer under a $\lambda/4$ condition (where $\lambda$ is the wavelength of light) and controlling the thickness and number of layers. The DBR structure is well known, and thus, the detailed descriptions thereof will be omitted. However, the present disclosure is not limited thereto, and the second color filter 20G may have a structure other than a DBR structure, for example, a high-contrast grating (HCG) structure.

FIG. 5 has been described based on the second color filter 20G and the second color conversion layer 21G corresponding to the second pixel P2, but such a multilayer structure is also the same with respect to the color filter and the color conversion layer corresponding to the first pixel P1. The first color filter 20R and the first color conversion layer 21R corresponding to the first pixel P1 may also convert the incident light I into the first color light Lr through the same mechanism. In addition, the third color filter 20B corresponding to the third pixel P3 may use an absorption type blue-color filter C/F. The blue-color filter 20B may selectively transmit light in a blue wavelength region and absorb light in the remaining wavelength region, but the present disclosure is not limited thereto.

Figure 6:
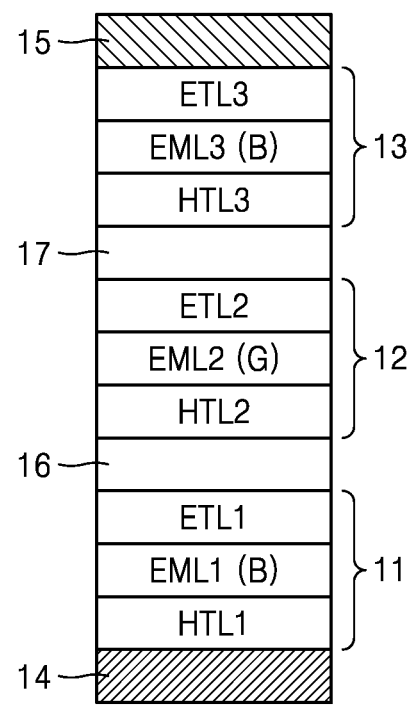
FIG. 6 is a cross-sectional view showing a more detailed configuration of an organic light emitting diode (OLED) structure that may be applied to a display apparatus according to an embodiment.

FIG. 6 is a schematic cross-sectional view showing a more detail configuration of the OLED structure 10 of a display apparatus 1 according to an embodiment.

Referring to FIG. 6, a first blue light-emitting unit 11, a first charge generation layer 16, a green light-emitting unit 12, a second charge generation layer 17, and a second blue light-emitting unit 13, and a second electrode 15 may be sequentially provided on a first electrode 14.

The first blue light-emitting unit 11 may include a first blue light-emitting layer EML1 including an organic material-based blue light-emitting material, and may further include a first hole transport layer HTL1 and a first electron transport layer ETL1. The first hole transport layer HTL1 may be disposed between the first blue light-emitting layer EML1 and the first electrode 14, and the first electron transport layer ETL1 may be disposed between the first blue light-emitting layer EML1 and the first charge generation layer 16.

The green light-emitting unit 12 may include a green light-emitting layer EML2 including an organic material-based green light-emitting material, and may further include a second hole transport layer HTL2 and a second electron transport layer ETL2.

The second blue light-emitting unit 13 may include a second blue light-emitting layer EML3 including an organic material-based blue light emitting material, and may further include a third hole transport layer HTL3 and a third electron transport layer ETL3. Although not shown, each of the first blue light-emitting unit 11, the green light-emitting unit 12, and the second blue light-emitting unit 13 may further include at least one of a hole injection layer and an electron injection layer. The first and second charge generation layers 16 and 17 may include a metal or a metallic material, and may increase the luminous efficiency of the OLED structure 10.

Hereinafter, a blue light-emitting material included in the first blue light-emitting unit 11 and the second blue light-emitting unit 13 and a green light-emitting material included in the green light-emitting unit 12 of the display apparatus 1 according to the embodiment will be described.

The green light-emitting material or blue light-emitting material may include a phosphorescent dopant. The phosphorescent dopant may be selected from, for example, compounds PD1 to PD25, but is not limited thereto.

PD1
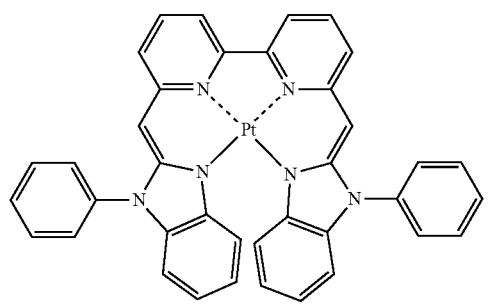

PD2
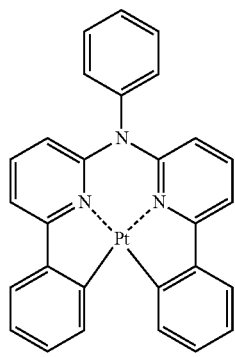

PD3
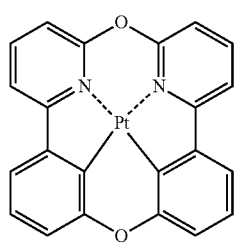

PD4
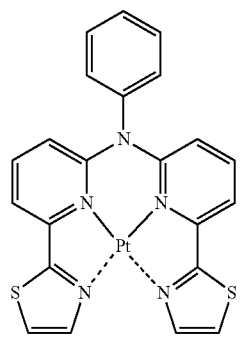

PD5
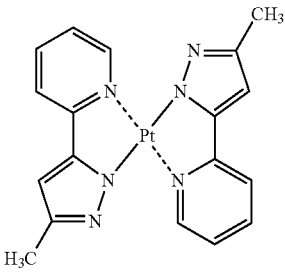

PD6
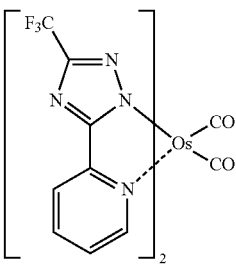

PD7
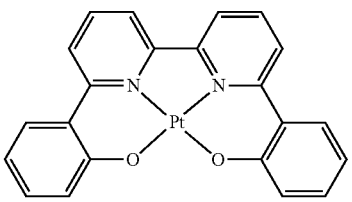

PD8
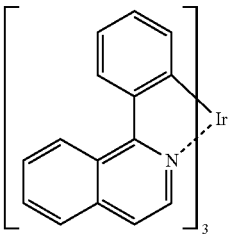

PD9
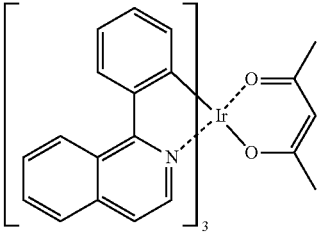

PD10
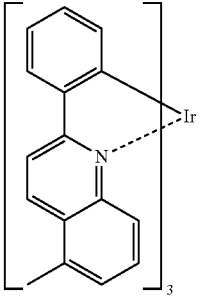

PD11 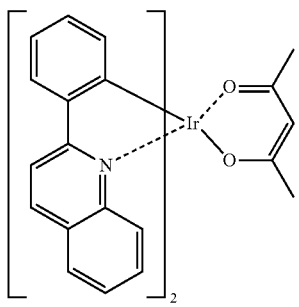
PD12 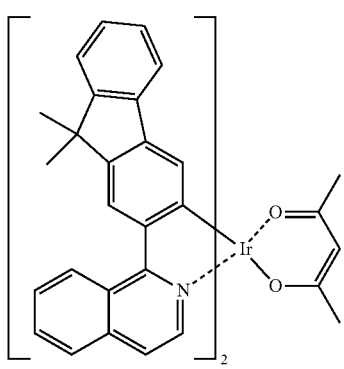
PD13 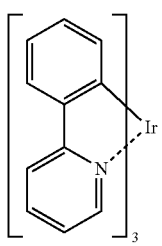
PD14 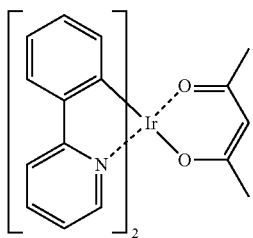
PD15 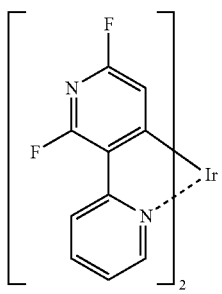
PD16 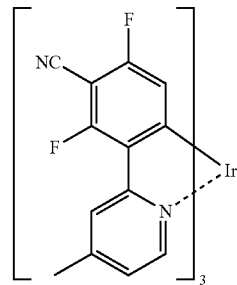
PD17 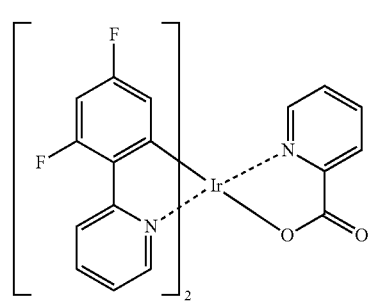
PD18 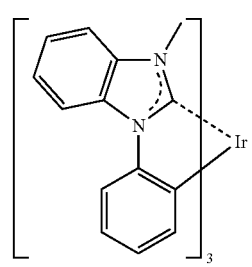
PD19 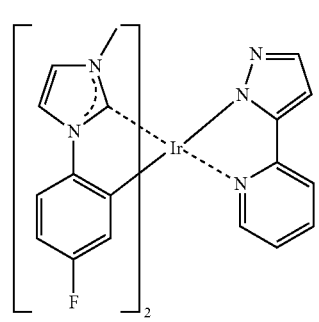
PD20 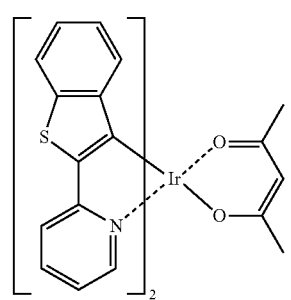

PD21 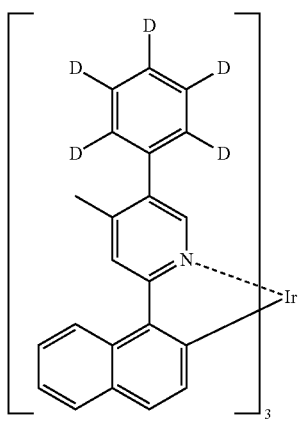

PD22 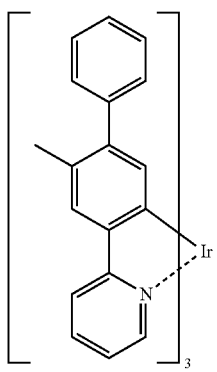

PD23 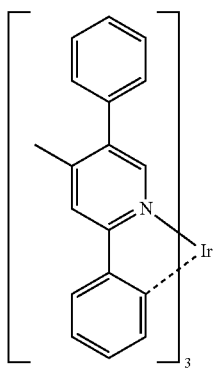

PD24 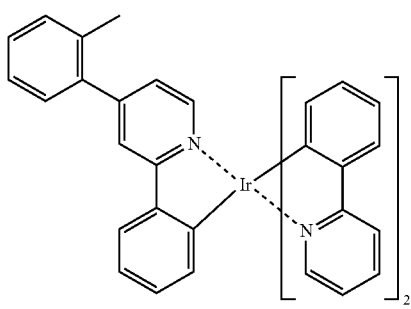

PD25 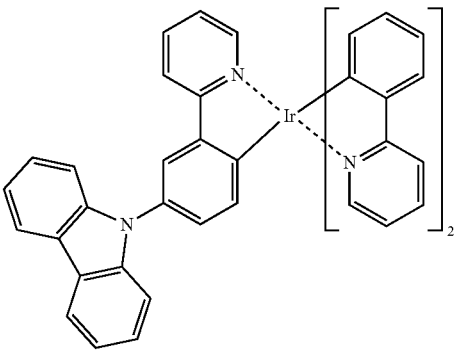

As described above, the phosphorescent dopant may include an organometallic compound including iridium Ir, an organometallic compound including platinum Pt, or an organometallic compound including osmium Os. Besides above, various materials may be applied as phosphorescent dopants.

A light-emitting layer of the green light-emitting unit (green organic light-emitting device) 12 may include an electron transport host, a hole transport host, and a dopant. The dopant may be an organometallic compound, and the dopant may or may not include iridium Ir. That is, the dopant may be an iridium-including or iridium-free organometallic compound. The dopant in the light-emitting layer of the green light-emitting unit (green organic light-emitting device) 12 may include a phosphorescent compound. The organic green light-emitting device may be explicitly distinguished from an organic light-emitting device that emits fluorescence by a fluorescence mechanism.

According to an embodiment, the dopant in the light-emitting layer may satisfy T1 (dopant)≤S1(dopant)≤T1(dopant)+0.5 eV, for example, T1(dopant)≤S1(dopant)≤T1(dopant)+0.36 eV, but is not limited thereto. Here, T1 (dopant) is a triplet energy level with a value in eV of a dopant in the light-emitting layer, and S1 (dopant) is a singlet energy level with a value in eV of a dopant included in the light-emitting layer. Since the S1 (dopant) satisfies the range described above, the dopant in the light-emitting layer may have a high radiative decay rate even though spin-orbit coupling (SOC) with the singlet energy level close to the triplet energy level is weak.

For example, the dopant may be an organometallic compound including iridium (Ir), or an organometallic compound including platinum Pt, osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au. For example, the dopant may be an organometallic compound including platinum Pt or palladium Pd, but is not limited thereto.

According to another embodiment, the dopant in the light-emitting layer may be an organometallic compound having a square-planar coordination structure.

Also, according to another embodiment, the dopant in the light-emitting layer may satisfy T1 (dopant)≤Egap (dopant) ≤T1 (dopant)+0.5, but is not limited thereto. Here, T1 (dopant) is a triplet energy level in eV of a dopant in the light-emitting layer, and Egap (dopant) is an energy difference between HOMO (dopant) and LUMO (dopant) of a dopant included in the light-emitting layer. The HOMO (dopant) is a highest occupied molecular orbital (HOMO) energy level eV of the dopant included in the light-emitting layer, and the LUMO (dopant) is a lowest unoccupied molecular orbital (LUMO) energy level eV of the dopant included in the light-emitting layer. The HOMO (dopant) and LUMO (dopant) are negative values measured by using differential pulse voltammetry using ferrocene as a reference material, and the T1 (dopant) is calculated from a peak wavelength of a phosphorescence spectrum of the dopant measured by using a luminescence measuring device. The dopant in the light-emitting layer may satisfy −2.8 eV≤LUMO (dopant)≤−2.3 eV, −2.8 eV≤LUMO (dopant)≤−2.4 eV, −2.7 eV≤LUMO (dopant)≤−2.5 eV, or −2.7 eV≤LUMO (dopant)≤−2.61 eV.

According to another embodiment, the dopant in the light-emitting layer may satisfy −6.0 eV≤HOMO (dopant) ≤−4.5 eV, −5.7 eV≤HOMO (dopant)≤−5.1 eV, −5.6 eV≤HOMO (dopant)≤−5.2 eV, or −5.6 eV≤HOMO (dopant) ≤−5.25 eV.

According to another embodiment, the dopant may include a metal M and an organic ligand, and the metal M and the organic ligand may form 1, 2 or 3 cyclometallated rings. The metal M is iridium Ir, platinum Pt, osmium Os, titanium Ti, zirconium Zr, hafnium Hf, europium Eu, terbium Tb, thulium Tm, Rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au.

According to another embodiment, the dopant may include a metal M and a four-coordinate organic ligand capable of forming 3 or 4 (e.g., 3) cyclometallated rings. With regards to the description of the metal M, refer to the descriptions made in this specification. The four-coordinate organic ligand may structurally include, for example, a benzimidazole group and/or a pyridine group, but is not limited thereto.

According to another embodiment, the dopant may include a metal M and at least one ligand from among ligands represented by Formulas 1-1 to 1-4 below.

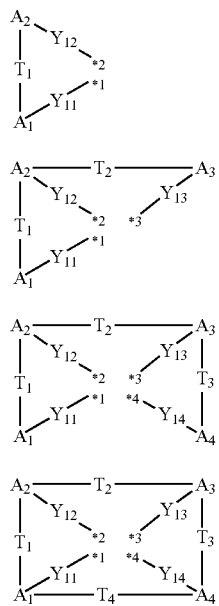

Formula 1-1

Formula 1-2

Formula 1-3

Formula 1-4

For example, when the metal M is iridium Ir, the metal M may be combined with a ligand of Formula 1-1, and when the metal M is platinum Pt, the metal M may be combined with the ligands represented by Formulas 1-2 to 1-4. When the metal M is osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au, the metal M may be combined with any one of the ligands represented by Formulas 1-1 to 1-4.

In Formulas 1-1 to 1-4, $A_1$ to $A_4$ may be each independently a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may be each independently a chemical bond, O, S, $N(R_{91})$, $B(R_{91})$, $P(R_{91})$ or $C(R_{91})(R_{92})$, $T_1$ to $T_4$ may be each independently a single bond, a double bond, *—$N(R_{93})$—*', *—$B(R_{93})$—*', *—$P(R_{93})$—*', *—$C(R_{93})(R_{94})$—*', *—$Si(R_{93})(R_{94})$—*', *—$Ge(R_{93})(R_{94})$—*', *—S—*', *—Se—*', *—O—*', *—C(=O)—*', *—S(=O)—*', *—S(=O)_2$—*', *—$C(R_{93})$=*', *=$C(R_{93})$—*', *—$C(R_{93})$=$C(R_{94})$—*', *—C(=S)—*', or *—C≡C—*', The substituent of the substituted $C_5$-$C_{30}$ carbocyclic group, the substituent of the substituted $C_1$-$C_{30}$ heterocyclic group, and $R_{91}$ to $R_{94}$ may be each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or salt thereof, a sulfonic acid group or salt thereof, a phosphoric acid group or salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ hetero-cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic heterocondensed polycyclic group, —N(Q1)(Q2), —Si(Q3)(Q4)(Q5), —B(Q6)(Q7), or —P(=O)(Q8)(Q9), wherein Q1 to Q9 are each independently —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, and *¹, *², *³ and *⁴ are bonding sites of the dopant with the metal M, respectively.

For example, the dopant may include a ligand represented by Formula 1-3, and any two of $A_1$ to $A_4$ in Formula 1-3 respectively may be a substituted or unsubstituted benzimidazole group and a substituted or unsubstituted pyridine group, but is not limited thereto.

According to another embodiment, the dopant may be an organometallic compound represented by Formula 1A.

Formula 1A

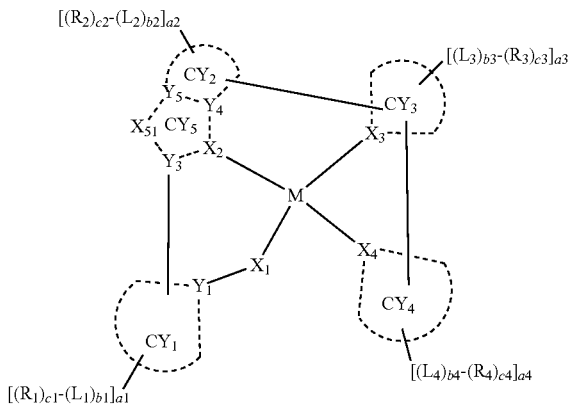

In Formula 1A,

M represents beryllium Be, magnesium Mg, aluminum Al, calcium Ca, titanium Ti, manganese Mn, cobalt Co, copper Cu, zinc Zn, gallium Ga, germanium Ge, zirconium Zr, ruthenium Ru, rhodium Rh, palladium Pd, silver Ag, rhenium Re, platinum Pt or gold Au, $X_1$ represents O or S, and a bond between $X_1$, and M is a covalent bond, $X_2$ to $X_4$ are each independently C or N, at least one of a bond between $X_2$ and M, a bond between $X_3$ and M, and a bond between $X_4$ and M is a covalent bond, and the other two bonds are coordination bonds, $Y_1$ and $Y_3$ to $Y_5$ are each independently C or N, a bond between $X_2$ and $Y_3$, a bond between $X_2$ and $Y_4$, a bond between $Y_4$ and $Y_5$, a bond between $Y_5$ and $X_{51}$, and a bond between $X_{51}$ and $Y_3$ are chemical bonds, $CY_1$ to $CY_5$ are each independently a $C_5$-$C_{30}$ carbocyclic group or a $C_1$-$C_{30}$ heterocyclic group, and $CY_4$ is not benzimidazole, and the cyclometallated ring formed by $CY_5$, $CY_2$, $CY_3$ and M is a 6-membered ring, $X_{51}$ is O, S, N-[($L_7$)$_{b7}$-($R_7$)$_{c7}$], C($R_7$)($R_8$), Si($R_7$)($R_8$), Ge($R_7$)($R_8$), C(=O), N, C($R_7$), Si($R_7$), or Ge($R_7$), $R_7$ and $R_8$ may form a substituted or unsubstituted $C_5$-$C_{30}$ carbocyclic group or a substituted or unsubstituted $C_1$-$C_{30}$ heterocyclic group by optionally bonding to each other through a first linking group, $L_1$ to $L_4$ and $L_7$ may be each independently a substituted or unsubstituted $C_5$-$C_{30}$ carbocyclic group or a substituted or unsubstituted $C_1$-$C_{30}$ heterocyclic group, b1 to b4 and b7 may be each independently an integer of 0 to 5, $R_1$ to $R_4$, $R_7$ and $R_8$ may be each independently hydrogen, deuterium, —F, —Cl, —Br, —I, —SF5, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ is defined above;

c1 to c4 may be each independently selected from an integer of 1 to 5, a1 to a4 are each independently 0, 1, 2, 3, 4 or 5, two of a plurality of $R_1$ adjacent to each other may form a substituted or unsubstituted $C_5$-$C_{30}$ carbocyclic group or a substituted or unsubstituted $C_1$-$C_{30}$ heterocyclic group by optionally bonding to each other, two of a plurality of $R_2$ adjacent to each other may form a substituted or unsubstituted $C_5$-$C_{30}$ carbocyclic group or a substituted or unsubstituted $C_1$-$C_{30}$ heterocyclic group by optionally bonding to each other, two of a plurality of $R_3$ adjacent to each other may form a substituted or unsubstituted $C_5$-$C_{30}$ carbocyclic group or a substituted or unsubstituted $C_1$-$C_{30}$ heterocyclic group by optionally bonding to each other, two of a plurality of $R_4$ adjacent to each other may form a substituted or unsubstituted $C_5$-$C_{30}$ carbocyclic group or a substituted or unsubstituted $C_1$-$C_{30}$ heterocyclic group by optionally bonding to each other, and two of $R_1$ to $R_4$ adjacent to each other may form a substituted or unsubstituted $C_5$-$C_{30}$ carbocyclic group or a substituted or unsubstituted $C_1$-$C_{30}$ heterocyclic group by optionally bonding to each other.

In Formulas 1-1 to 1-4 and 1A, $C_5$-$C_{30}$ carbocyclic group, $C_1$-$C_{30}$ heterocyclic group, and $CY_1$ to $CY_4$ may be each independently selected from a) a 6-membered ring, b) a condensed ring in which two or more 6-membered rings are condensed with each other, or c) one or more 6-membered rings and one 5-membered ring condensed with each other, the 6-membered ring is selected from a cyclohexane group, a cyclohexene group, an adamantane group, a norbornane group, a norbornene group, a benzene group, a pyridine group, a pyrimidine group, a pyrazine group, a pyridazine group, and a triazine group, and the 5-membered ring is selected from a cyclopentane group, a cyclopentene group, a cyclopentadiene group, a furan group, a thiophene group, a silol group, a pyrrole group, a pyrazole group, an imidazole group, a triazole group, an oxazole group, a isoxazole group, a thiazole group, an isothiazole group, an oxadiazole group, and a thiadiazole group.

In Formulas 1-1 to 1-4, non-cyclic groups may include *—C(=O)—*', *—O—C(=O)—*', *—S—C(=O)—*', *—O—C(=S)—*', *—S—C(=S)—*', etc., but is not limited thereto.

In Formulas 1-1 to 1-4 and 1A, a substituent of a substituted $C_5$-$C_{30}$ carbocyclic group, a substituent of a substituted $C_1$-$C_{30}$ heterocyclic group, and $R_{91}$ to $R_{94}$, $R_1$ to $R_4$, $R_7$, and $R_8$ may be each independently hydrogen, deuterium, —F, —Cl, —Br, —I, a hydroxyl group, a cyano group, a nitro group, an amino group, an amidino group, a hydrazine group, a hydrazone group, a carboxylic acid group or salt thereof, a sulfonic acid group or salt thereof, a phosphoric acid group or a salt thereof, —SF5, $C_1$-$C_{20}$ alkyl group, or a $C_1$-$C_{20}$ alkoxy group;

a $C_1$-$C_{20}$ alkyl group and a $C_1$-$C_{20}$ alkoxy group substituted with at least one of deuterium, —F, —Cl, —Br, —I, —CD3, —CD2H, —CDH2, —CF3, —CF2H, —CFH2, a hydroxyl group, a cyano group, a nitro group, an amino group, an amidino group, a hydrazine group, a hydrazone group, a carboxylic acid group or salt thereof, a sulfonic acid group or salt thereof, a phosphoric acid group or salt thereof, a $C_1$-$C_{10}$ alkyl group, a cyclopentyl group, a cyclohexyl group, a cycloheptyl group, a cyclooctyl group, an adamantanyl group, norbornanyl, norbornenyl, cyclopentenyl, cyclohexenyl, cycloheptenyl, phenyl, naphthyl, pyridinyl, or pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrroleyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindoleyl group, an indoleyl group, an indazolyl group, a furanyl group, a quinolinyl group, an isoquinolinyl group, a benzoquinolinyl group, a quinoxalinyl group, a quinazolinyl group, a cinnolinyl group, a carbazolyl group, a phenanthrolyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an Imidazopyridinyl group, or imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, pyrroleyl group, a thiophenyl group, a furanyl group, an imidazolyl group, a pyrazolyl group, thiazolyl group, an isothiazolyl group, an oxazolyl group, an isoxazolyl group, a pyridinyl group, a pyrazinyl group, a pyrimidinyl group, a pyridazinyl group, an isoindole group, an indolyl group, an indazolyl group, a furanyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and imidazopyrimidinyl group substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrroleyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindole group, an indolyl group, an indazolyl group, a furanyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, or —$Si(Q_{33})(Q_{34})(Q_{35})$; and —$N(Q_1)(Q_2)$, —$Si(Q_3)(Q_4)(Q_5)$, —$B(Q_6)(Q_7)$, or —$P(=O)(Q_8)(Q_9)$;

$Q_1$ to $Q_9$ and $Q_{33}$ to $Q_{35}$ may be each independently —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; an n-propyl group, an iso-propyl group, an n-butyl group, an isobutyl group, a sec-butyl group, a tert-butyl group, an n-pentyl group, an iso-pentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group substituted with at least one selected from deuterium, $C_1$-$C_{10}$ alkyl group, or a phenyl group, but is not limited thereto.

According to another embodiment, the dopant is an organometallic compound represented by Formula 1A, and in Formula 1A, $X_2$ and $X_3$ are each independently C or N, $X_4$ is N, i) M is Pt, ii) $X_1$ is O, iii) $X_2$ and $X_4$ are N, $X_3$ is C, bonds between $X_2$ and M and between $X_4$ and M are coordination bonds, and a bond between $X_3$ and M is a covalent bond, iv) $Y_1$ to $Y_5$ are C, v) bonds between $Y_5$ and $X_{51}$ and between $Y_3$ and $X_5$, are a single bond, vi) $CY_1$, $CY_2$, and $CY_3$ are benzene groups, and $CY_4$ is a pyridine group, vii) $X_{51}$ is O, S or N-$[(L_7)_{b7}$-$(R_7)_{c7}]$, viii) b7 is 0, c7 is 1, when $R_7$ is a substituted or unsubstituted $C_1$-$C_{60}$ alkyl group, a1 to a4 are each independently, 1, 2, 3, 4 or 5, and at least one of $R_1$ to $R_4$ may be each independently selected from among: a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ hetero-cycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic heterocondensed polycyclic group.

According to another embodiment, the dopant may be represented by the following Formula 1A-1.

Formula 1A-1

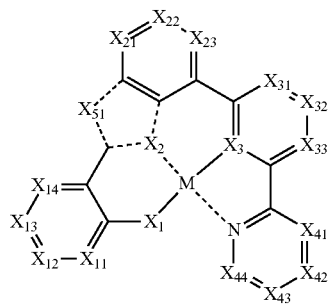

In Formula 1A-1, M, $X_1$ to $X_3$, and $X_5$, are the same as described for Formula 1A, $X_{11}$ is N or C-[$(L_{11})_{b11}$-$(R_{11})_{c11}$], $X_{12}$ is N or C-[$(L_{12})_{b12}$-$(R_{12})_{c12}$], $X_{13}$ is N or C-[$(L_{13})_{b13}$-$(R_{13})_{c13}$], and $X_{14}$ is N or C-[$(L_{14})_{b14}$-$(R_{14})_{c14}$], $L_{11}$ to $L_{14}$, b11 to b14, $R_{11}$ to $R_{14}$, and c11 to c14, refer to the descriptions of $L_1$, b1, $R_1$, and c1 in the present specification, respectively, $X_{21}$ is N or C-[$(L_{21})_{b21}$-$(R_{21})_{c21}$], $X_{22}$ is N or C-[$(L_{22})_{b22}$-$(R_{22})_{c22}$], and $X_{23}$ is N or C-[$(L_{23})_{b23}$-$(R_{23})_{c23}$]

$L_{21}$ to $L_{23}$, b21 to b23, $R_{21}$ to $R_{23}$, and c21 to c23, refer to the descriptions of $L_2$, b2, $R_2$, and c2 in the present specification, respectively, $X_{31}$ is N or C-[$(L_{31})_{b31}$-$(R_{31})_{c31}$], $X_{32}$ is N or C-[$(L_{32})_{b32}$-$(R_{32})_{c32}$] and, $X_{33}$ is N or C-[$(L_{33})_{b33}$-$(R_{33})_{c33}$], L31 to L33, b31 to b33, R31 to R33, and c31 to c33, refer to the description of L3, b3, R3 and c3 in the present specification, respectively, $X_{41}$ is N or C-[$(L_{41})_{b41}$-$(R_{41})_{c41}$], $X_{42}$ is N or C-[$(L_{42})_{b42}$-$(R_{42})_{c42}$], $X_{43}$ is N or C-[$(L_{43})_{b43}$-$(R_{43})_{c43}$], and $X_{44}$ is N or C-[$(L_{44})_{b44}$-$(R_{44})_{c44}$], $L_{41}$ to $L_{44}$, b41 to b44, $R_{41}$ to $R_{44}$, and c41 to c44, refer to the descriptions of $L_4$, b4, $R_4$ and c4 in the present specification, respectively, two of $R_{11}$ to $R_{14}$ may form a substituted or unsubstituted $C_5$-$C_{30}$ carbocyclic group or a substituted or unsubstituted $C_1$-$C_{30}$ heterocyclic group by optionally bonding to each other, two of $R_{21}$ to $R_{23}$ may form a substituted or unsubstituted $C_5$-$C_{30}$ carbocyclic group or a substituted or unsubstituted $C_1$-$C_{30}$ heterocyclic group by optionally bonding to each other, two of $R_{31}$ to $R_{33}$ may form a substituted or unsubstituted $C_5$-$C_{30}$ carbocyclic group or a substituted or unsubstituted $C_1$-$C_{30}$ heterocyclic group by optionally bonding to each other, and two of $R_{41}$ to $R_{44}$ may form a substituted or unsubstituted $C_5$-$C_{30}$ carbocyclic group or a substituted or unsubstituted $C_1$-$C_{30}$ heterocyclic group by optionally bonding to each other.

For example, the dopant may be one of the following compounds 1-1 to 1-88, 2-1 to 2-47, and 3-1 to 3-582, but is not limited thereto.

1-1

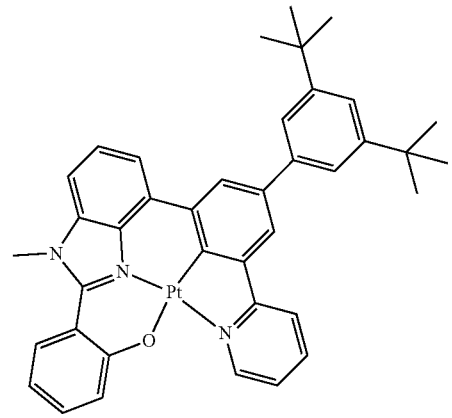

1-2

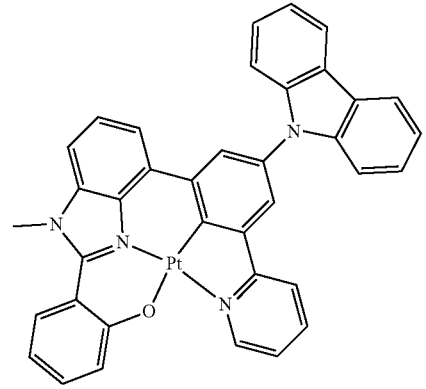

1-3

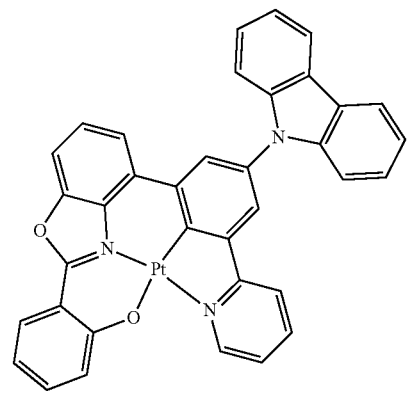

1-4

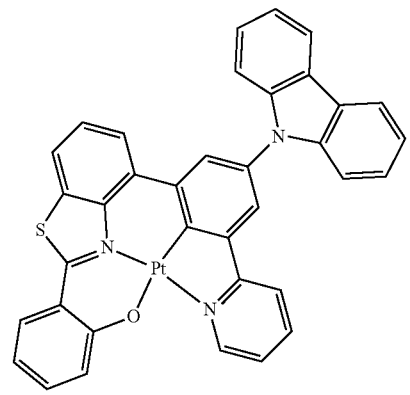

-continued
1-5
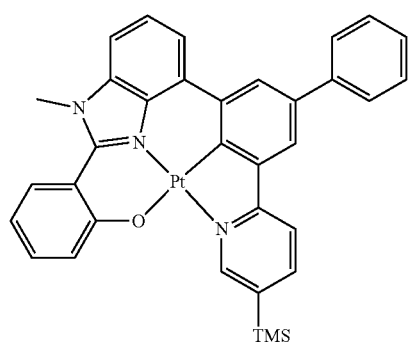
1-6
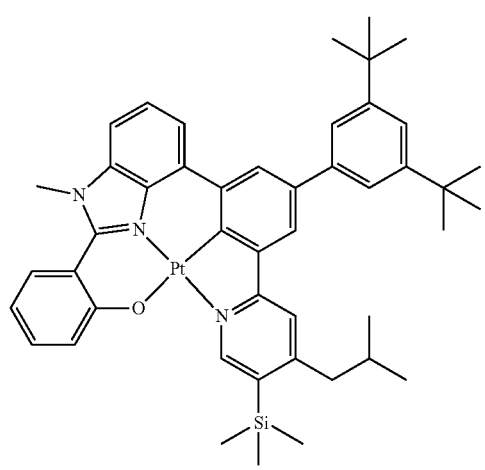
1-7
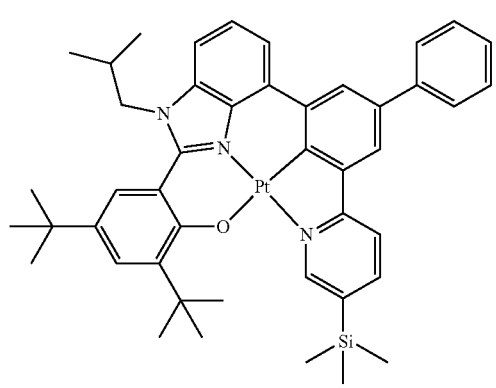
1-8
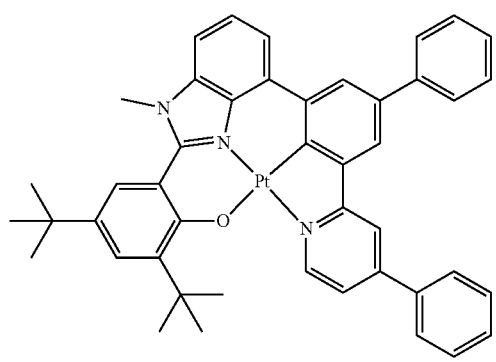
-continued
1-9
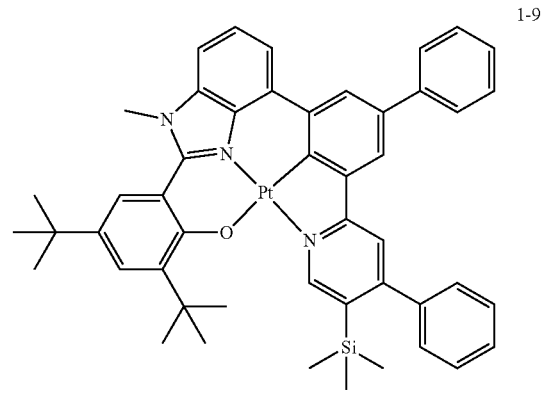
1-10
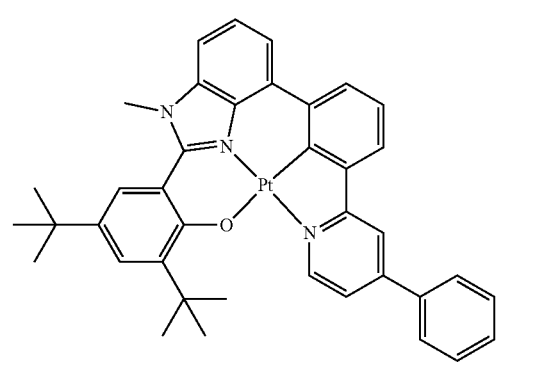
1-11
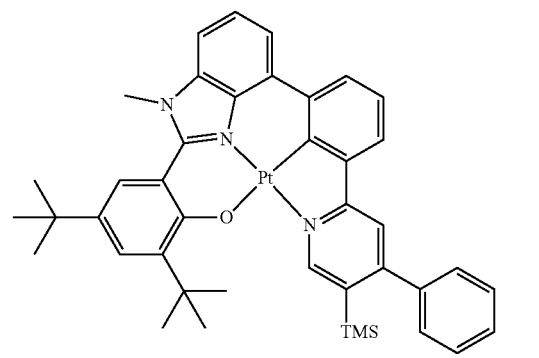
1-12
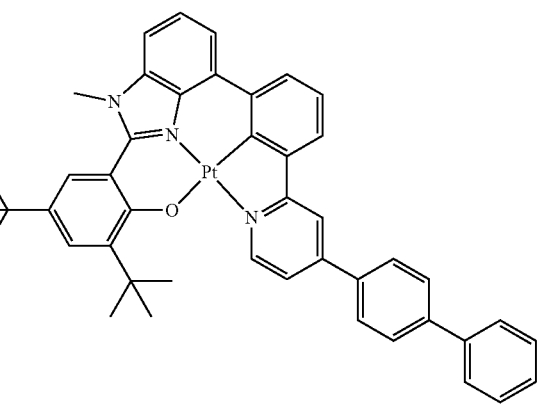

-continued
1-13
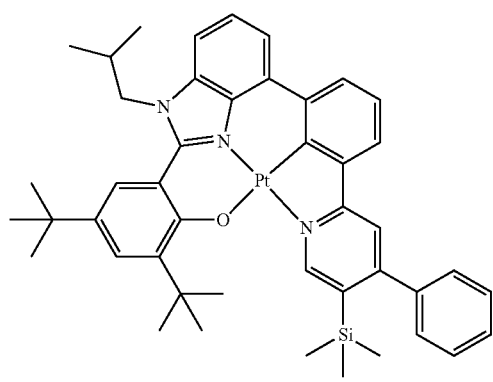
1-14
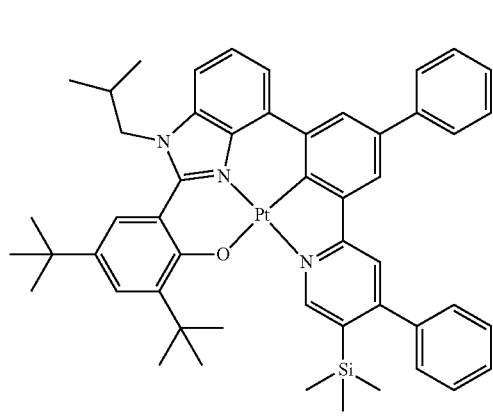
1-15
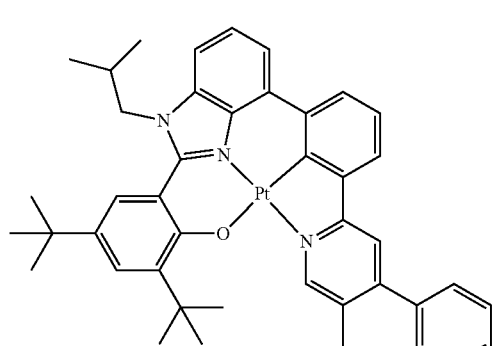
1-16
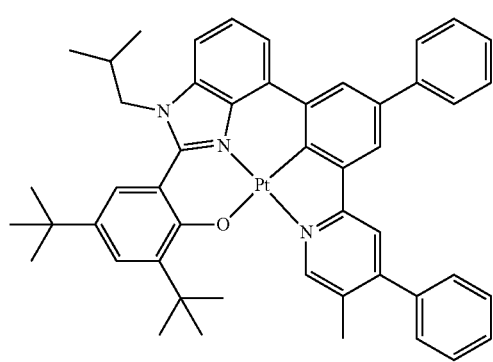
-continued
1-17
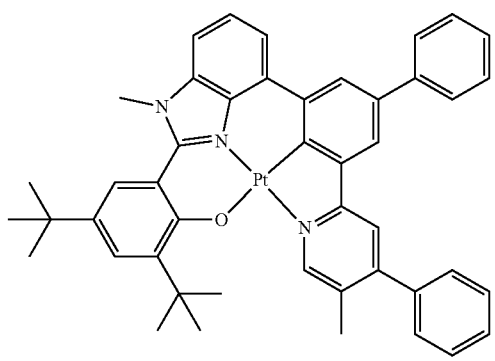
1-18
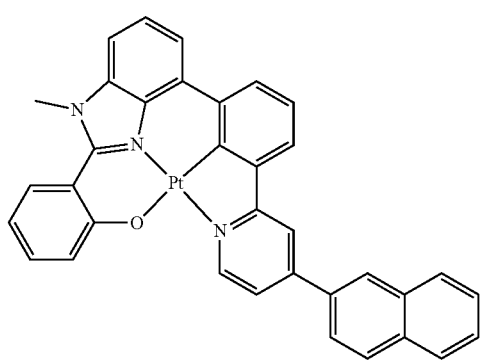
1-19
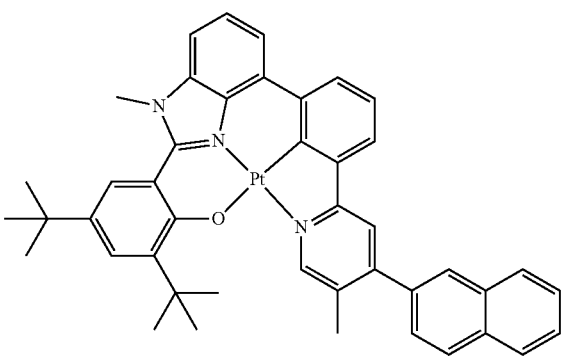
1-20
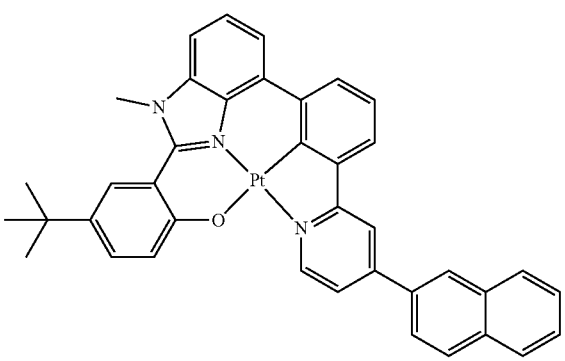

-continued
1-21
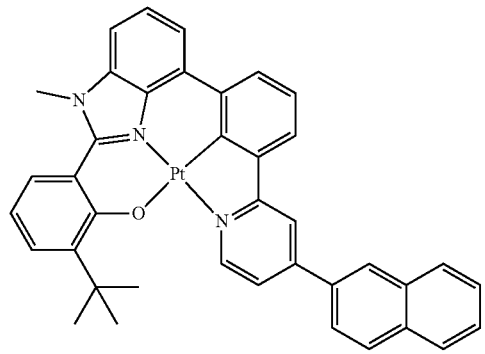
1-22
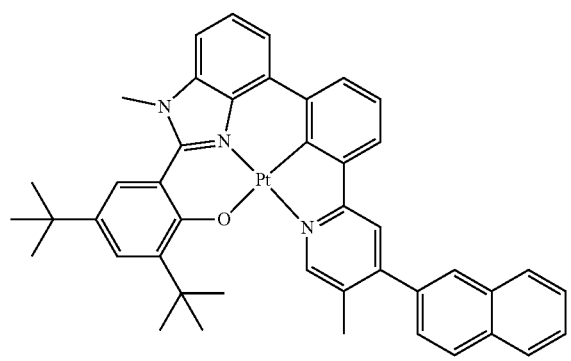
1-23
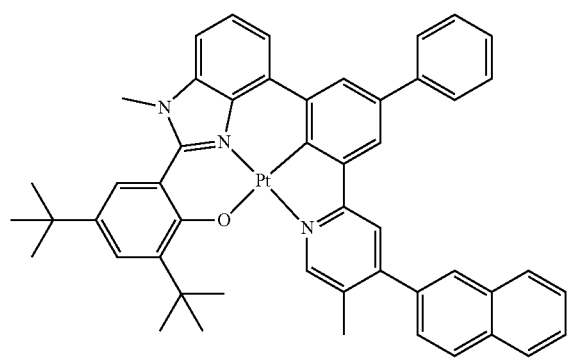
1-24
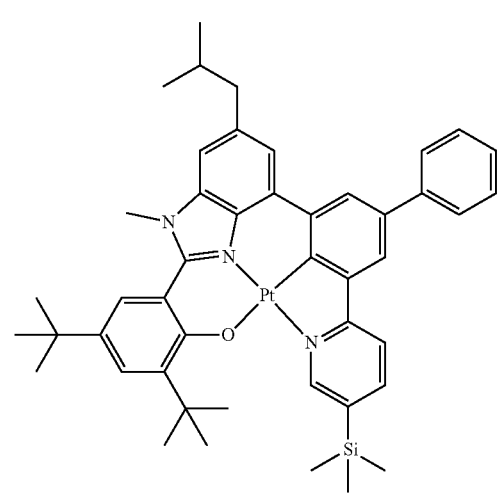
-continued
1-25
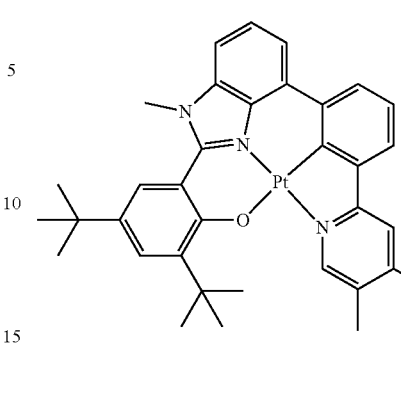
1-26
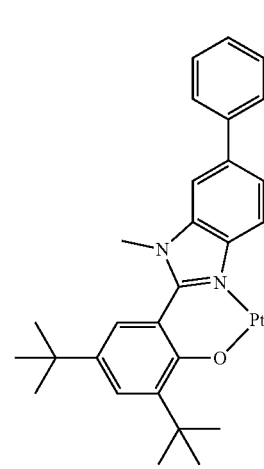
1-27
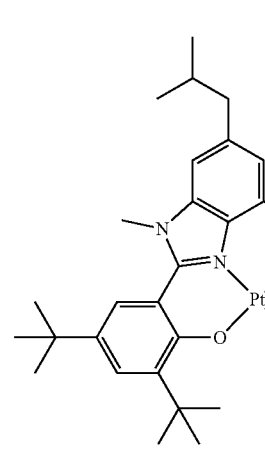

-continued
1-28
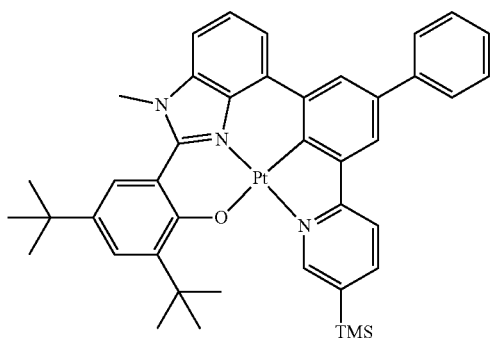
1-29
1-32
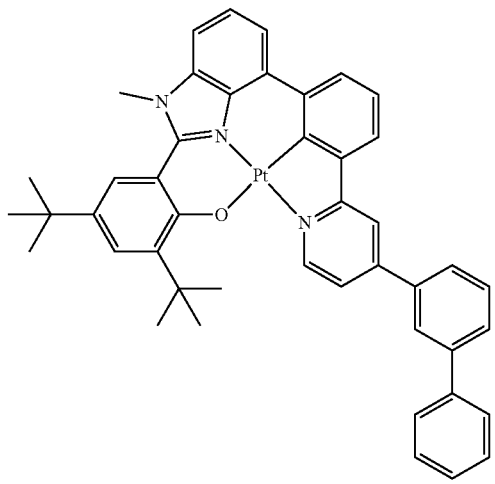
1-30
1-33
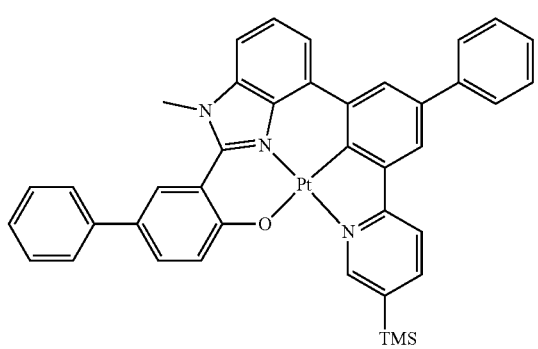
1-31
1-34
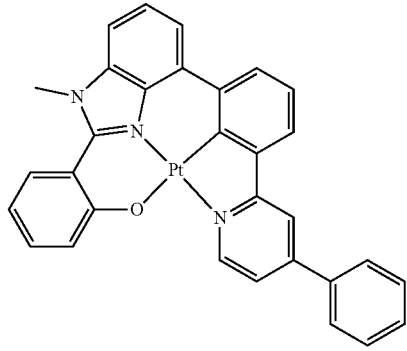
1-35
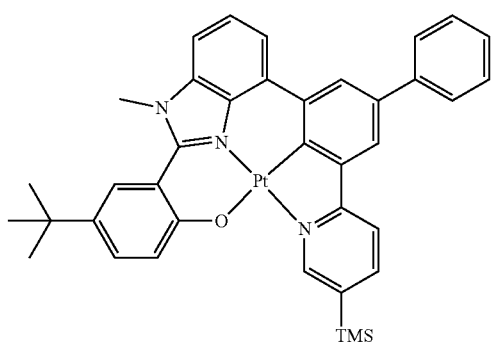

1-36
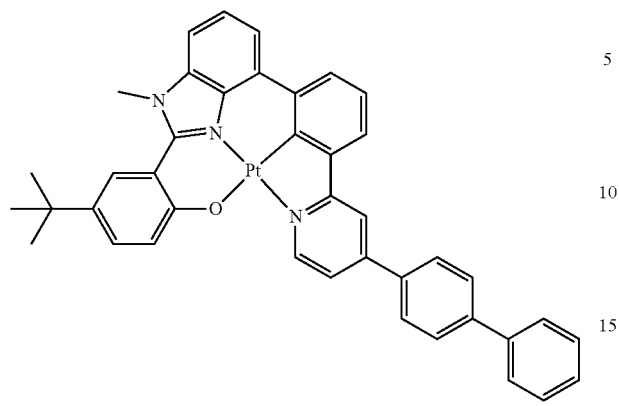
1-40
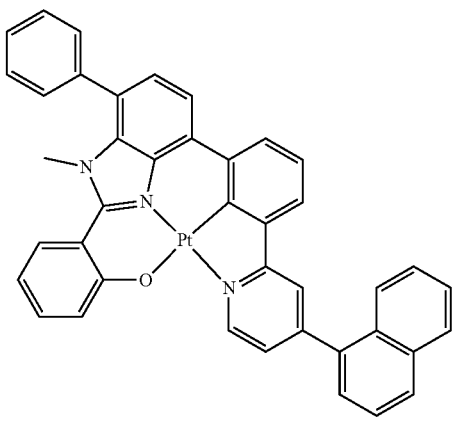
1-37
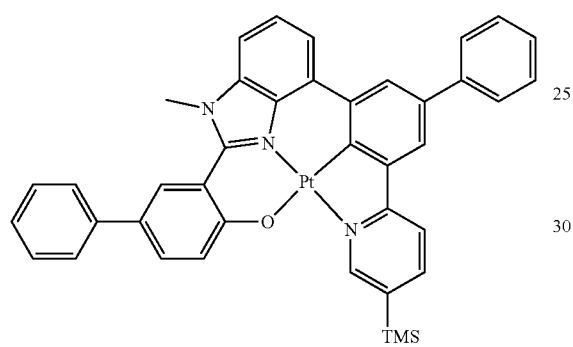
1-41
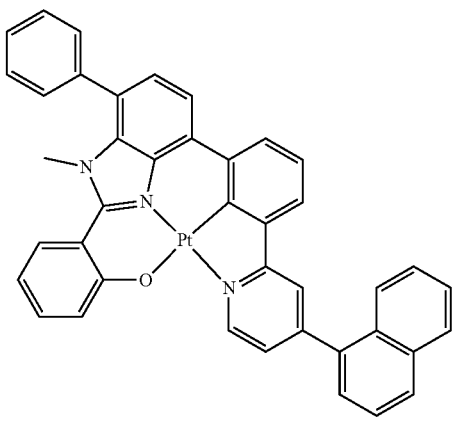
1-38
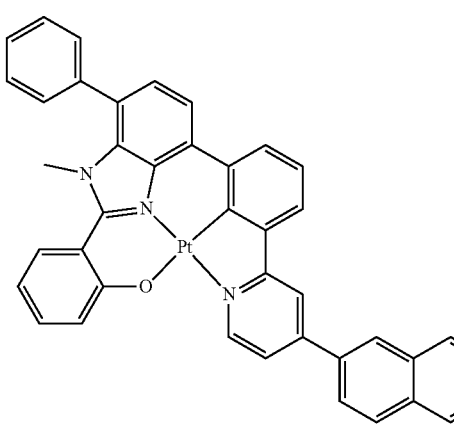
1-39
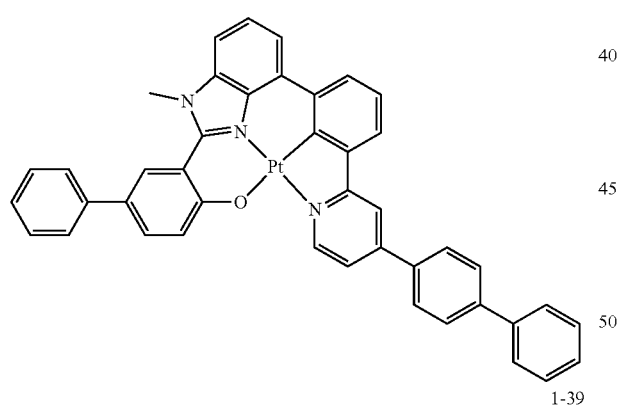
1-42
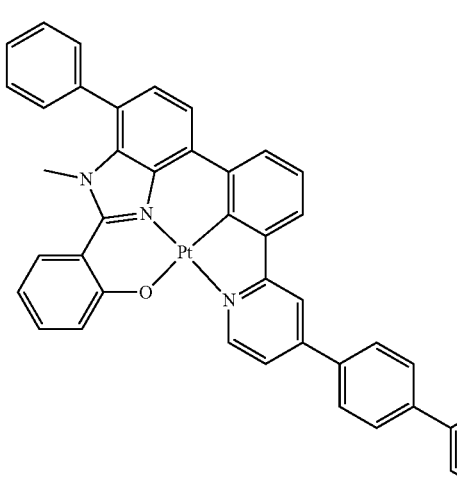

-continued
1-43
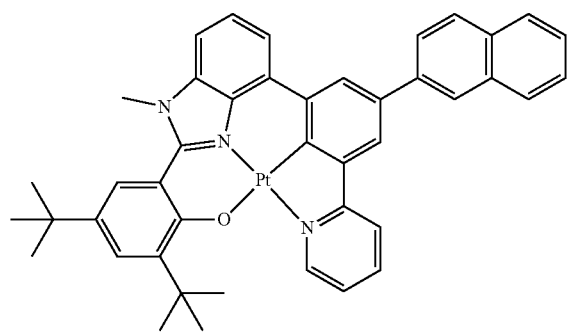
1-44
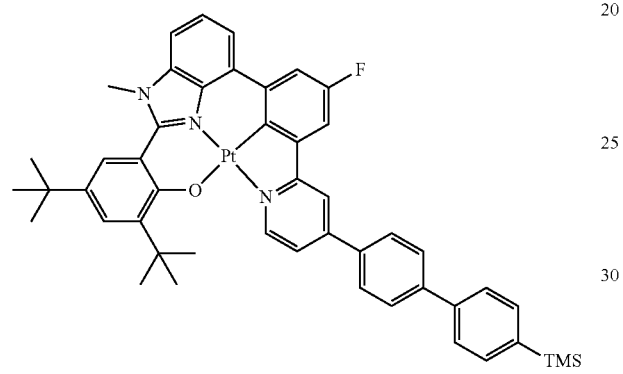
1-45
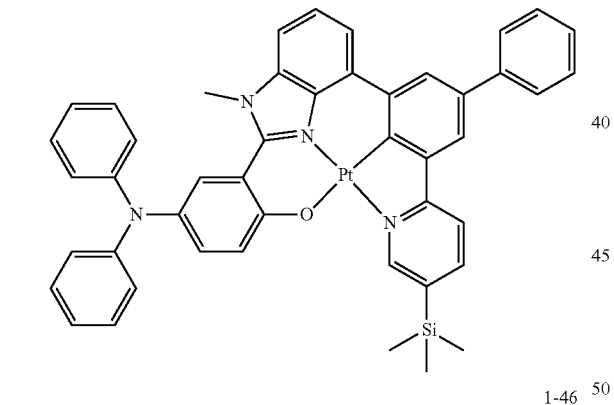
1-46
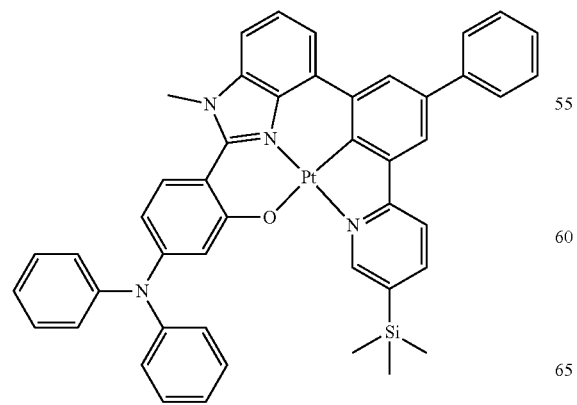
-continued
1-47
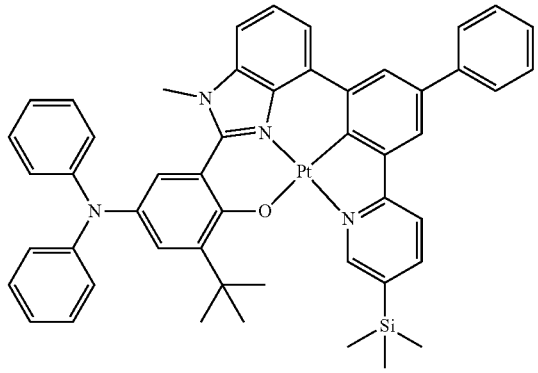
1-48
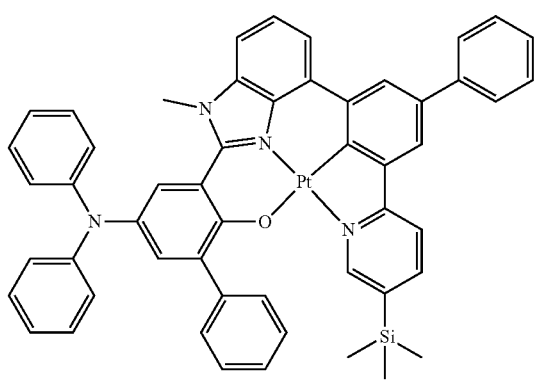
1-49
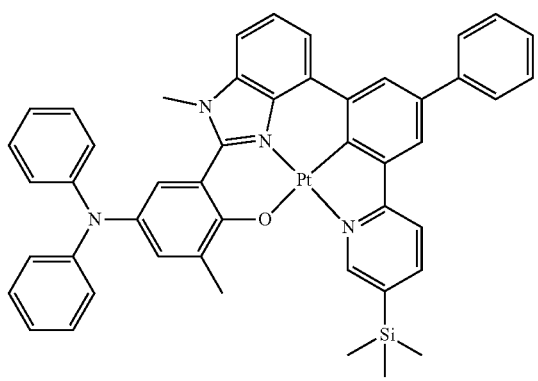
1-50
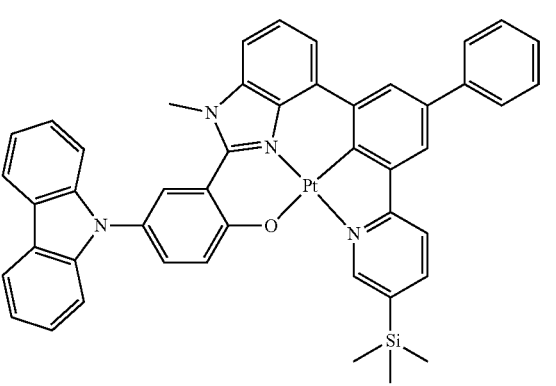

1-51
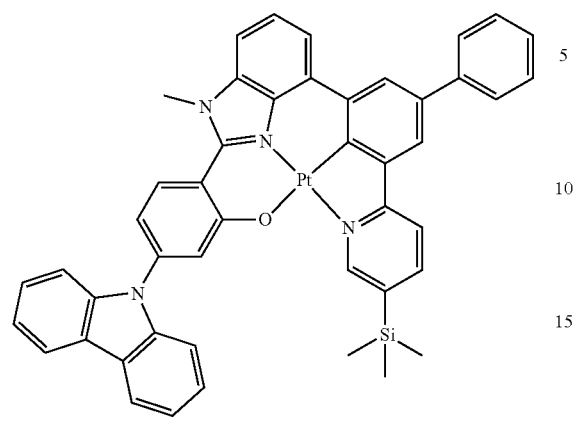
1-52
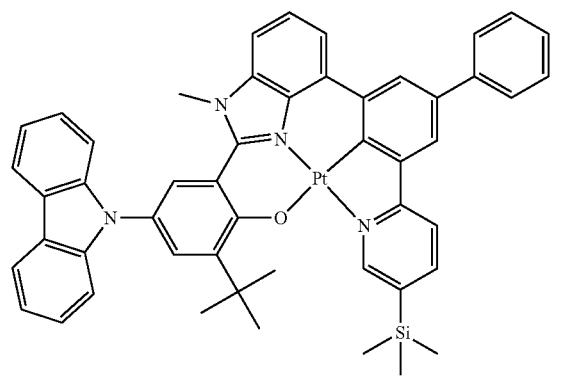
1-53
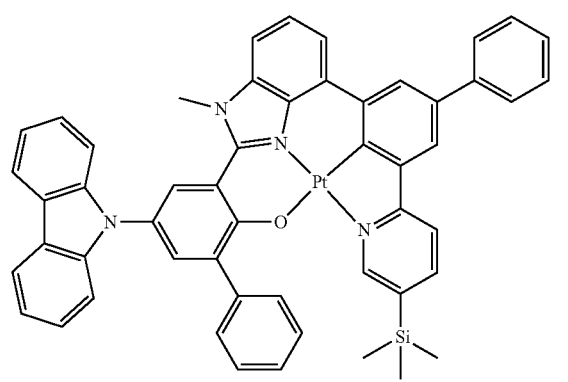
1-54
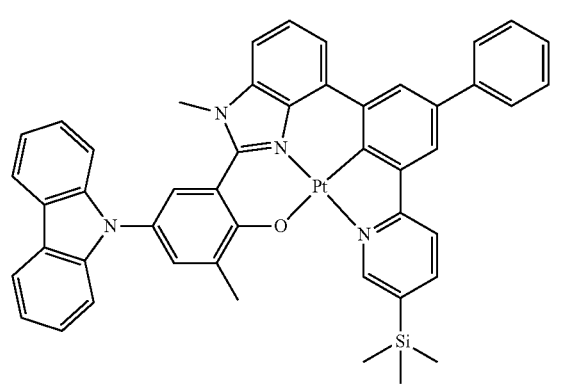
1-55
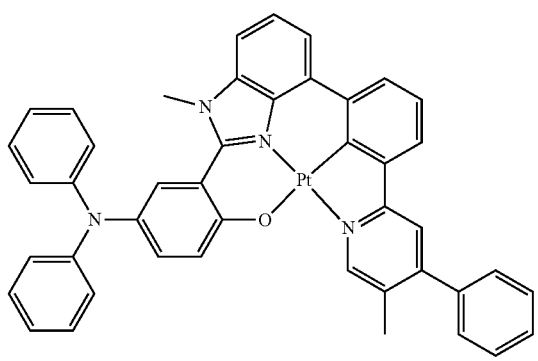
1-56
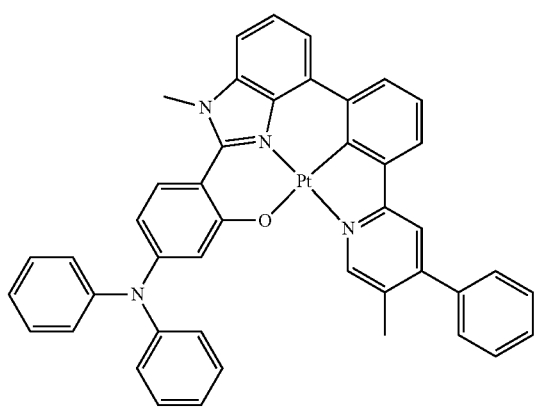
1-57
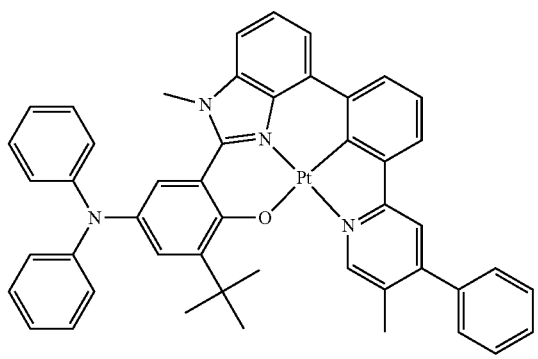
1-58
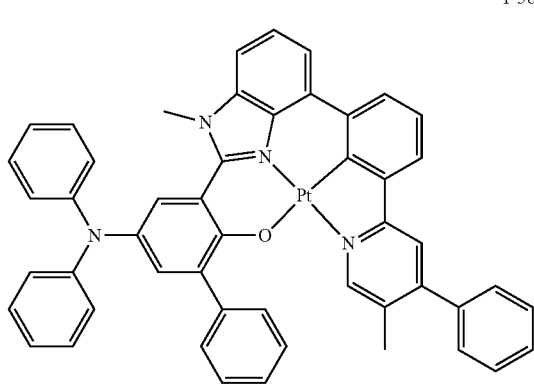

1-59
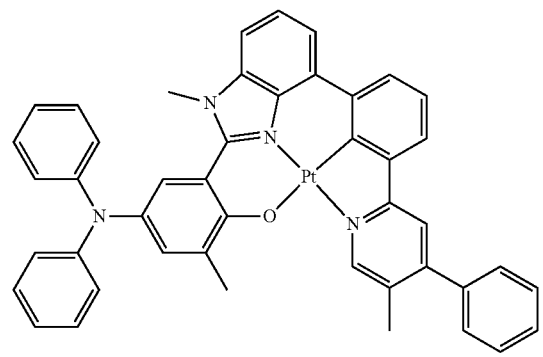
1-63
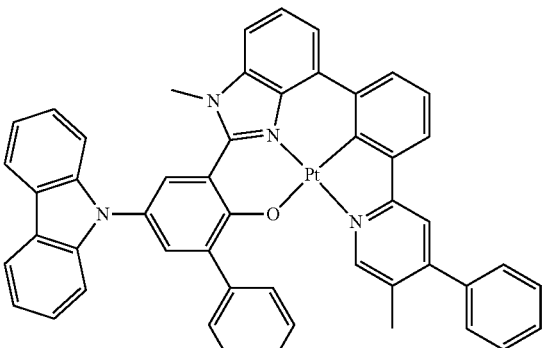
1-60
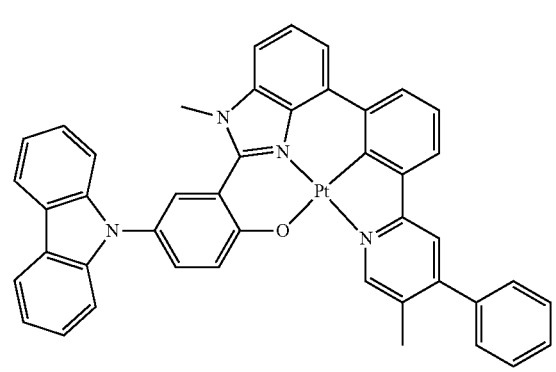
1-64
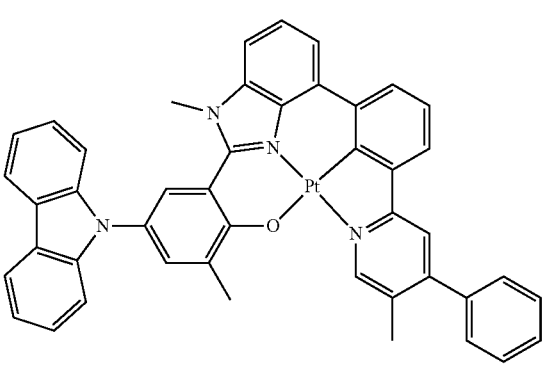
1-61
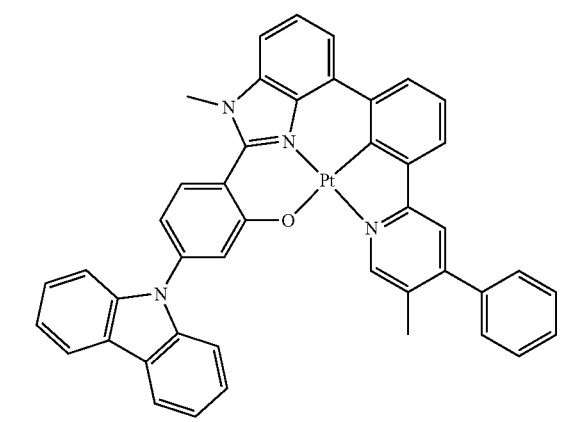
1-65
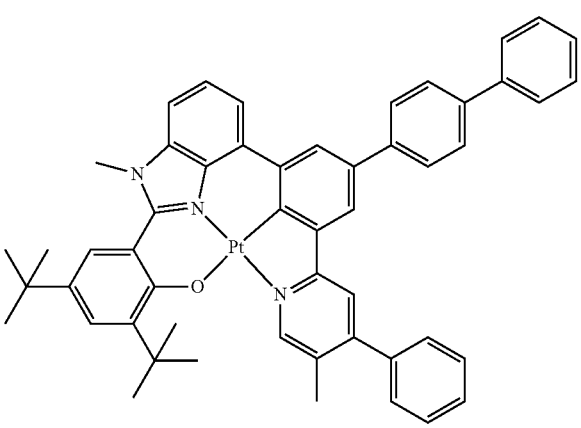
1-62
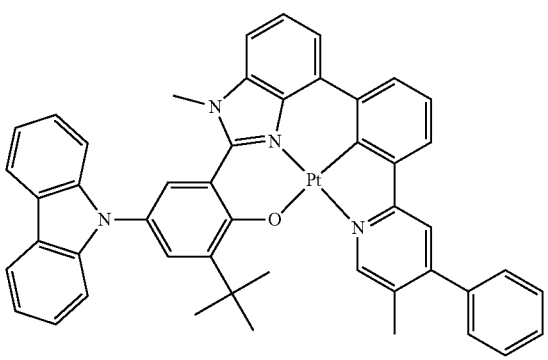
1-66
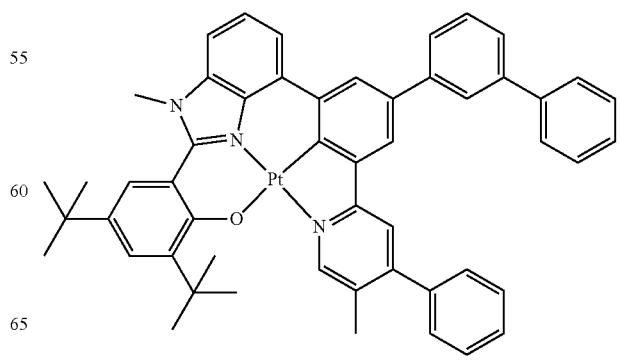

-continued
1-67
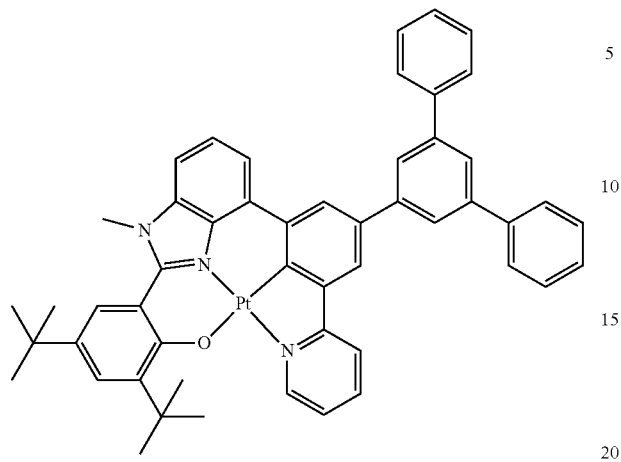
1-70
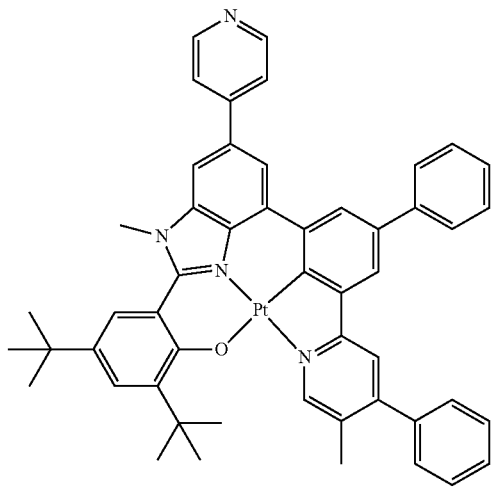
1-68
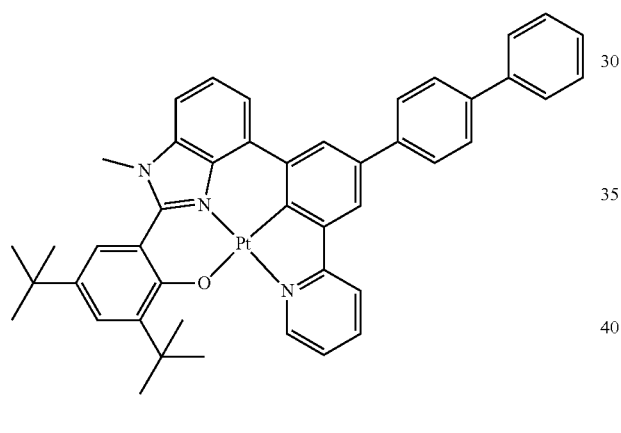
1-71
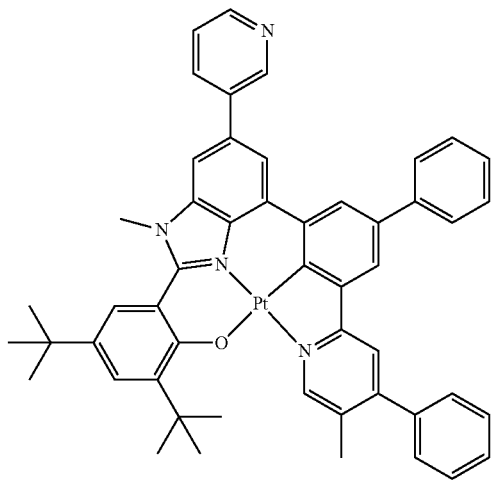
1-69
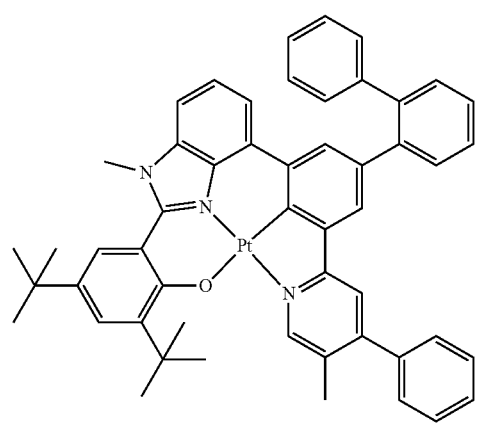
1-72
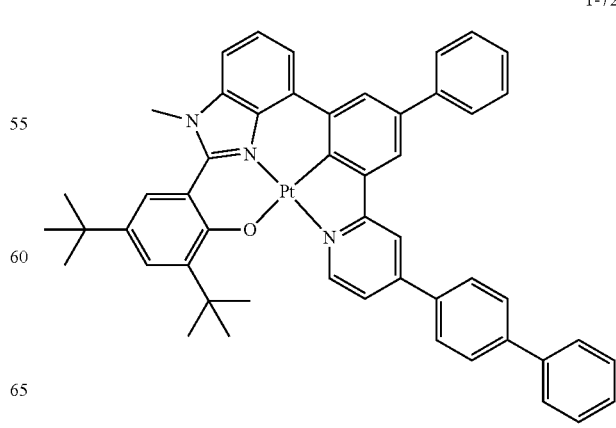

1-73
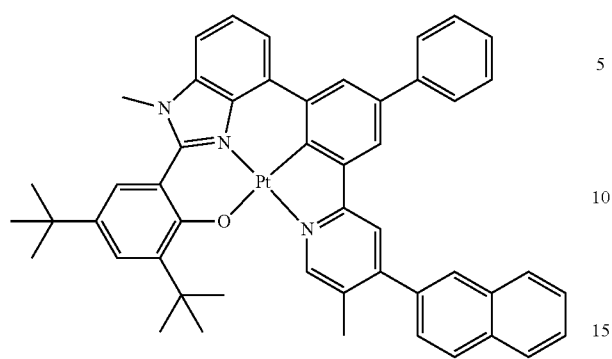
1-74
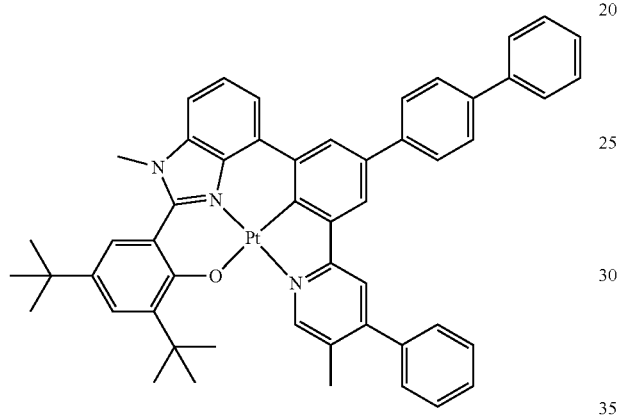
1-75
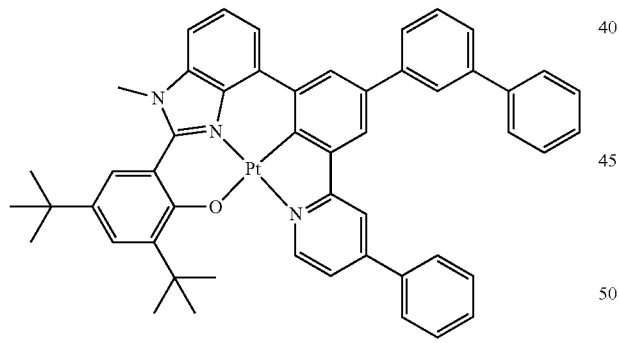
1-76
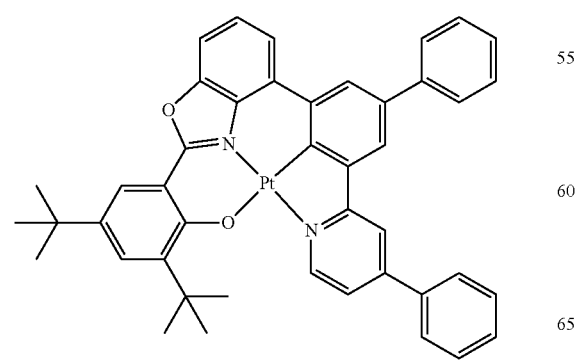
1-77
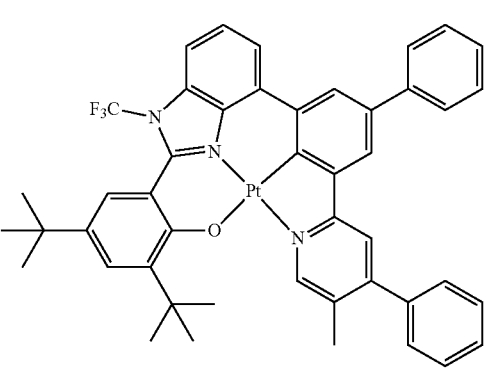
1-78
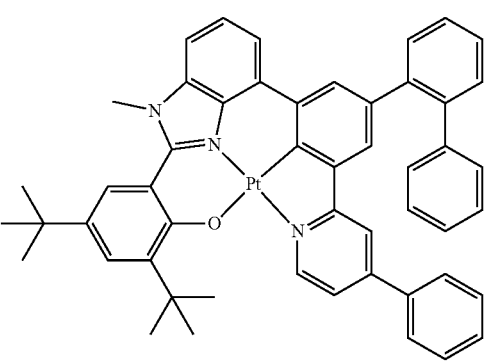
1-79
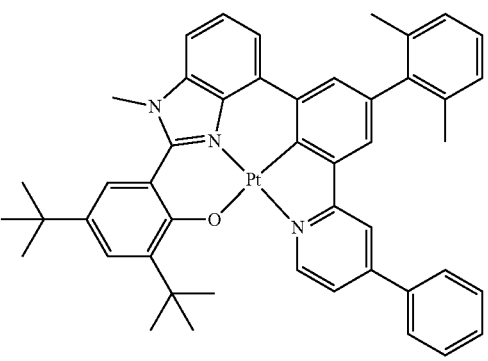
1-80
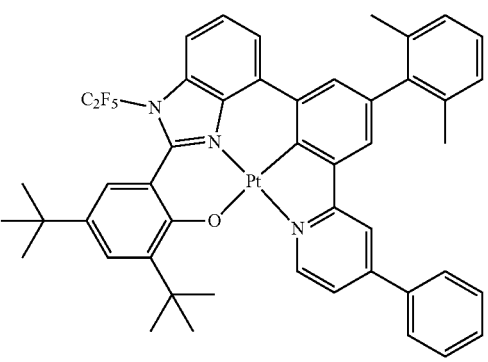

-continued
1-81
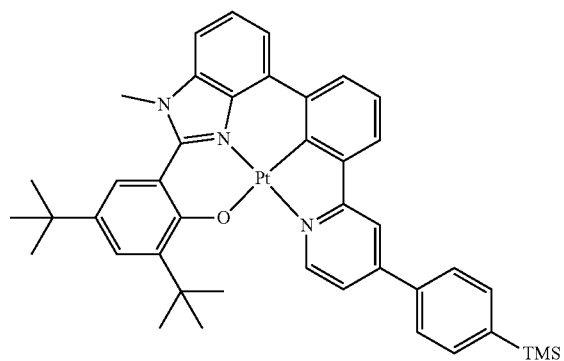
1-82
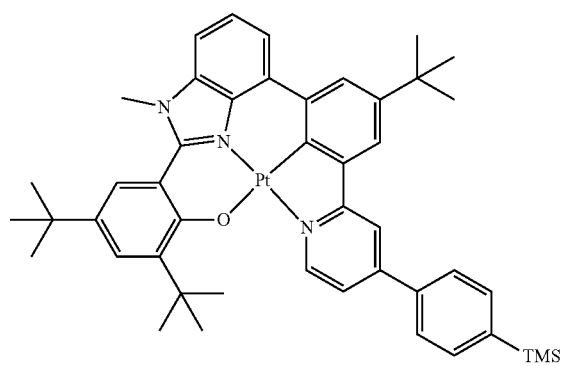
1-83
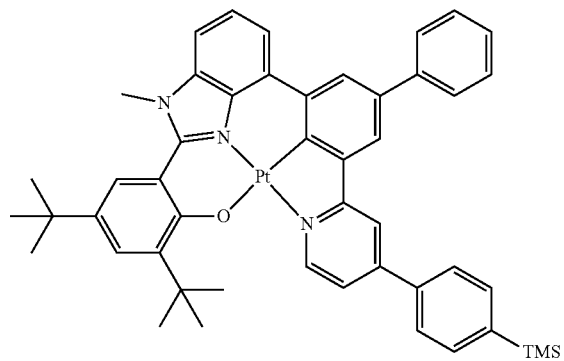
1-84
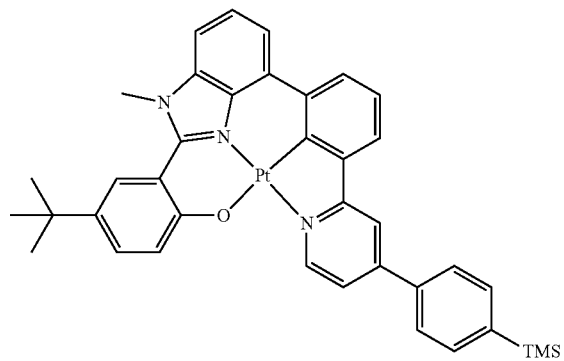
1-85
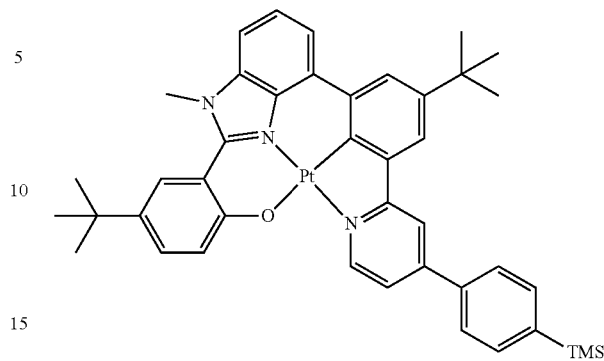
1-86
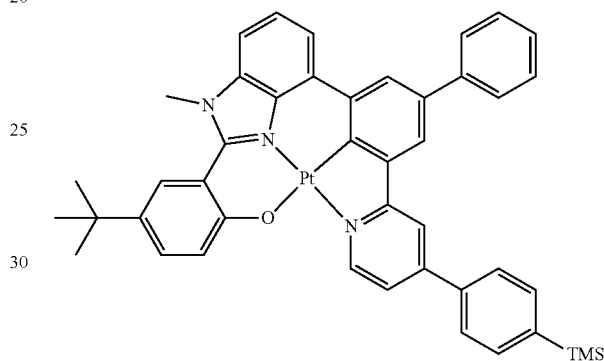
1-87
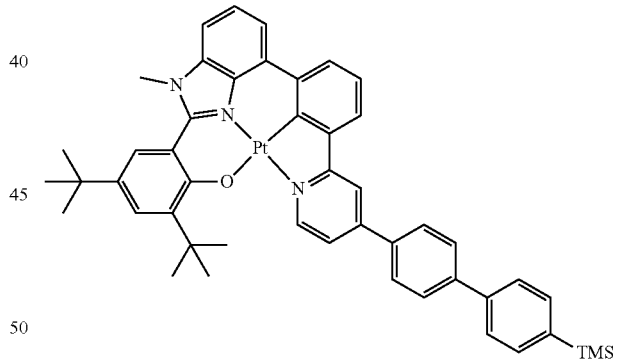
1-88
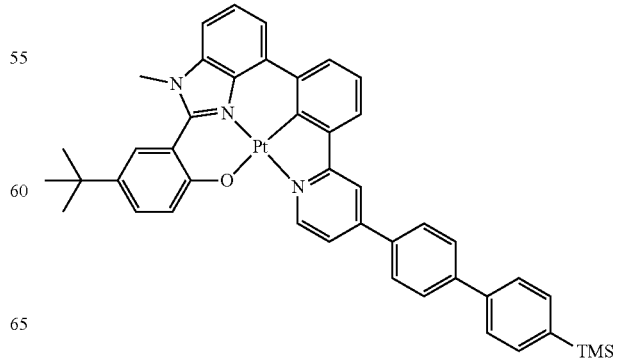

2-1 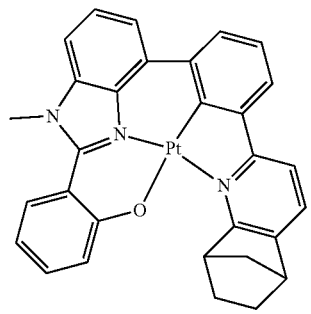
2-2 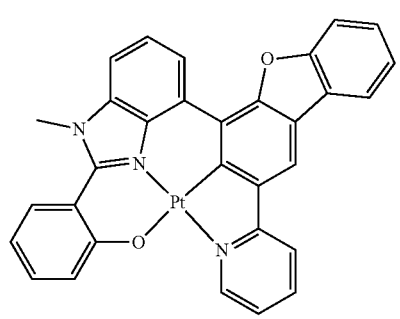
2-3 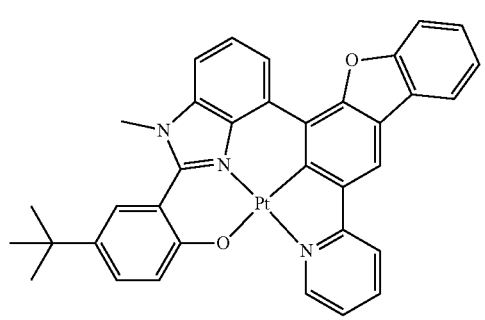
2-4 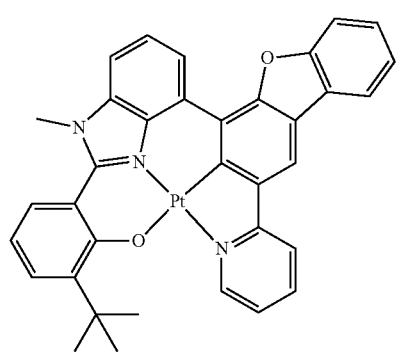
2-5 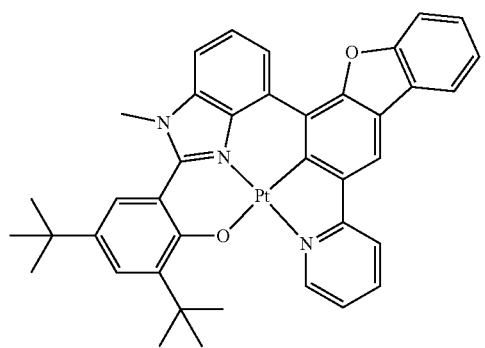
2-6 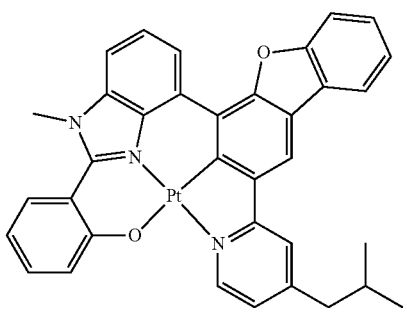
2-7 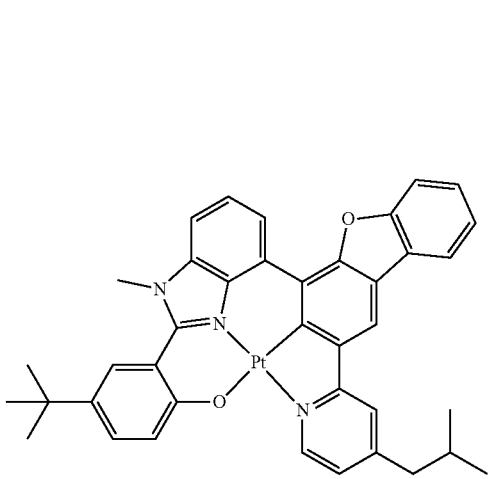
2-8 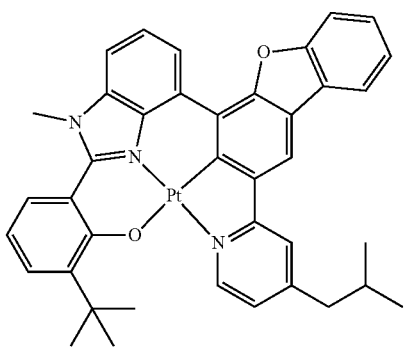
2-9 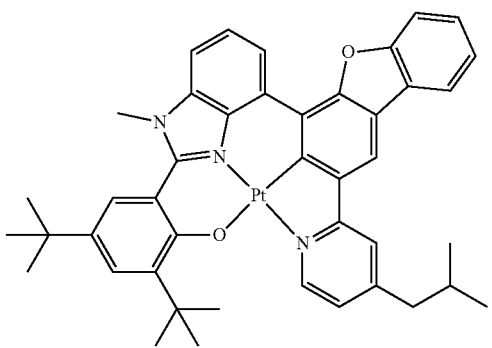

-continued
2-10
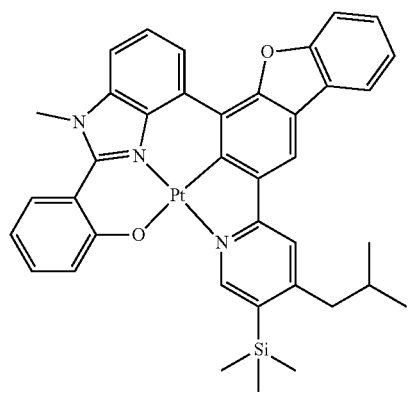
2-14
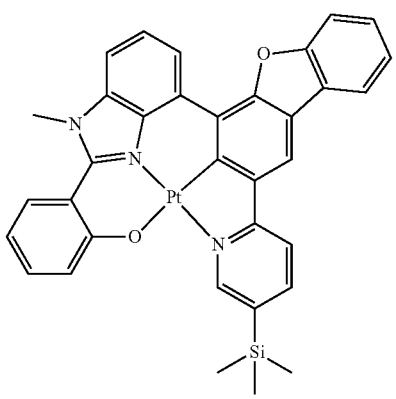
2-11
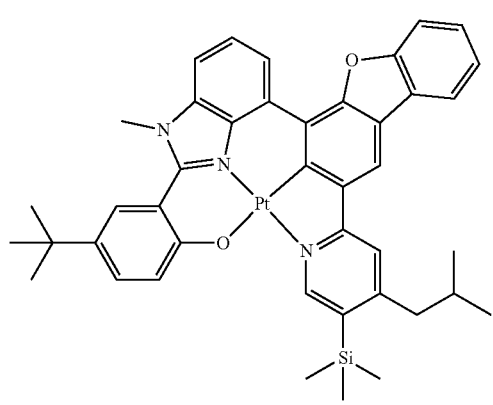
2-15
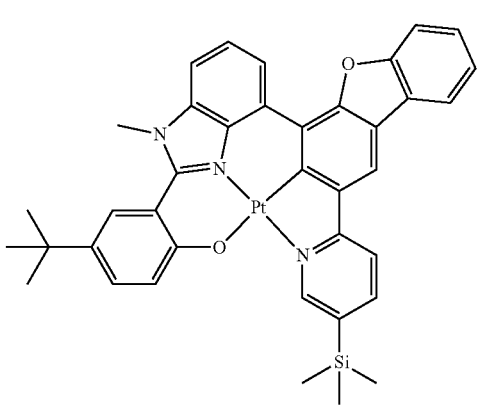
2-12
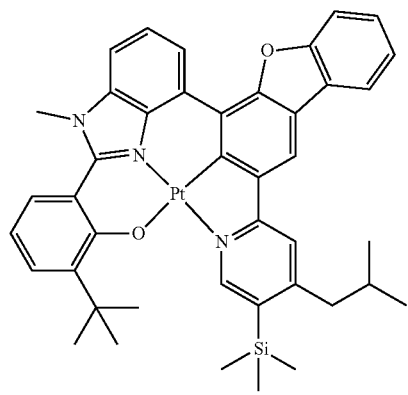
2-16
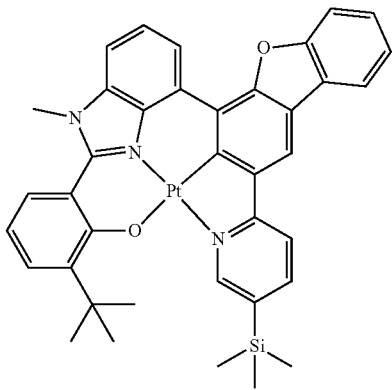
2-13
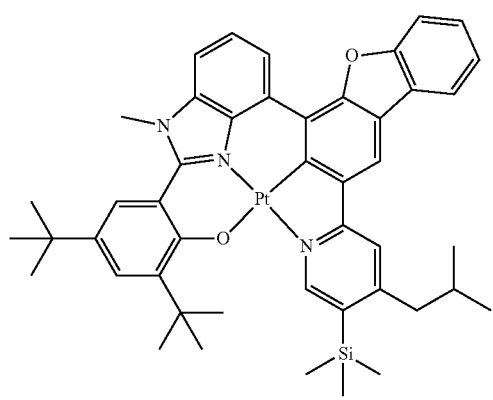
2-17
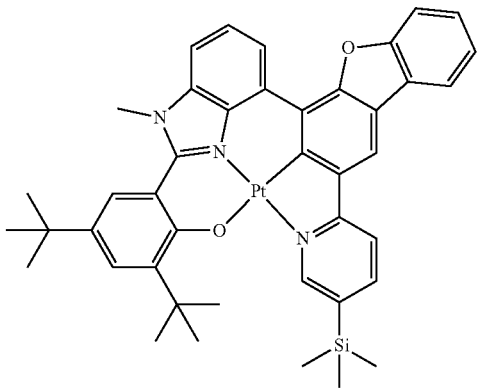

2-18
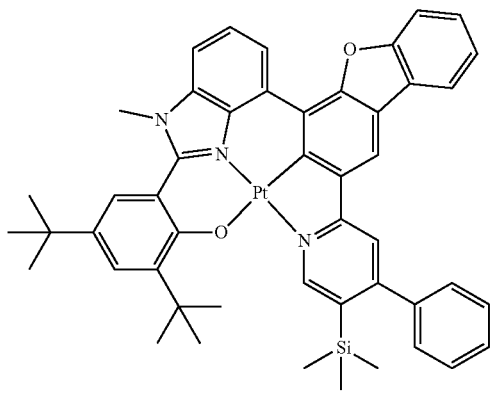
2-19
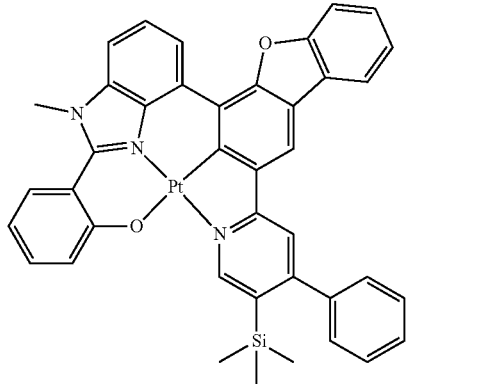
2-20
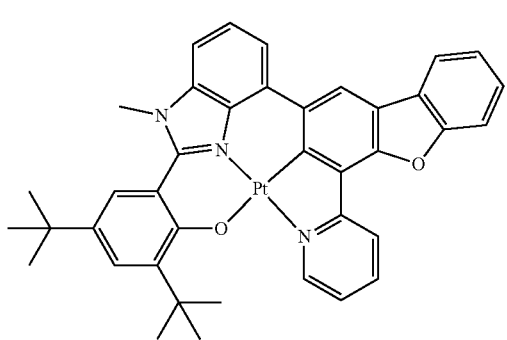
2-21
2-22
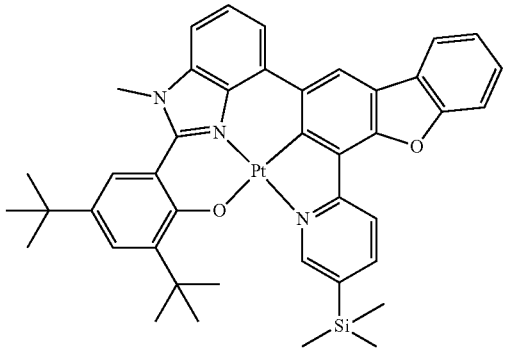
2-23
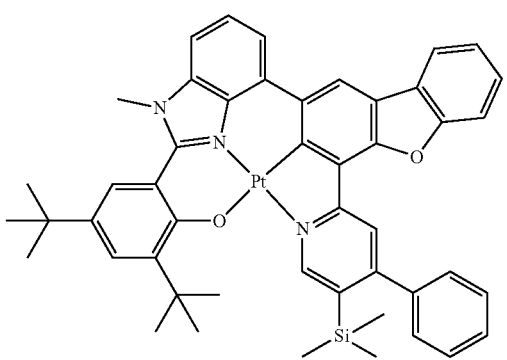
2-24
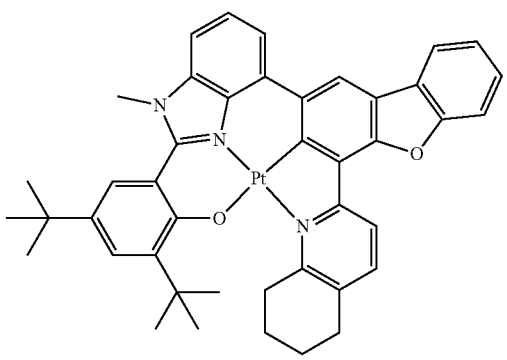
2-25
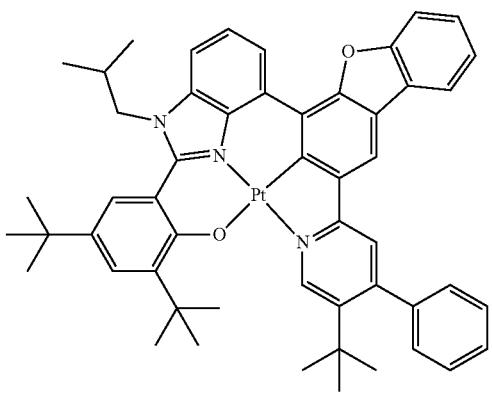

2-26
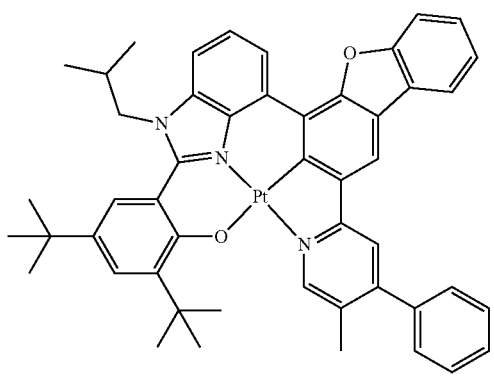
2-27
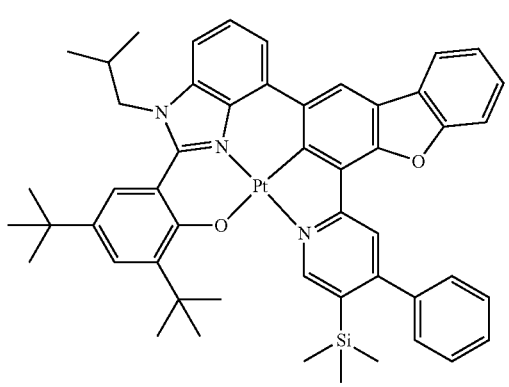
2-28
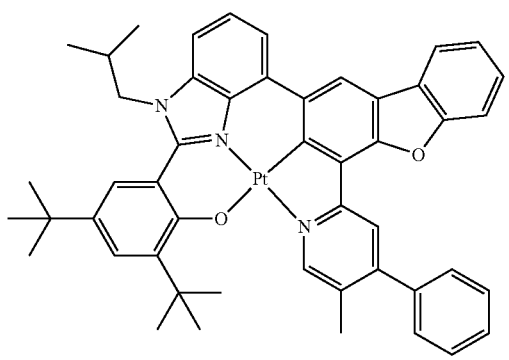
2-29
2-30
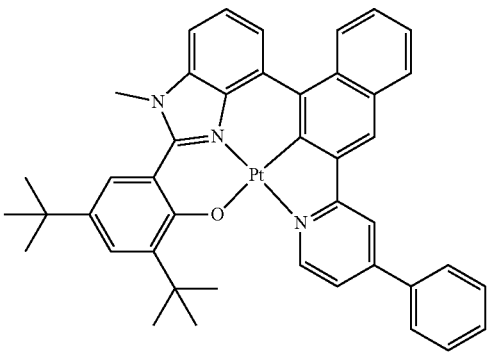
2-31
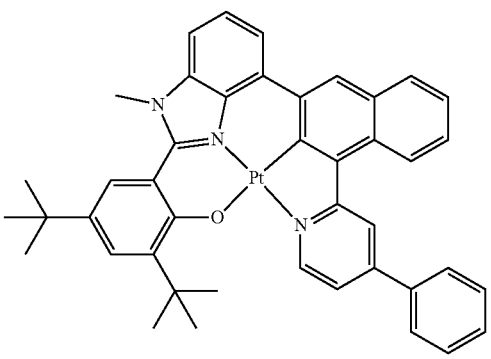
2-32
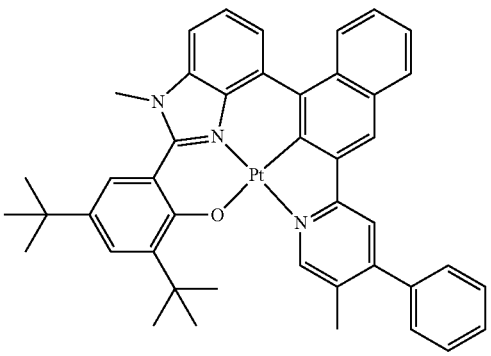
2-33
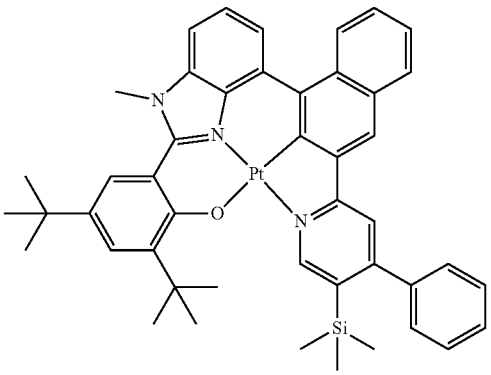

-continued
2-34
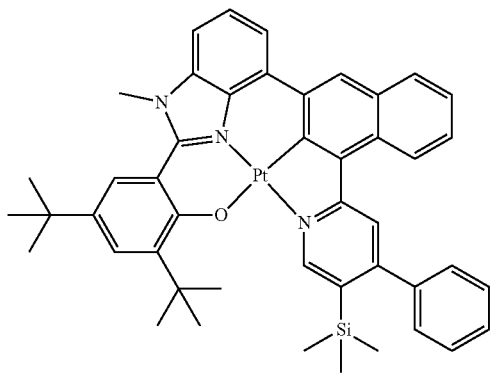
2-35
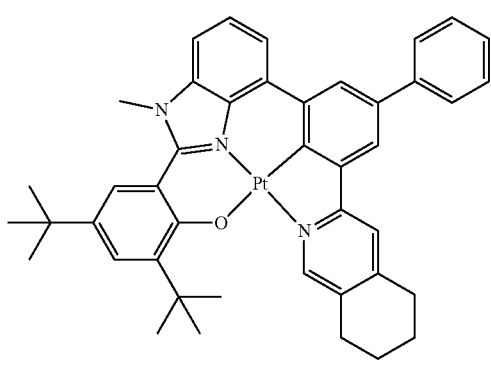
2-36
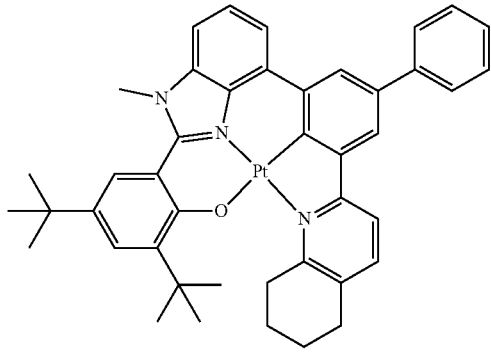
2-37
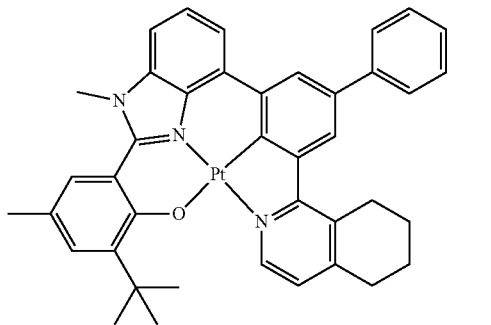
-continued
2-38
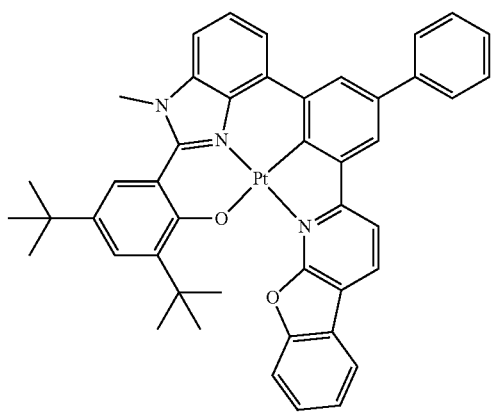
2-39
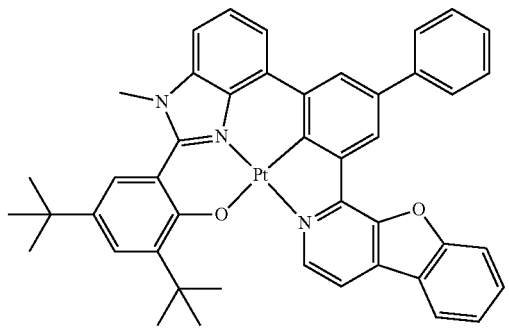
2-40
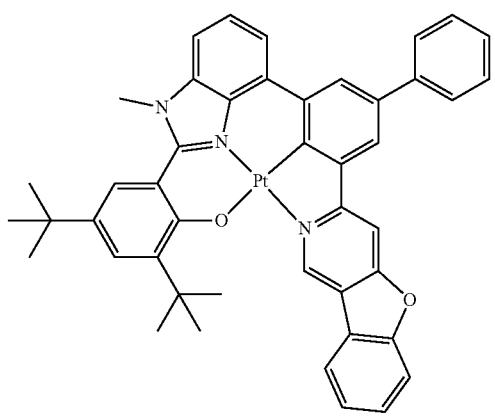
2-41
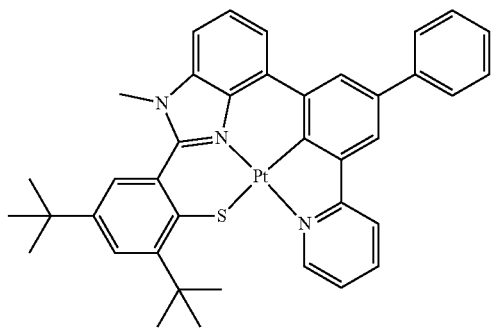

2-42
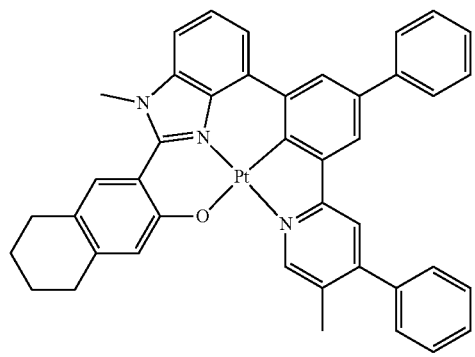
2-43
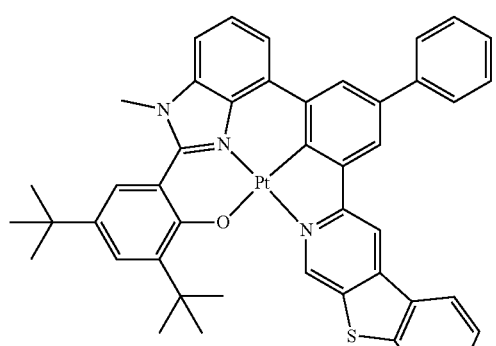
2-44
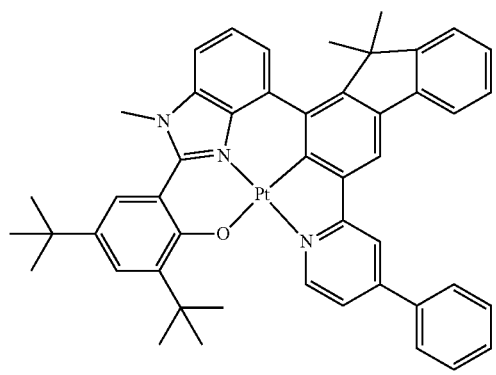
2-45
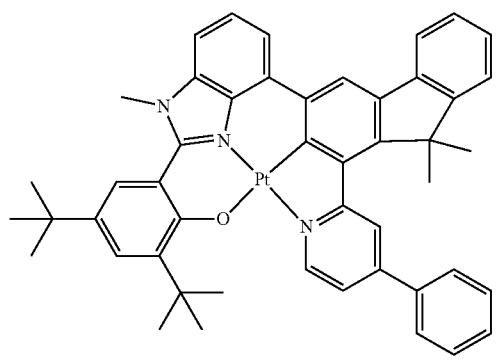
2-46
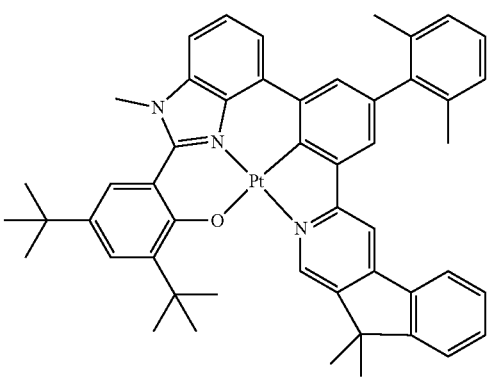
2-47
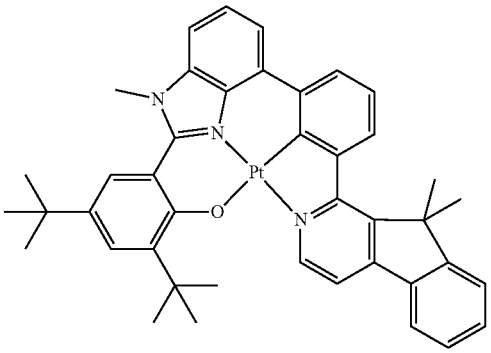
3-1
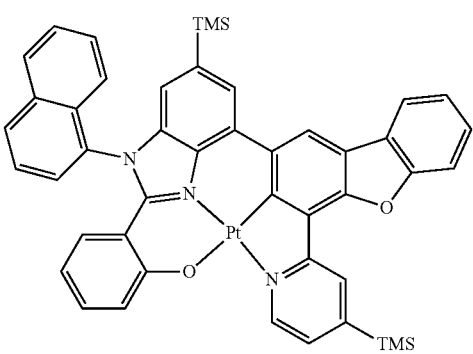
3-2
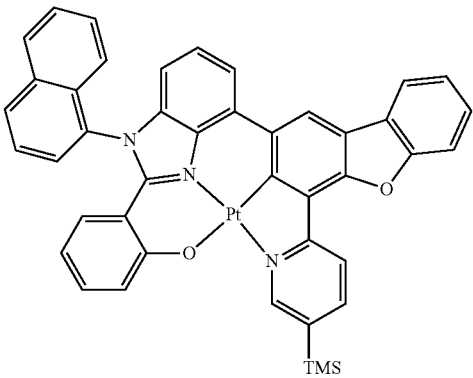

-continued
3-3
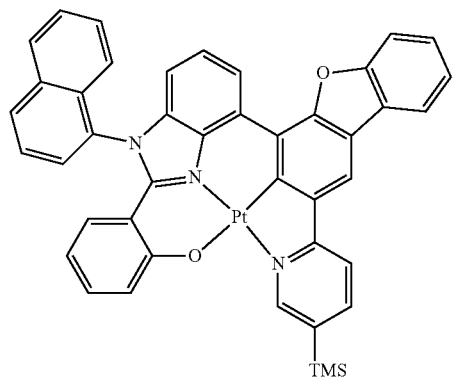
3-4
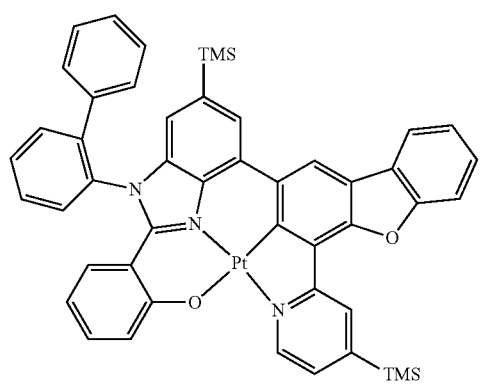
3-5
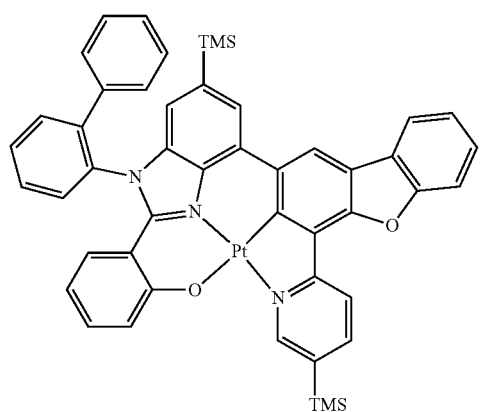
3-6
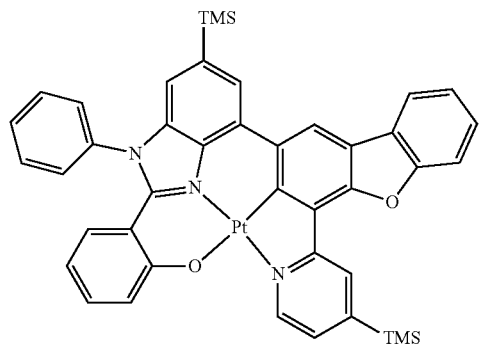
-continued
3-7
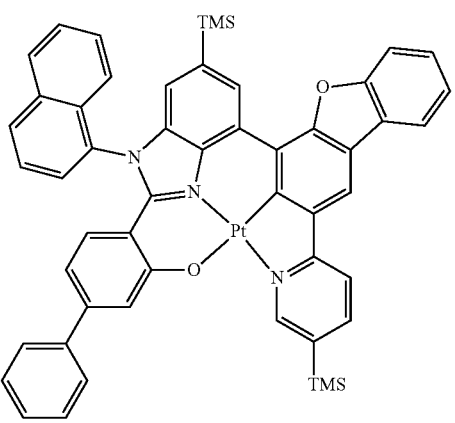
3-8
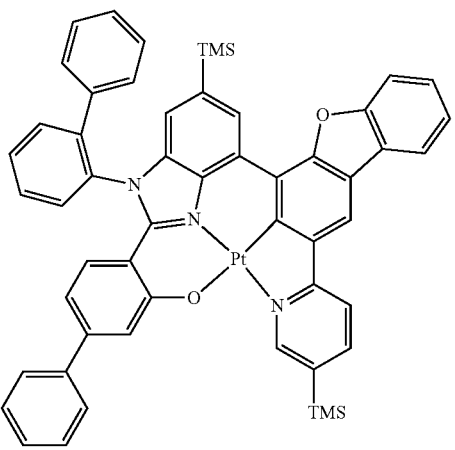
3-9
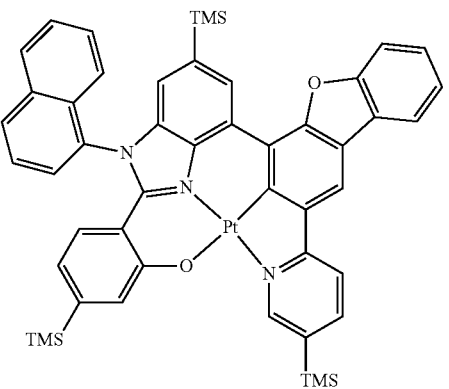

-continued
3-10
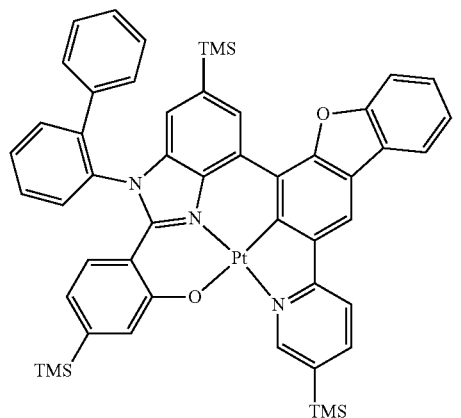
3-11
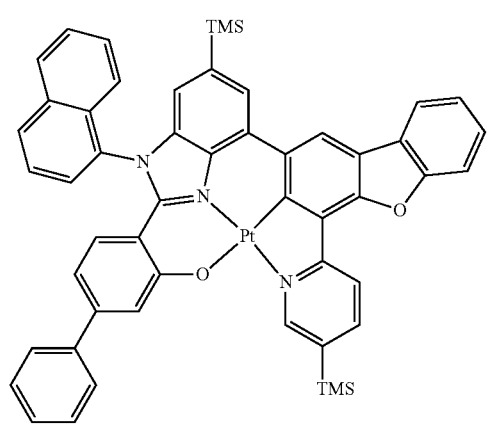
3-12
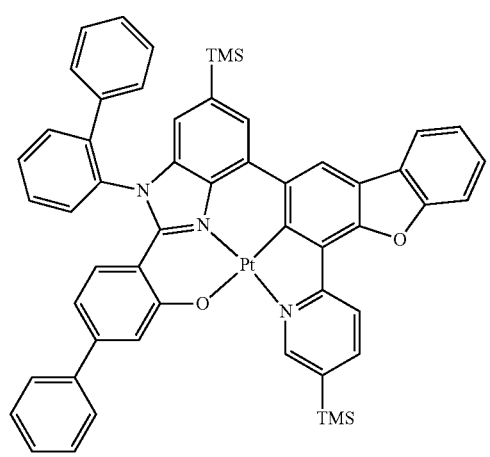
-continued
3-13
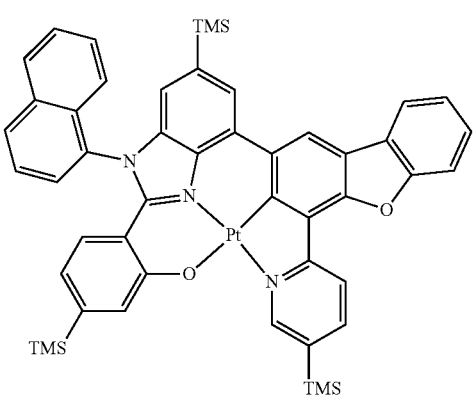
3-14
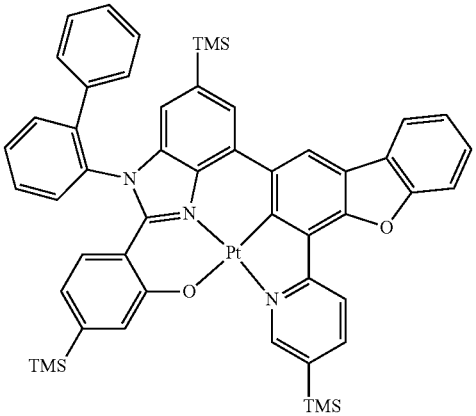
3-15
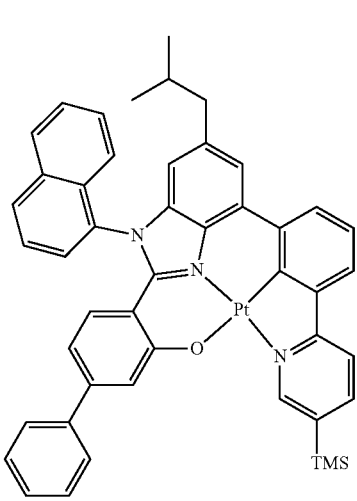

-continued
3-16
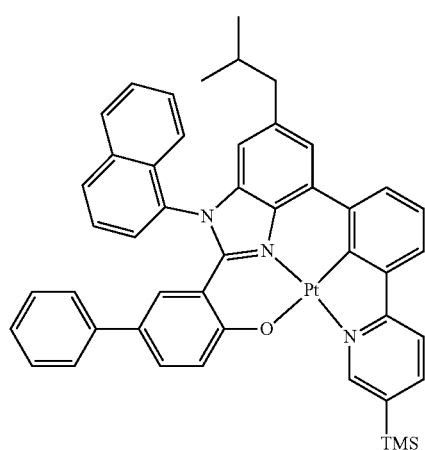
3-17
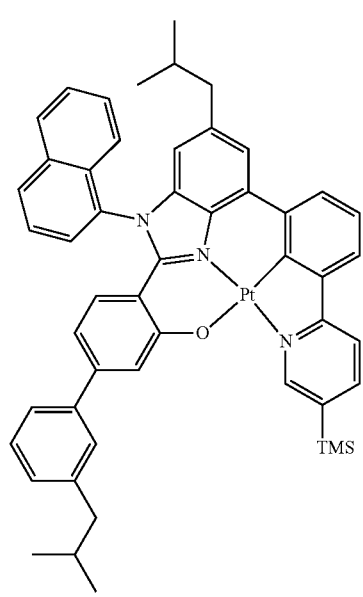
3-18
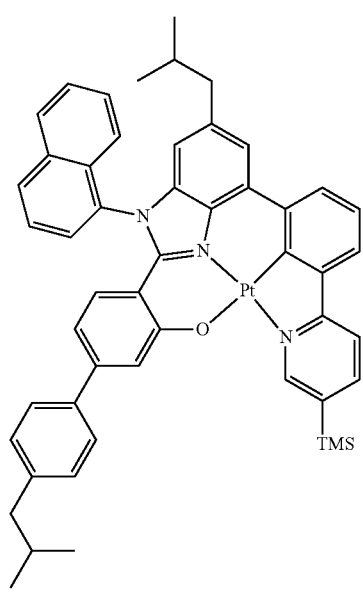
-continued
3-19
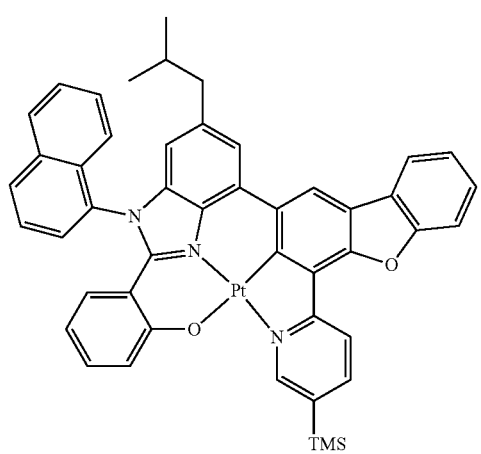
3-20
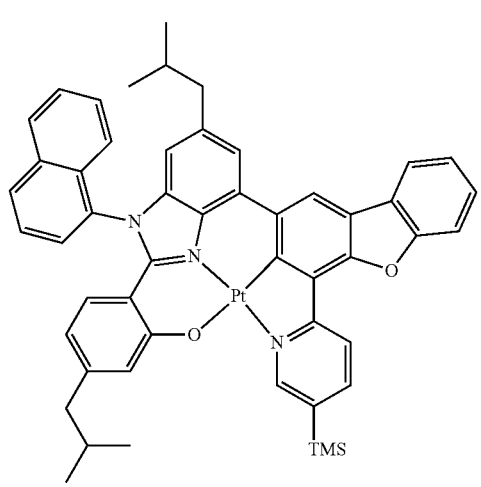
3-21
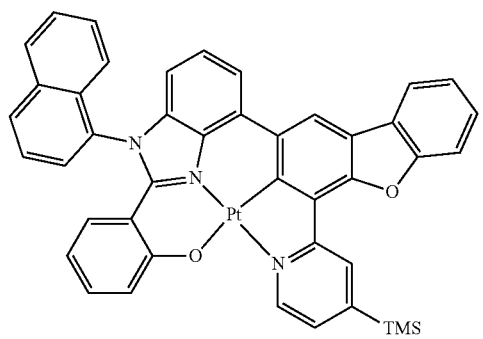

-continued
3-22
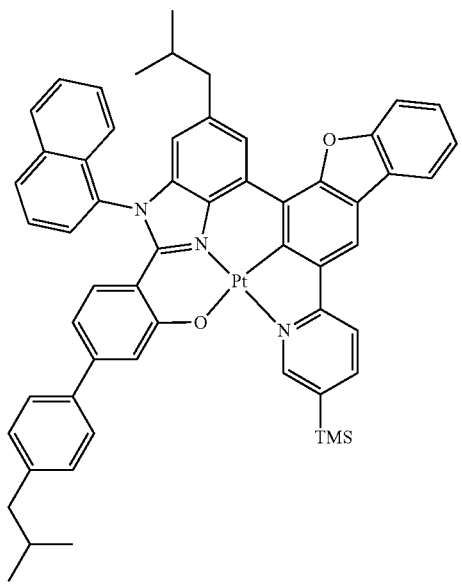
3-23
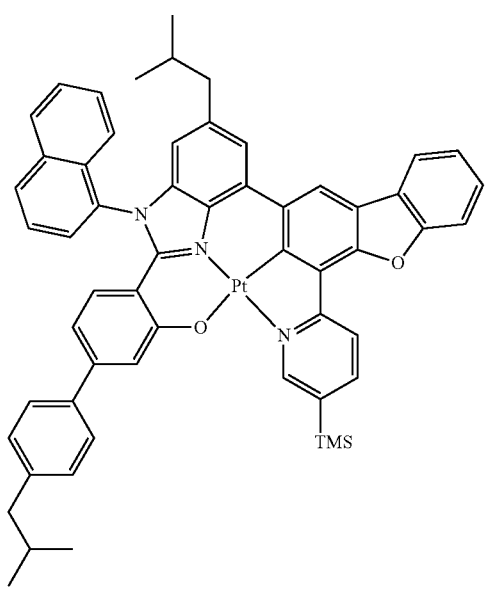
3-24
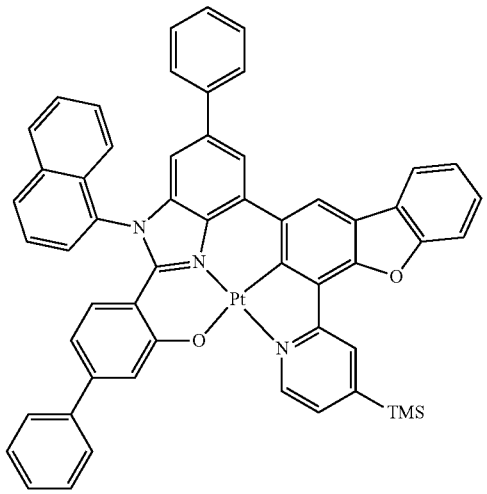
3-25
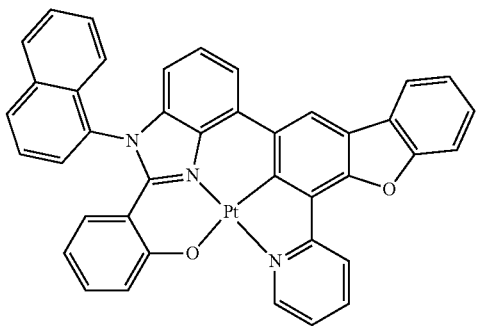
3-26
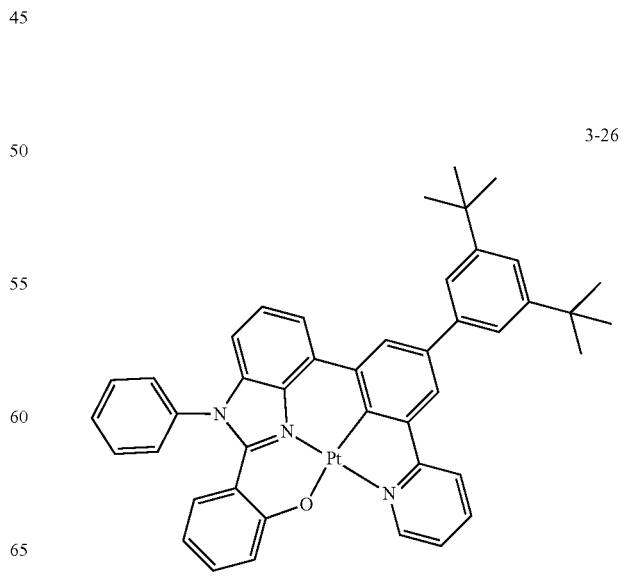

-continued
3-27
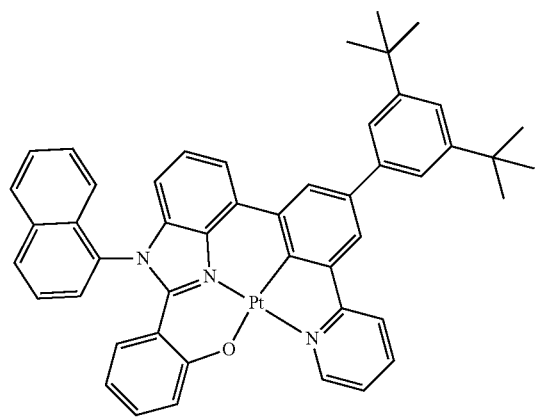
3-28
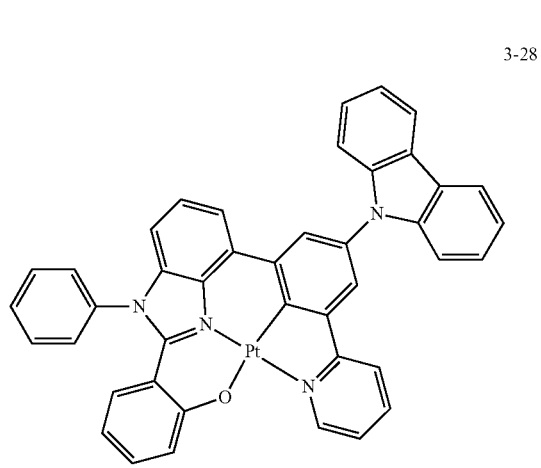
3-29
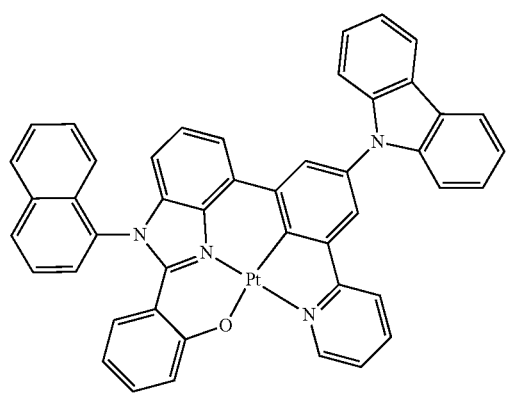
-continued
3-30
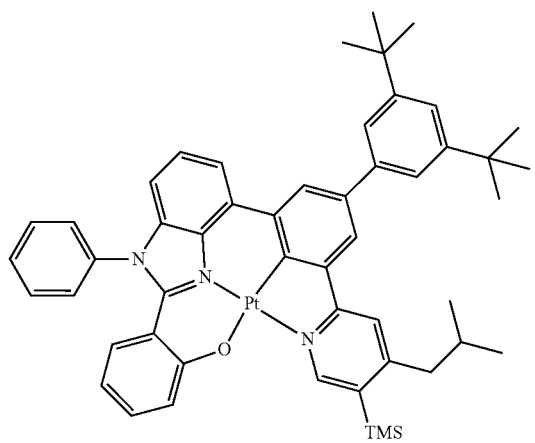
3-31
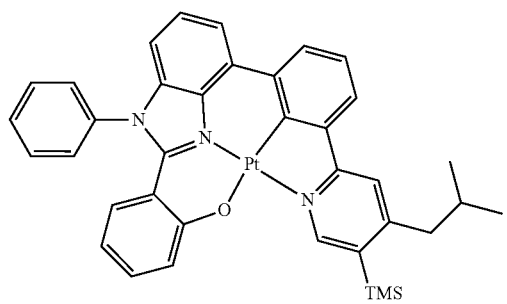
3-32
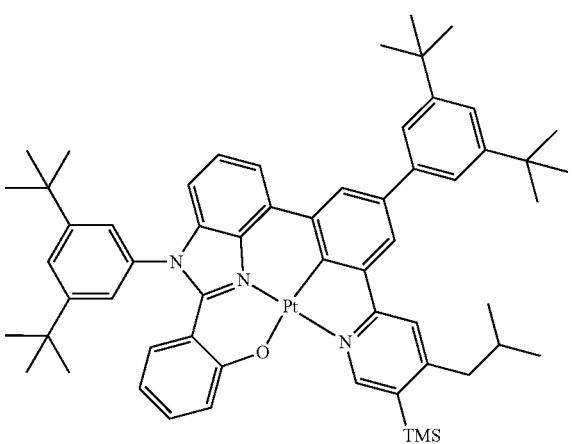
3-33
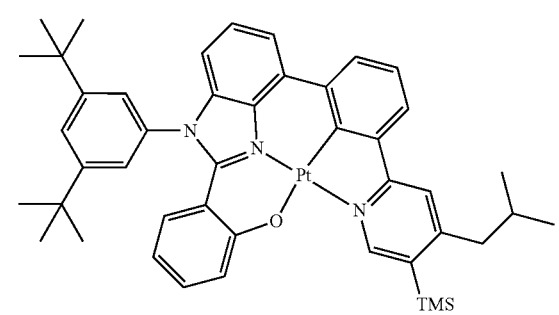

3-34
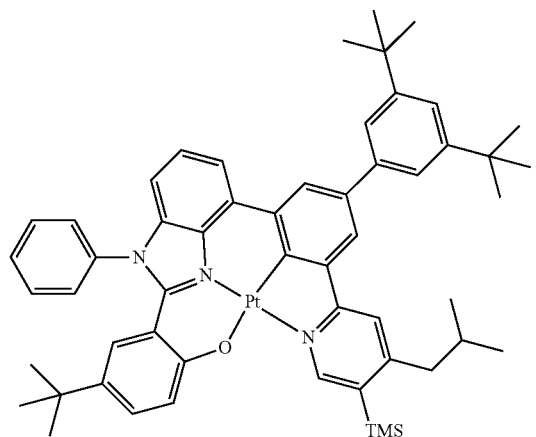
3-35
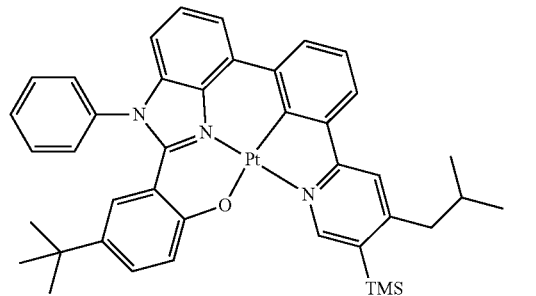
3-36
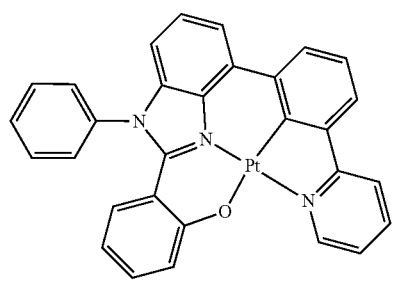
3-37
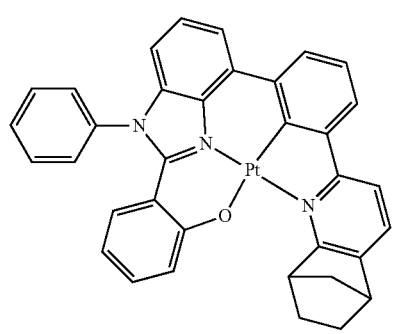
3-38
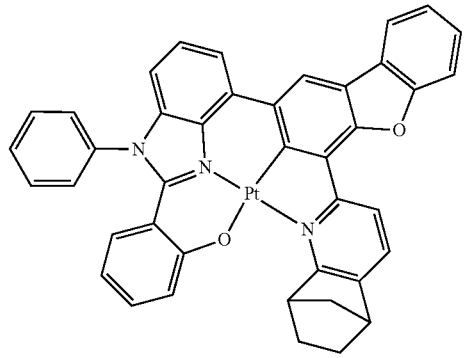
3-39
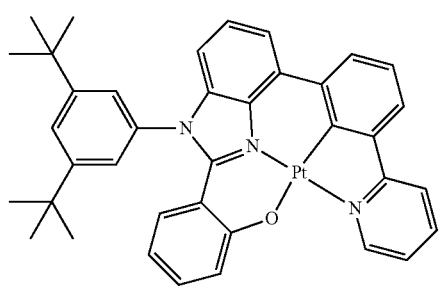
3-40
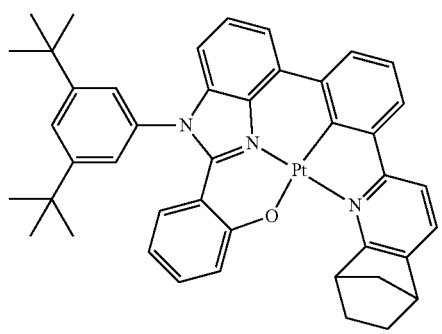
3-41
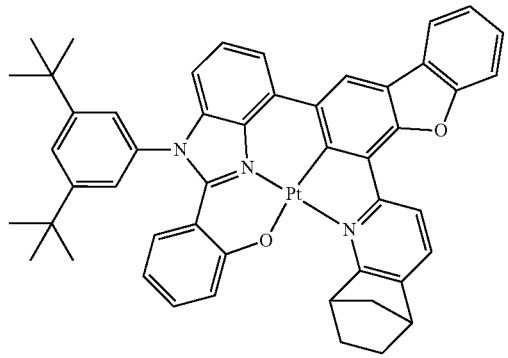

-continued
3-42
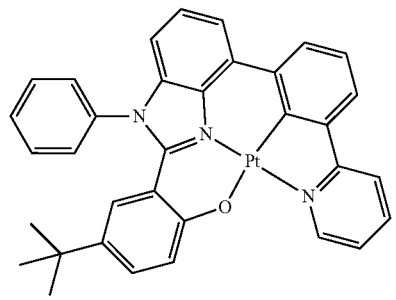
3-43
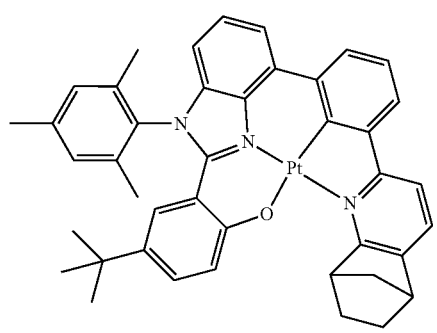
3-44
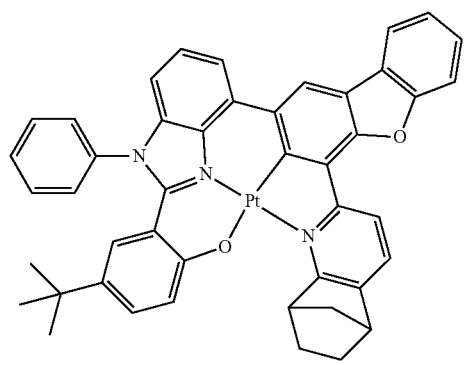
3-45
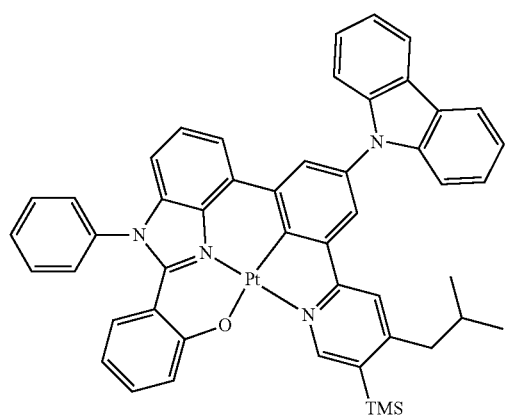
-continued
3-46
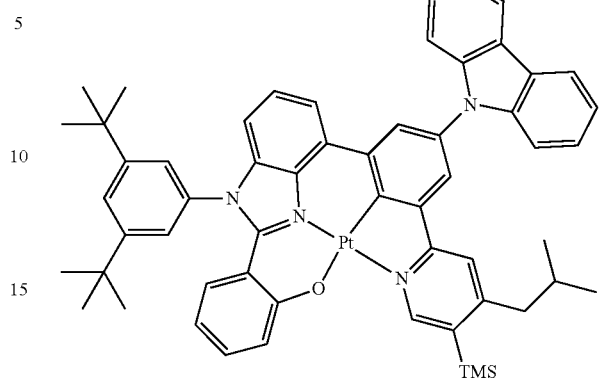
3-47
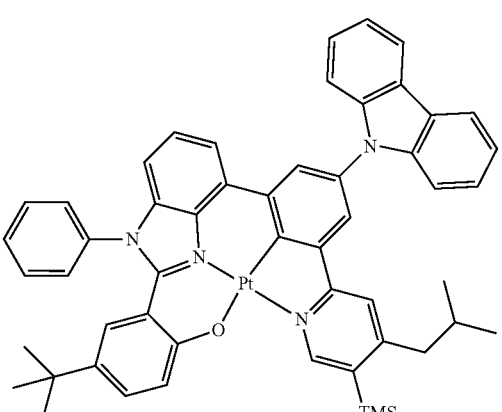
3-48
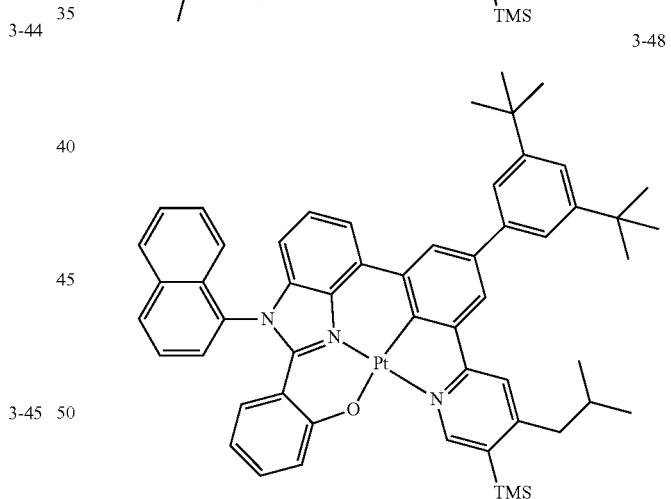
3-49
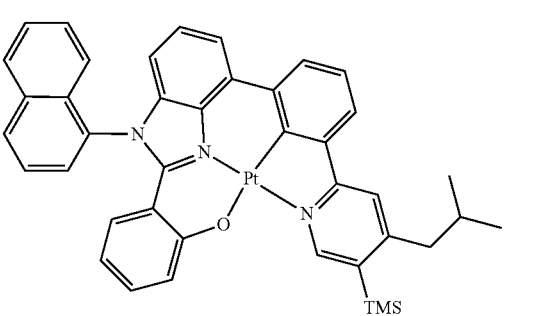

3-50
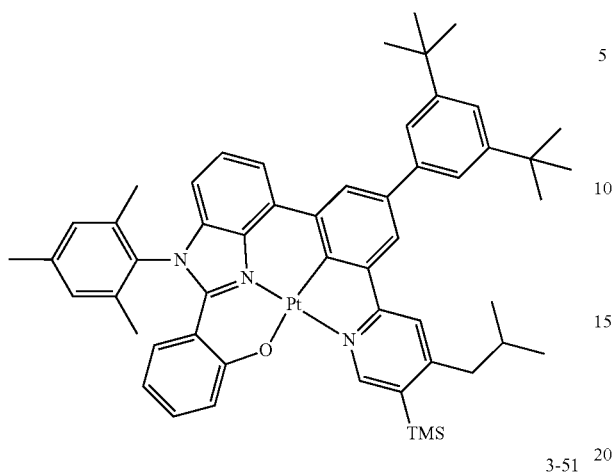
3-51
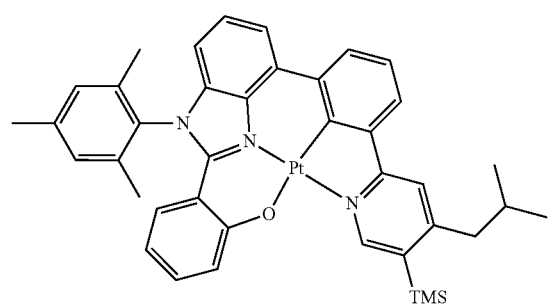
3-52
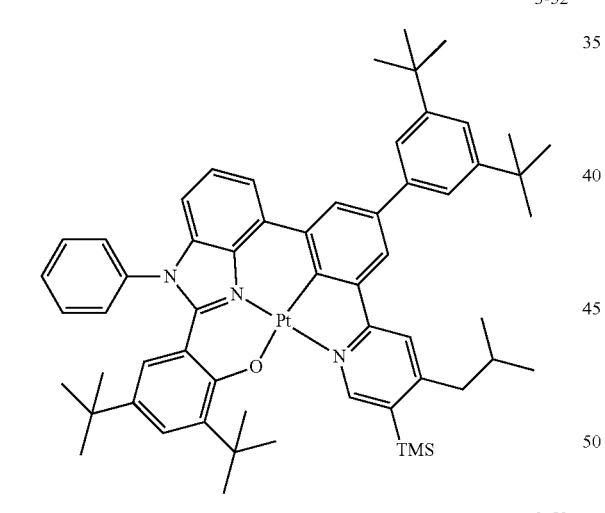
3-53
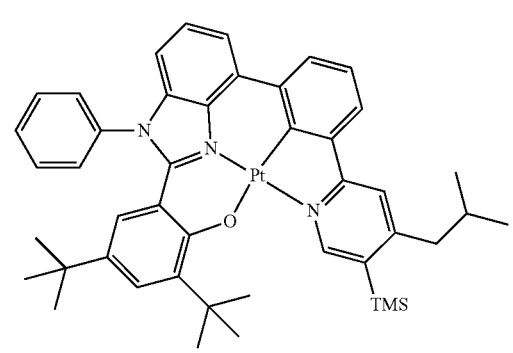
3-54
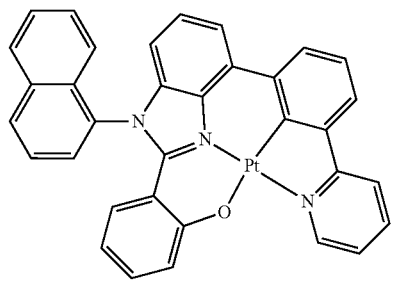
3-55
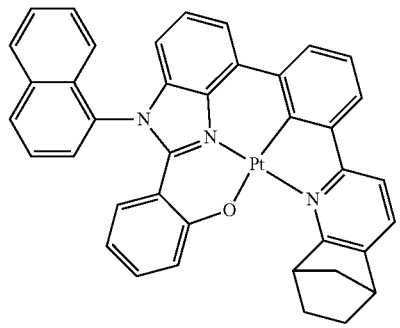
3-56
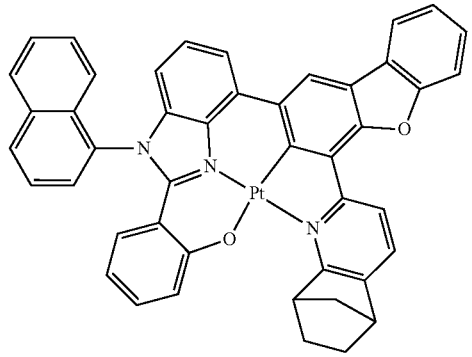
3-57
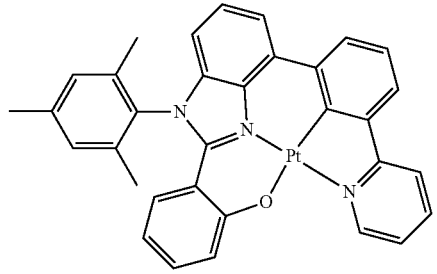
3-58
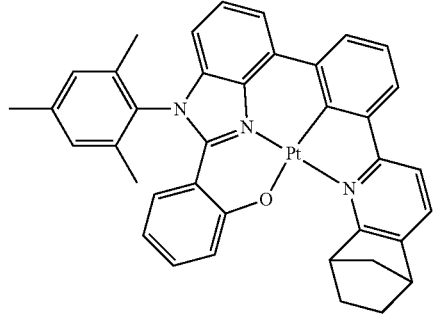

3-59
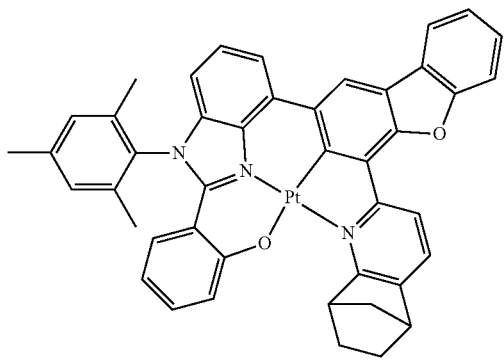
3-60
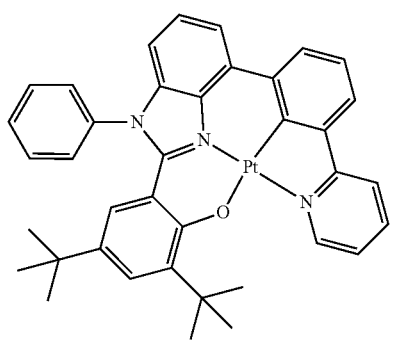
3-61
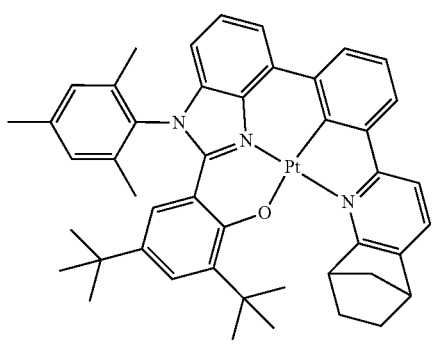
3-62
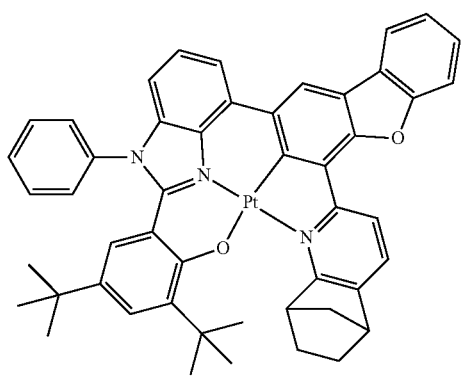
3-63
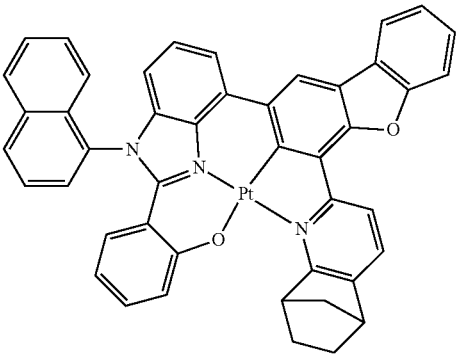
3-64
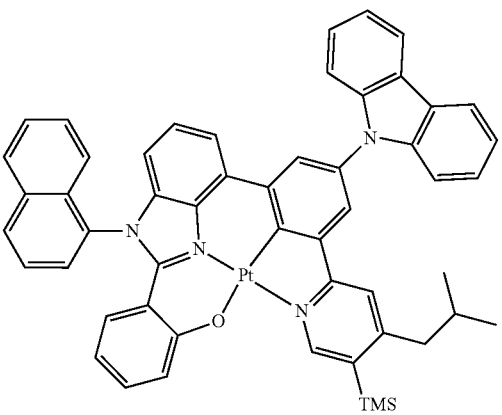
3-65
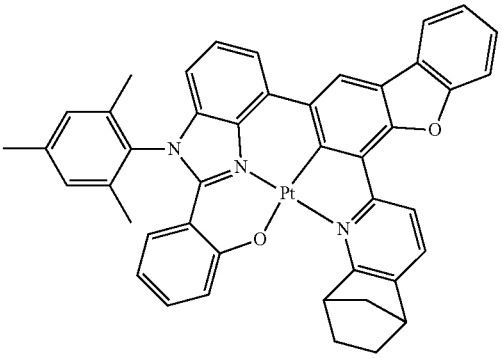
3-66
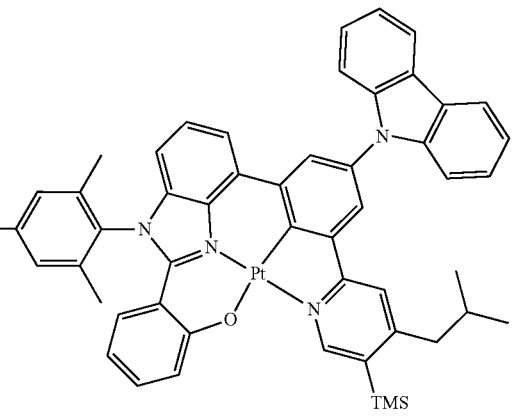

-continued
3-67
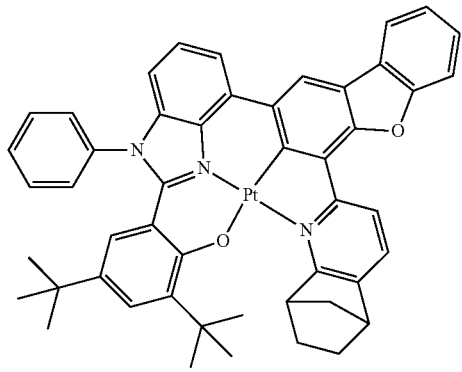
3-68
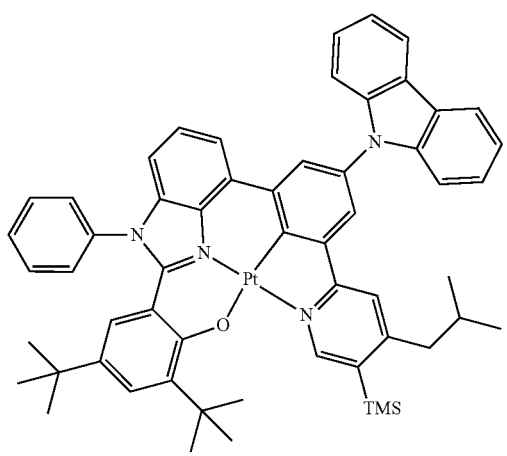
3-69
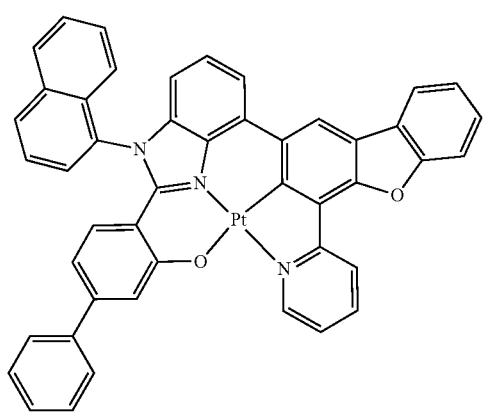
-continued
3-70
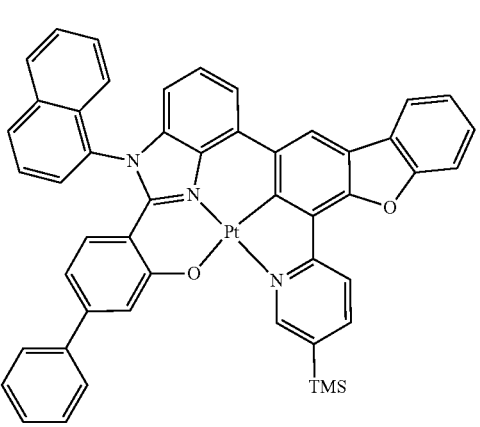
3-71
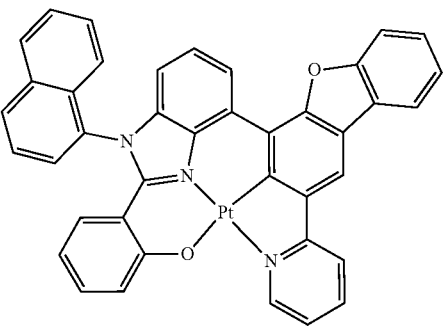
3-72
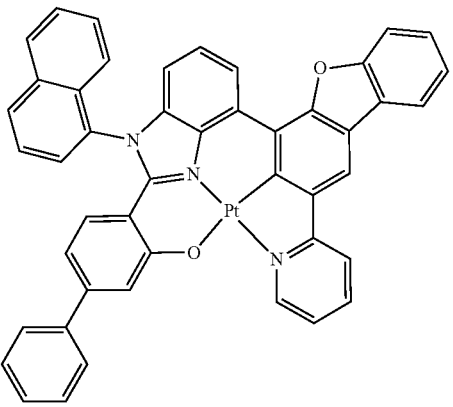
3-73
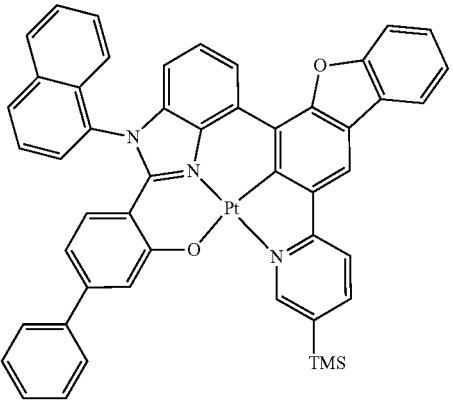

3-74
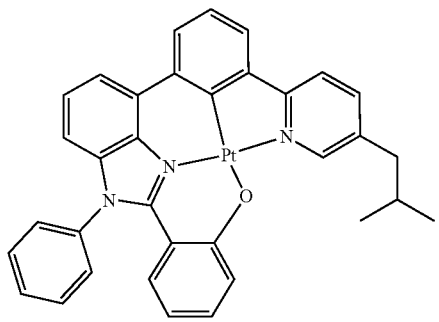
3-79
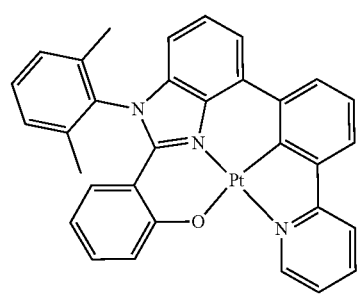
3-75
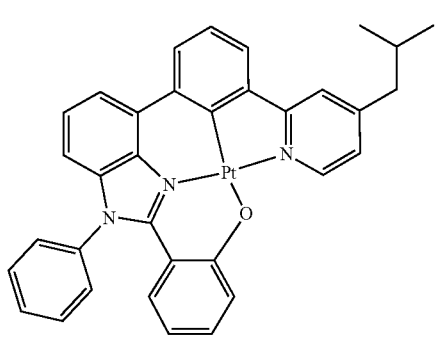
3-80
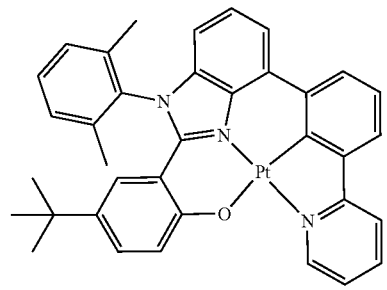
3-76
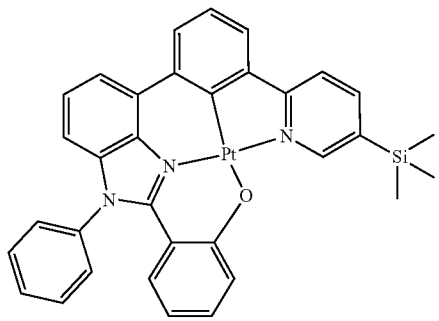
3-81
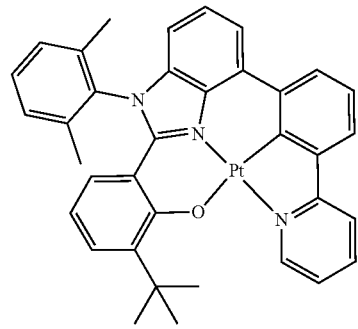
3-77
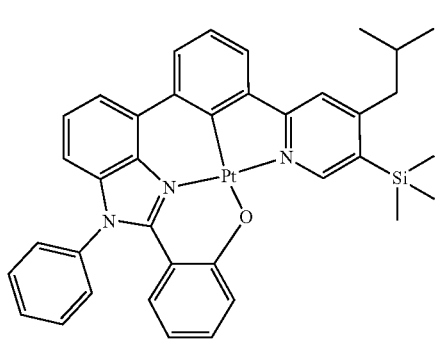
3-82
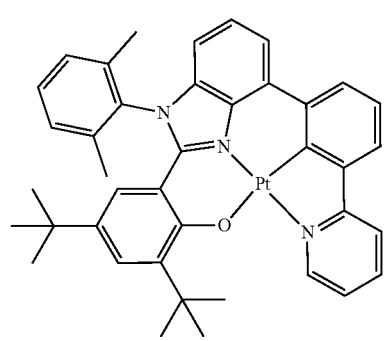
3-78
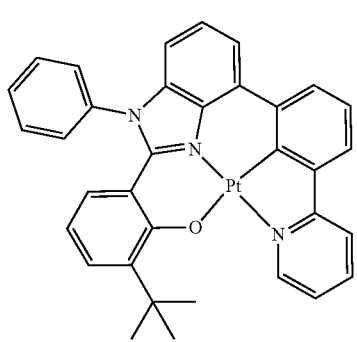
3-83
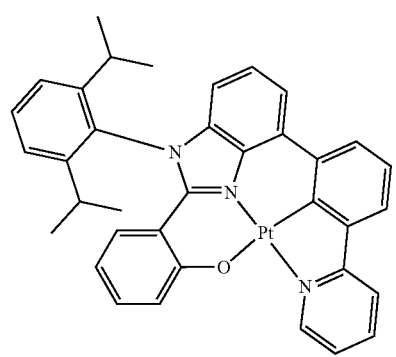

3-84
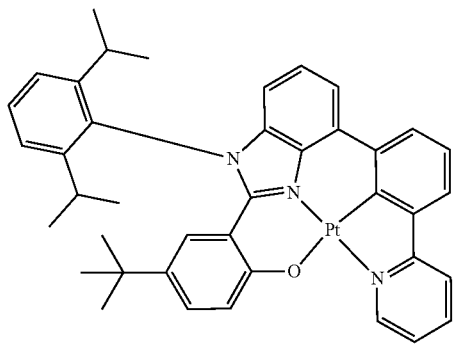
3-88
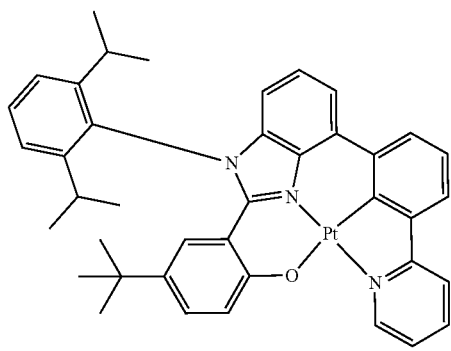
3-85
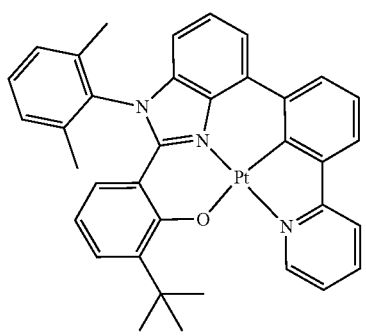
3-89
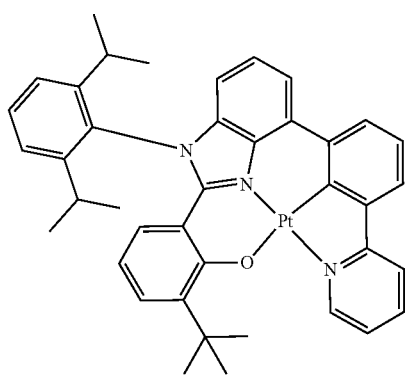
3-86
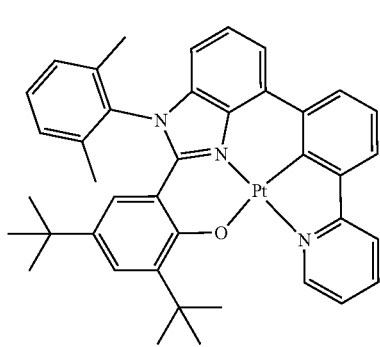
3-90
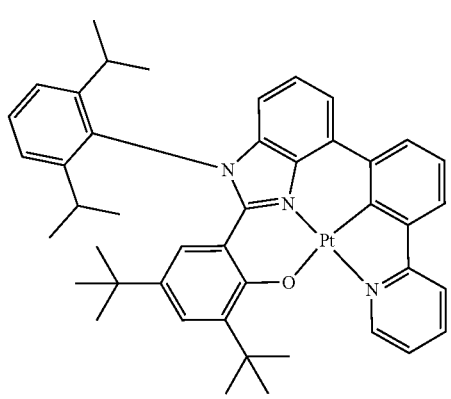
3-87
3-91
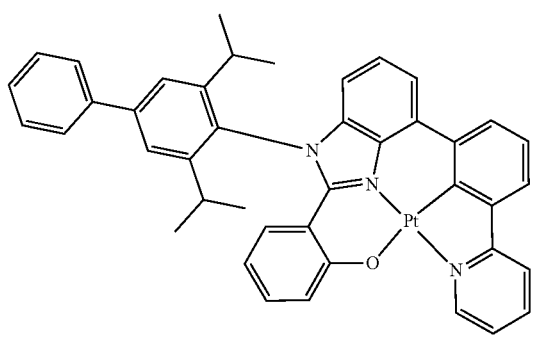

3-92
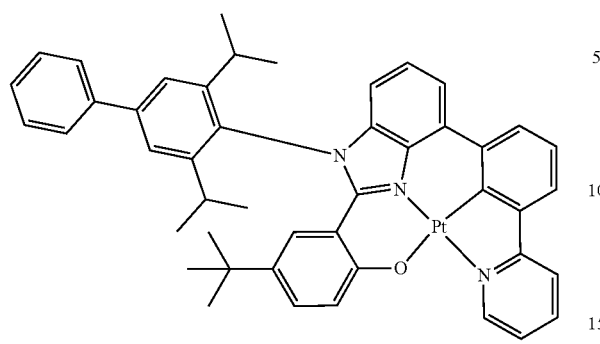
3-96
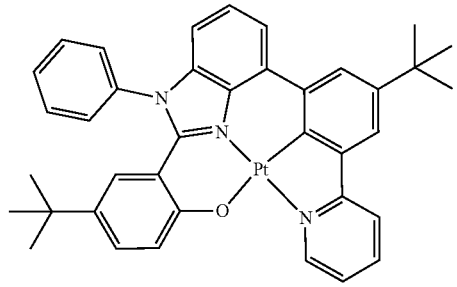
3-93
3-97
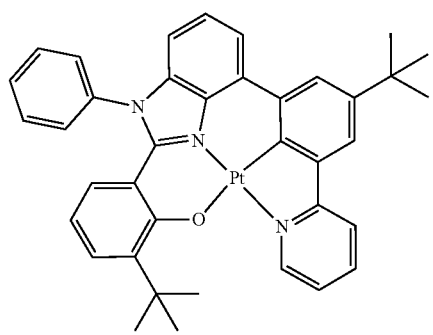
3-94
3-98
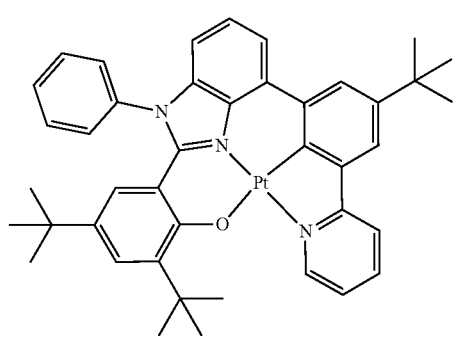
3-95
3-99
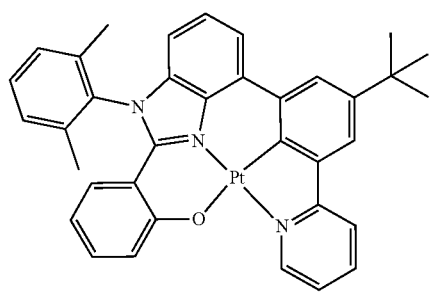
3-100
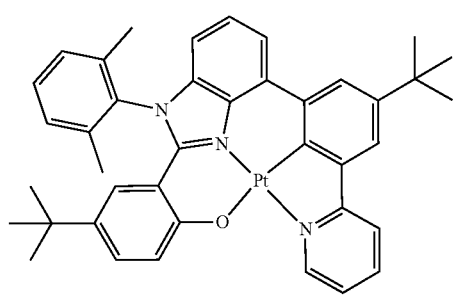

3-101
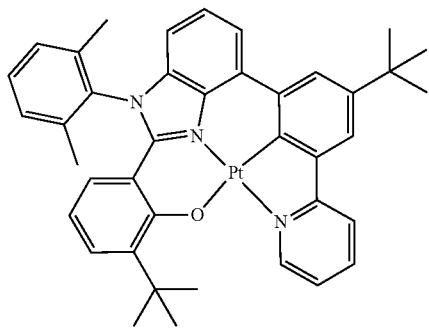
3-102
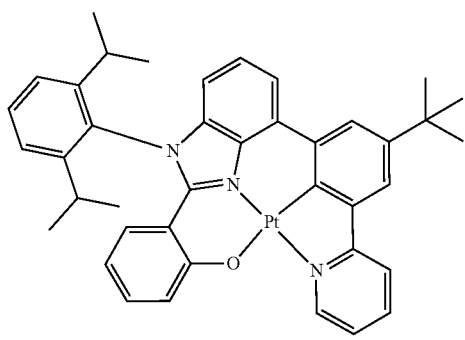
3-103
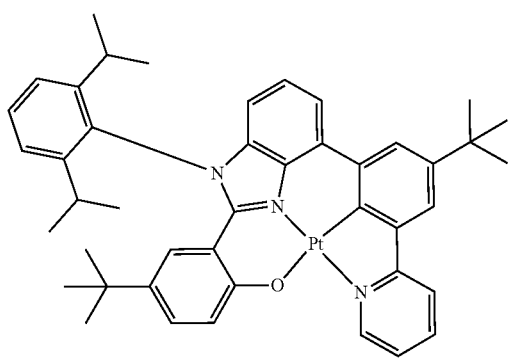
3-104
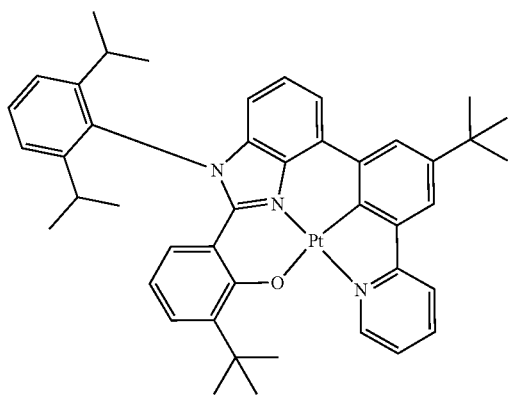
3-105
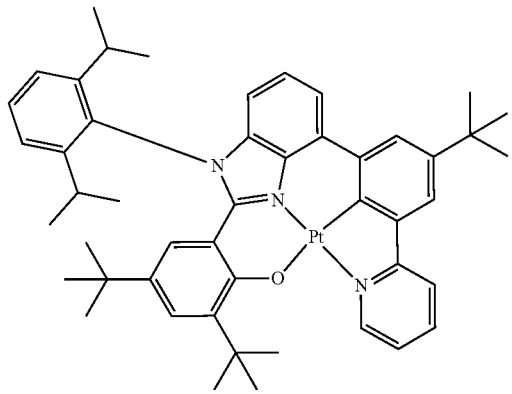
3-106
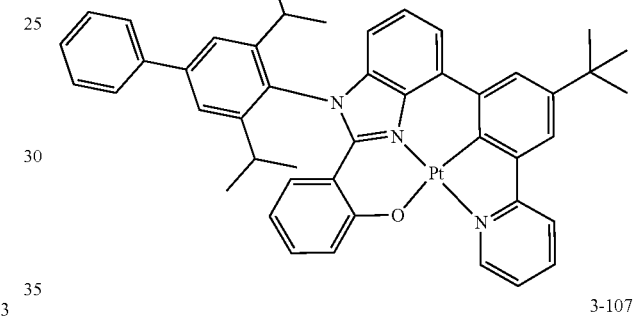
3-107
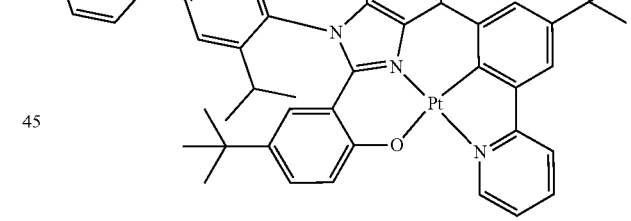
3-108
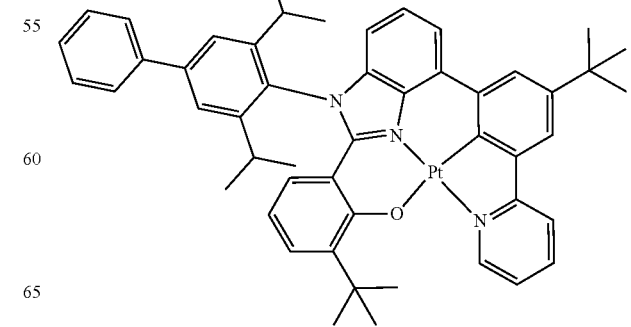

3-109
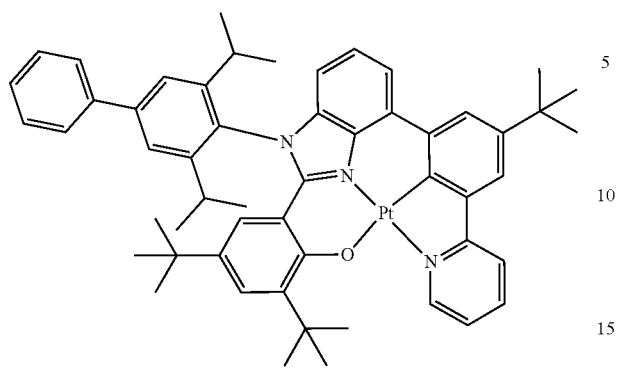
3-110
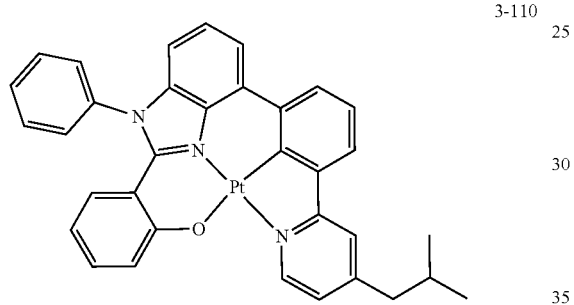
3-111
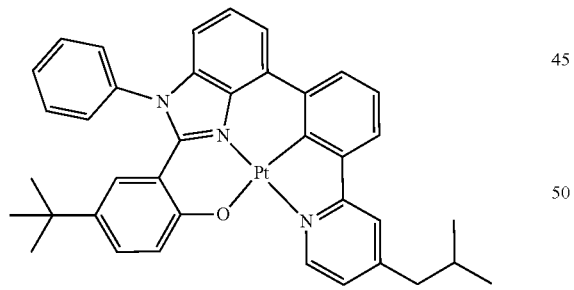
3-112
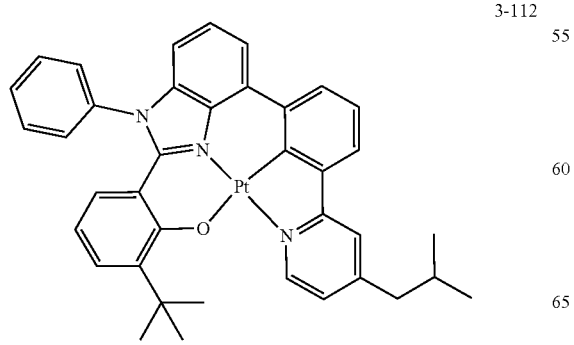
3-113
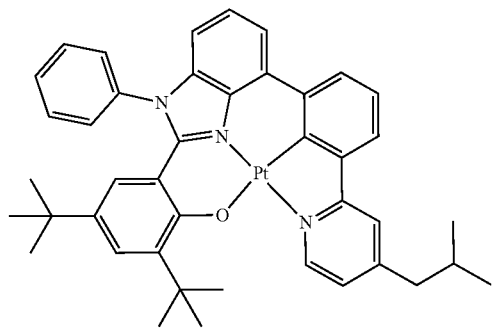
3-114
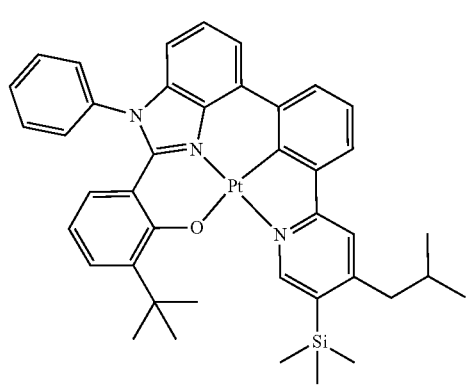
3-115
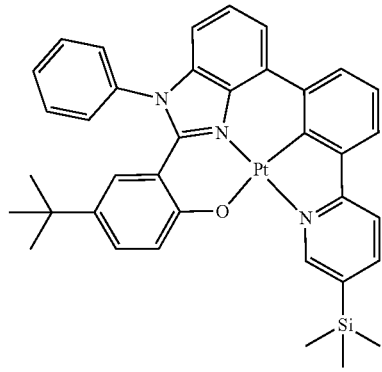
3-116

3-117
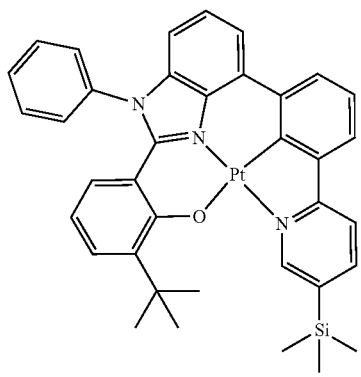
3-118
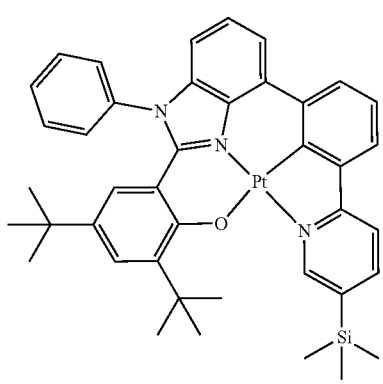
3-119
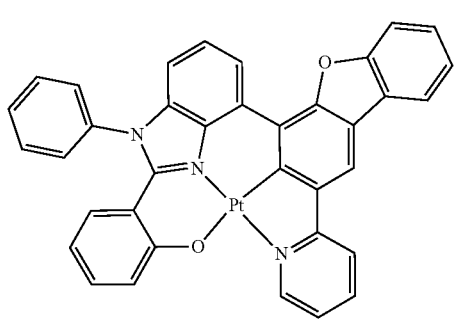
3-120
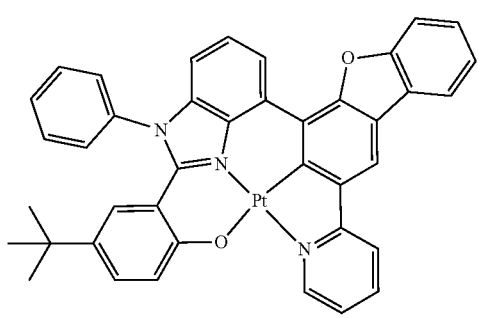
3-121
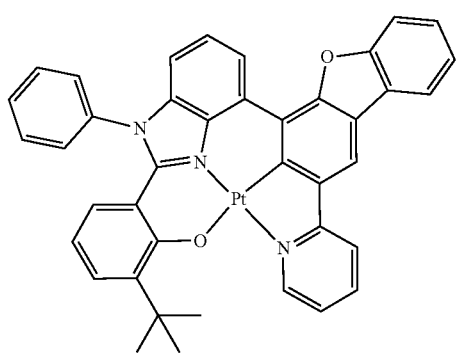
3-122
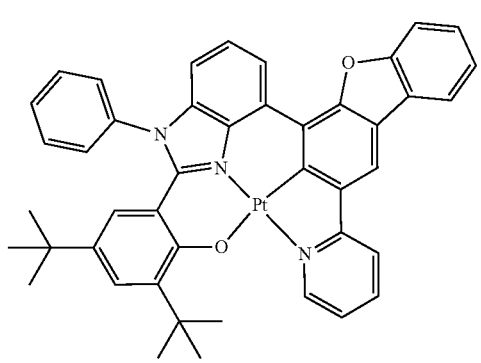
3-123
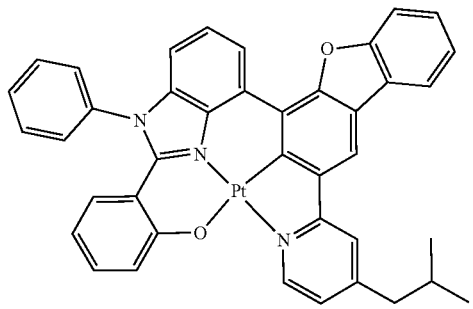
3-124
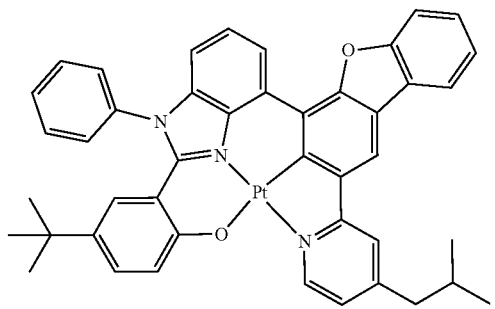

3-125
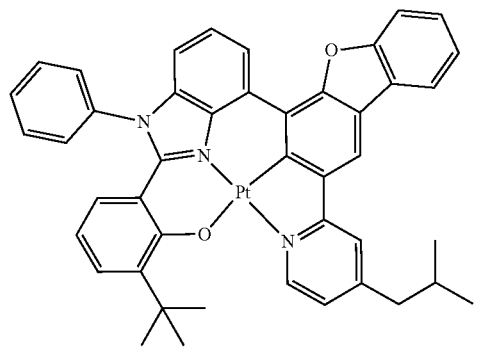
3-126
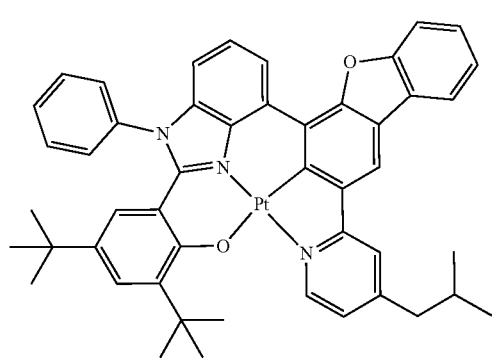
3-127
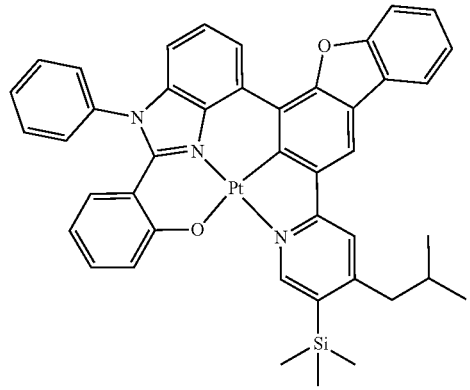
3-128
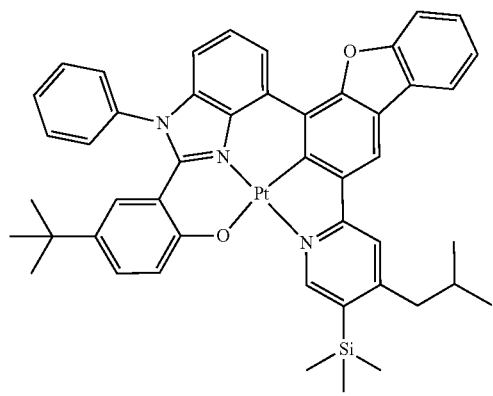
3-129
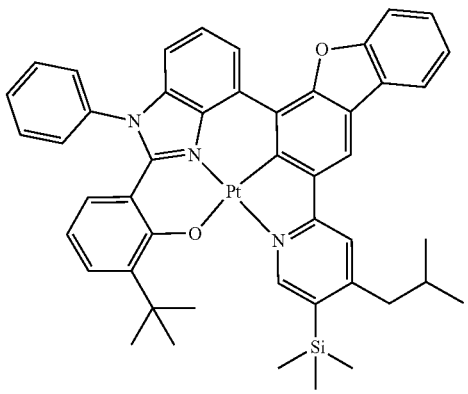
3-130
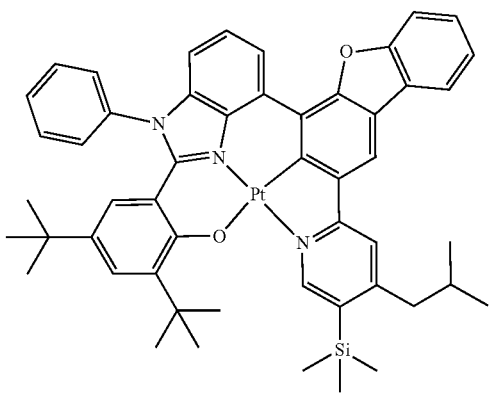
3-131
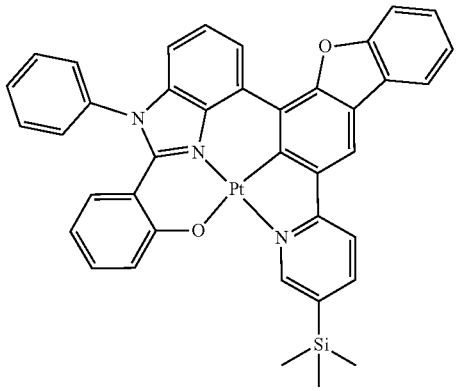
3-132
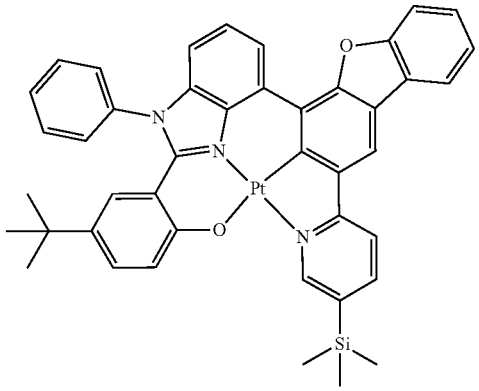

3-133
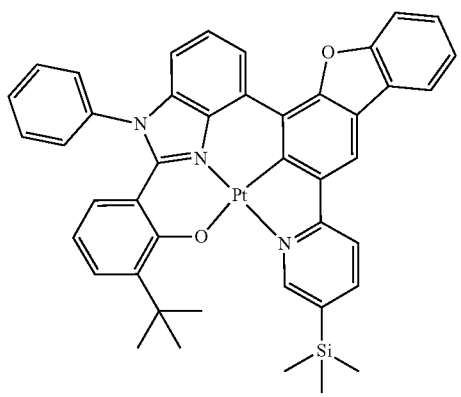
3-137
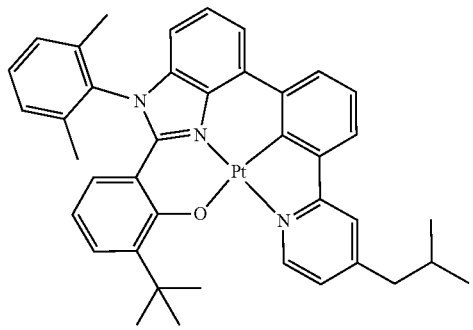
3-134
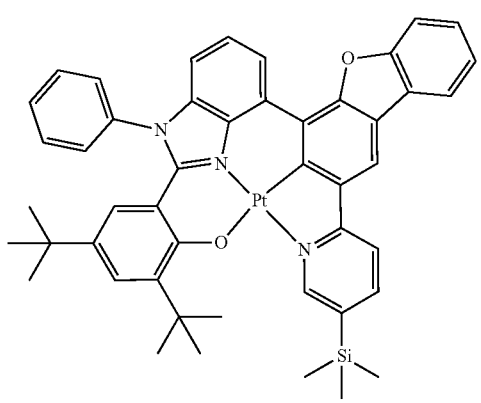
3-138
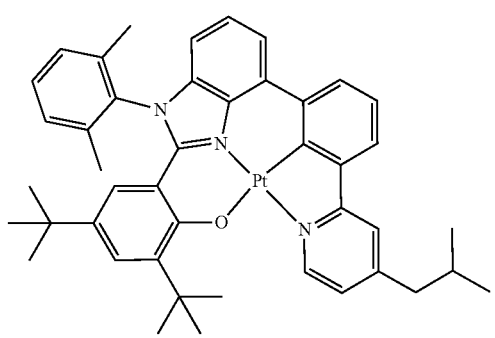
3-135
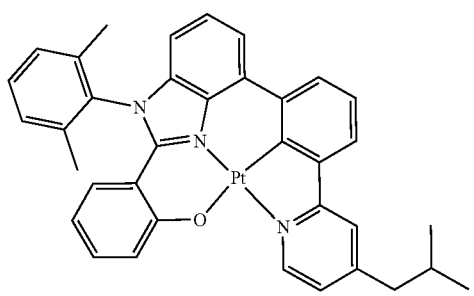
3-139
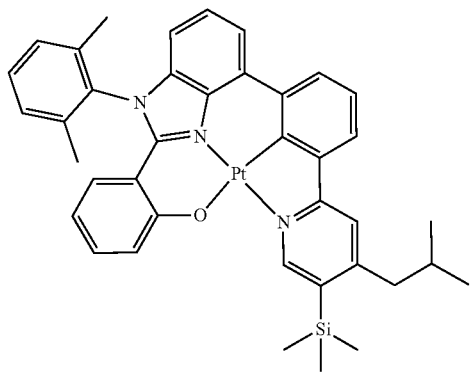
3-136
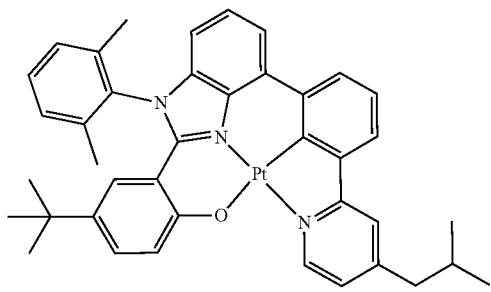
3-140
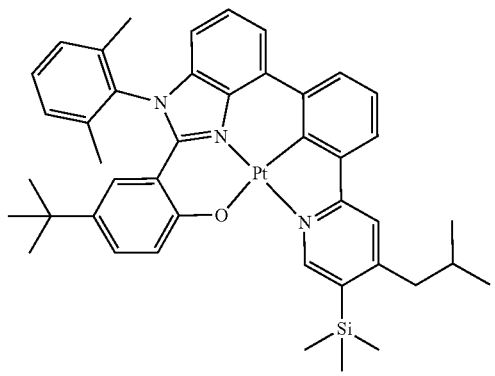

3-141 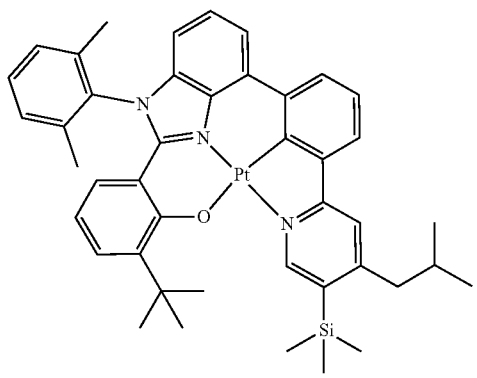
3-142 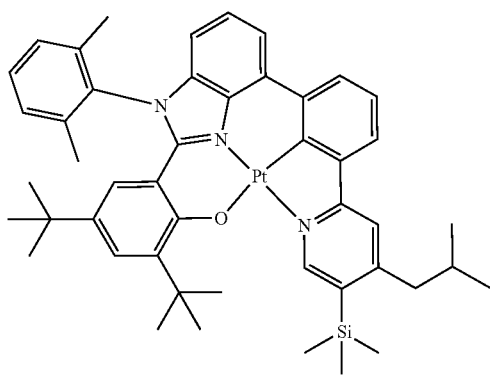
3-143 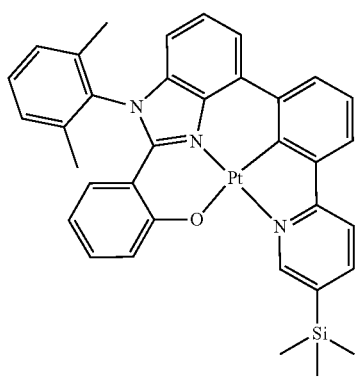
3-144 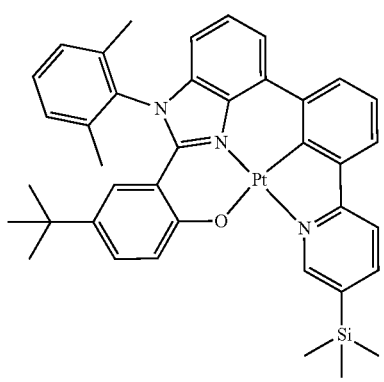
3-145 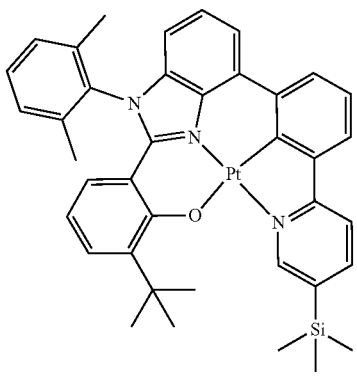
3-146 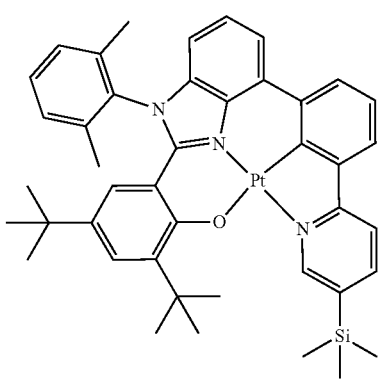
3-147 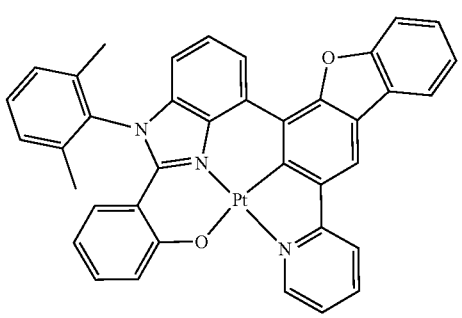
3-148 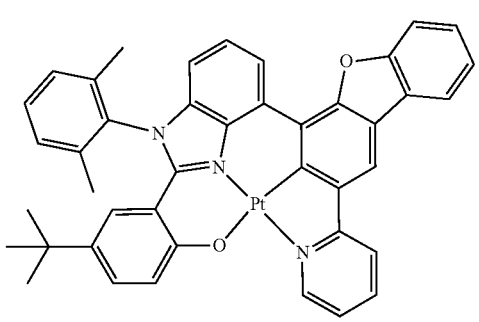

3-149
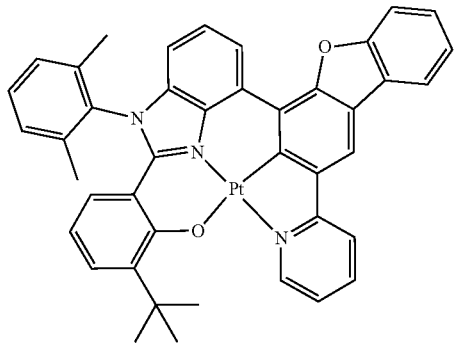
3-150
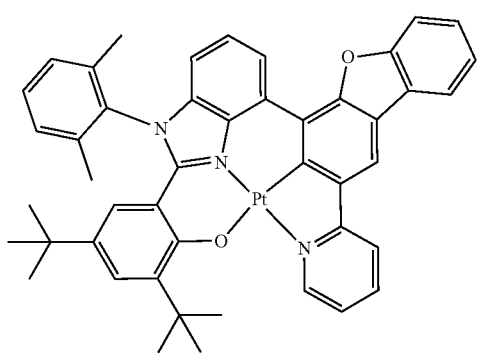
3-151
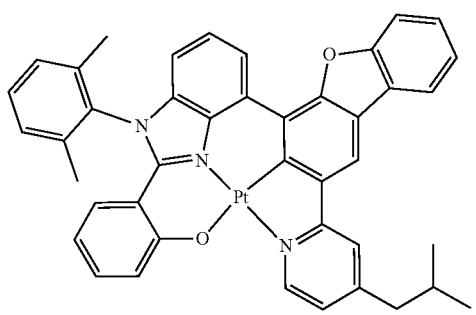
3-152
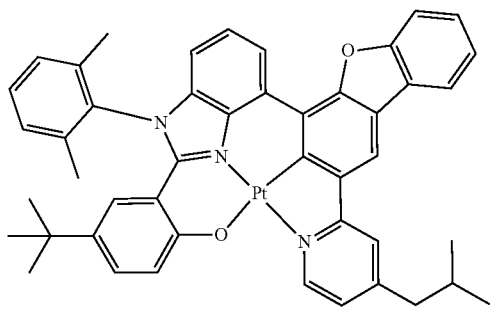
3-153
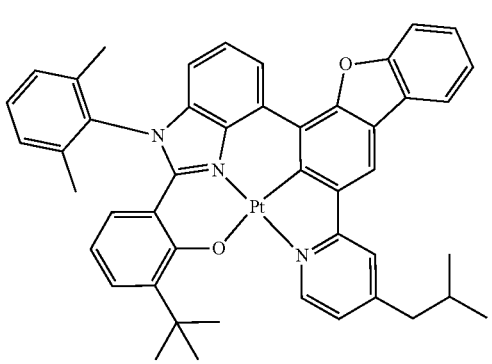
3-154
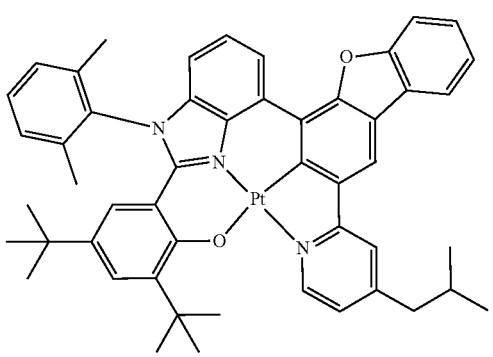
3-155
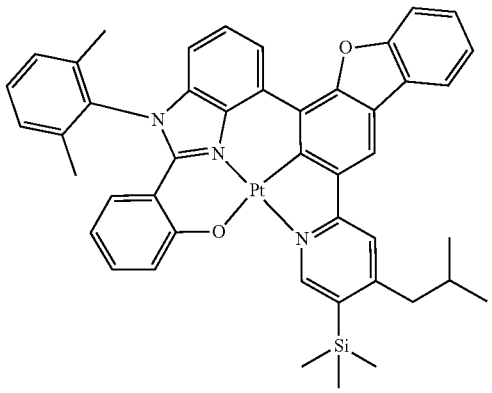
3-156
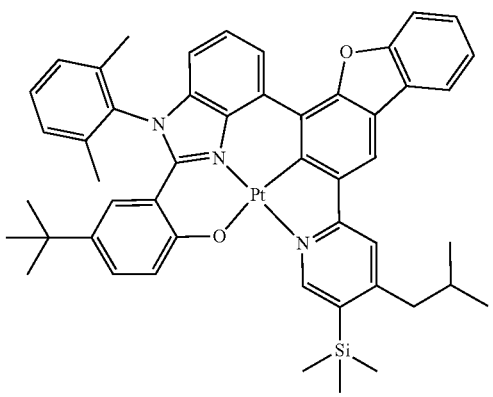

3-157
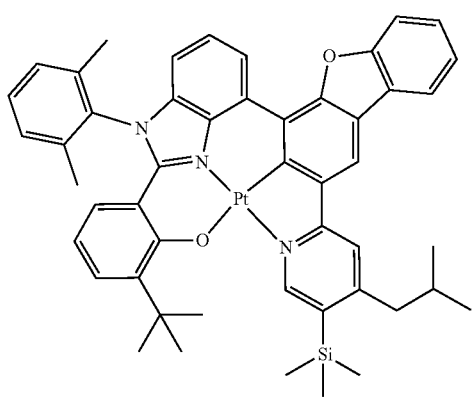
3-158
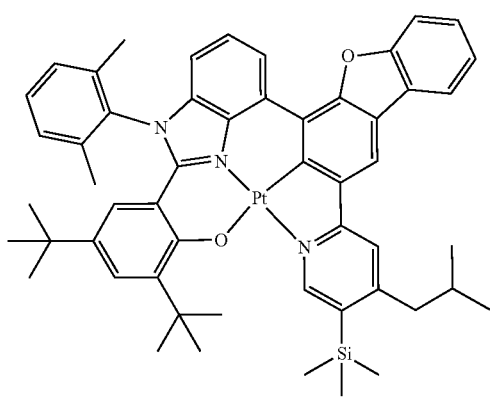
3-159
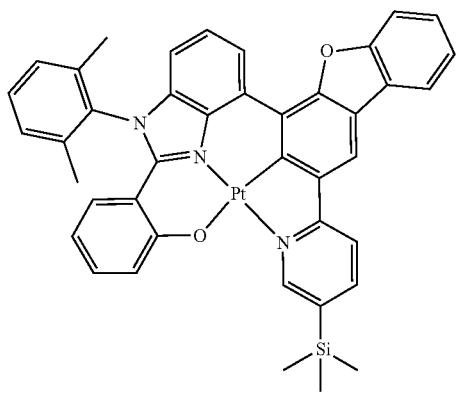
3-160
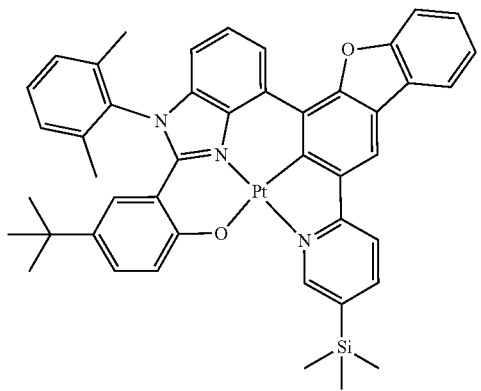
3-161
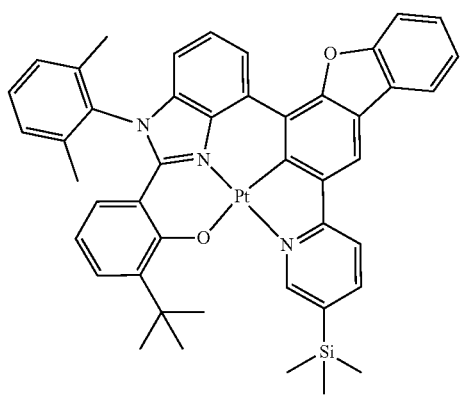
3-162
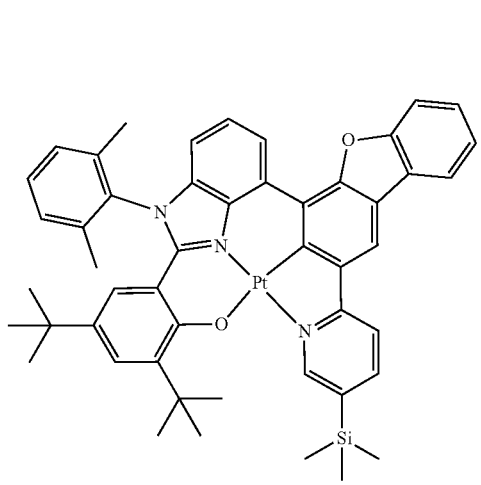
3-163
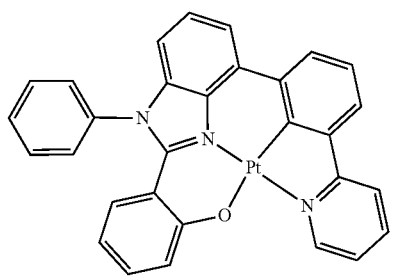
3-164
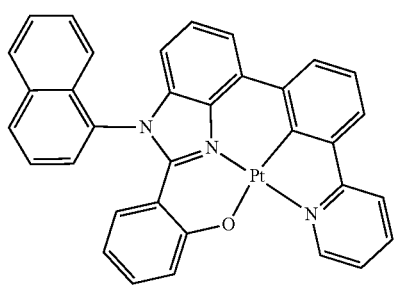

-continued
3-165
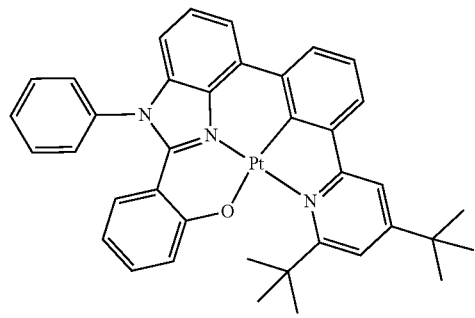
3-166
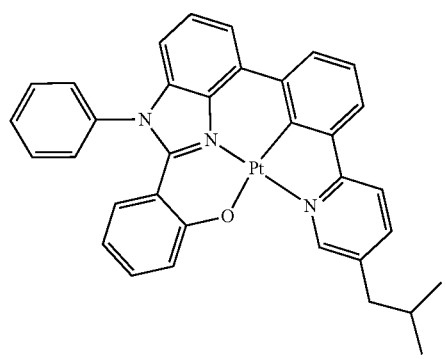
3-167
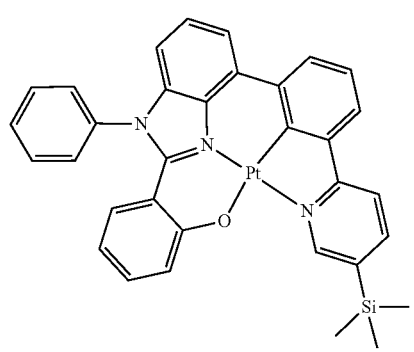
3-168
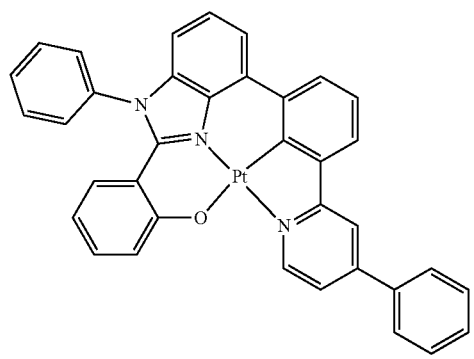
-continued
3-169
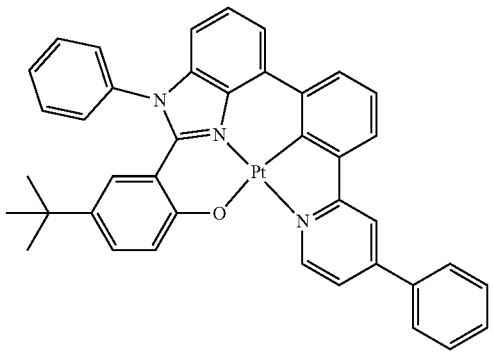
3-170
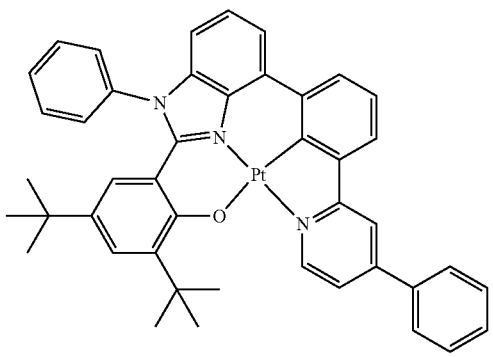
3-171
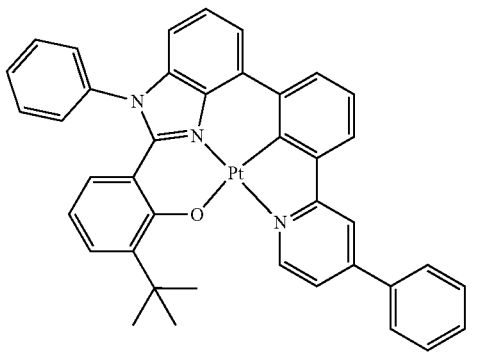
3-172
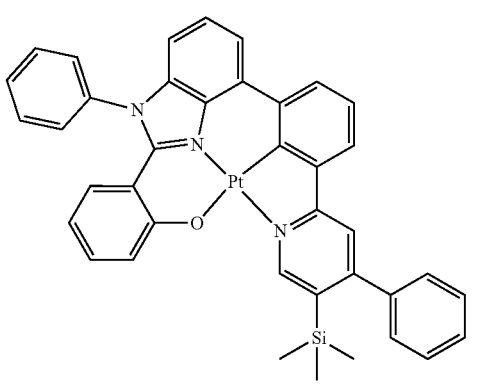

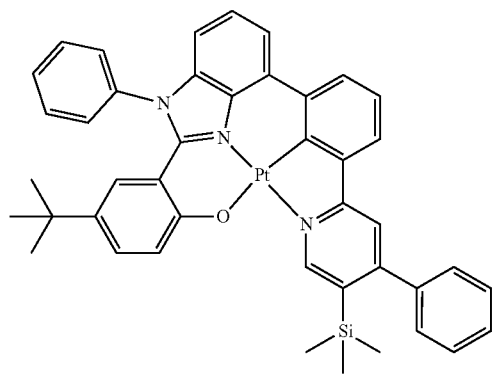
3-173
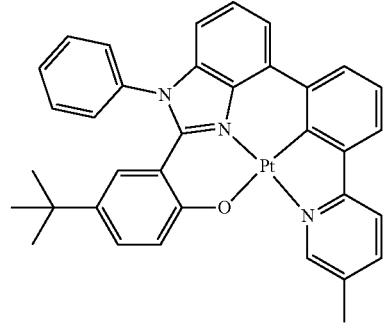
3-177
3-174
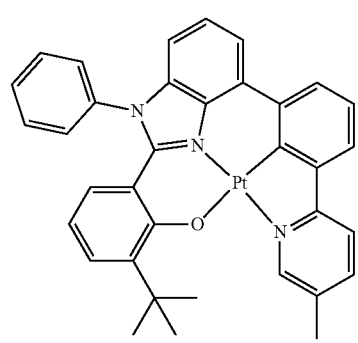
3-178
3-175
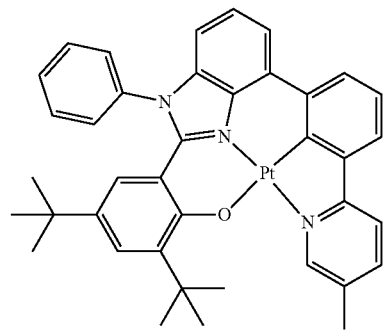
3-179
3-176
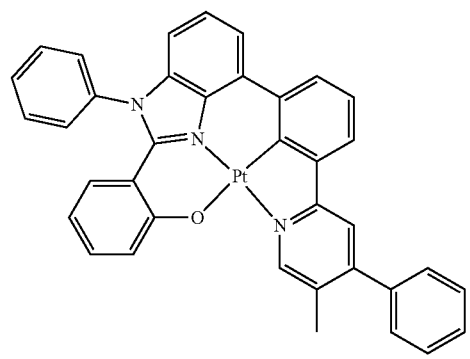
3-180

3-181
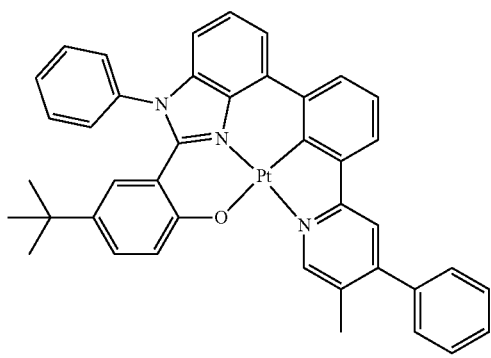
3-185
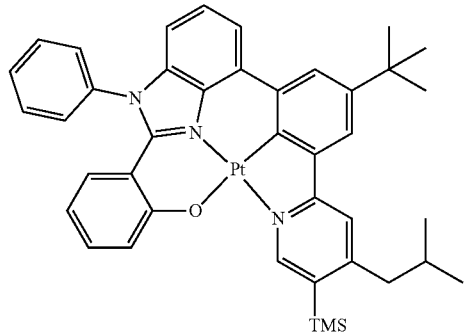
3-182
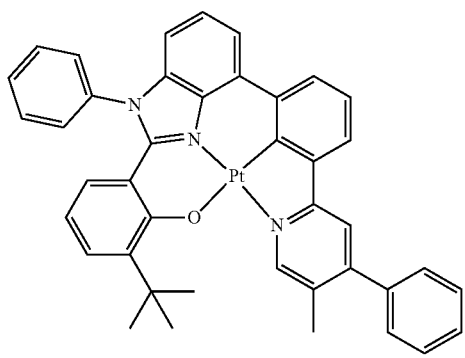
3-186
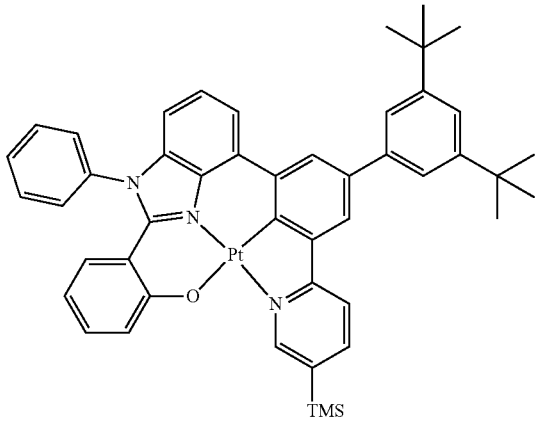
3-183
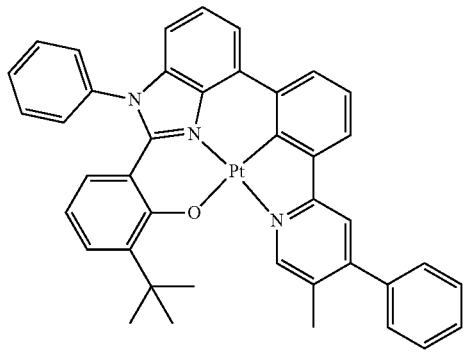
3-187
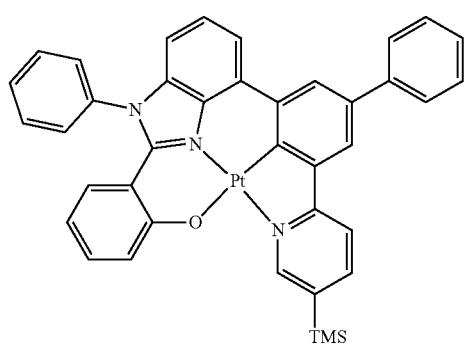
3-184
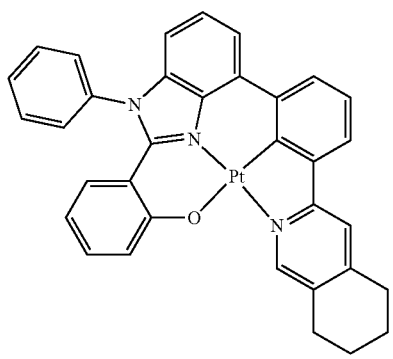
3-188
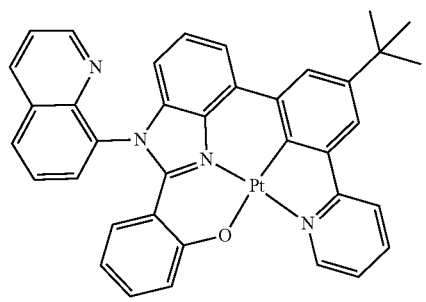

3-189
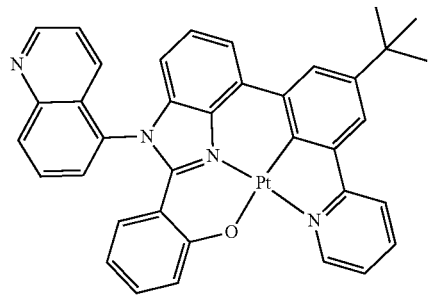
3-190
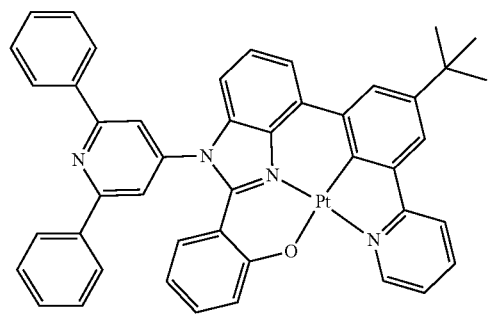
3-191
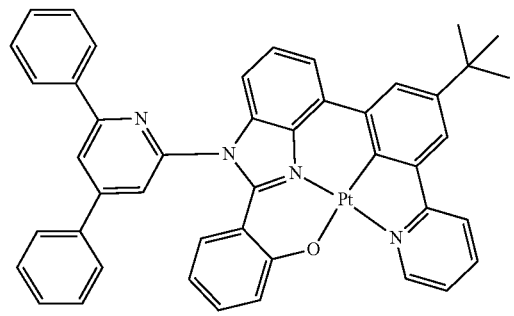
3-192
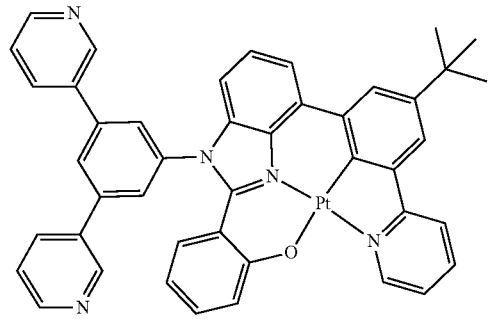
3-193
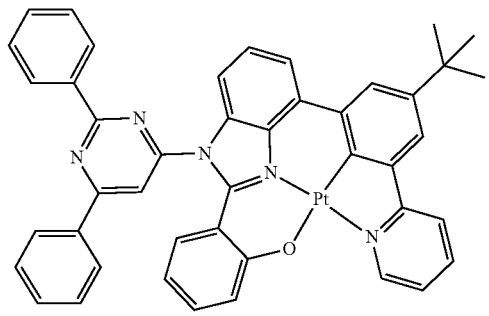
3-194
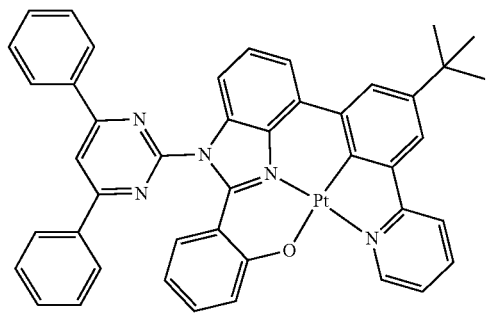
3-195
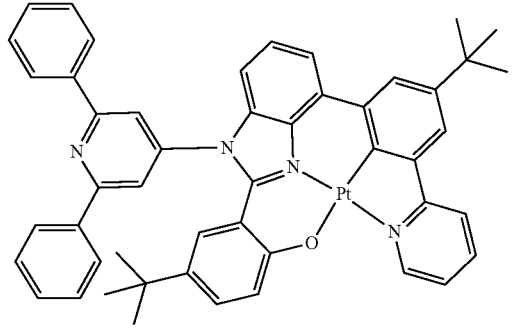
3-196
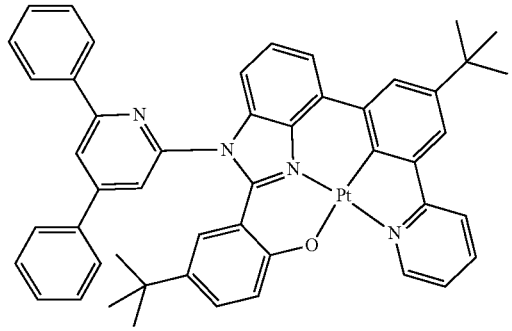

3-197
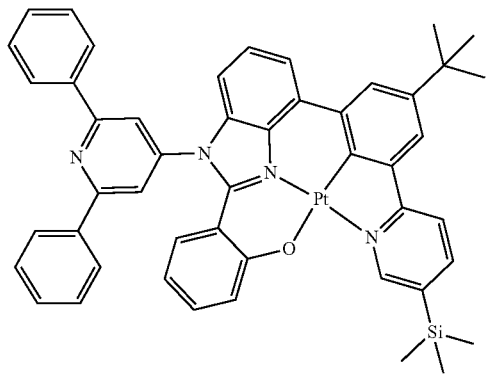
3-198
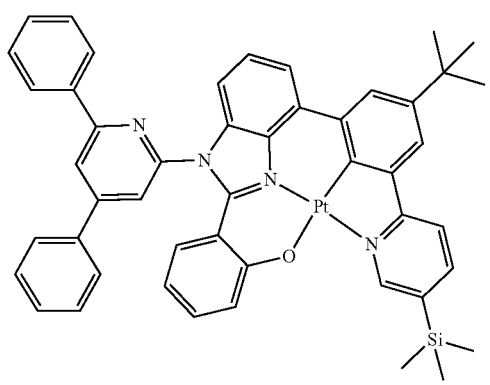
3-199
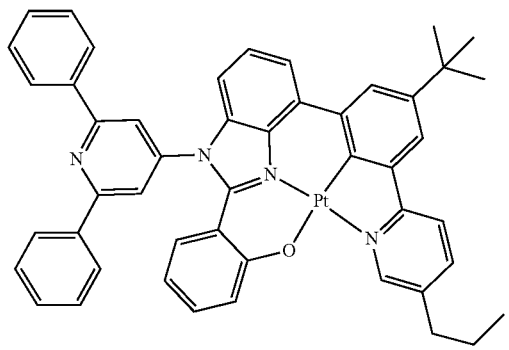
3-200
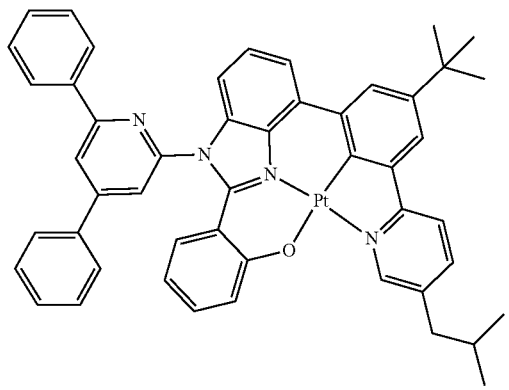
3-201
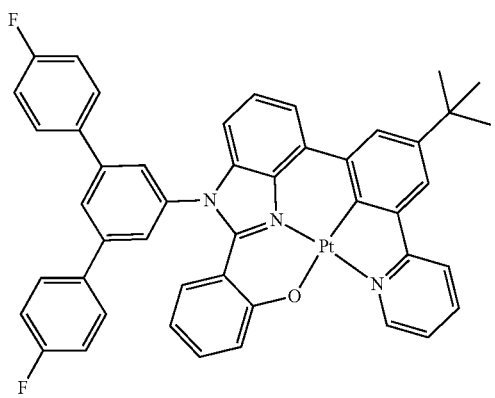
3-202
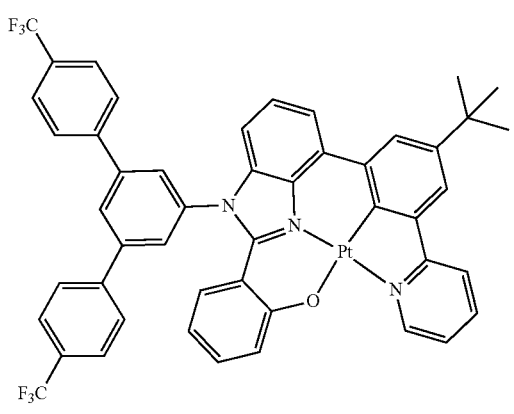
3-203
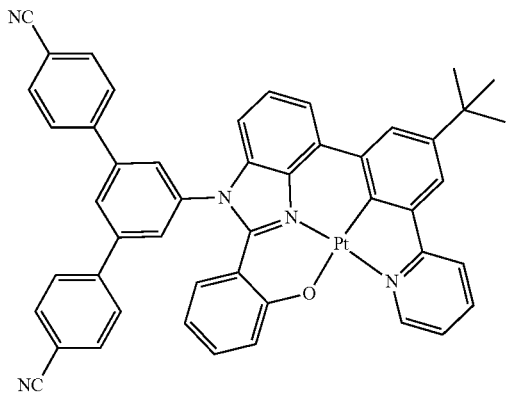
3-204
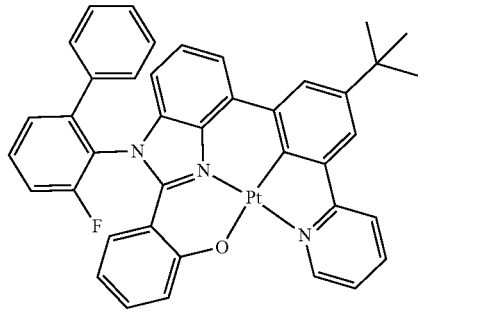

3-205
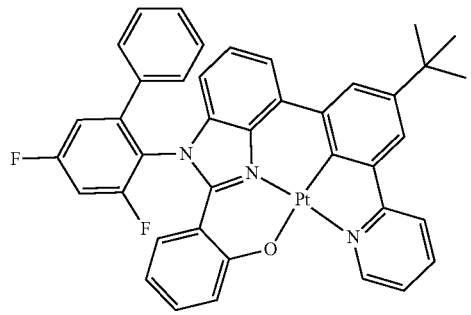
3-206
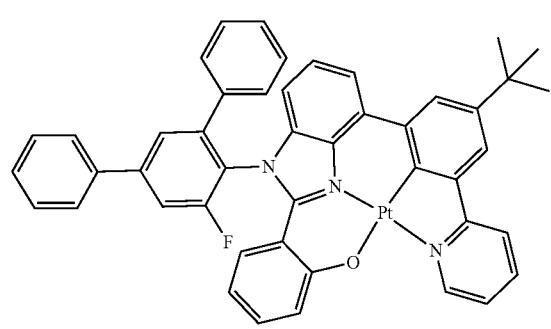
3-207
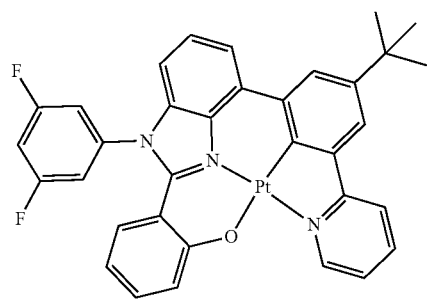
3-208
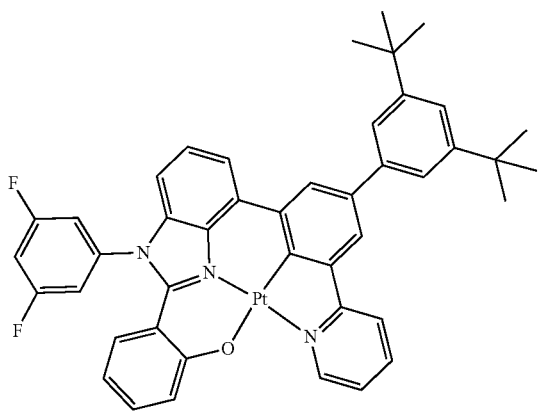
3-209
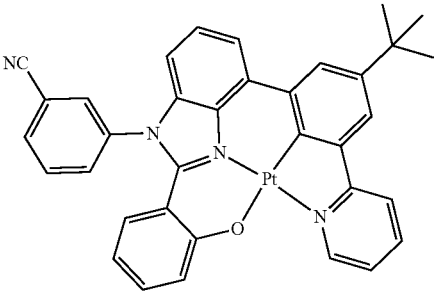
3-210
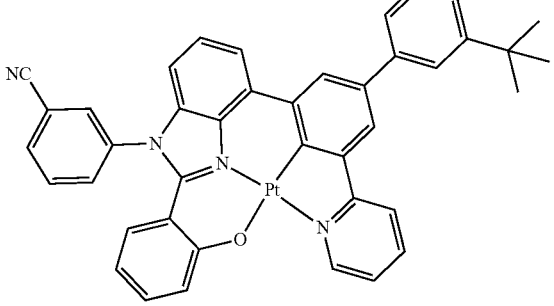
3-211
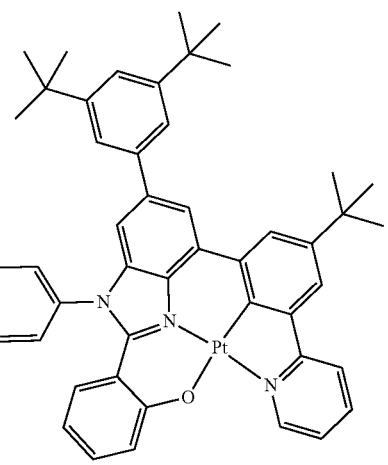
3-212
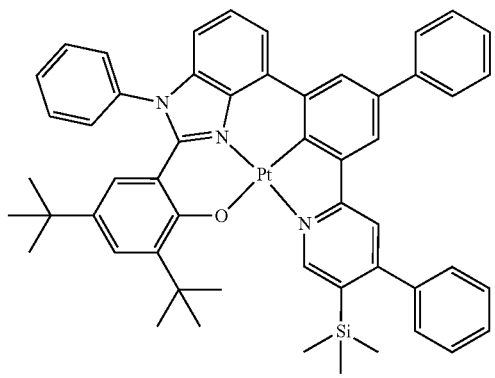

3-213
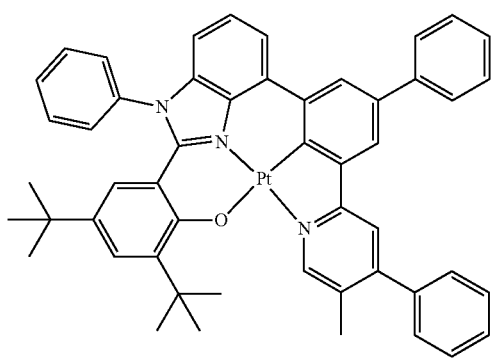
3-217
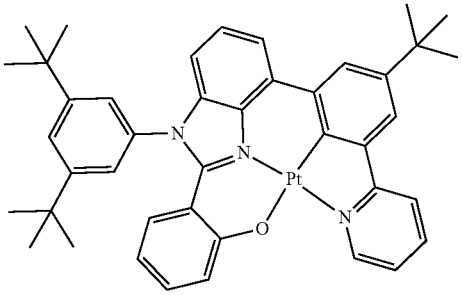
3-214
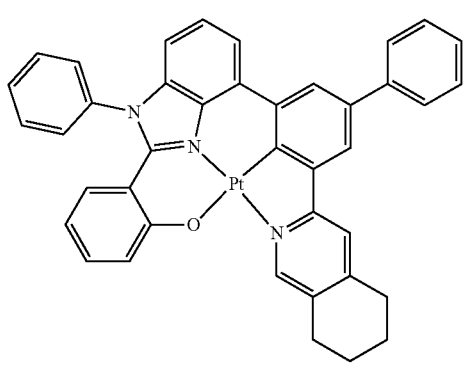
3-218
3-215
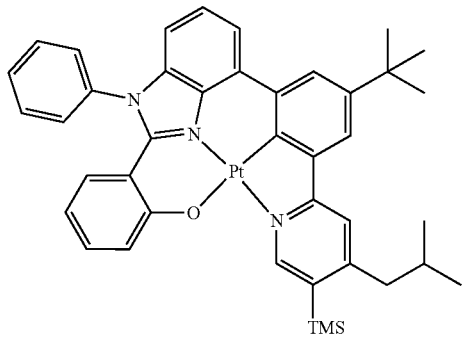
3-216
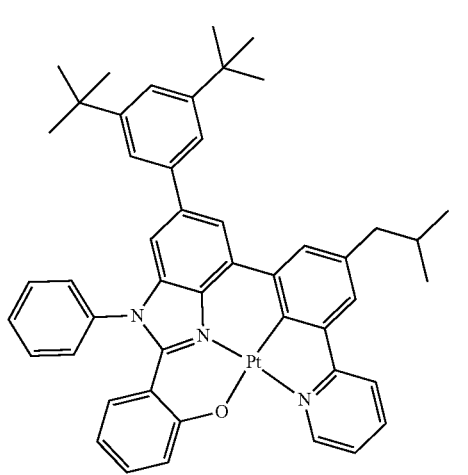
3-219
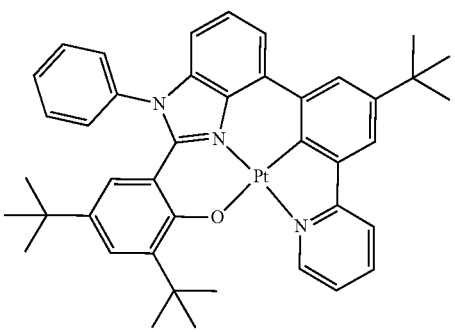
3-220
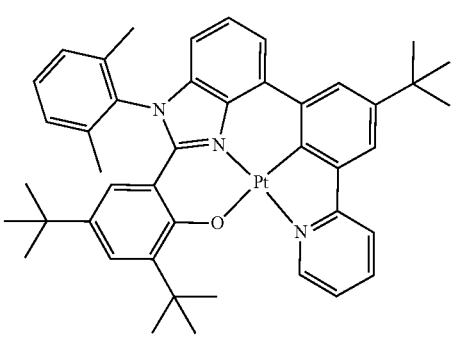

3-221
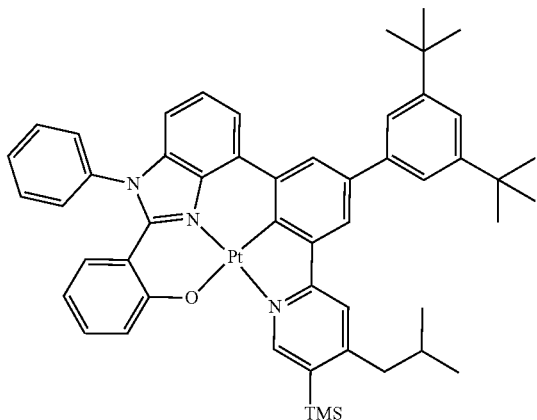
3-222
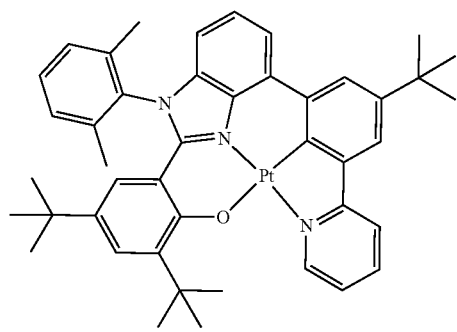
3-223
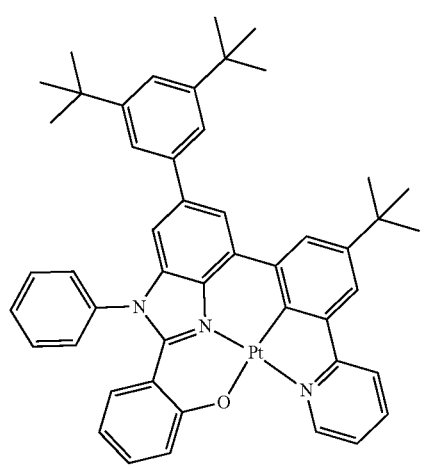
3-224
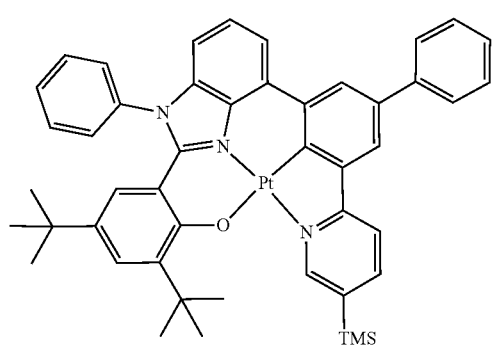
3-225
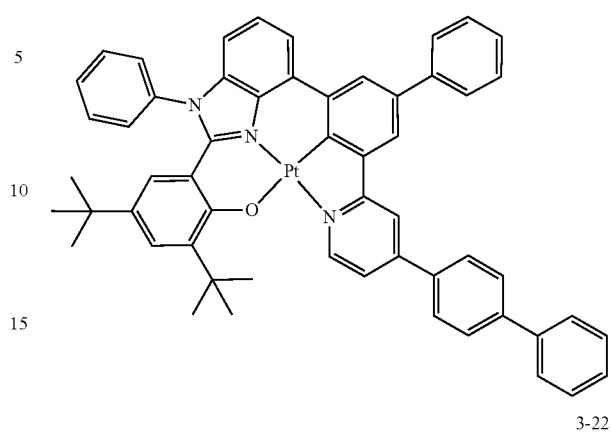
3-226
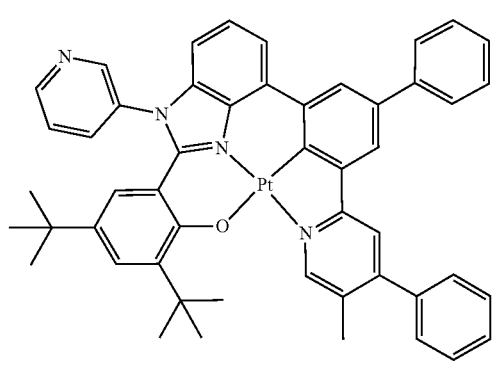
3-227
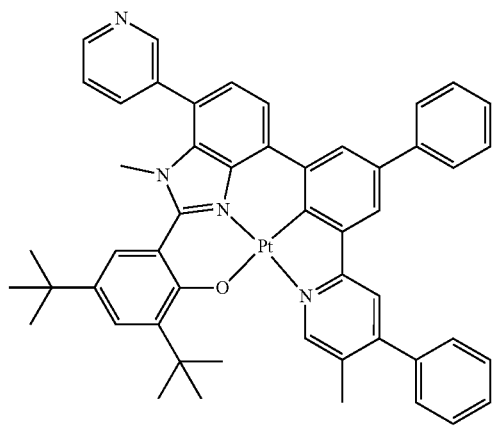
3-228
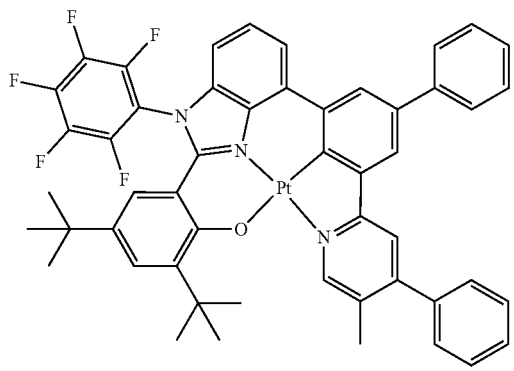

3-229
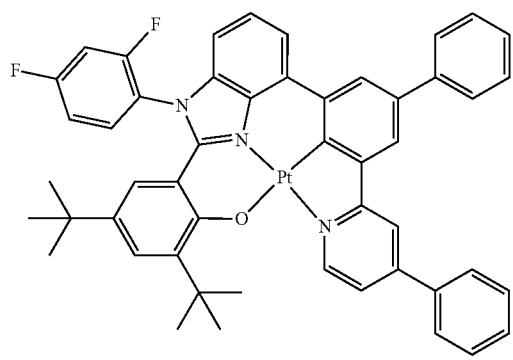
3-233
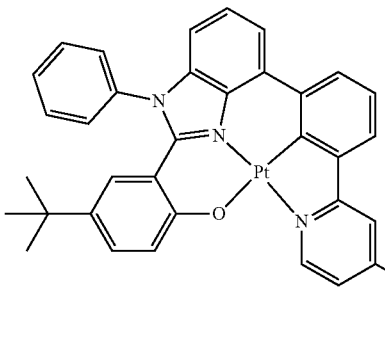
3-230
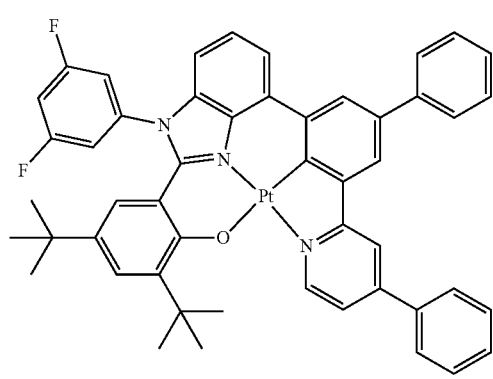
3-234
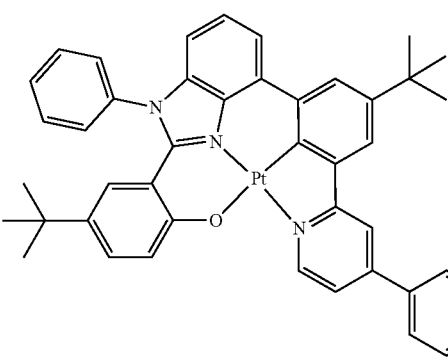
3-231
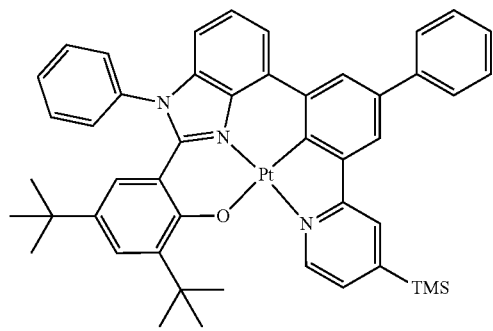
3-235
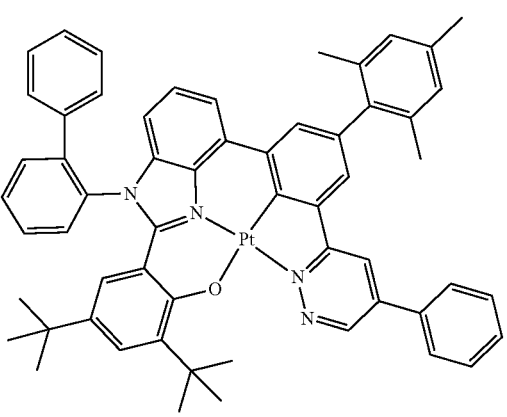
3-232
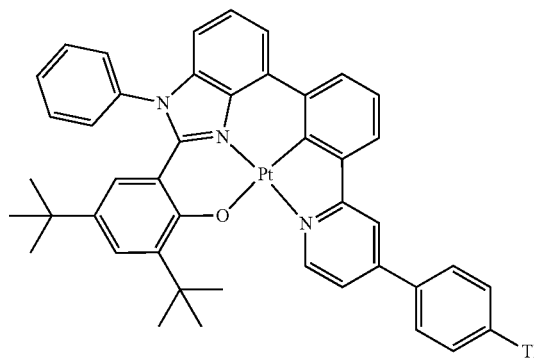
3-236
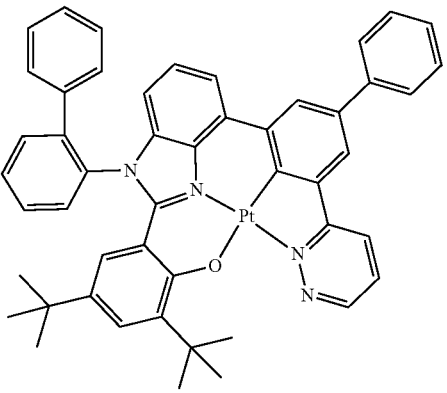

3-237
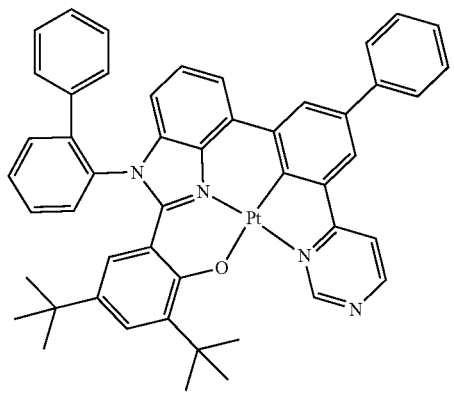
3-238
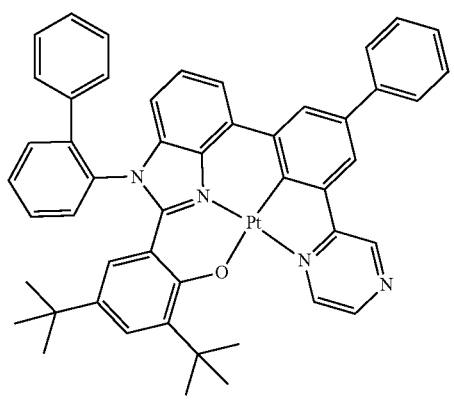
3-239
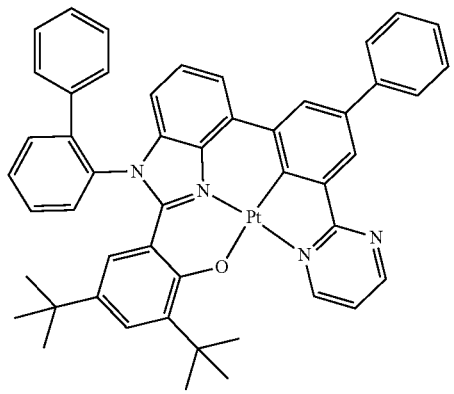
3-240
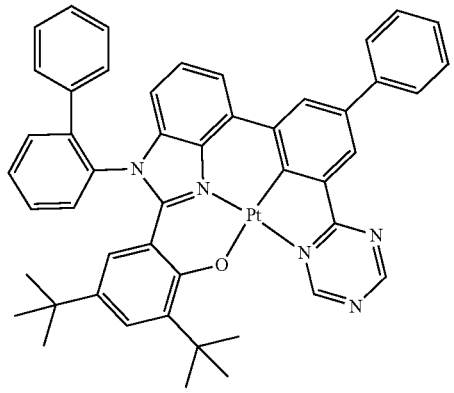
3-241
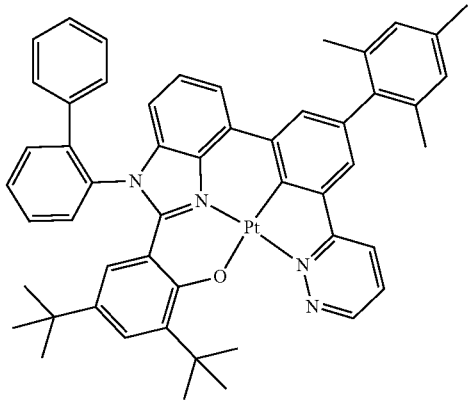
3-242
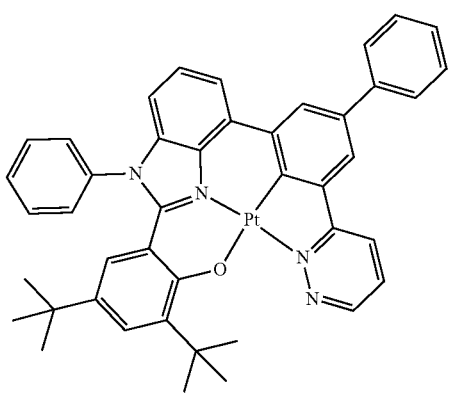
3-243
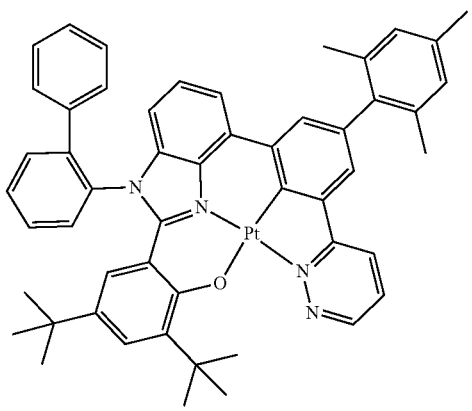
3-244
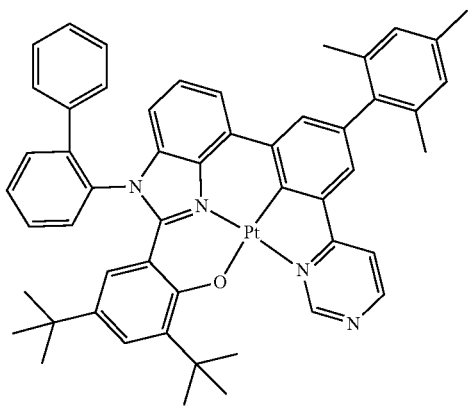

-continued
3-245
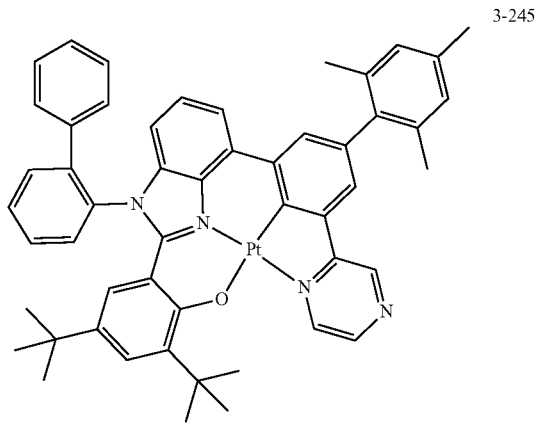
3-246
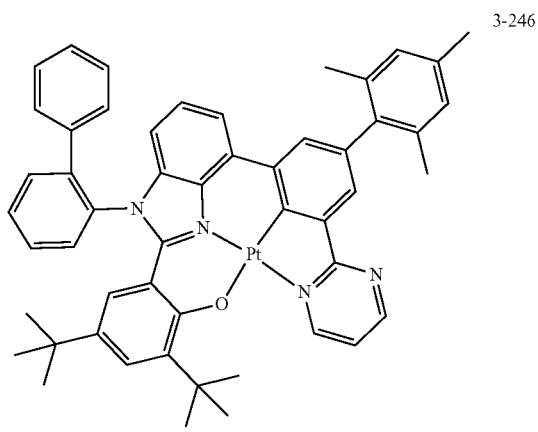
3-247
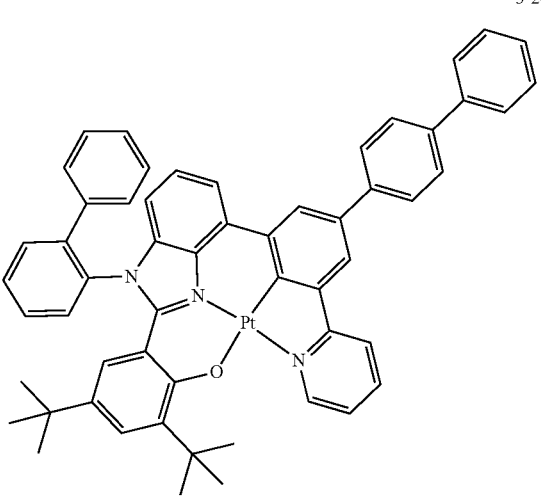
-continued
3-248
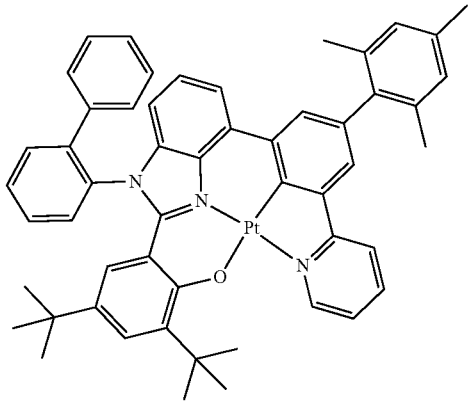
3-249
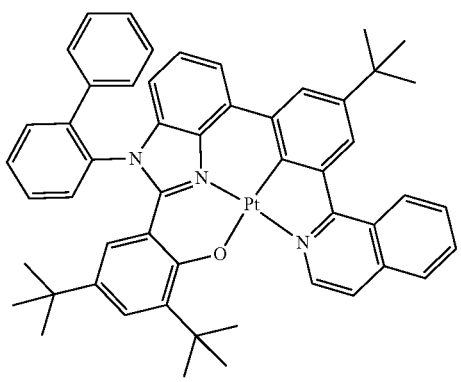
3-250
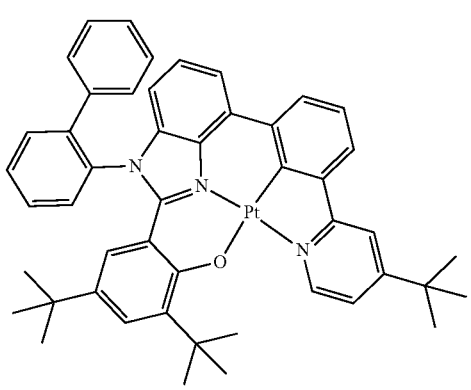
3-251
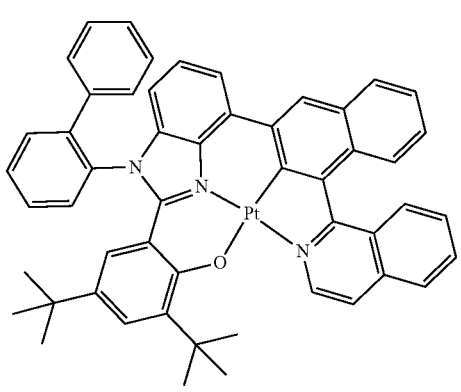

3-252
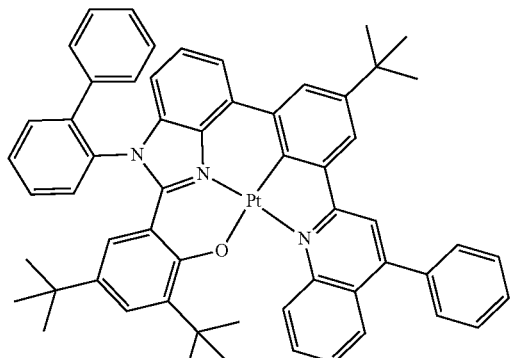
3-253
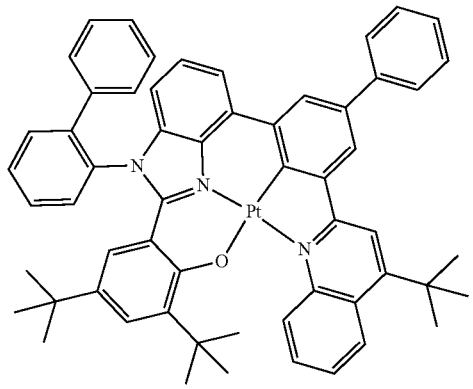
3-254
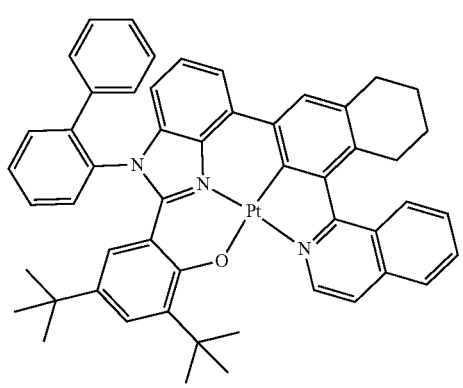
3-255
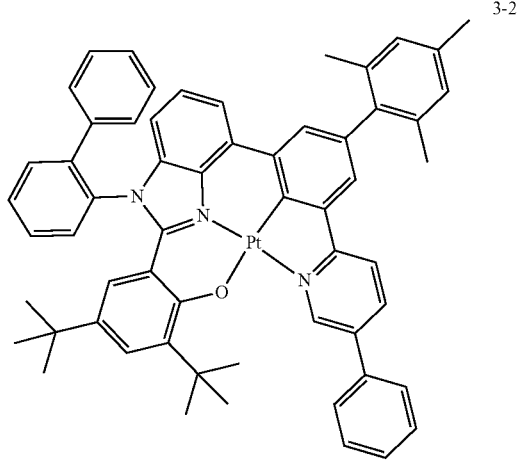
3-256
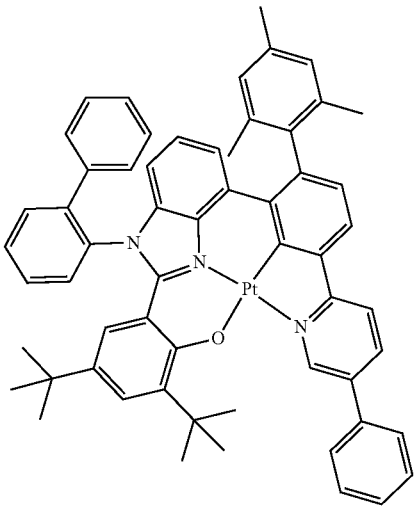
3-257
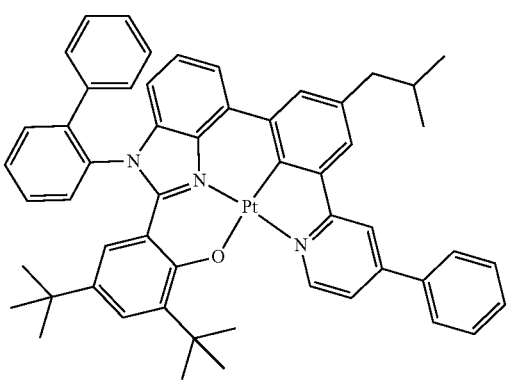
3-258
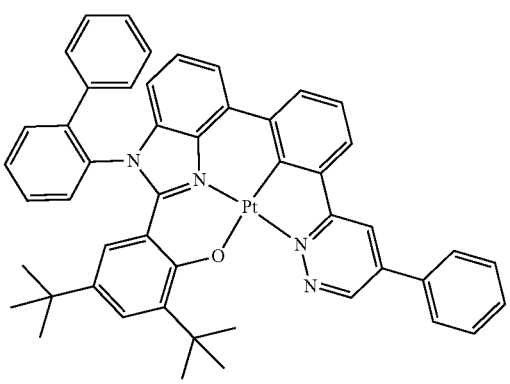

3-259
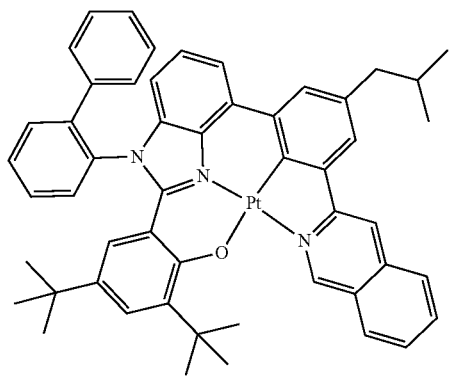
3-263
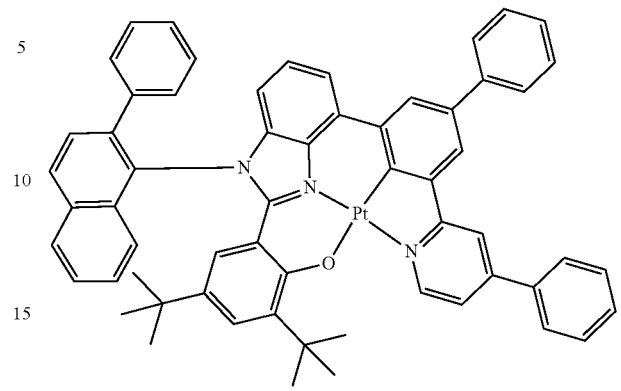
3-260
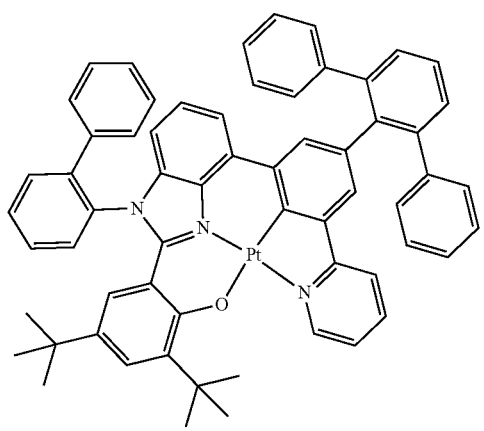
3-264
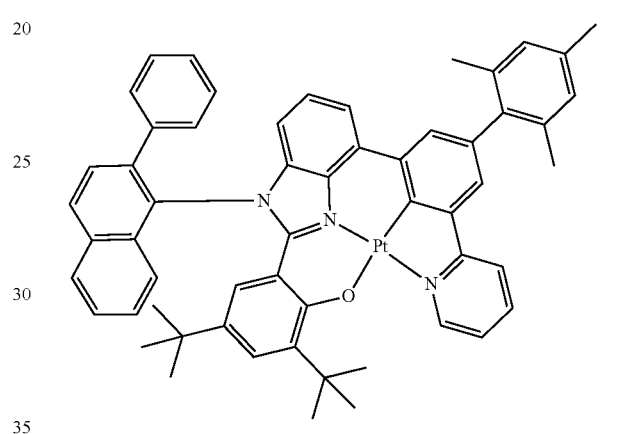
3-261
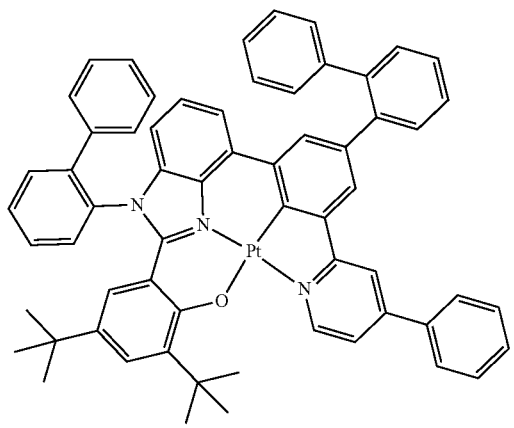
3-265
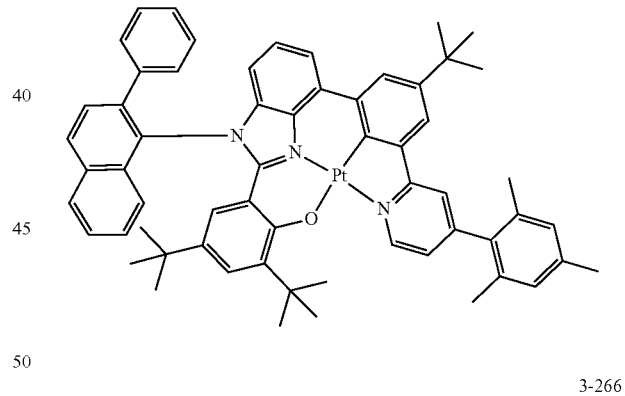
3-262
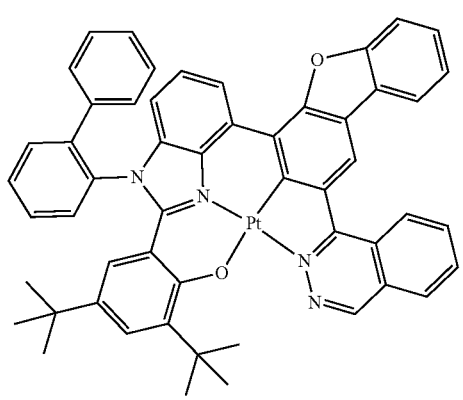
3-266
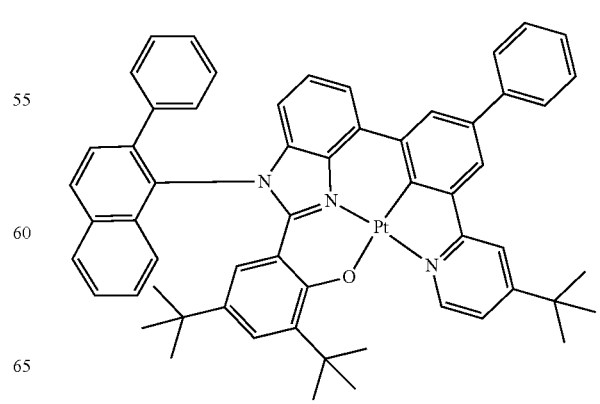

3-267
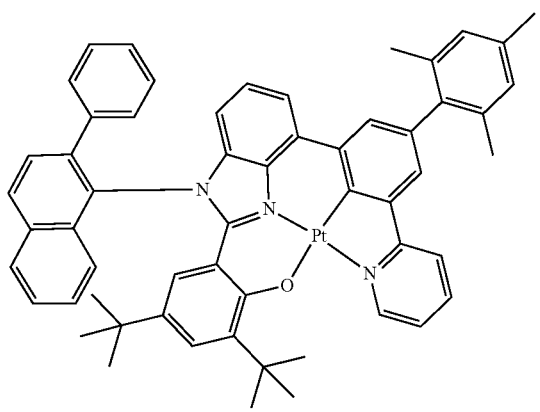
3-268
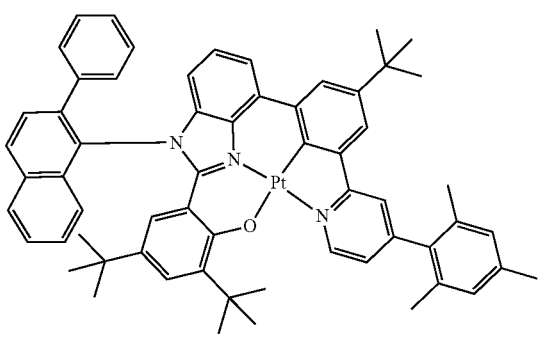
3-269
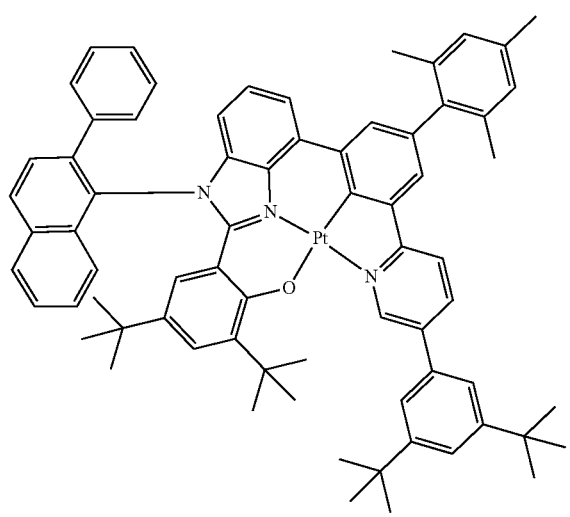
3-270
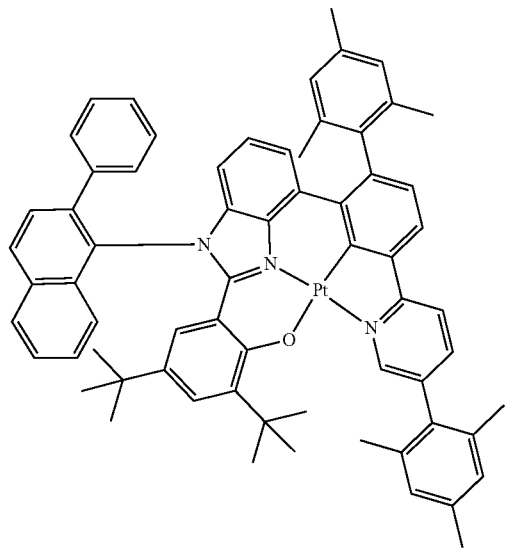
3-271
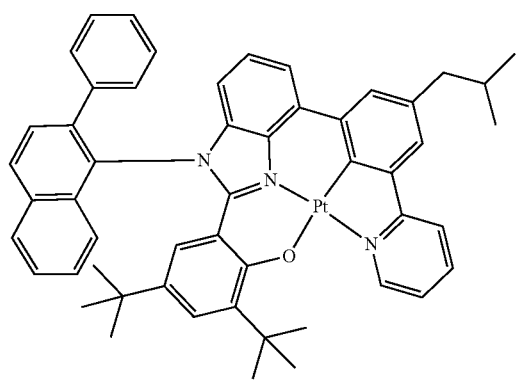
3-272
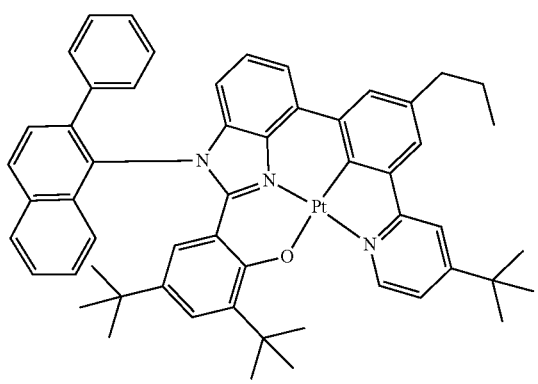

3-273
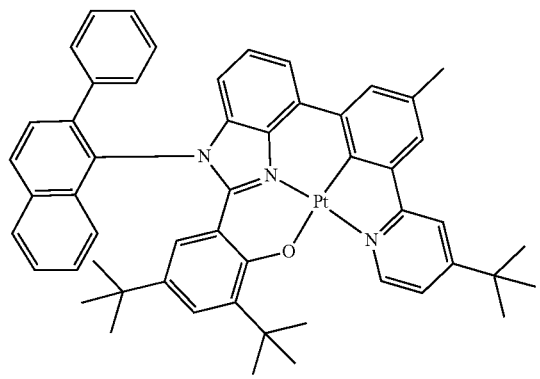
3-274
3-275
3-276
3-277
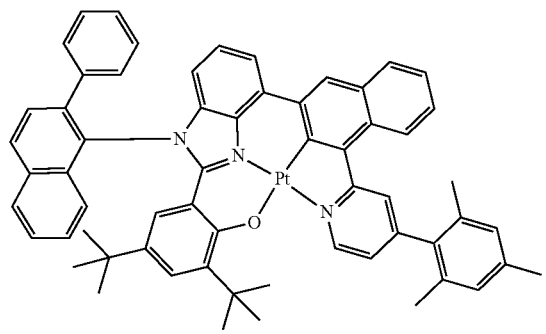
3-278
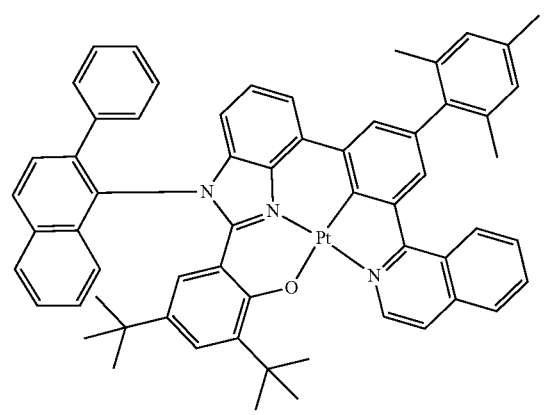
3-279
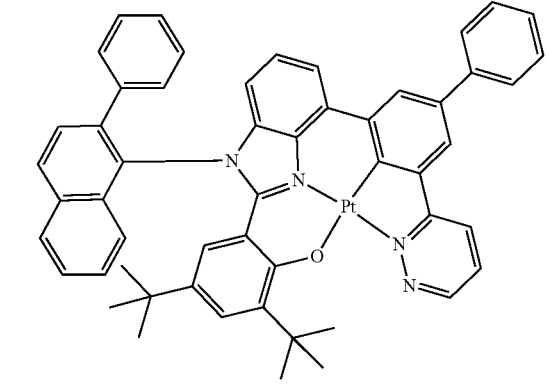
3-280
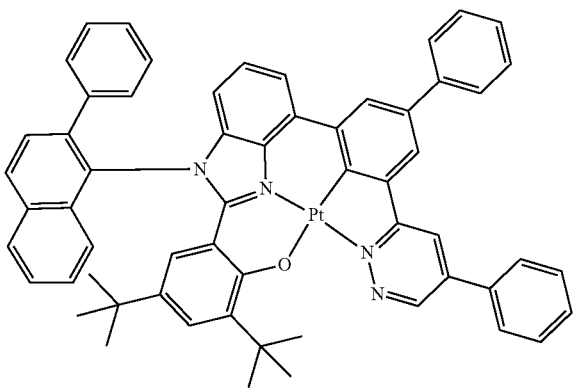

-continued
3-281
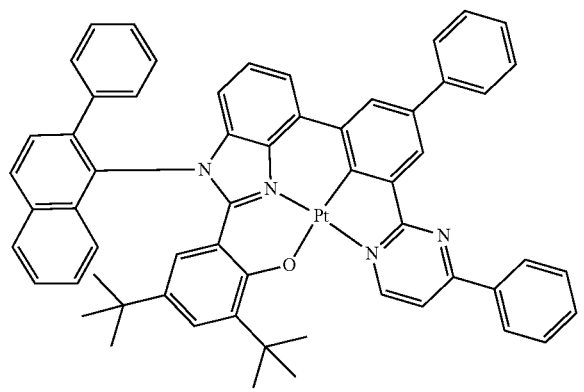
3-282
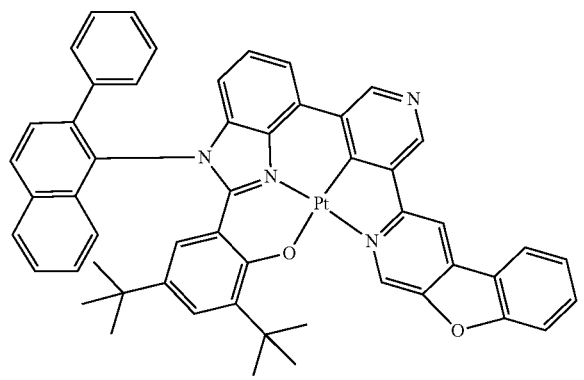
3-283
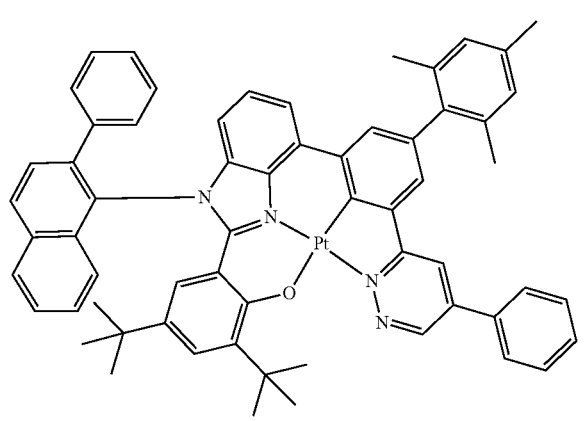
3-284
-continued
3-285
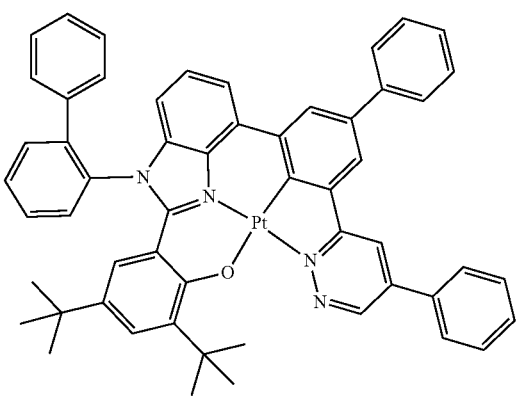
3-286
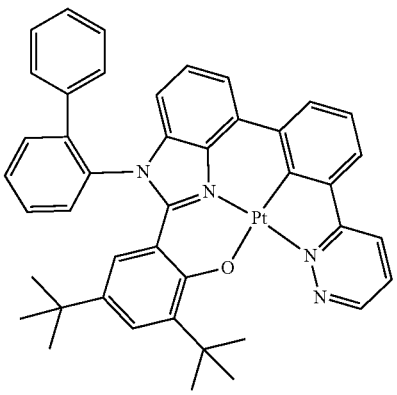
3-287
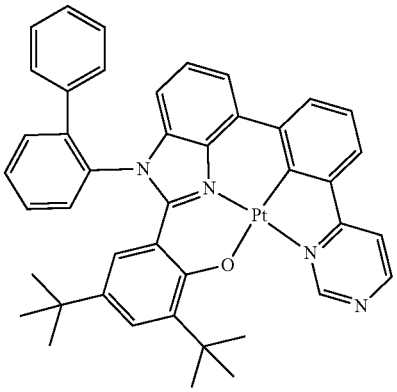
3-288
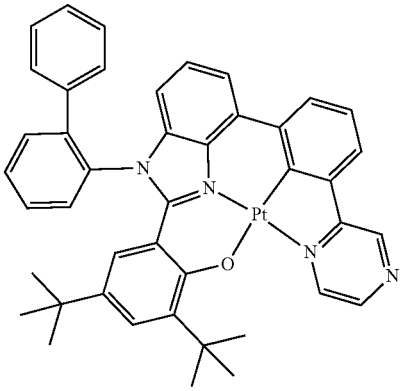

3-289
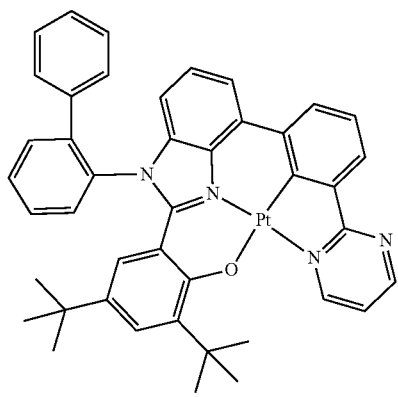
3-290
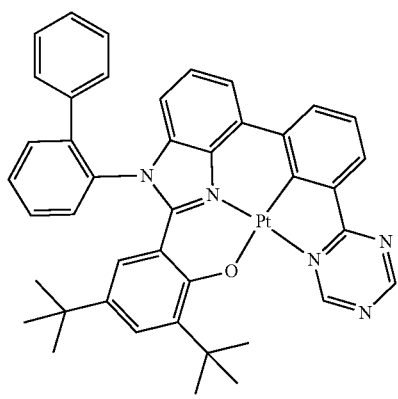
3-291
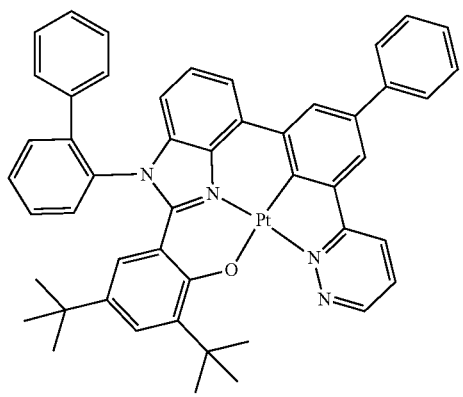
3-292
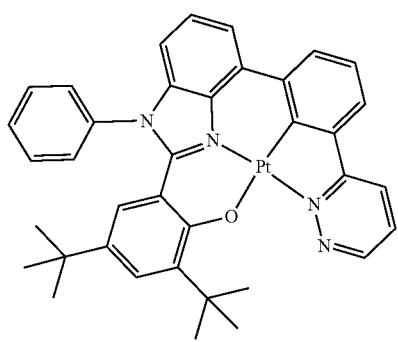
3-293
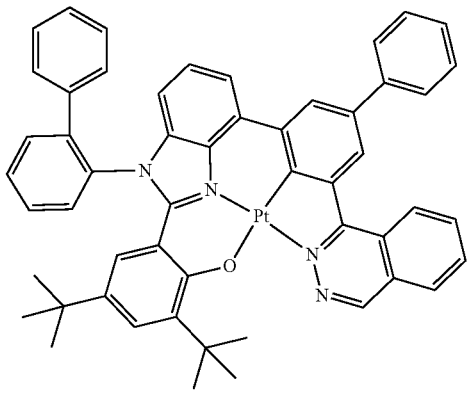
3-294
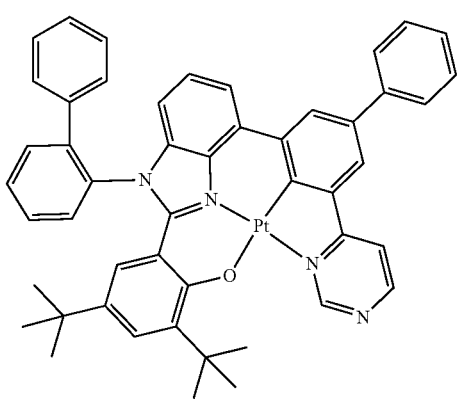
3-295
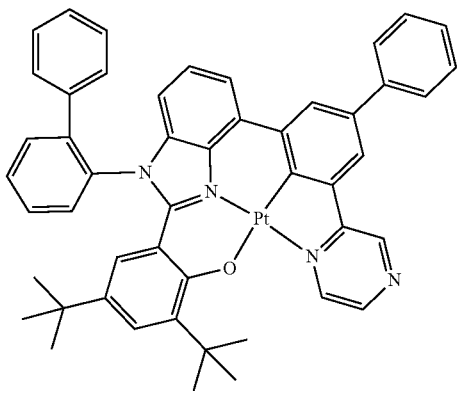
3-296
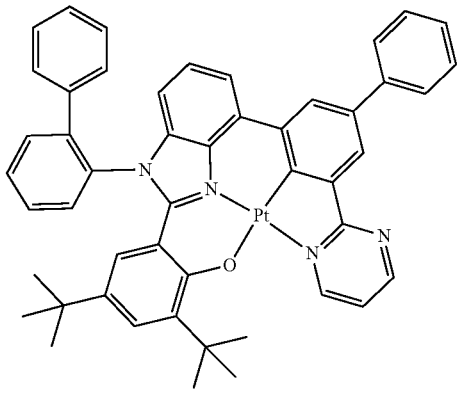

3-297
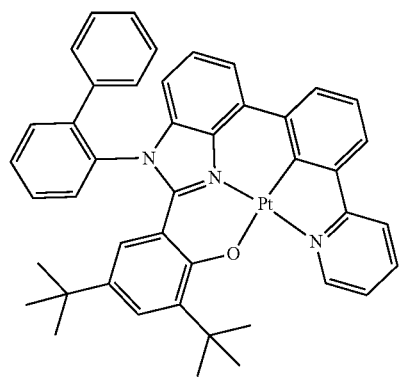
3-298
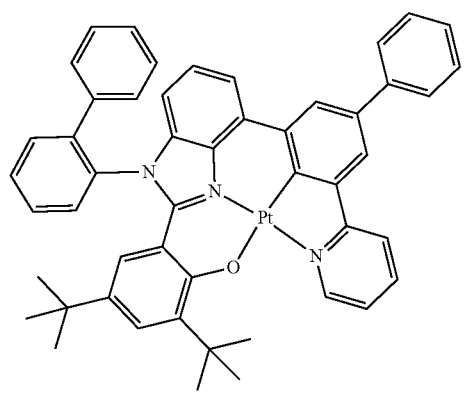
3-299
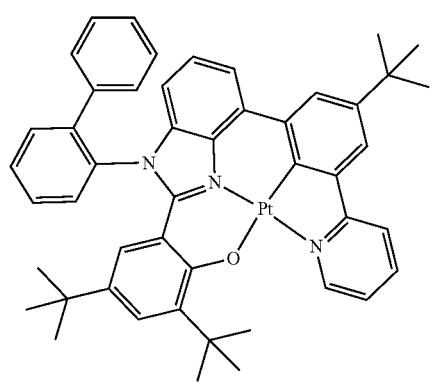
3-300
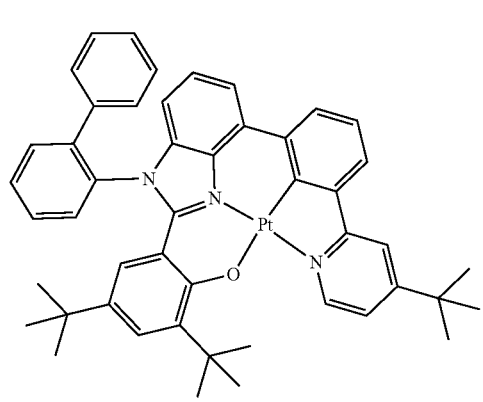
3-301
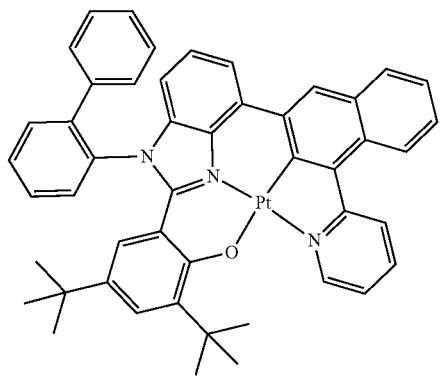
3-302
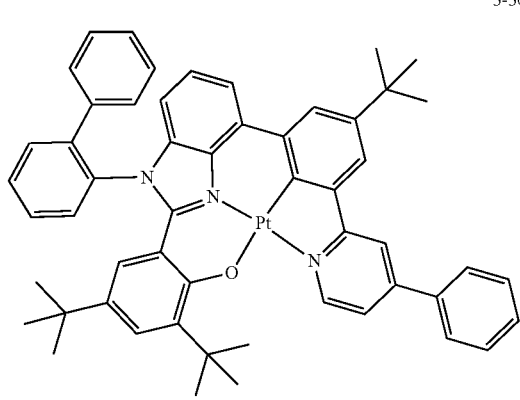
3-303
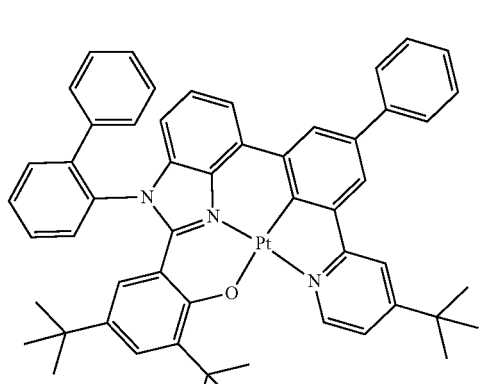
3-304
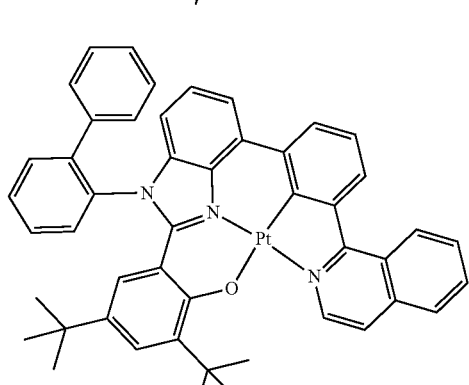

3-305
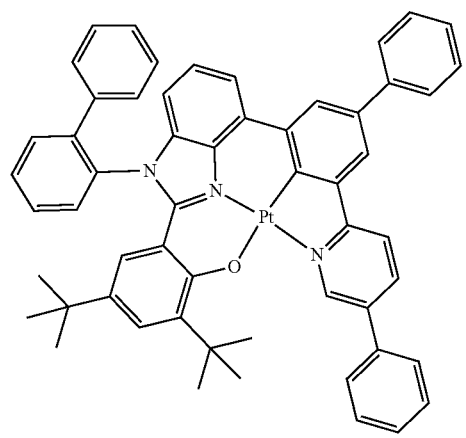
3-306
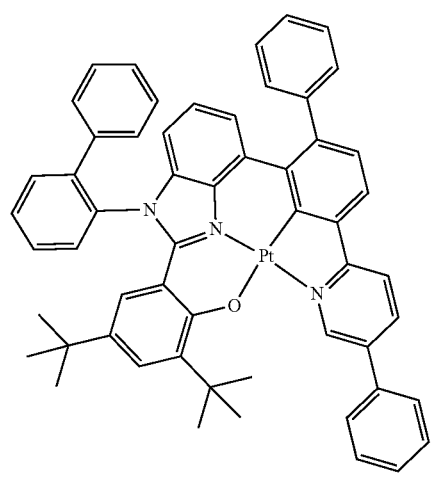
3-307
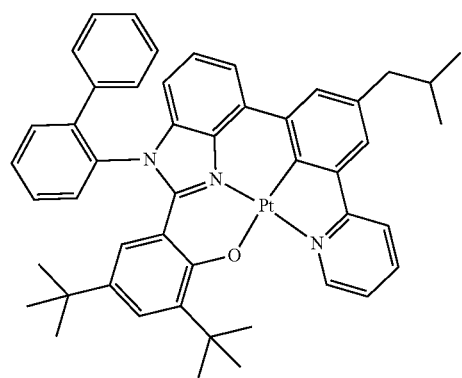
3-308
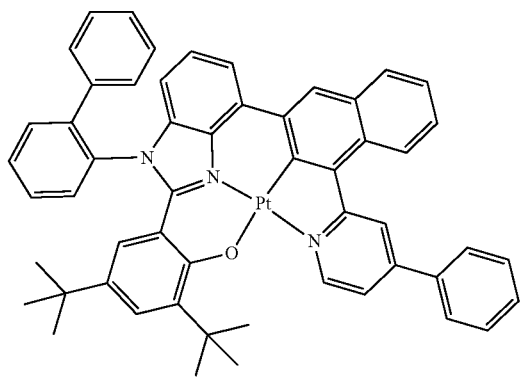
3-309
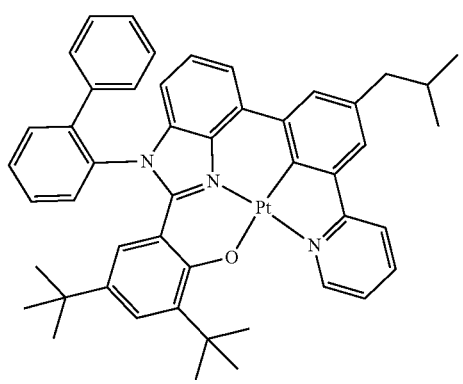
3-310
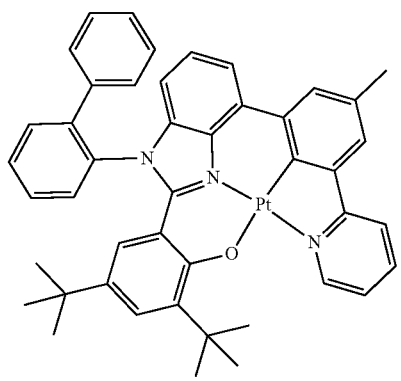
3-311
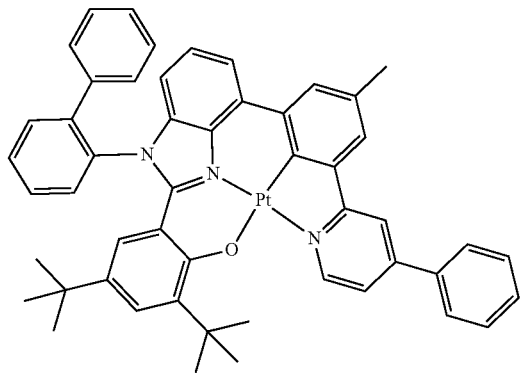

-continued
3-312
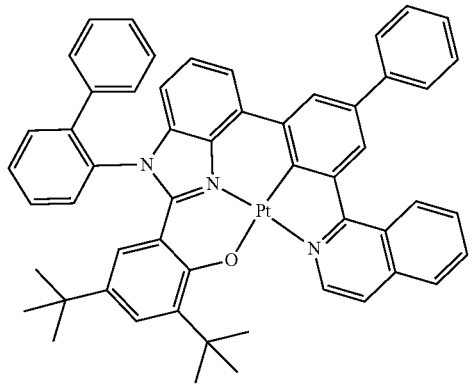
3-313
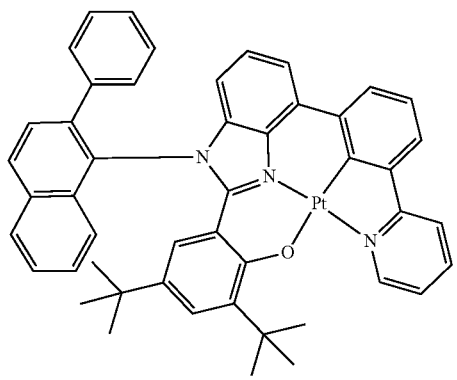
3-314
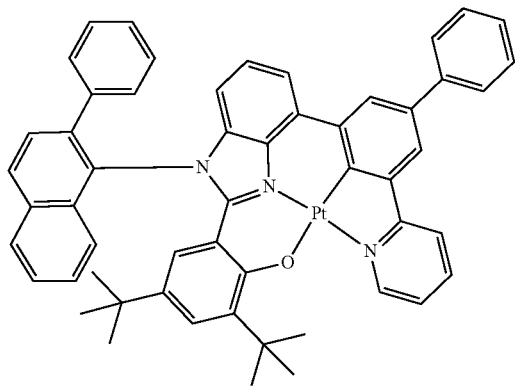
3-315
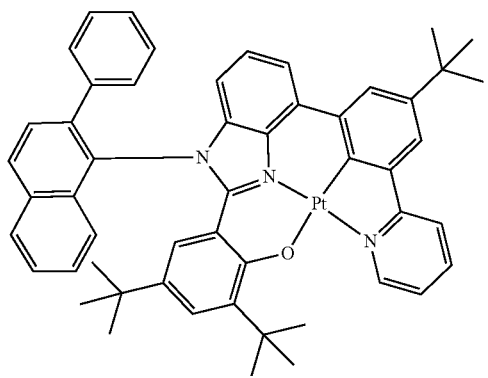
-continued
3-316
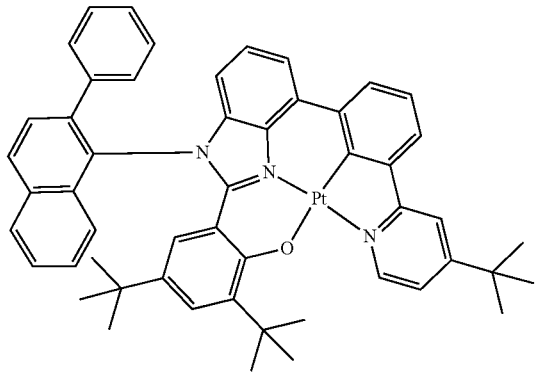
3-317
3-318
3-319
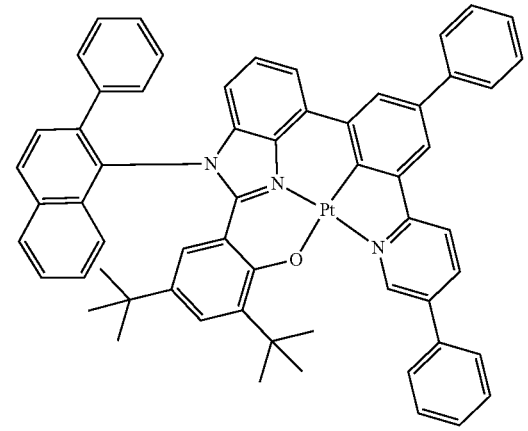

3-320
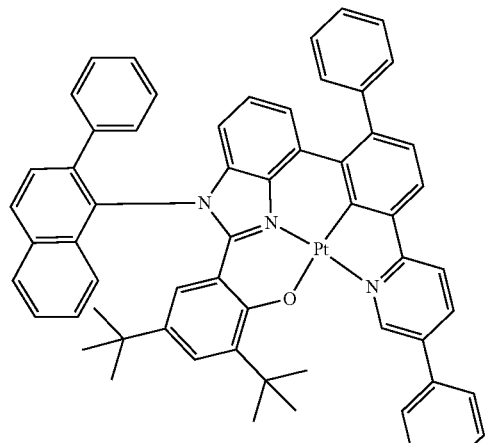
3-321
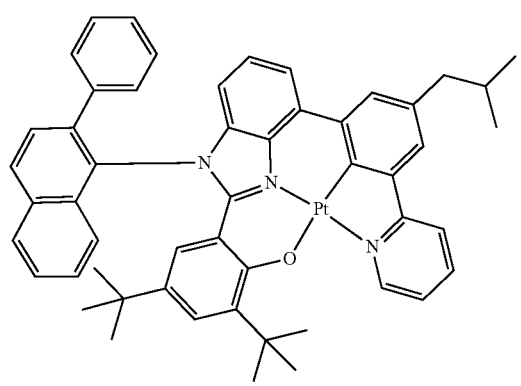
3-322
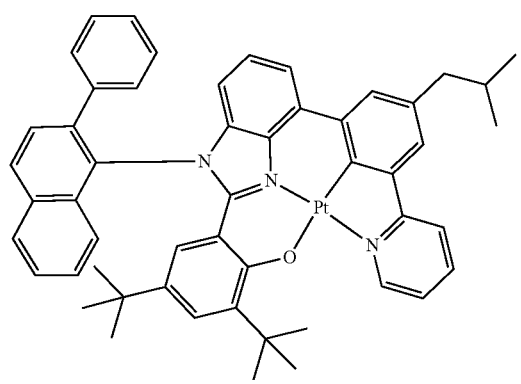
3-323
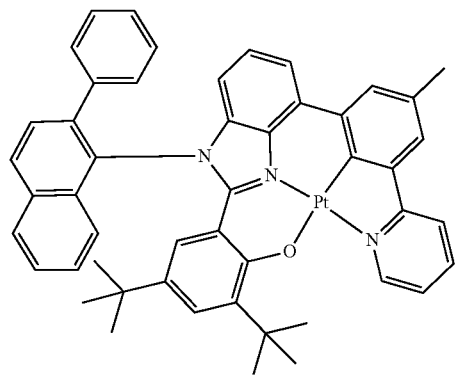
3-324
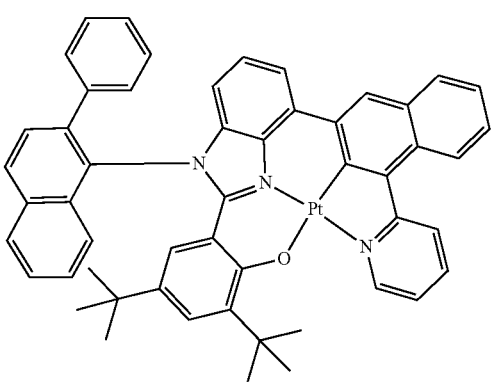
3-325
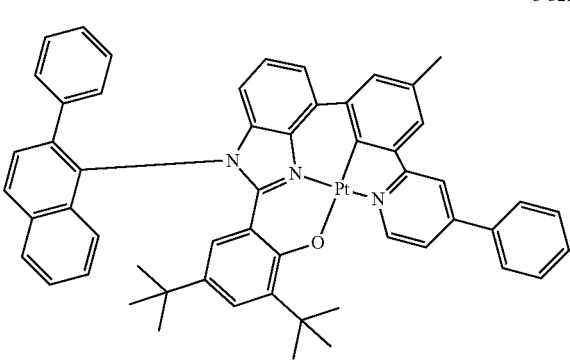
3-326
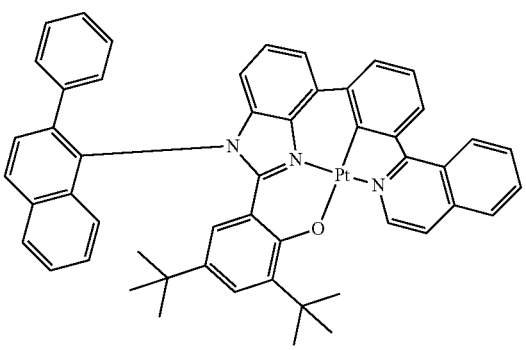
3-327
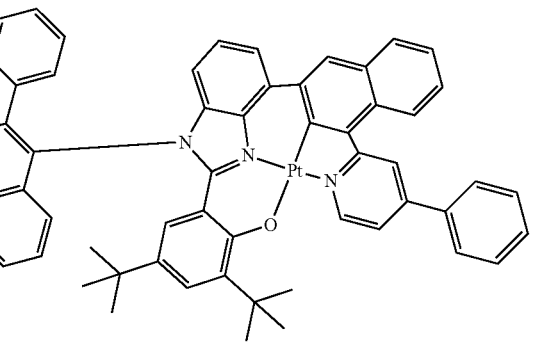

3-328
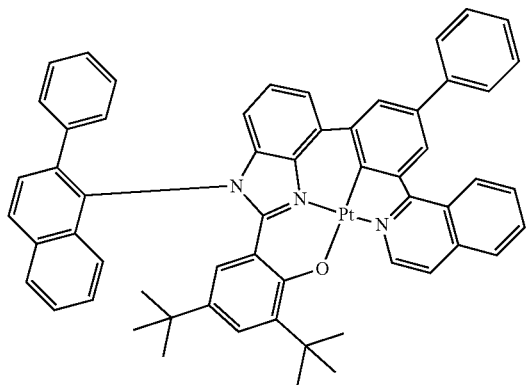
3-329
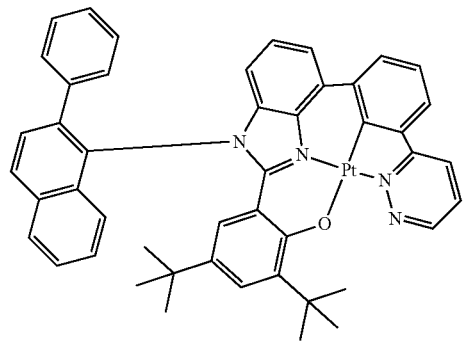
3-330
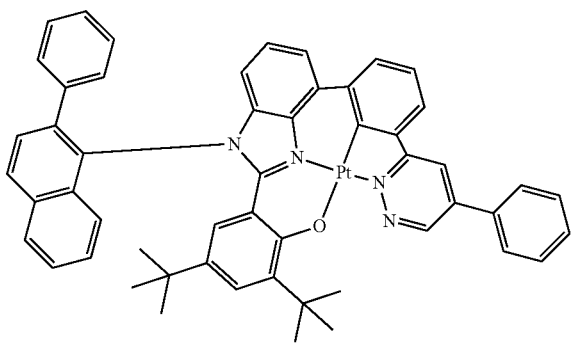
3-331
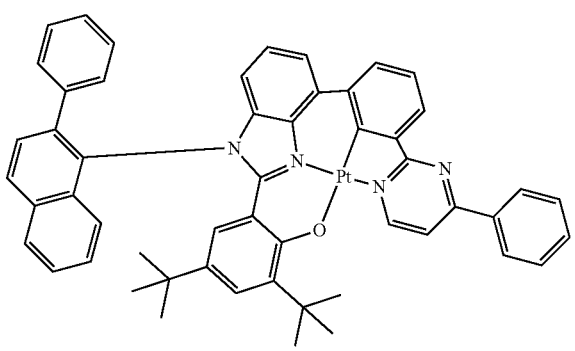
3-332
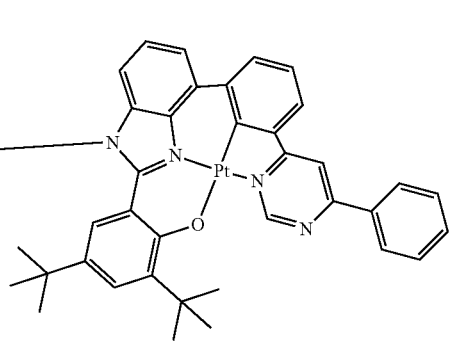
3-333
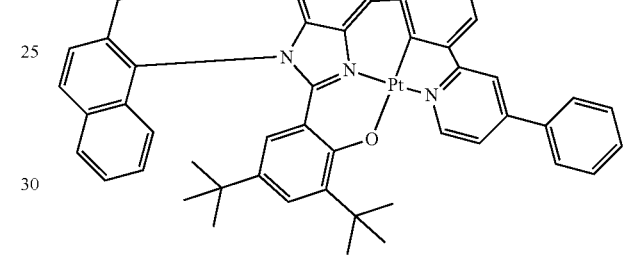
3-334
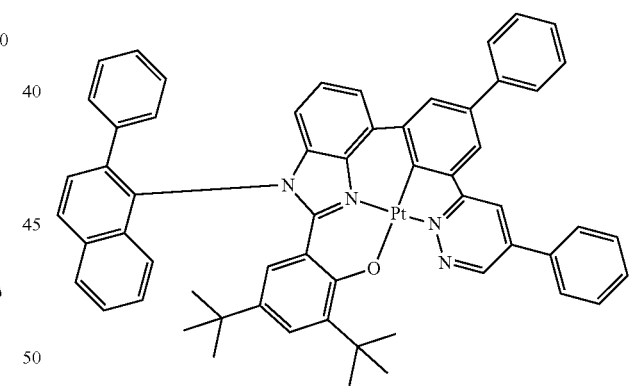
3-335
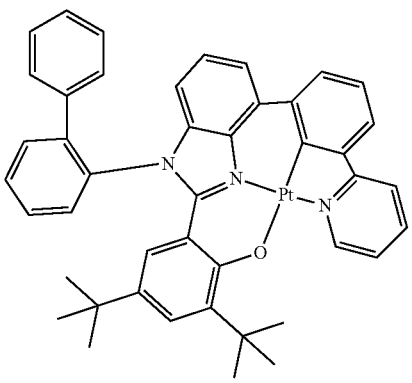

3-336
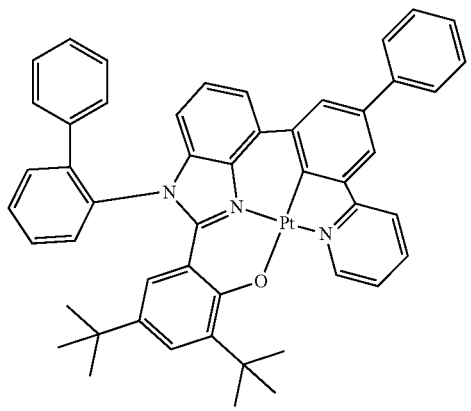
3-337
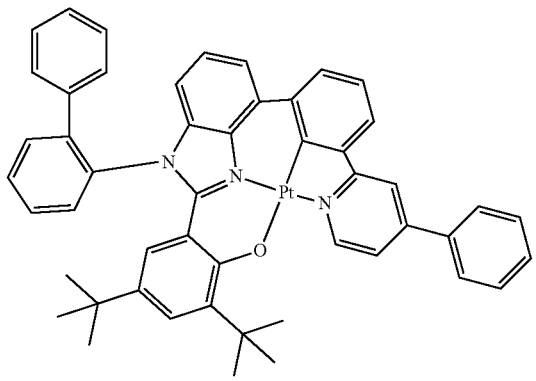
3-338
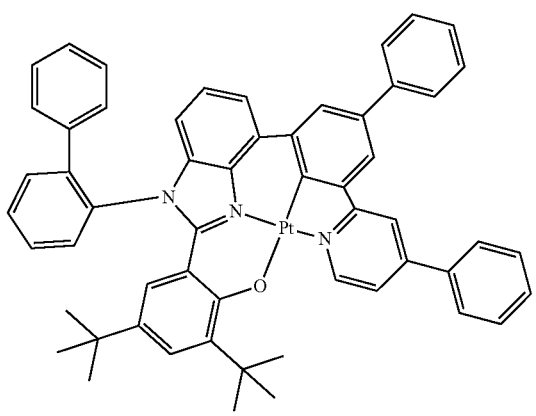
3-339
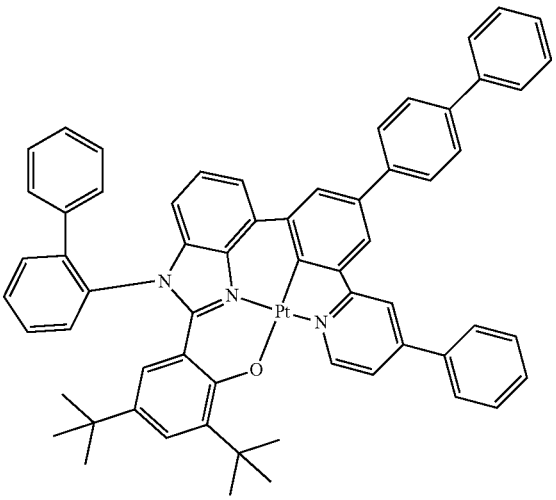
3-340
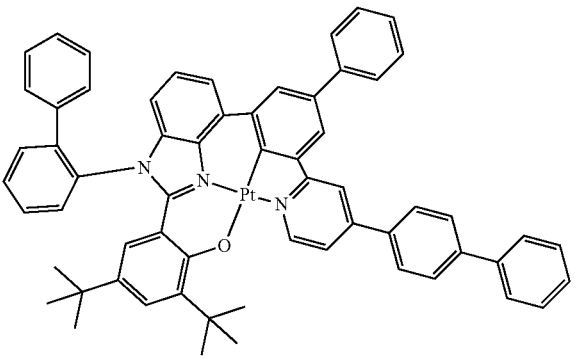
3-341
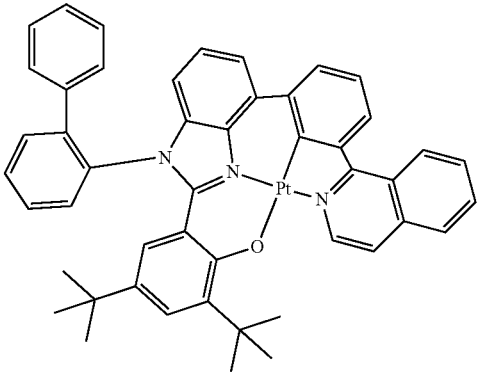

-continued
3-342
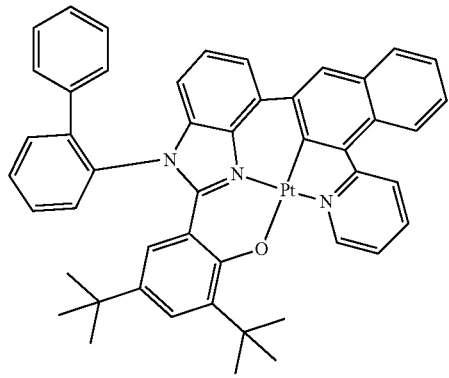
3-343
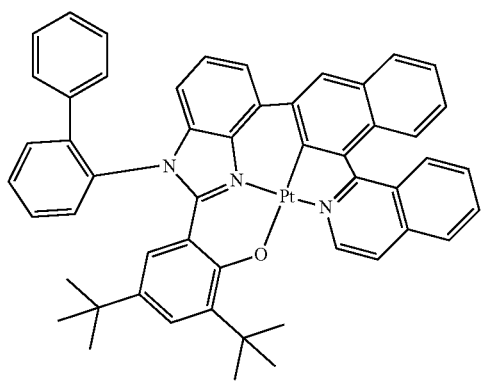
3-344
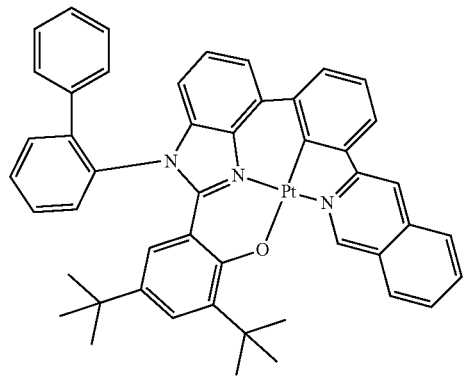
3-345
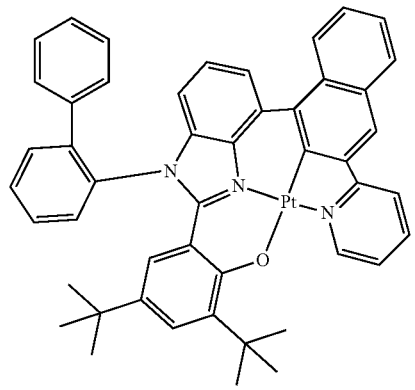
-continued
3-346
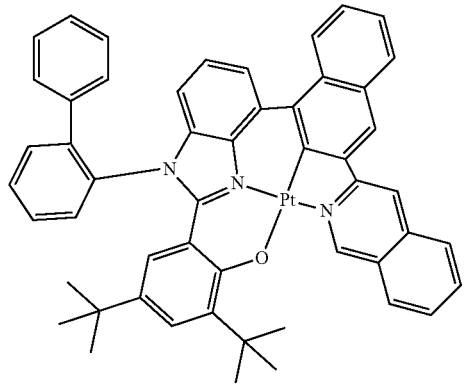
3-347
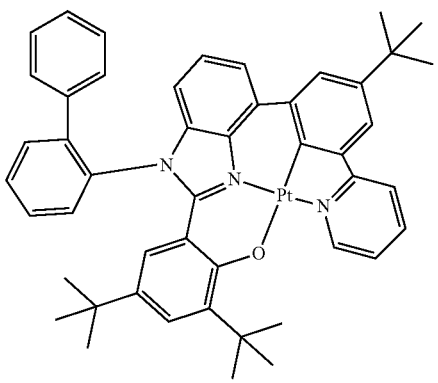
3-348
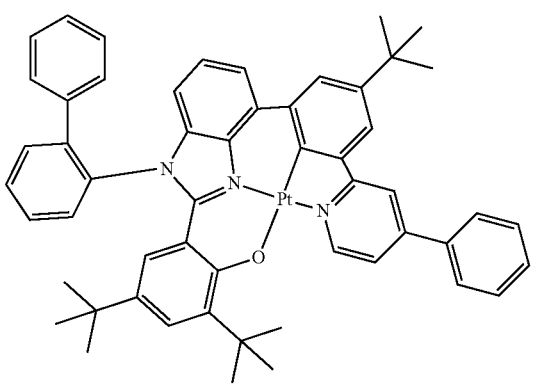
3-349
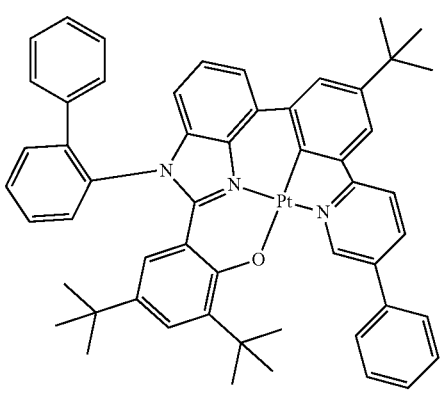

-continued
3-350
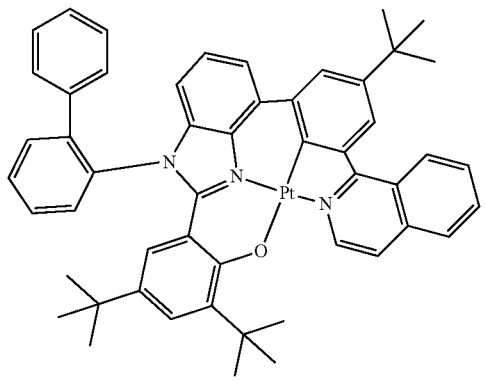
3-351
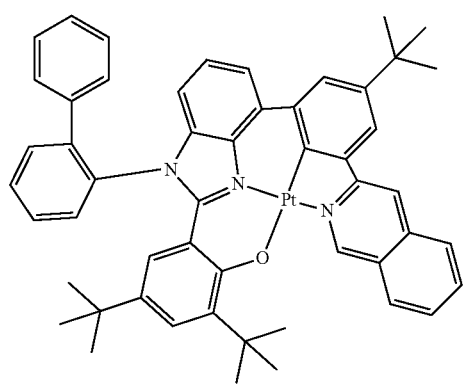
3-352
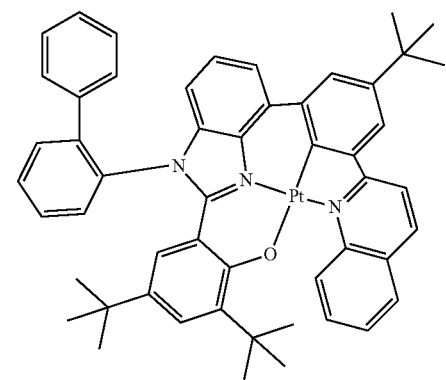
3-353
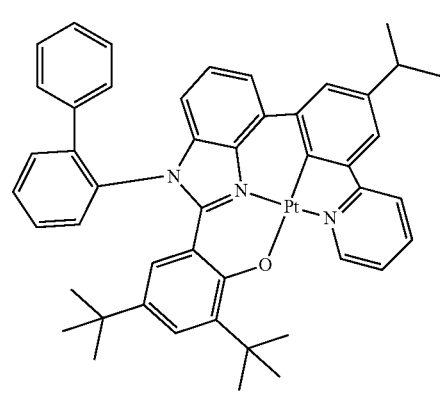
-continued
3-354
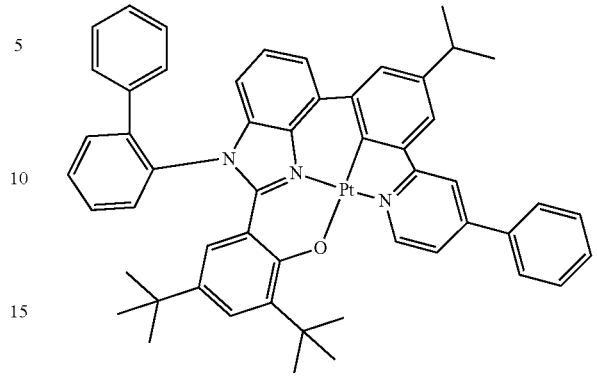
3-355
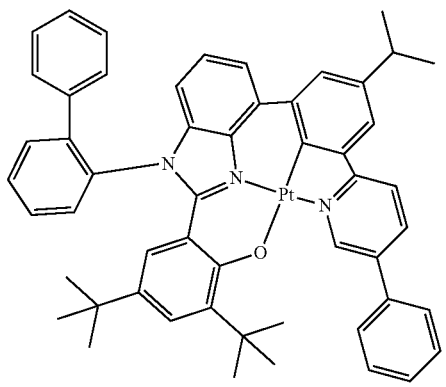
3-356
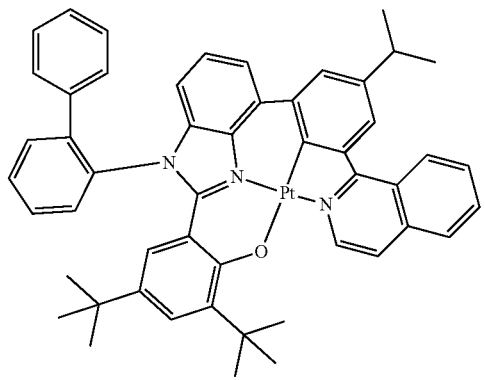
3-357
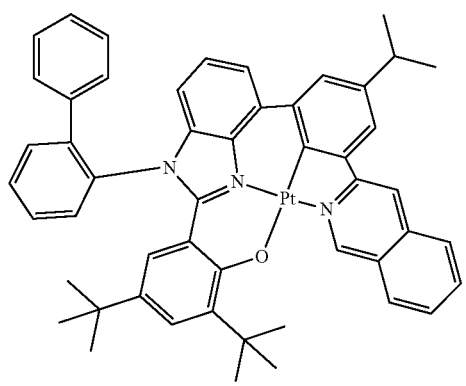

-continued
3-358
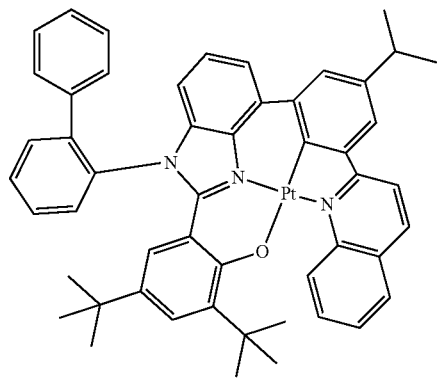
3-359
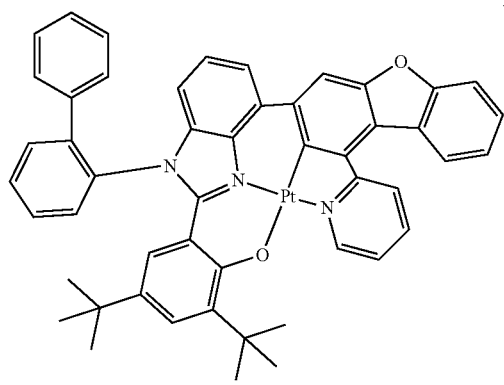
3-360
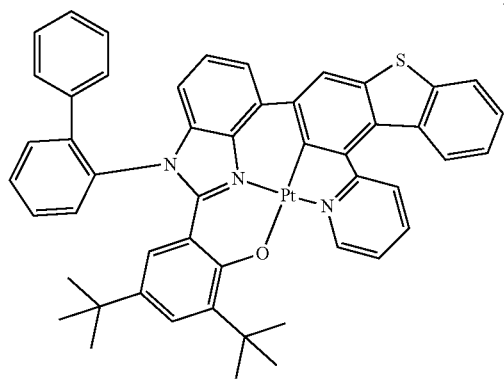
3-361
-continued
3-362
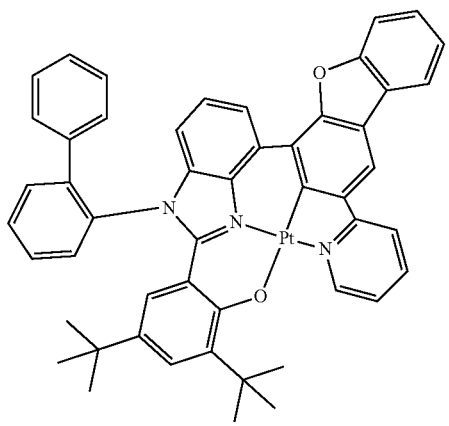
3-363
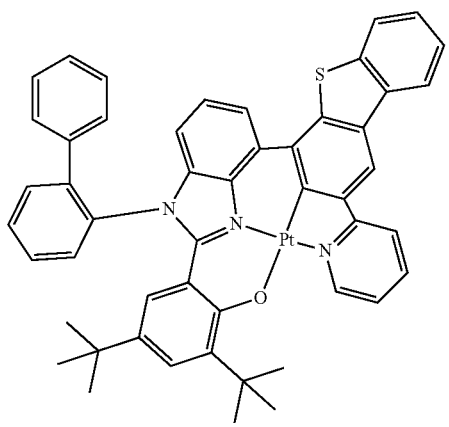
3-364
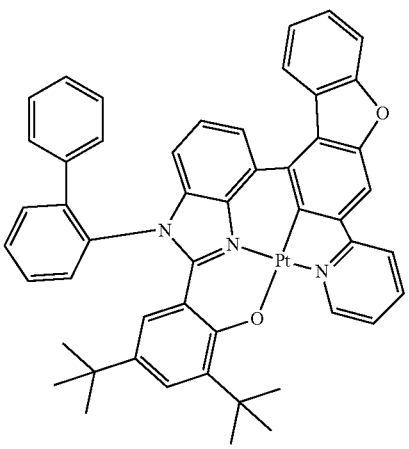

3-365
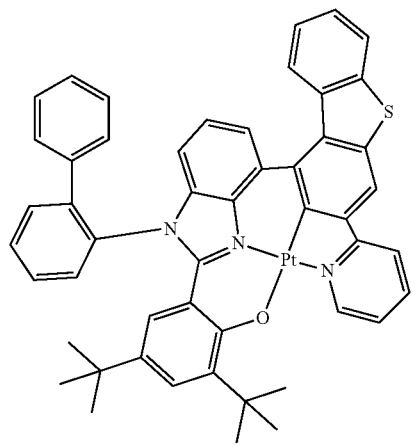
3-366
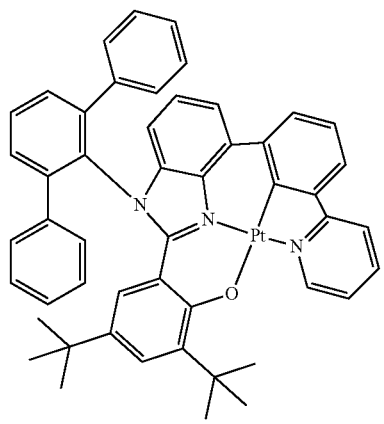
3-367
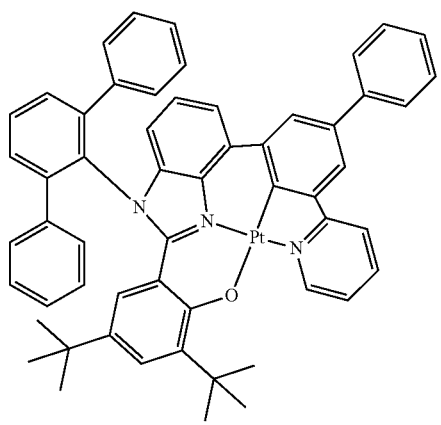
3-368
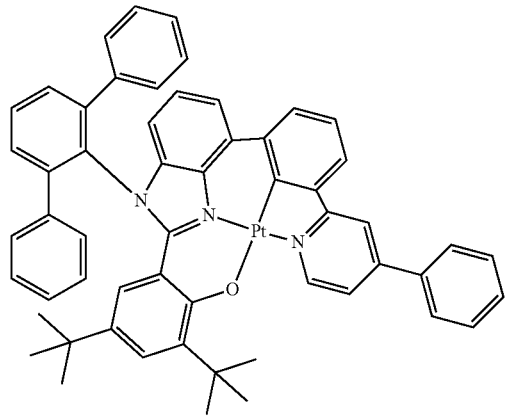
3-369
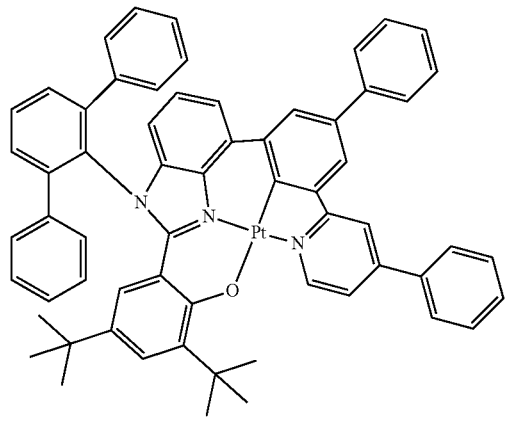
3-370
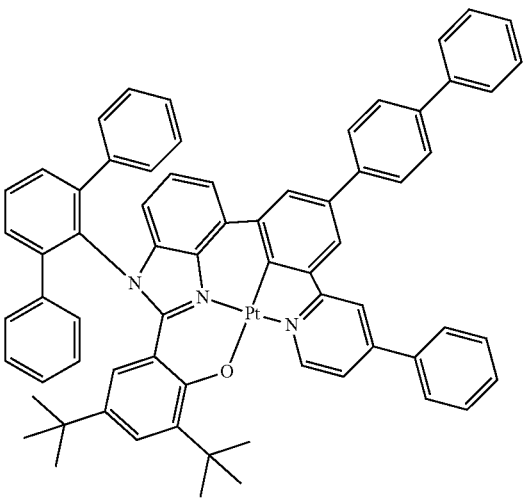

3-371
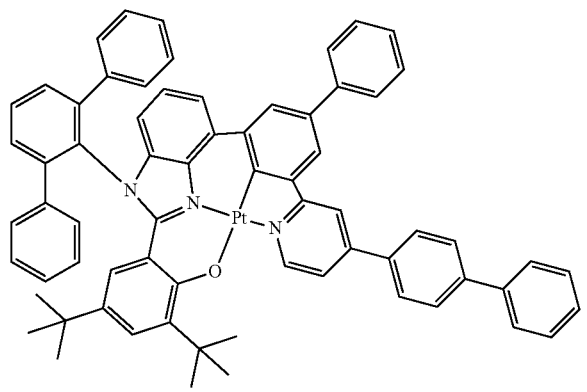
3-372
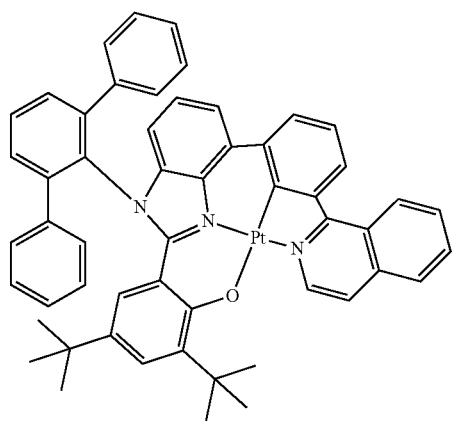
3-373
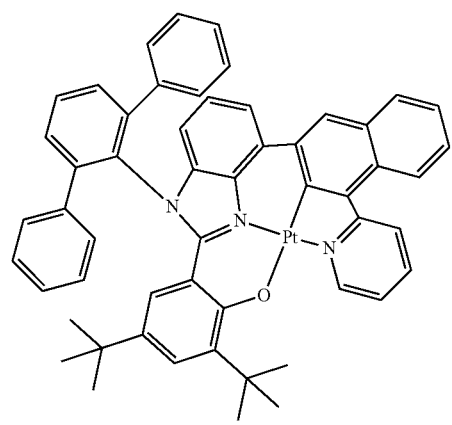
3-374
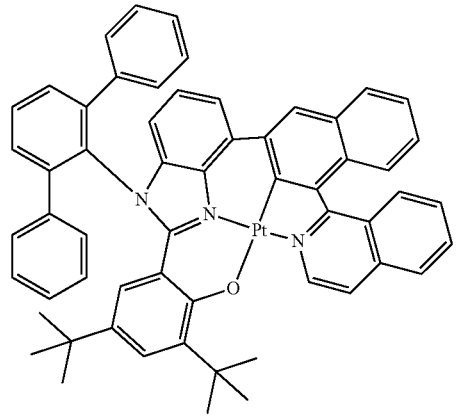
3-375
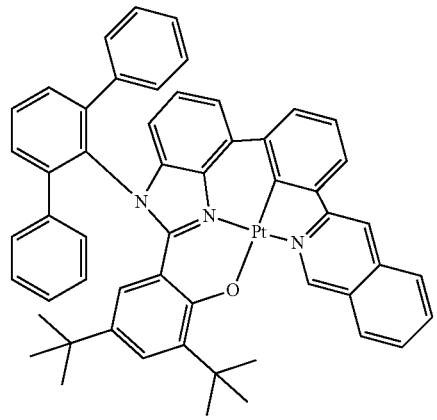
3-376
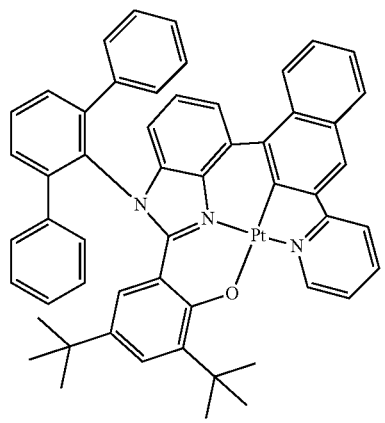

3-377
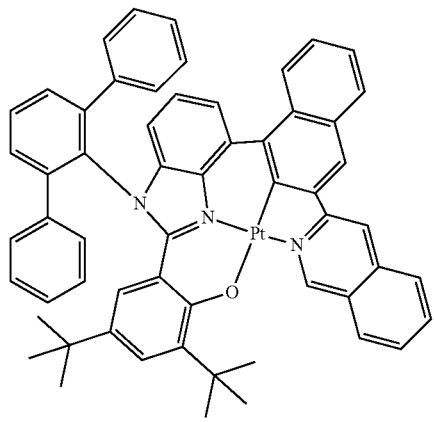
3-380
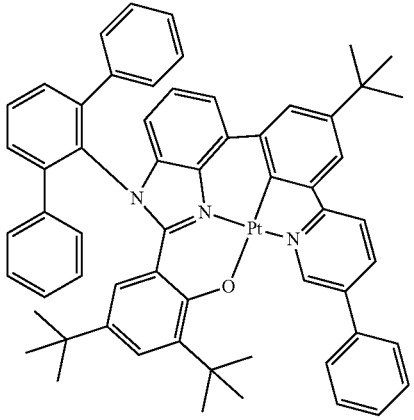
3-378
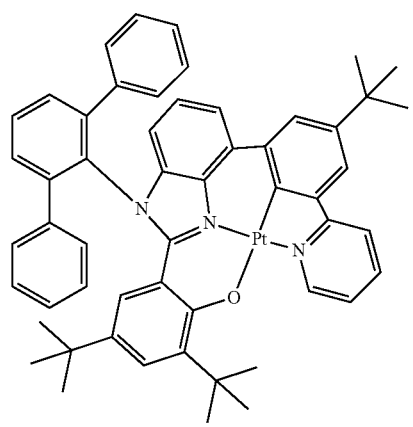
3-381
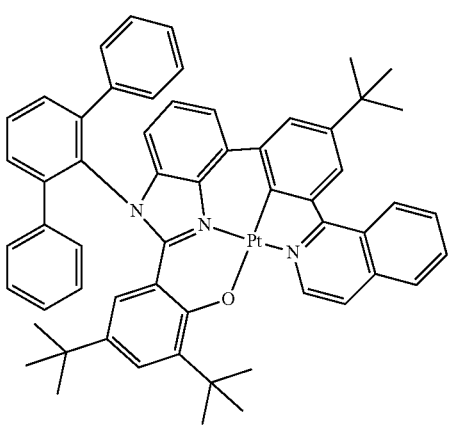
3-379
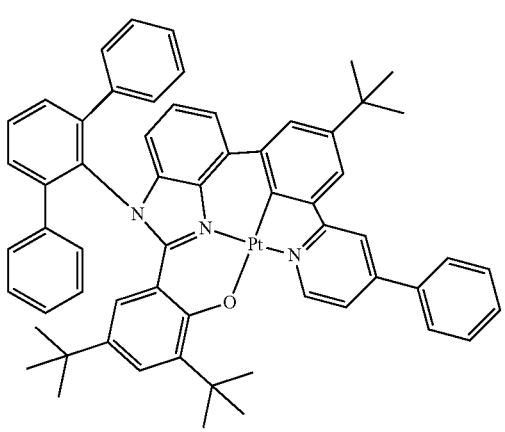
3-382
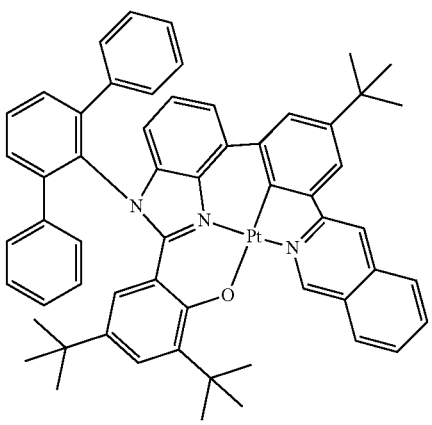

-continued
3-383
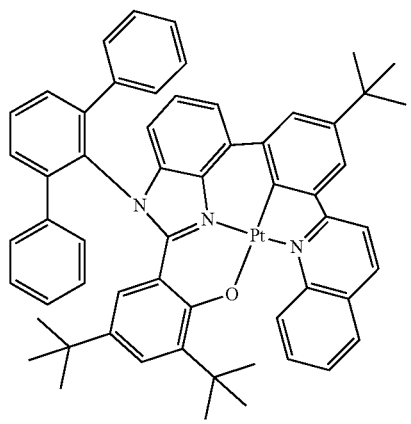
3-384
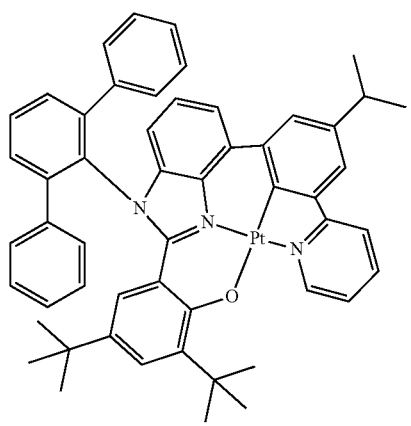
3-385
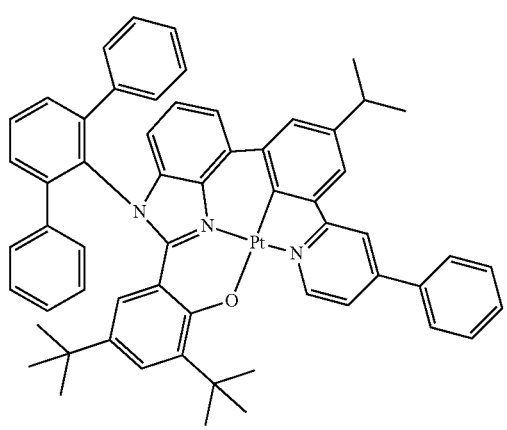
-continued
3-386
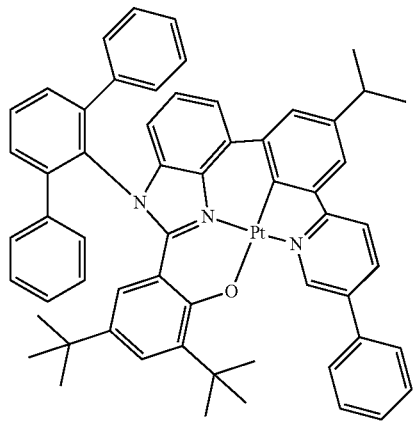
3-387
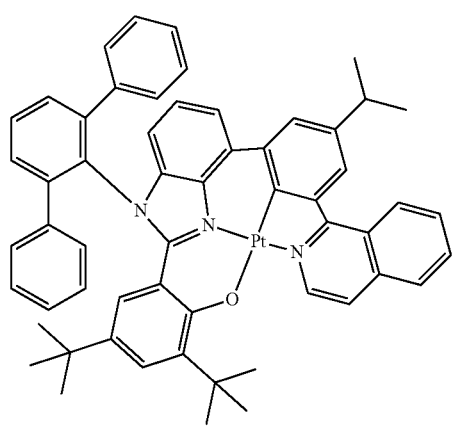
3-388
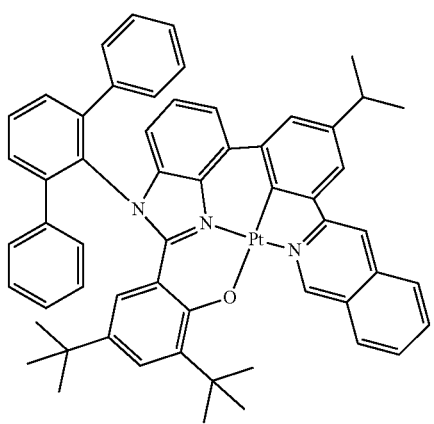

3-389
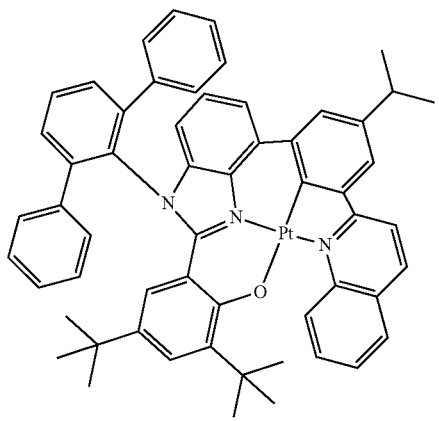
3-392
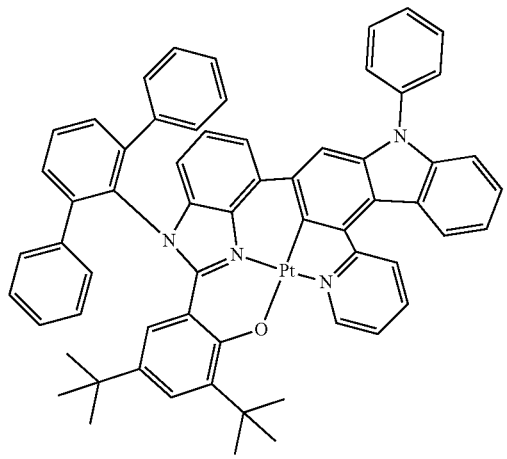
3-390
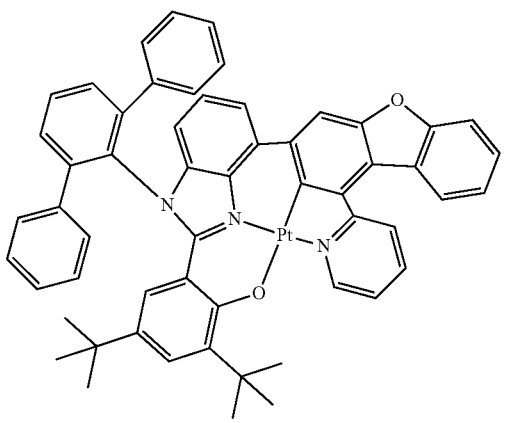
3-393
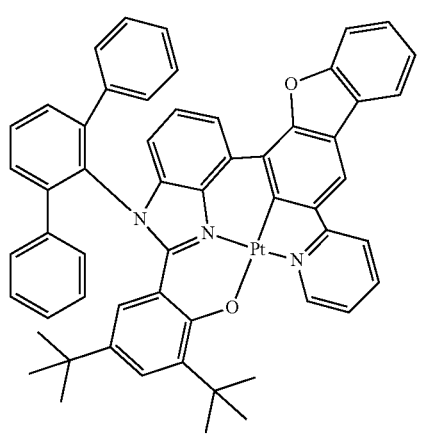
3-391
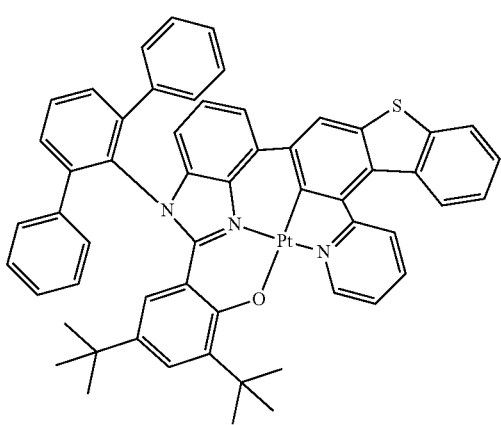
3-394
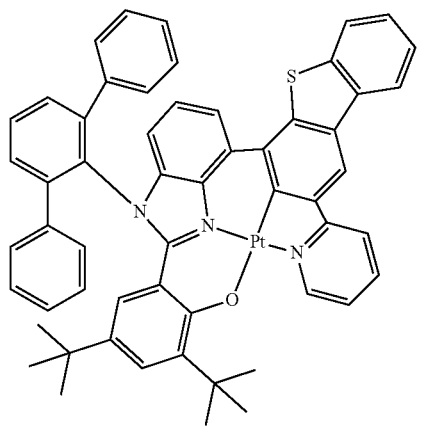

3-395
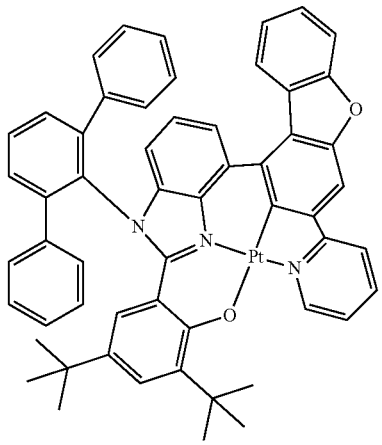
3-396
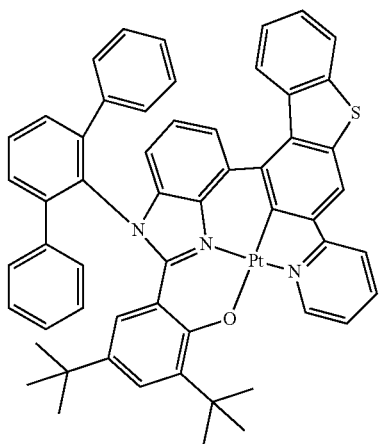
3-397
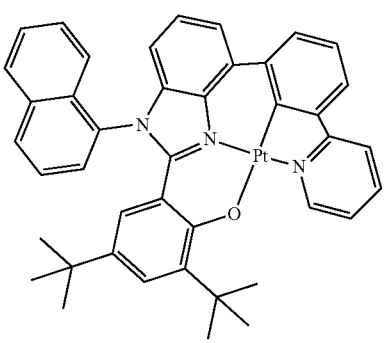
3-398
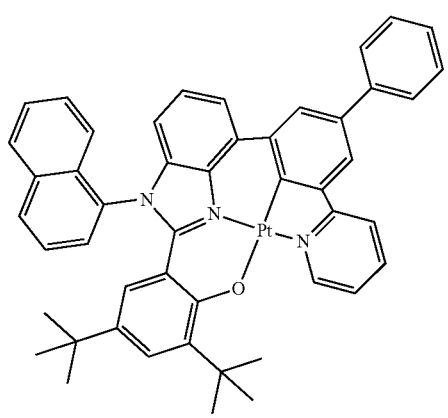
3-399
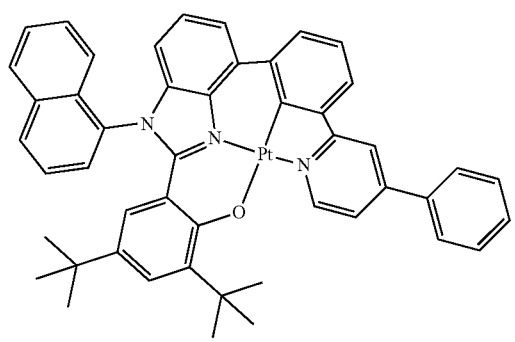
3-400
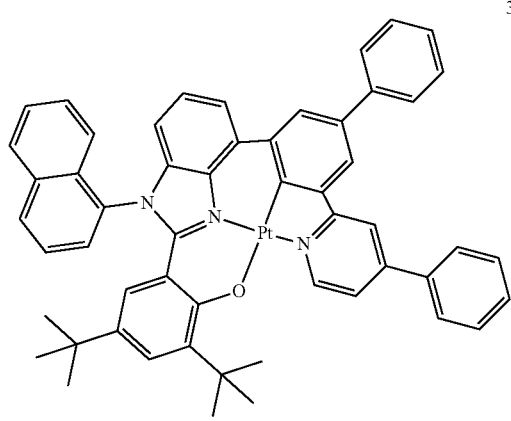
3-401
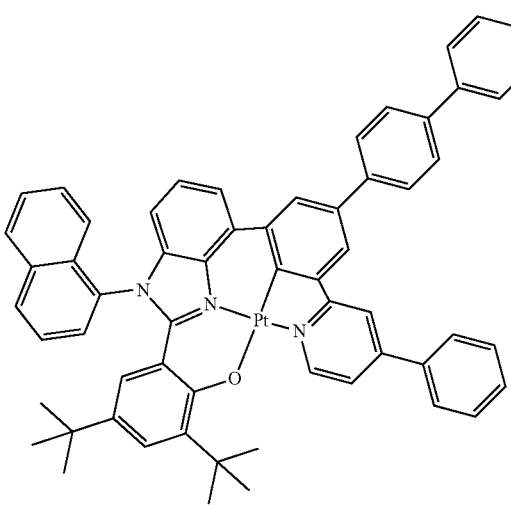

3-402
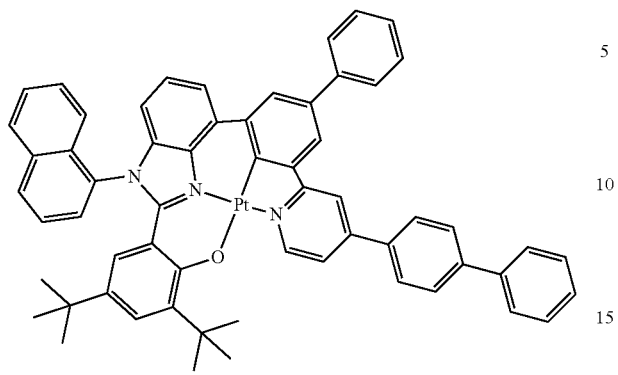
3-403
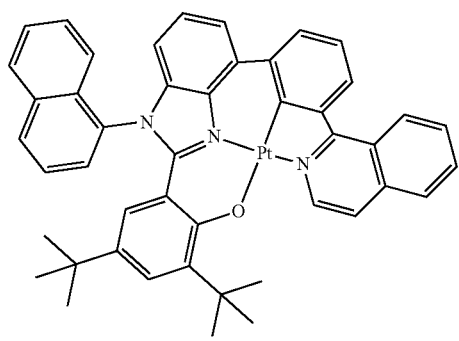
3-404
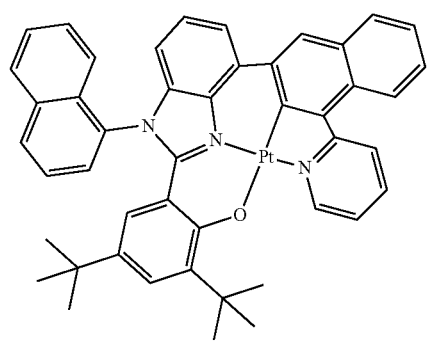
3-405
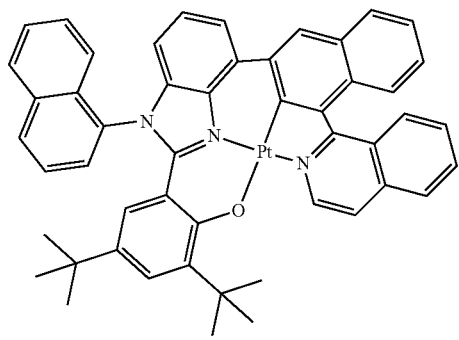
3-406
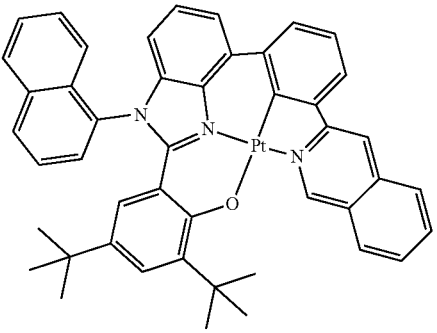
3-407
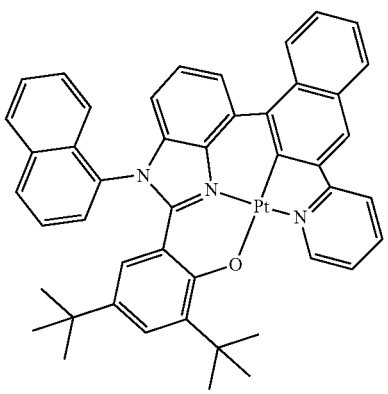
3-408
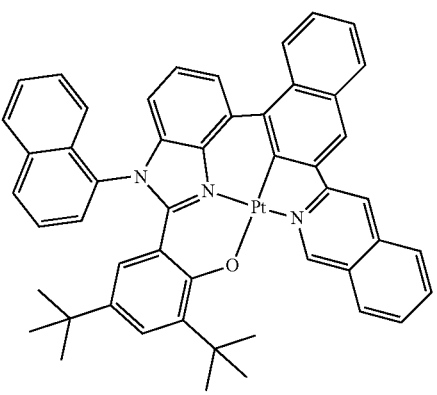
3-409
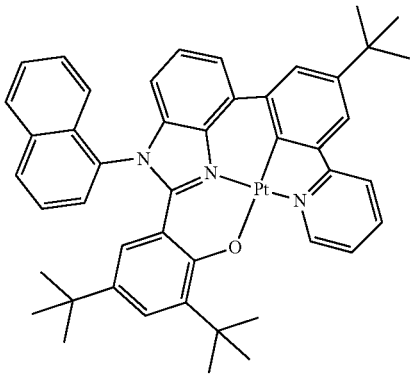

-continued
3-410
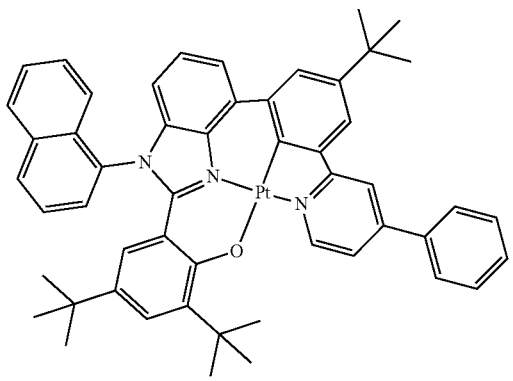
3-411
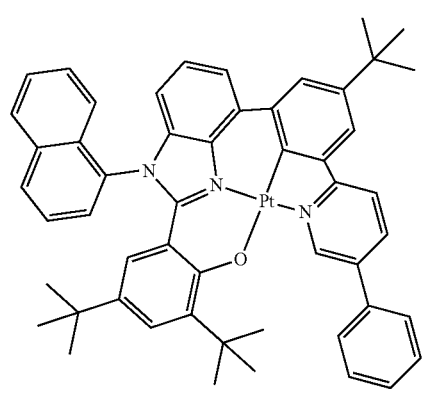
3-412
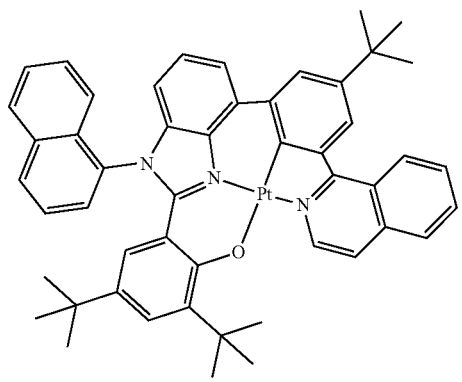
3-413
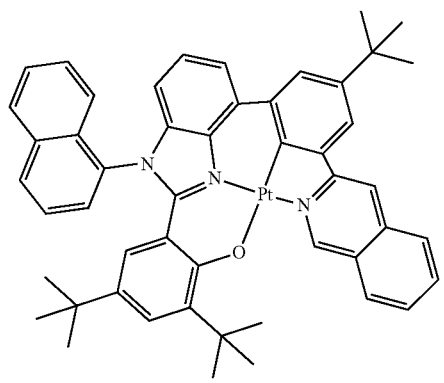
-continued
3-414
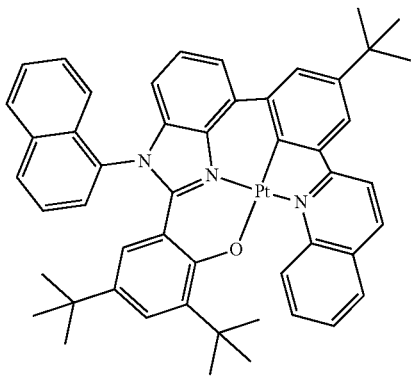
3-415
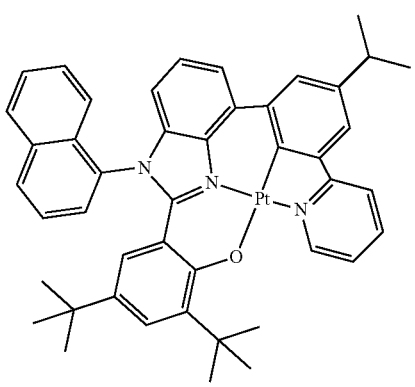
3-416
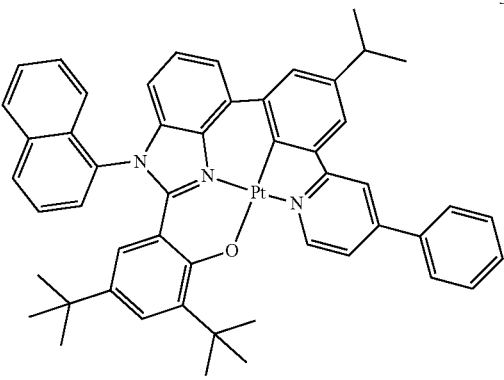
3-417
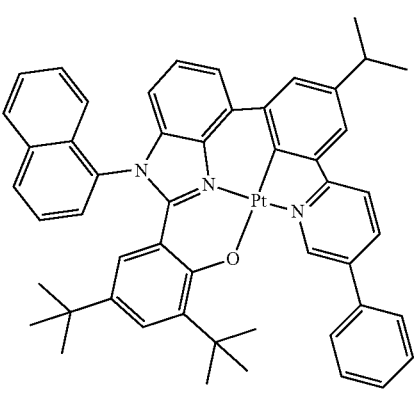

-continued
3-418
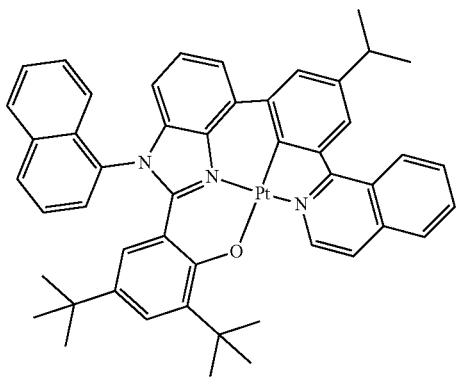
3-419
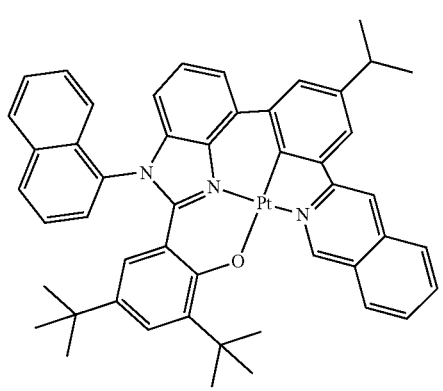
3-420
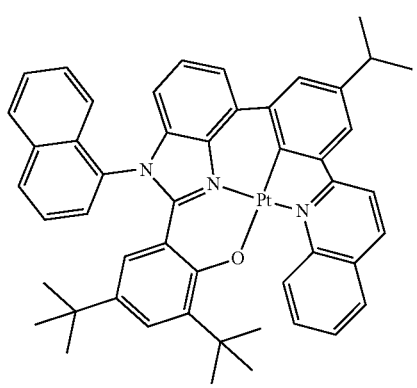
3-421
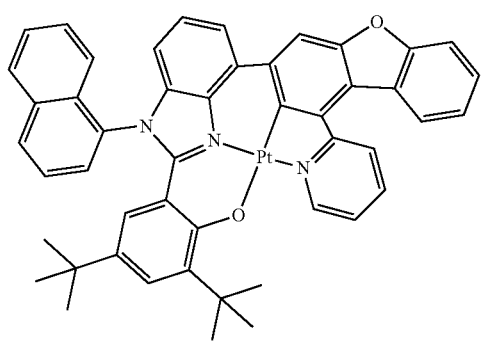
-continued
3-422
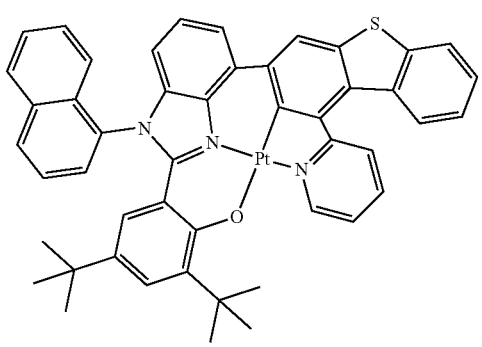
3-423
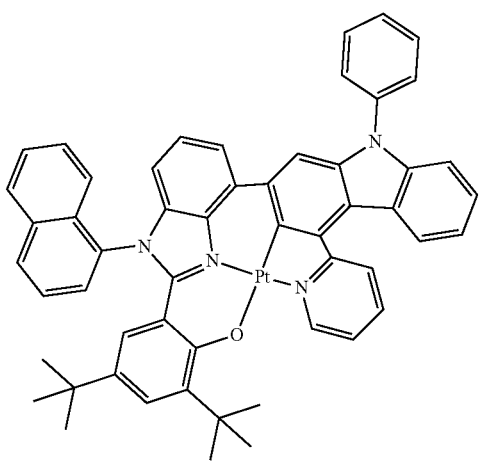
3-424
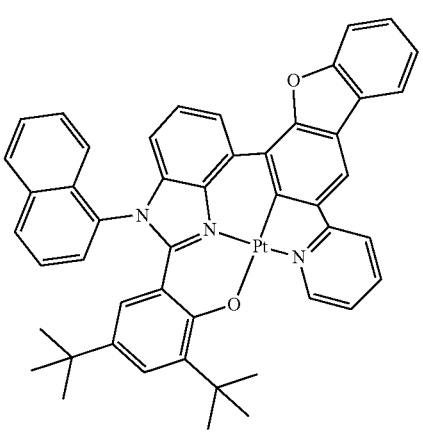

-continued
3-425
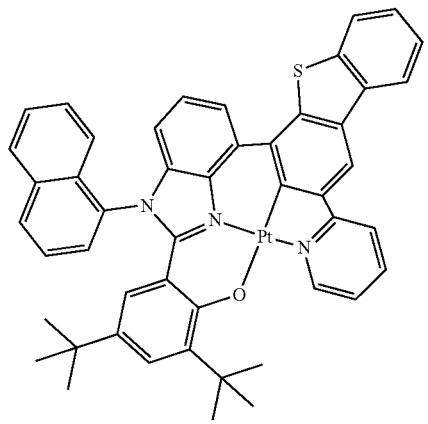
3-426
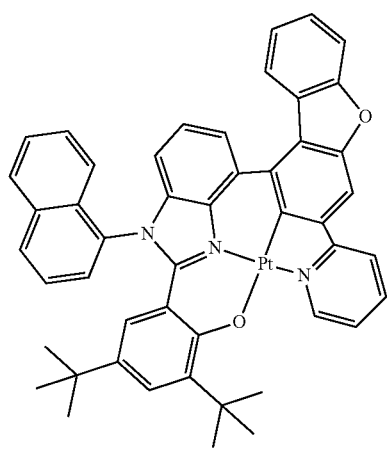
3-427
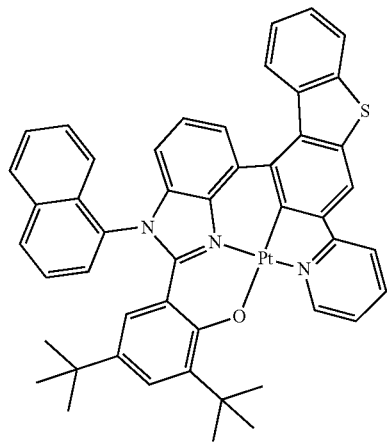
-continued
3-428
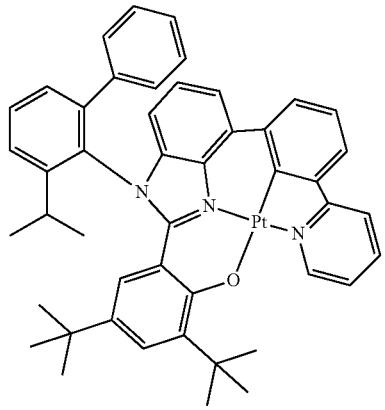
3-429
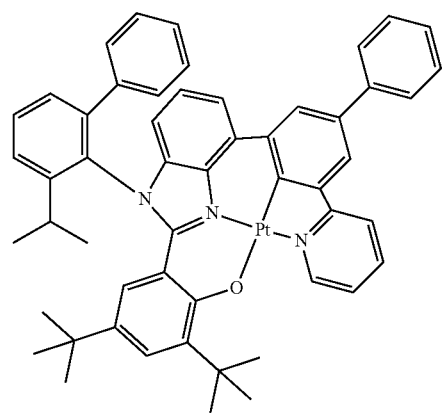
3-430
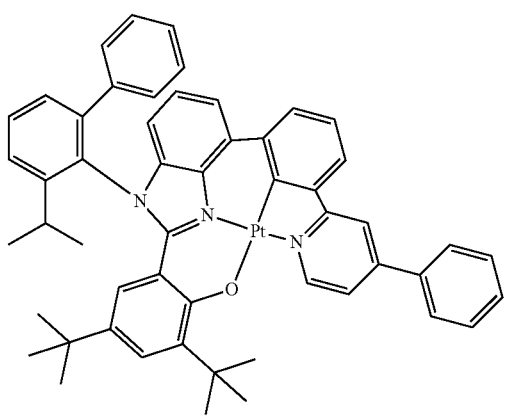

3-431
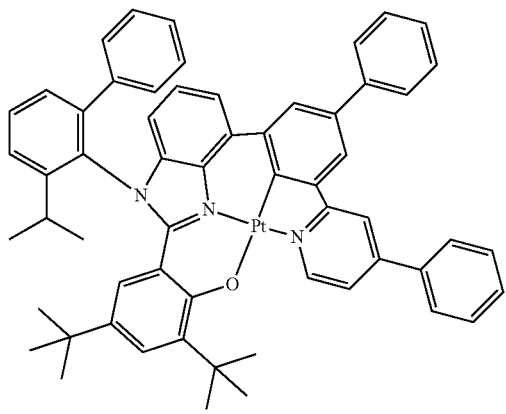
3-432
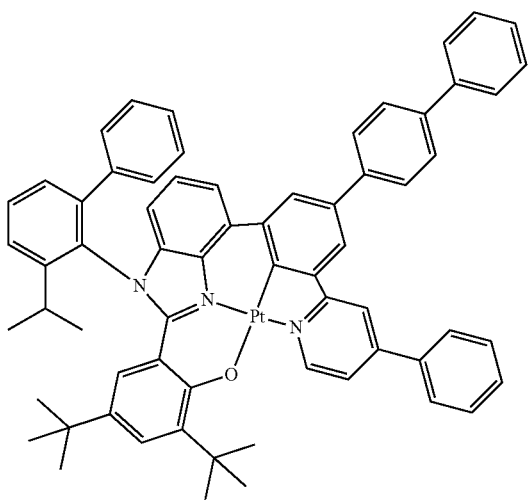
3-433
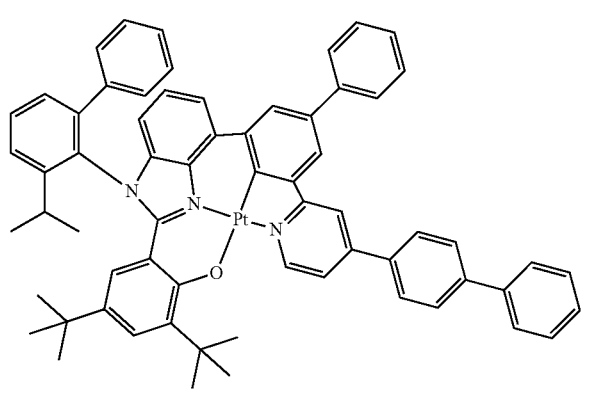
3-434
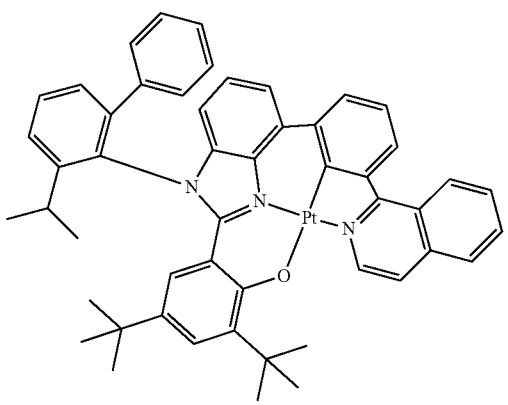
3-435
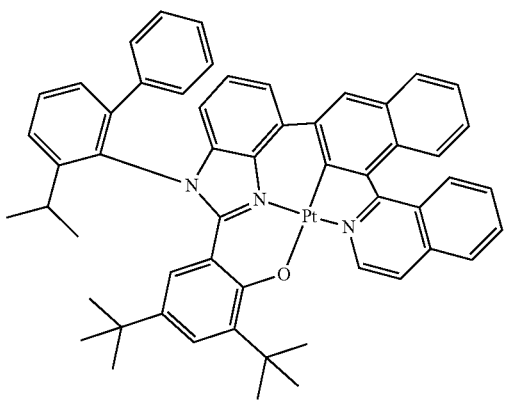
3-436
3-437
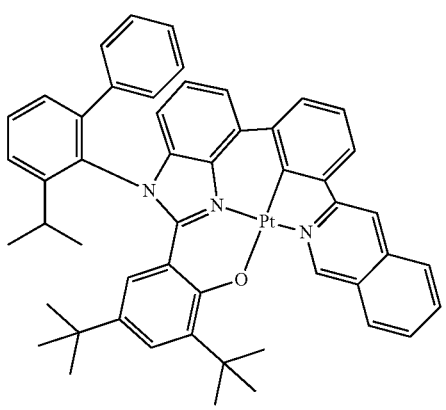

3-438
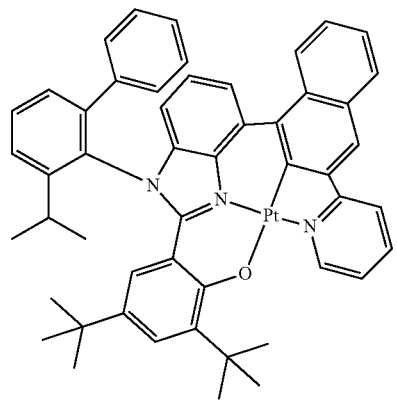
3-439
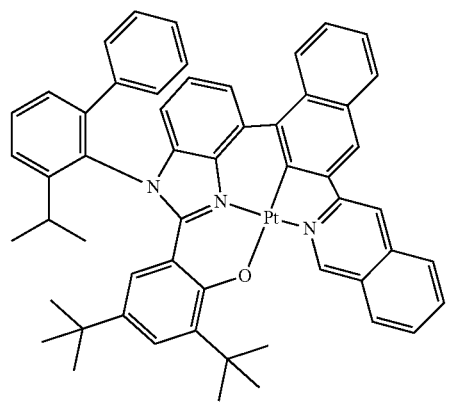
3-440
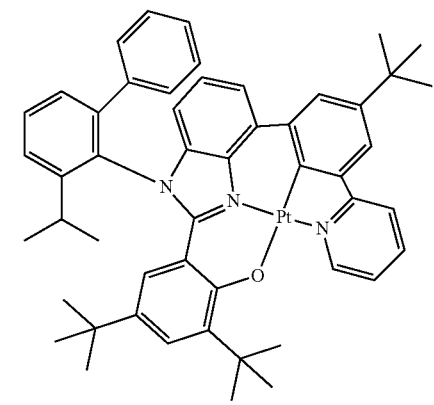
3-441
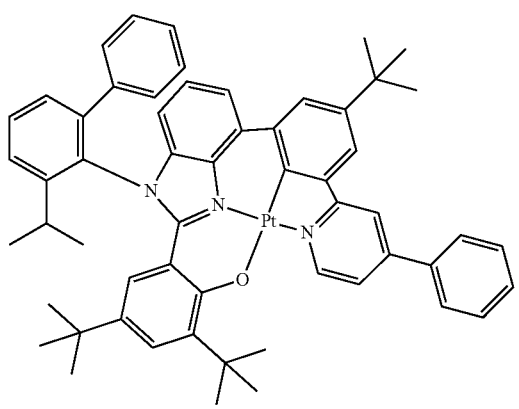
3-442
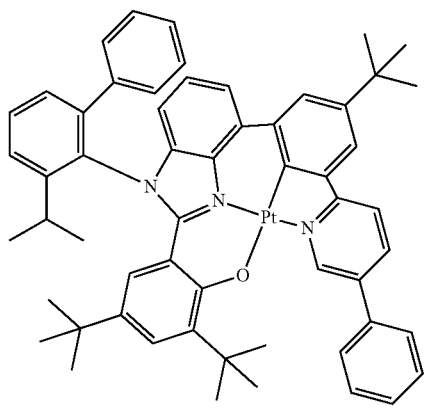
3-443
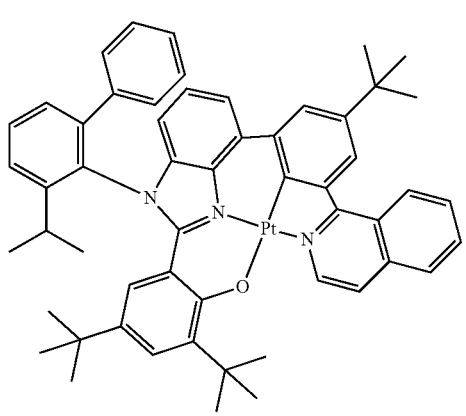
3-444
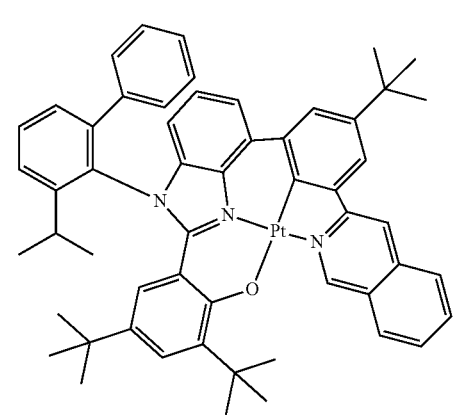
3-445
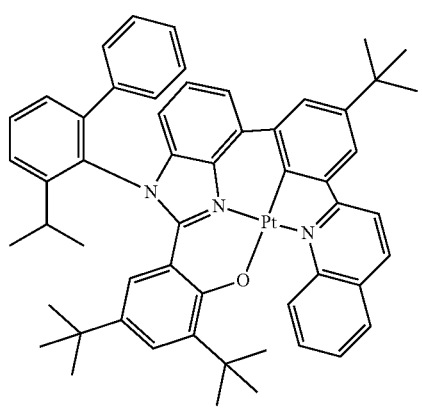

3-446
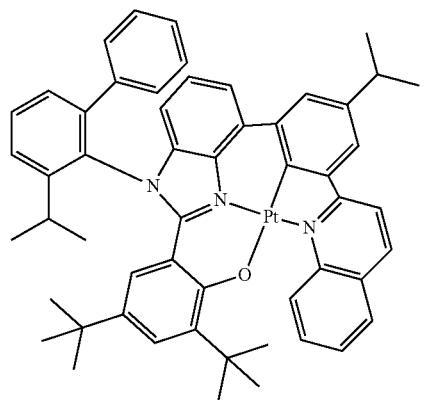
3-447
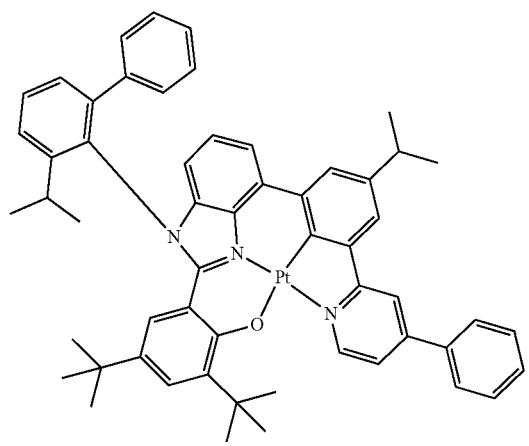
3-448
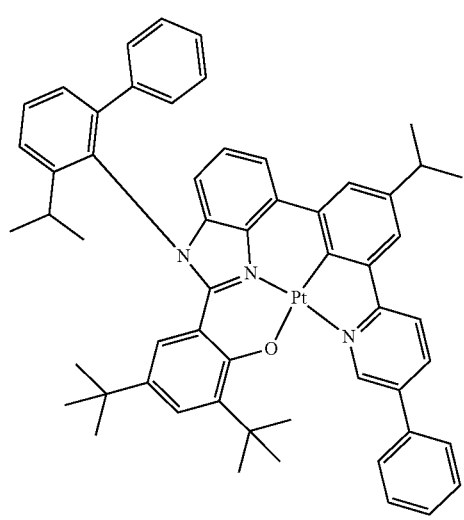
3-449
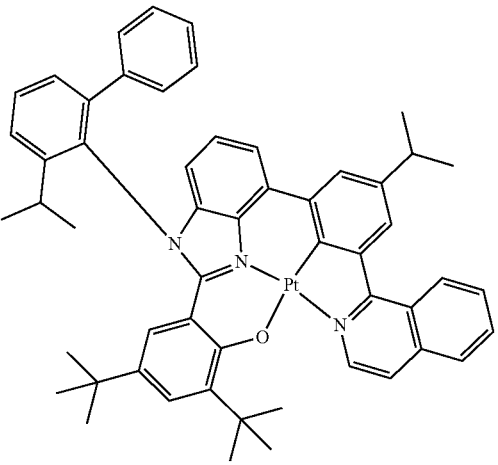
3-450
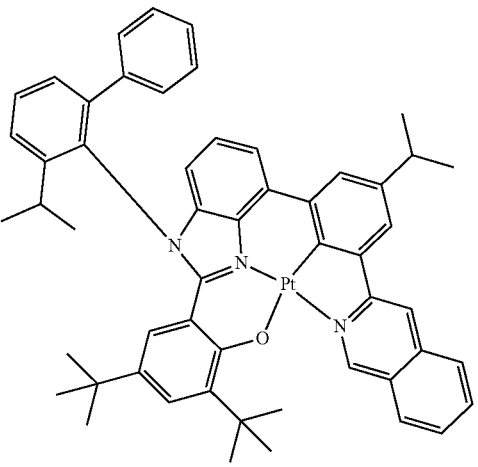
3-451
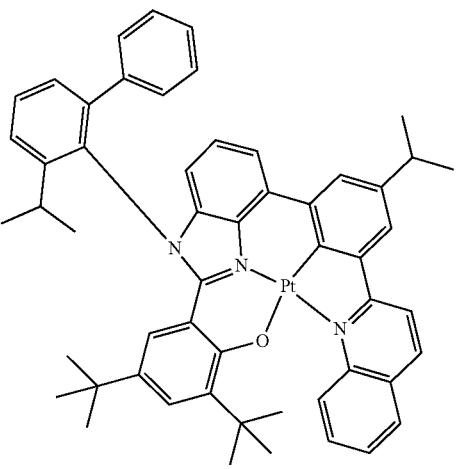

-continued
3-452
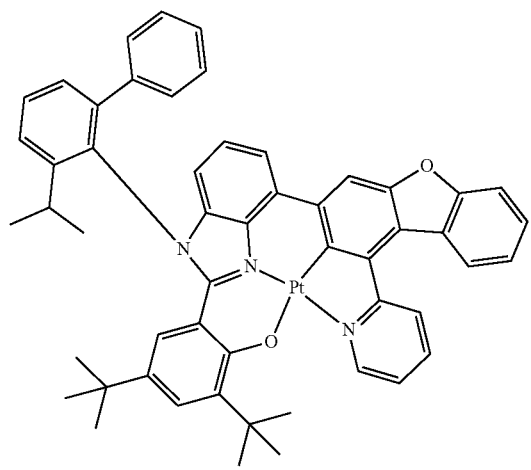
3-453
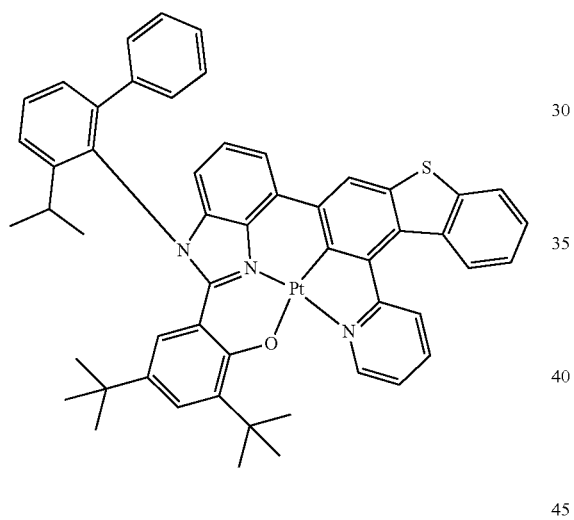
3-454
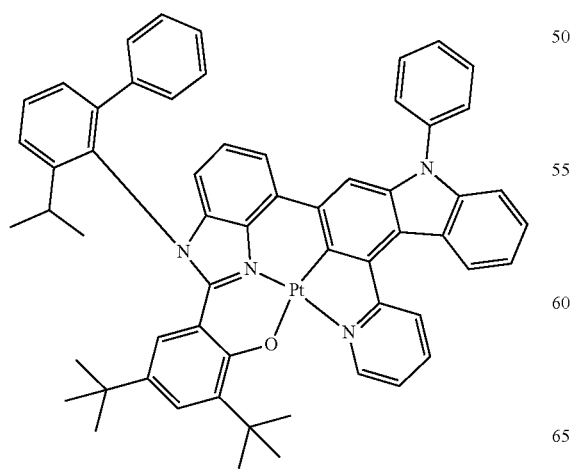
3-455
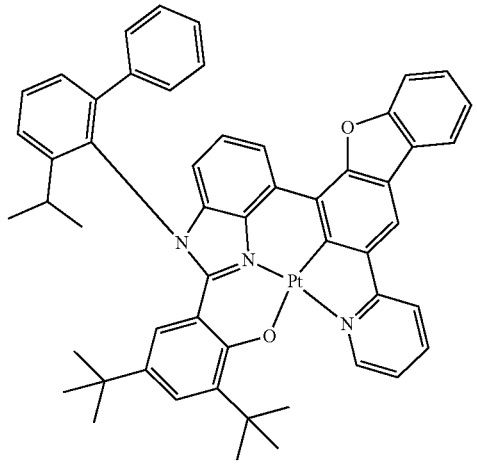
3-456
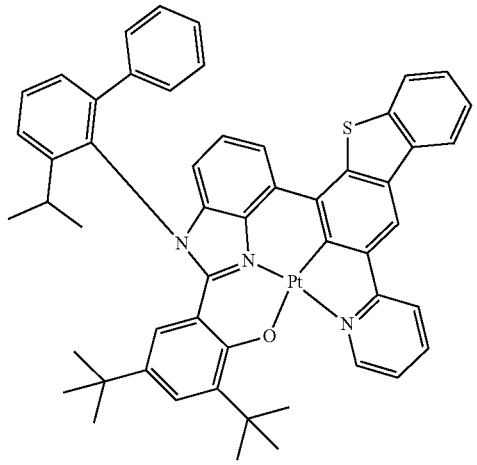
3-457
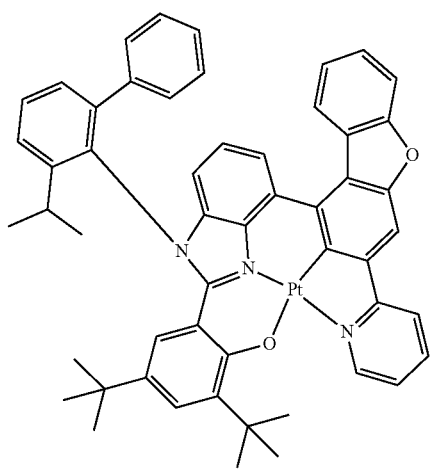

3-458
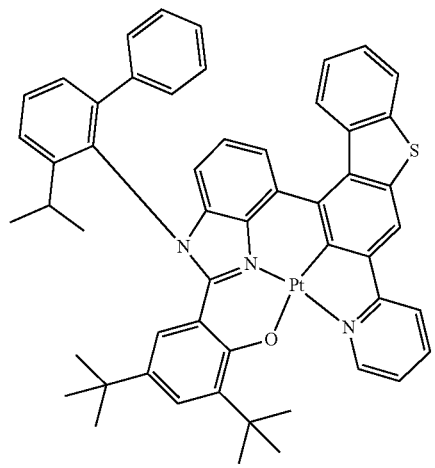
3-459
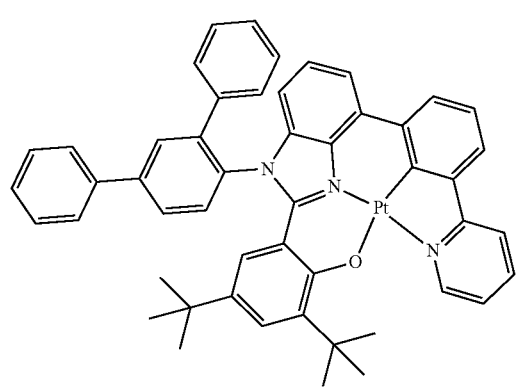
3-460
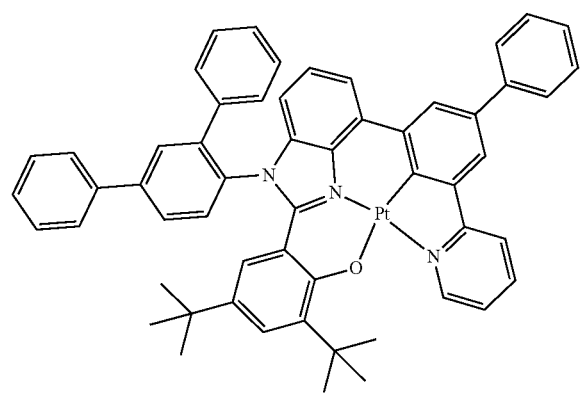
3-461
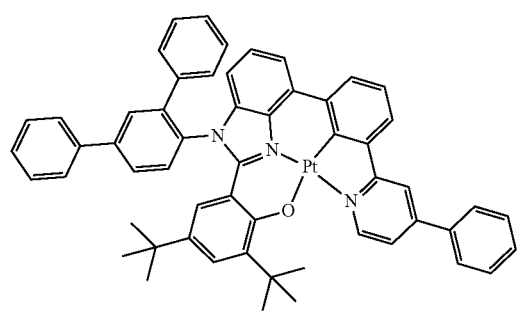
3-462
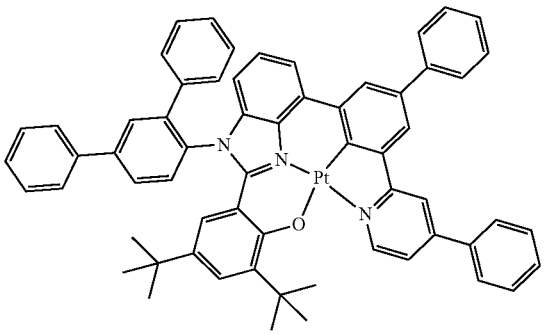
3-463
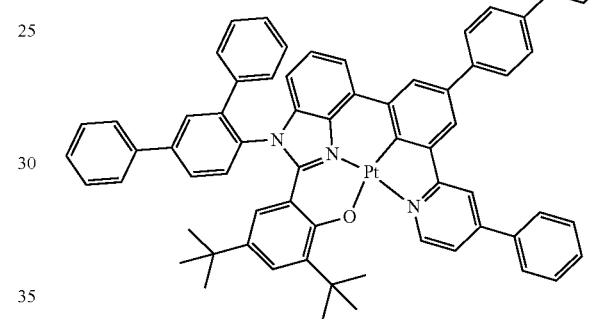
3-464
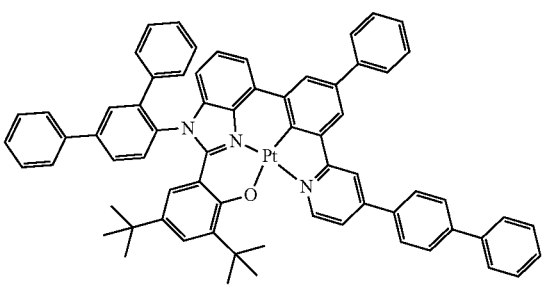
3-465
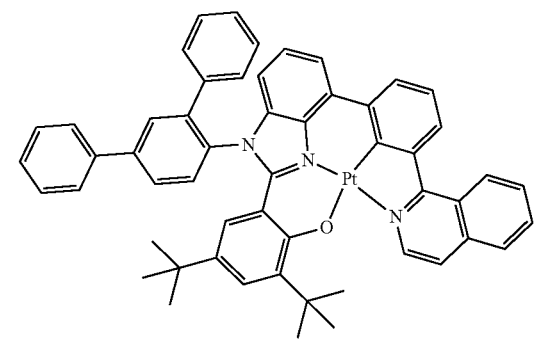

-continued
3-466
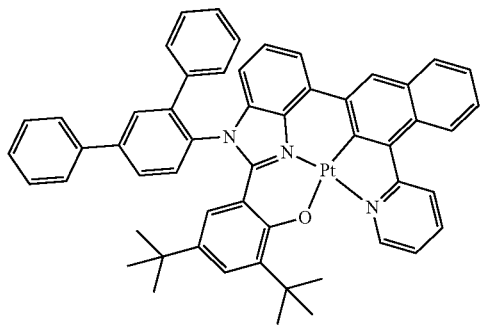
3-467
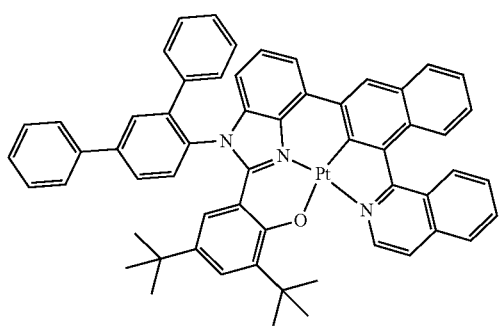
3-468
3-469
-continued
3-470
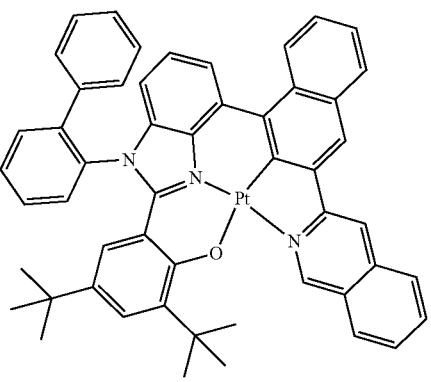
3-471
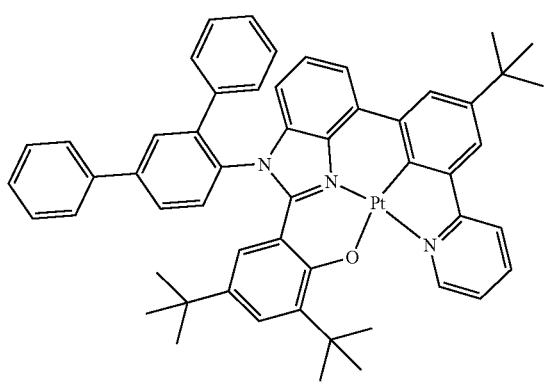
3-472
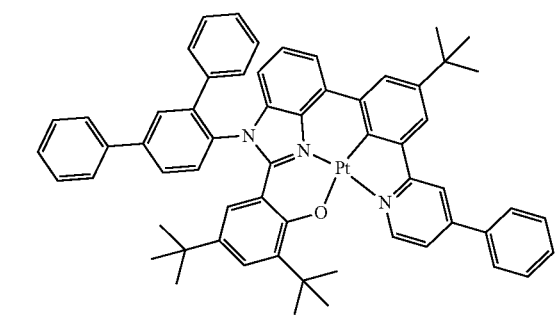
3-473
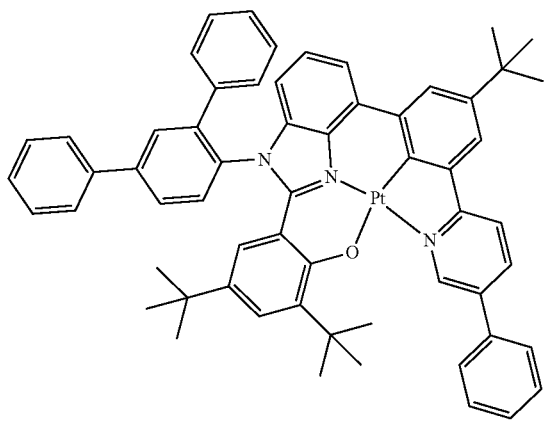

3-474
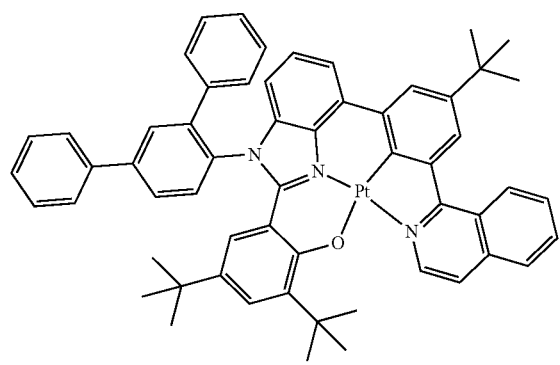
3-475
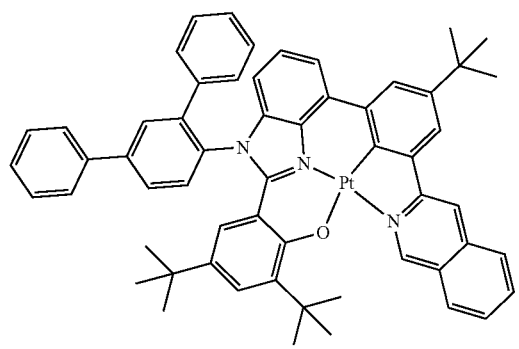
3-476
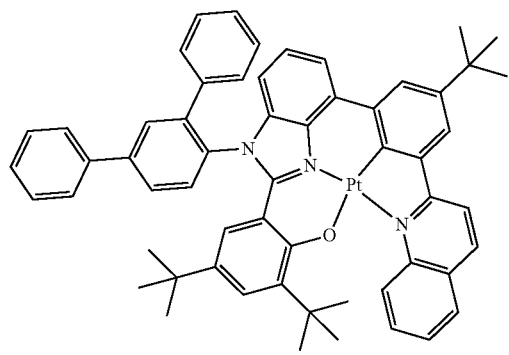
3-477
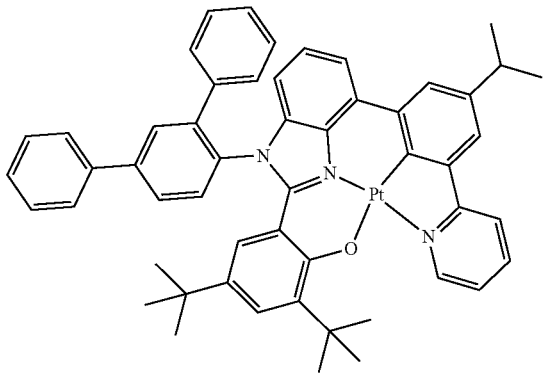
3-478
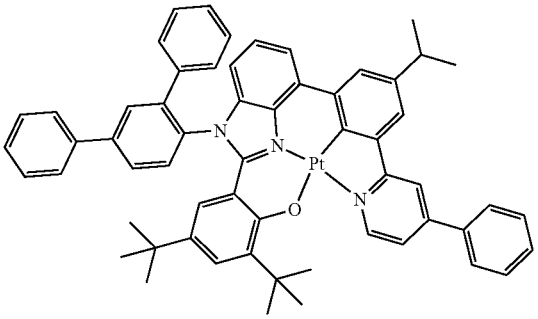
3-479
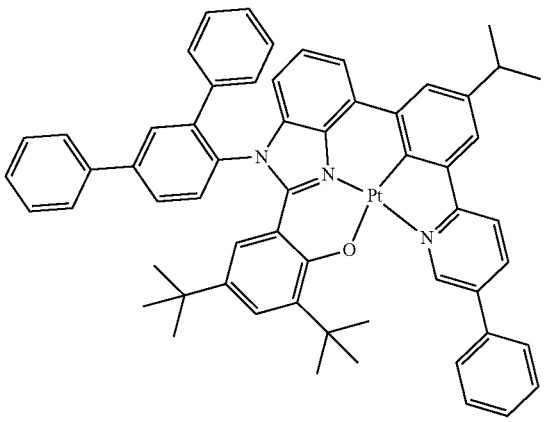
3-480
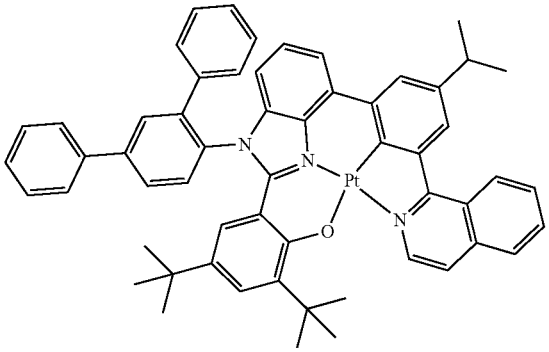
3-481
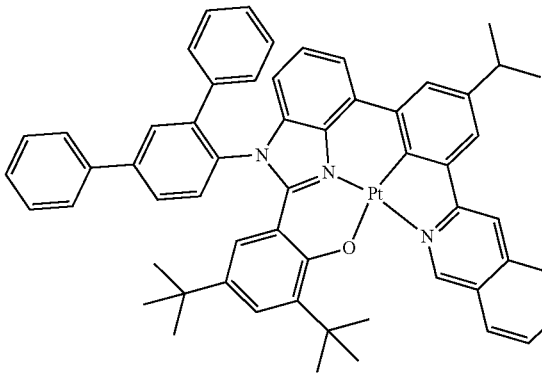

3-482
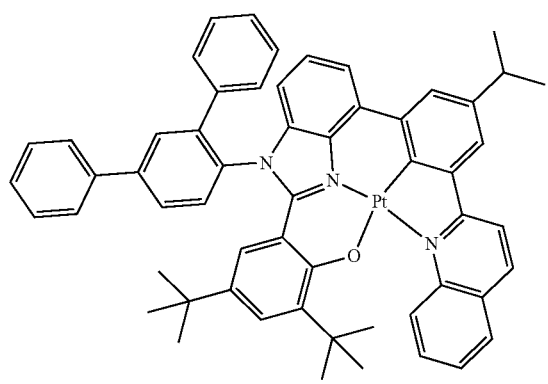
3-483
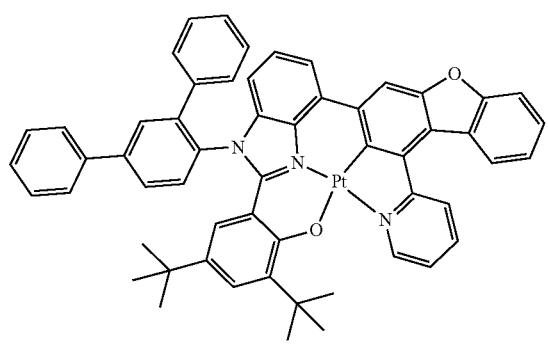
3-484
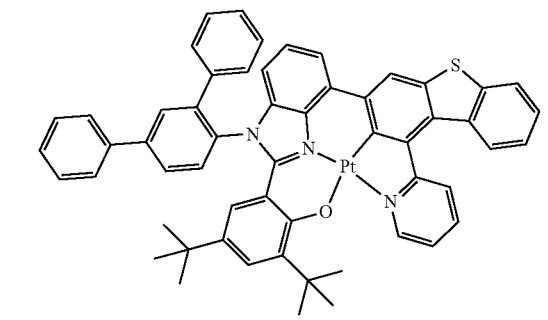
3-485
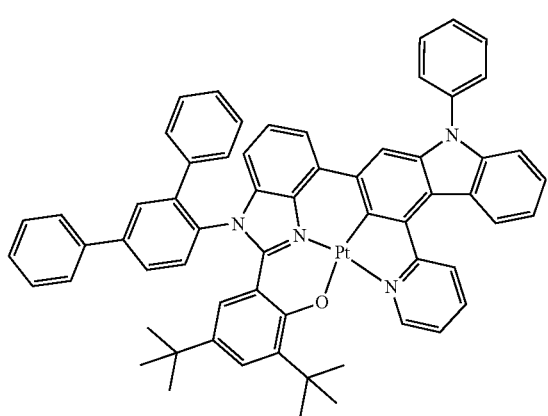
3-486
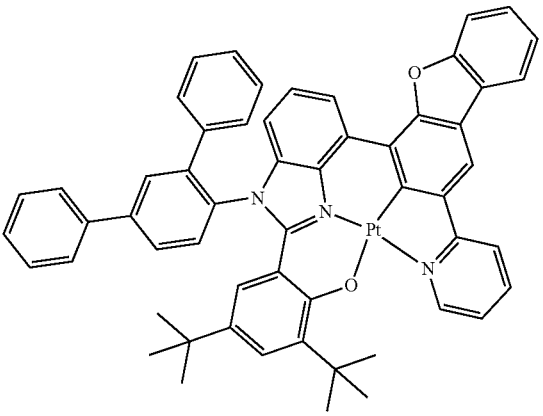
3-487
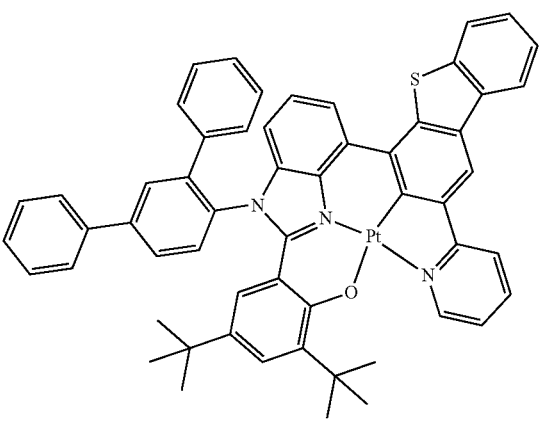
3-488
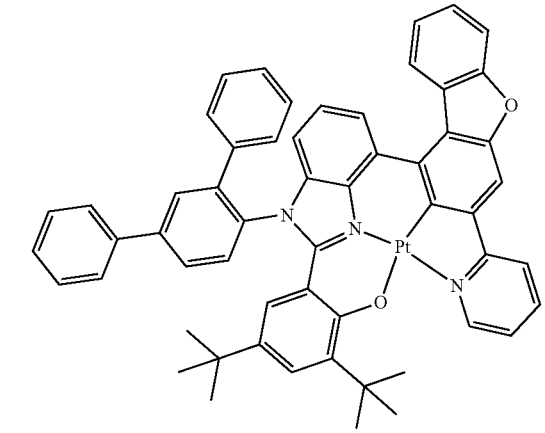

3-489
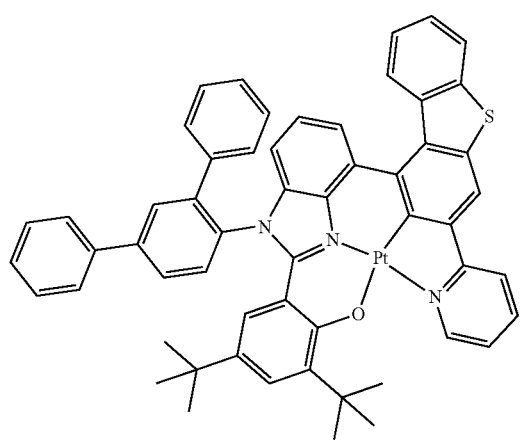
3-490
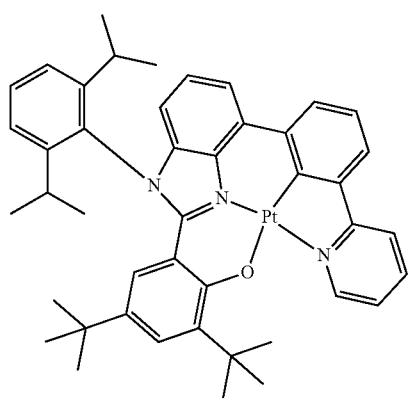
3-491
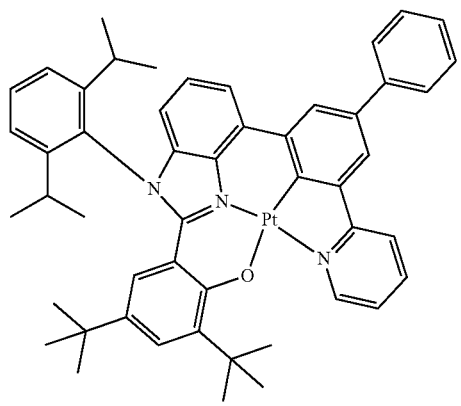
3-492
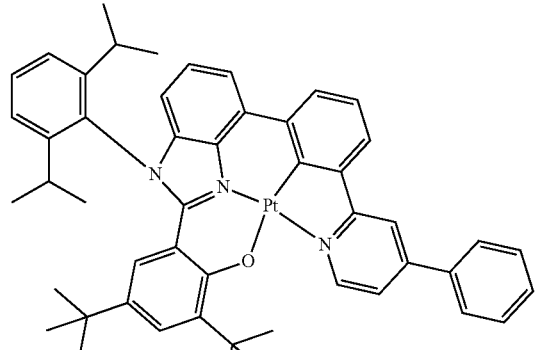
3-493
3-494
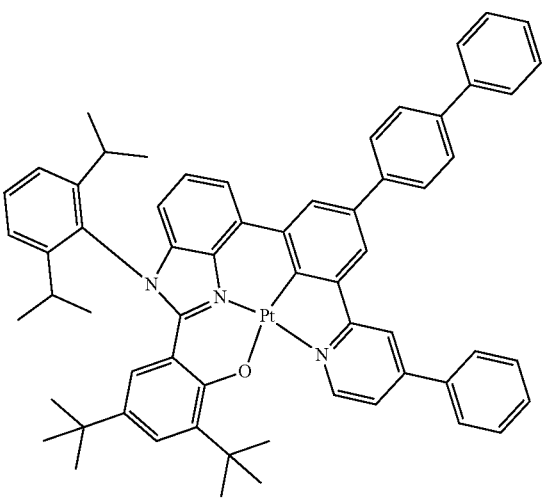

3-495
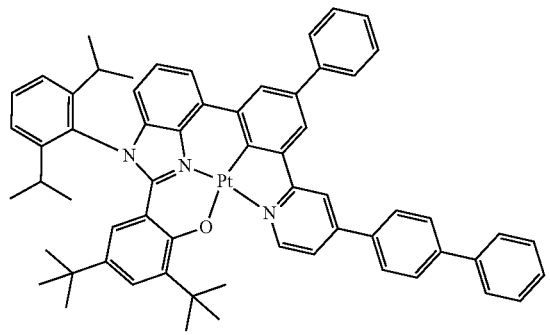
3-496
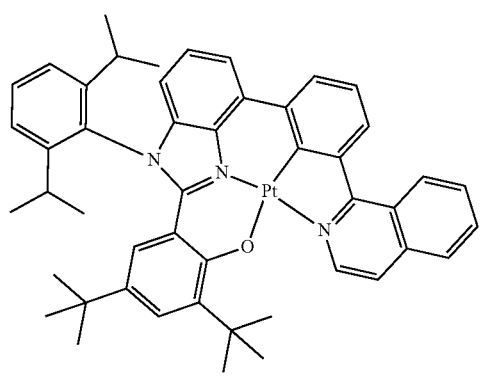
3-497
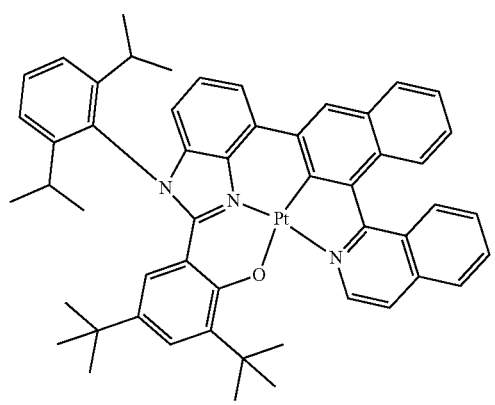
3-498
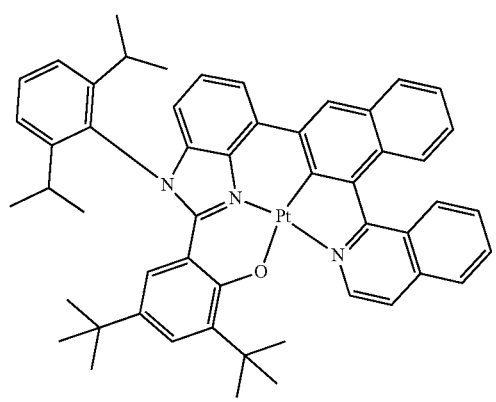
3-499
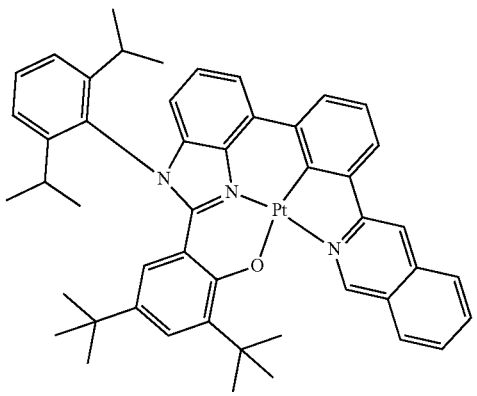
3-500
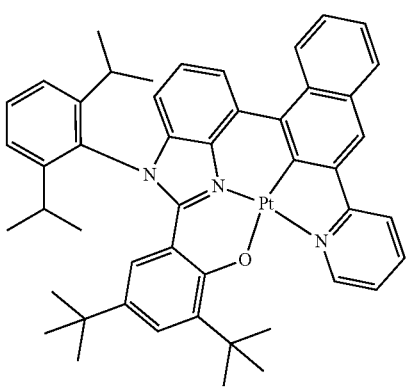
3-501
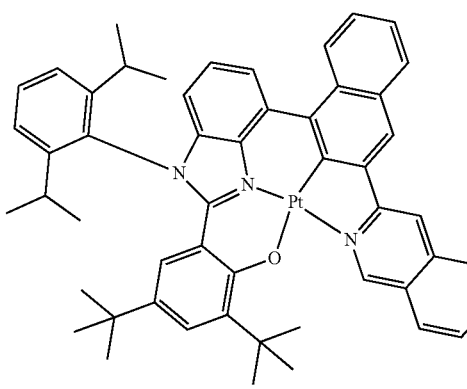
3-502
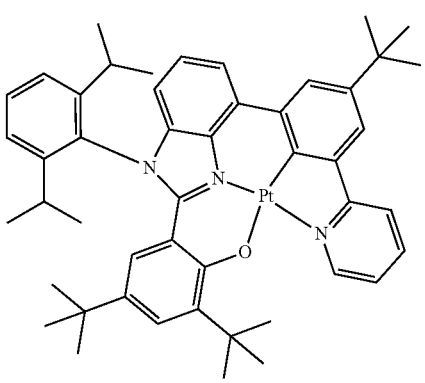

-continued
3-503
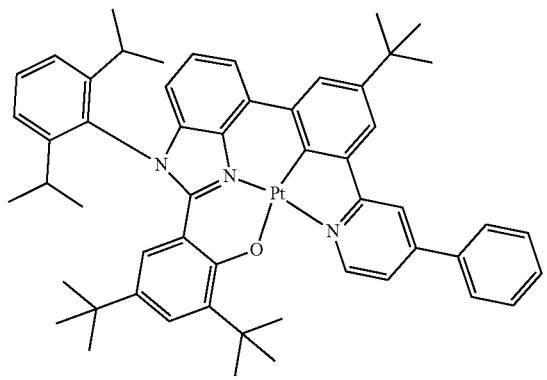
3-504
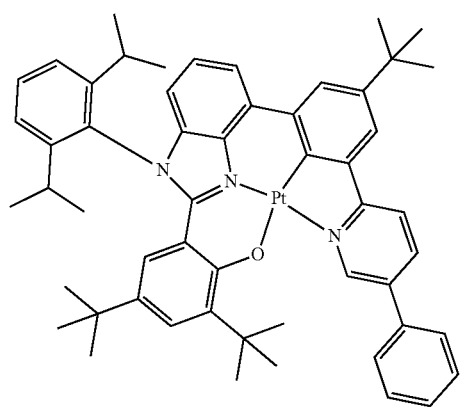
3-505
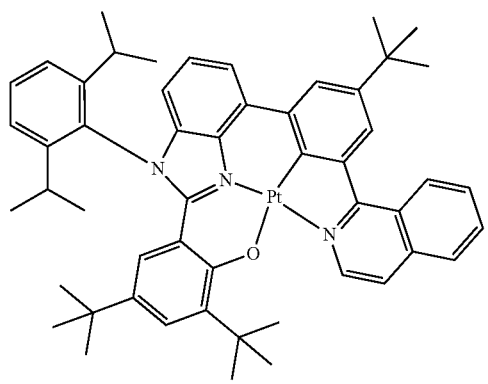
3-506
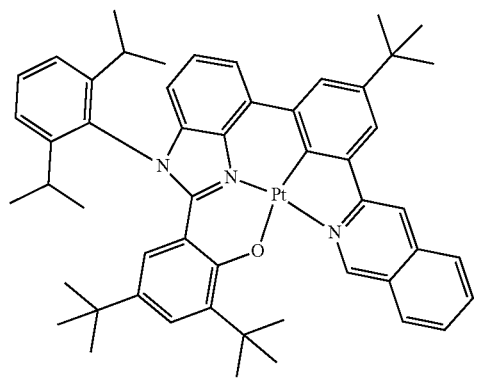
-continued
3-507
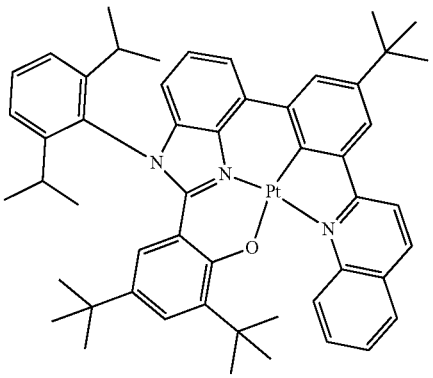
3-508
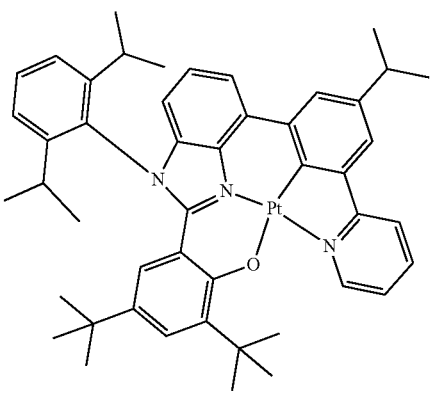
3-509
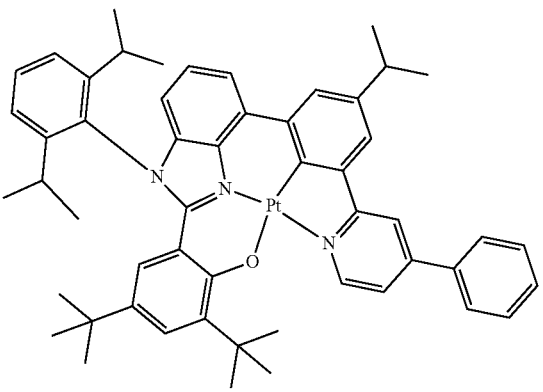
3-510
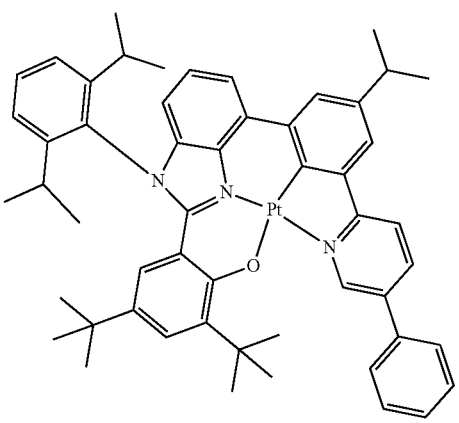

3-511
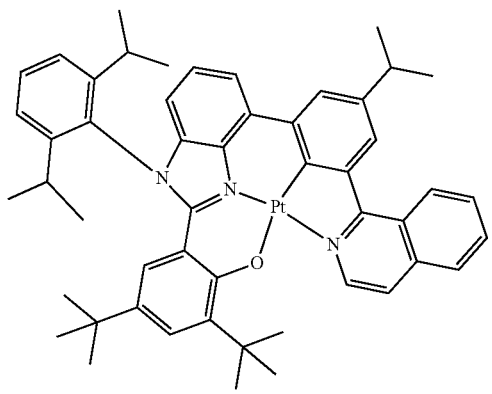
3-512
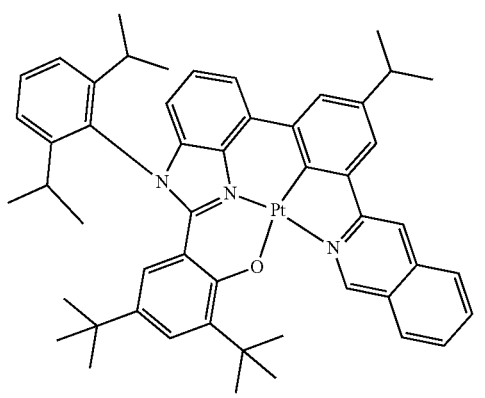
3-513
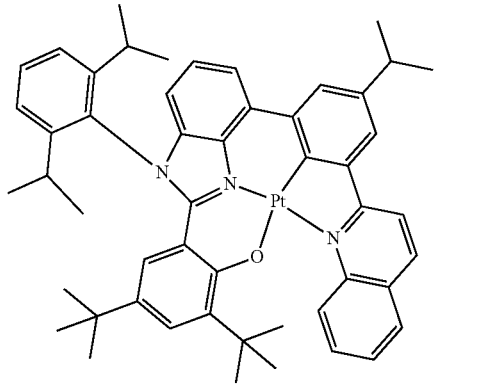
3-514
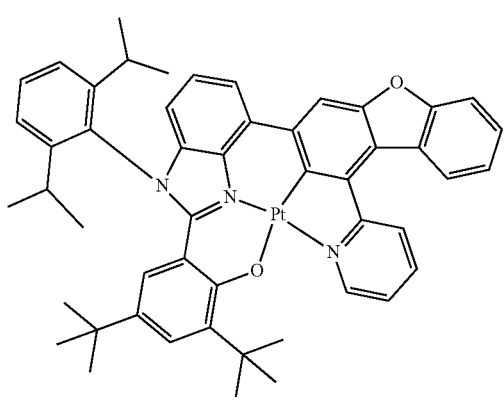
3-515
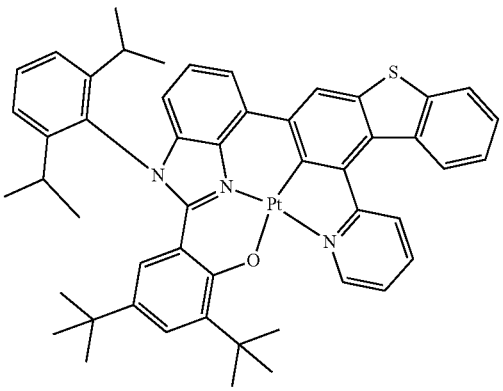
3-516
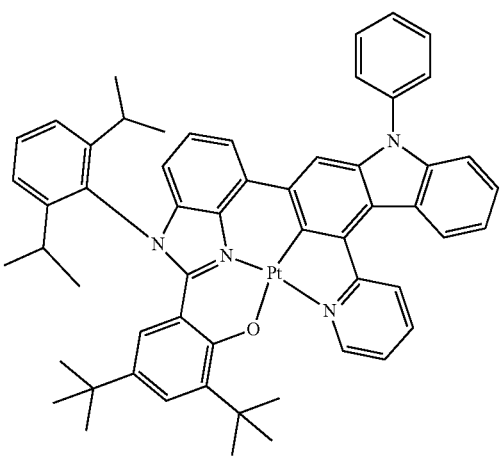
3-517
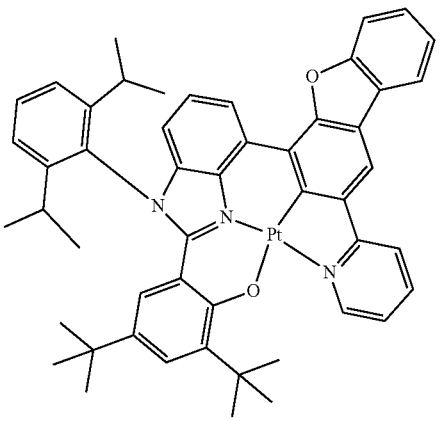

-continued
3-518
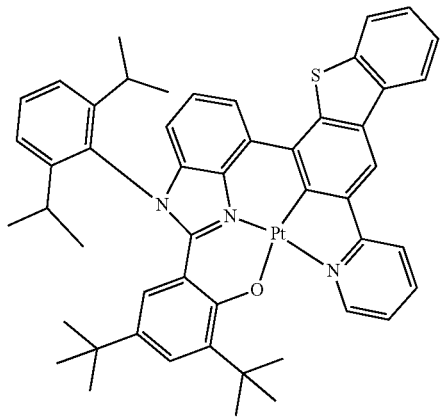
3-519
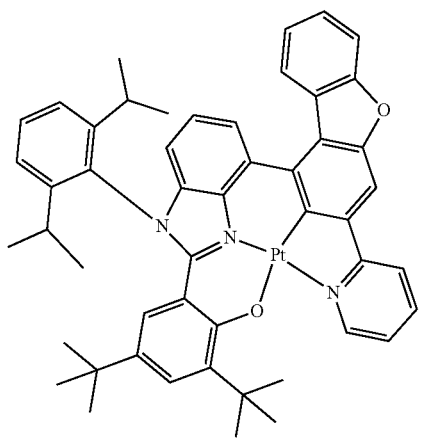
3-520
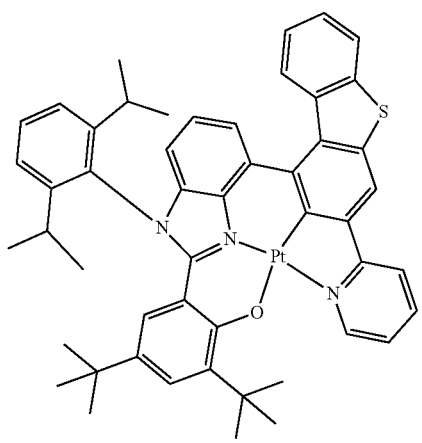
3-521
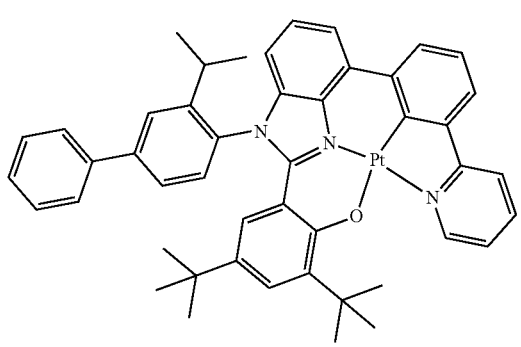
-continued
3-522
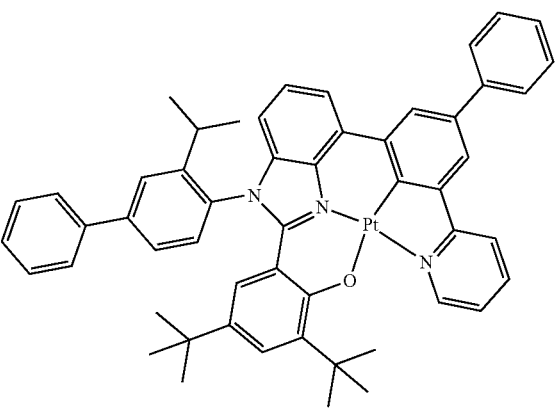
3-523
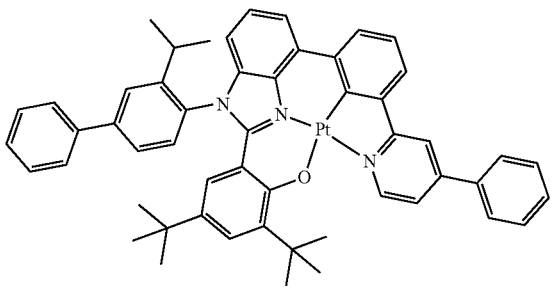
3-524
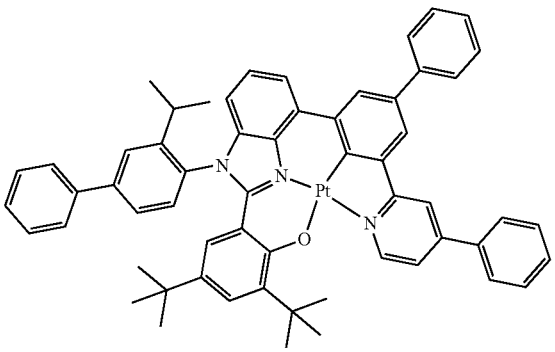
3-525
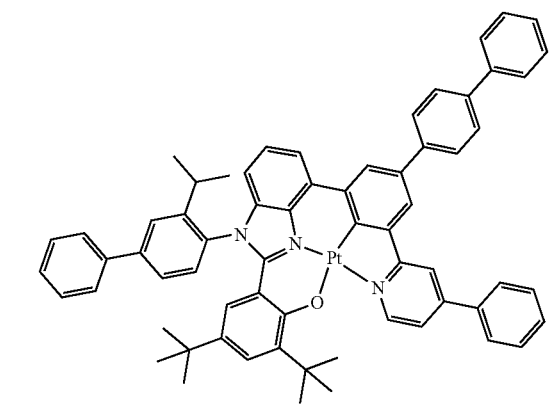

3-526
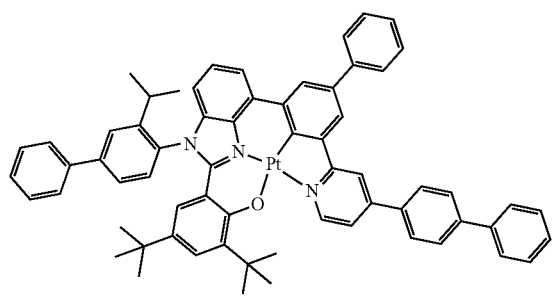
3-527
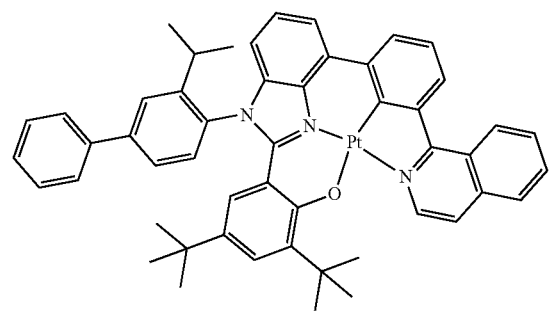
3-528
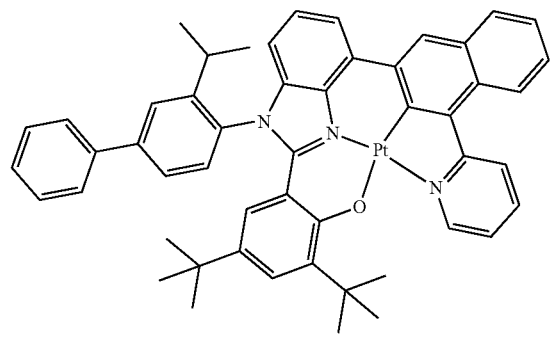
3-529
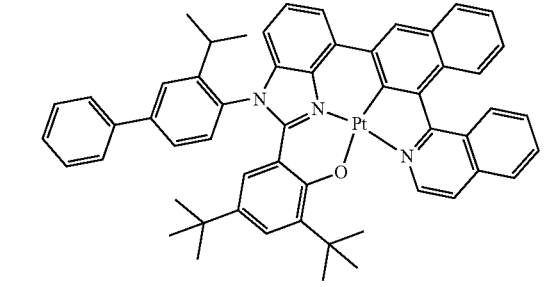
3-530
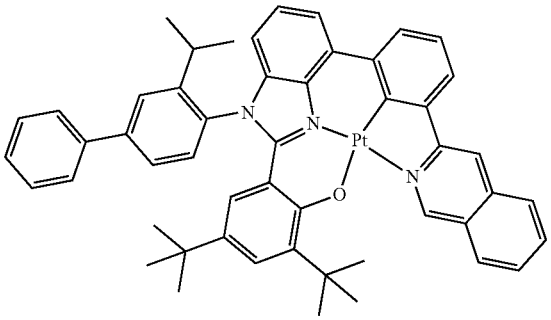
3-531
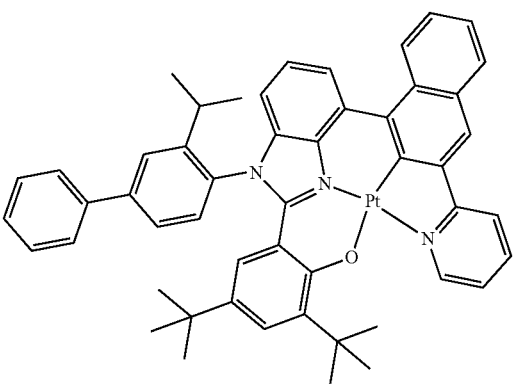
3-532
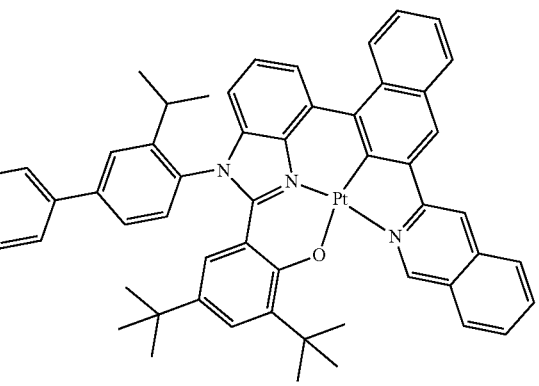
3-533
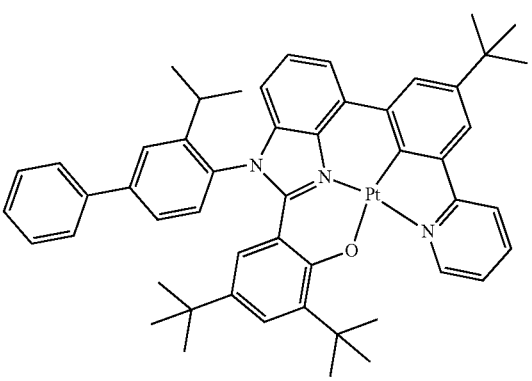

201
-continued
3-534
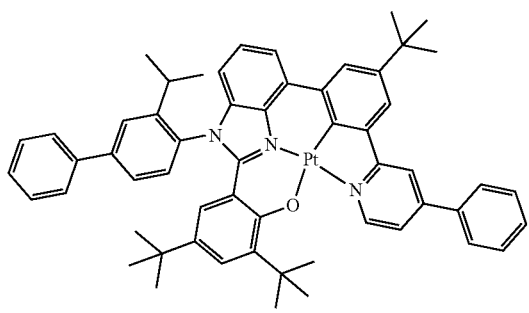
3-535
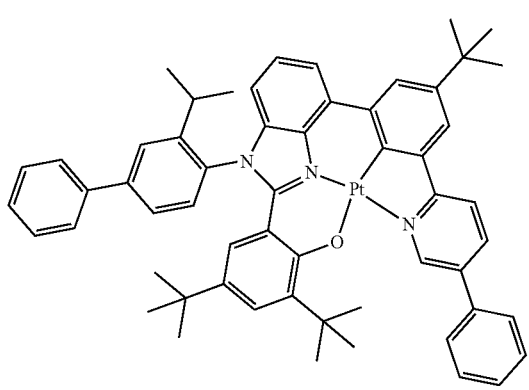
3-536
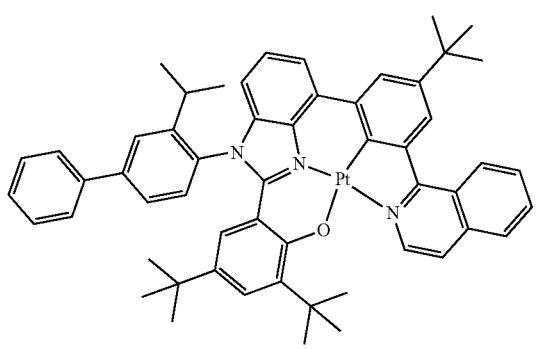
3-537
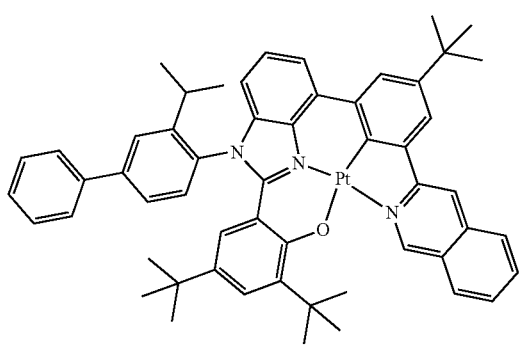
202
-continued
3-538
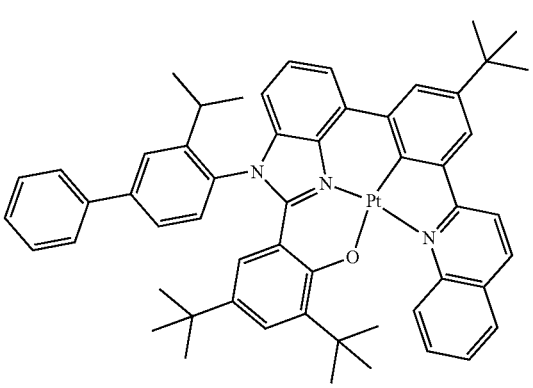
3-539
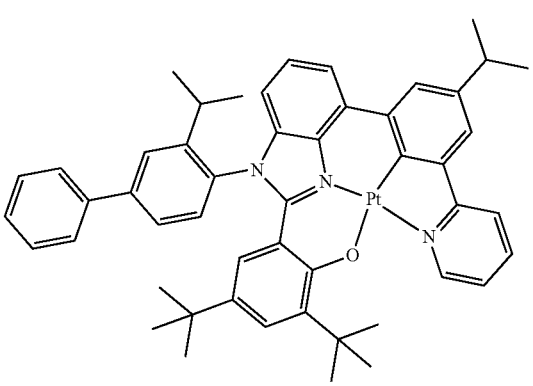
3-540
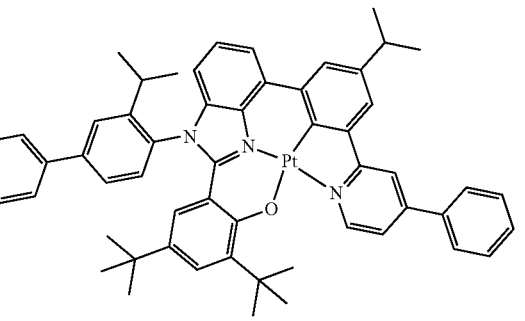
3-541
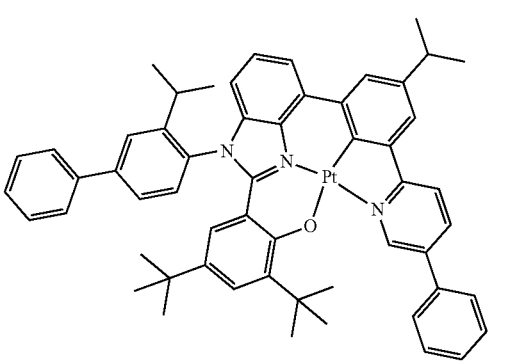

3-542
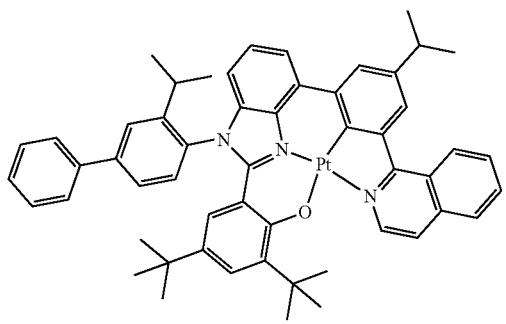
3-543
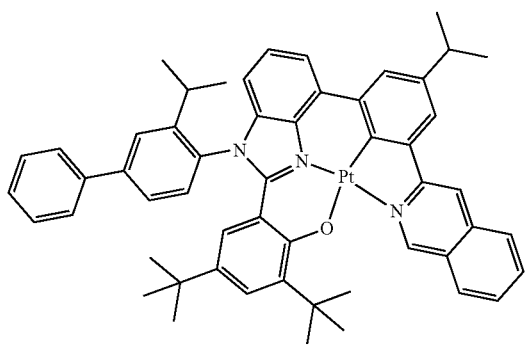
3-544
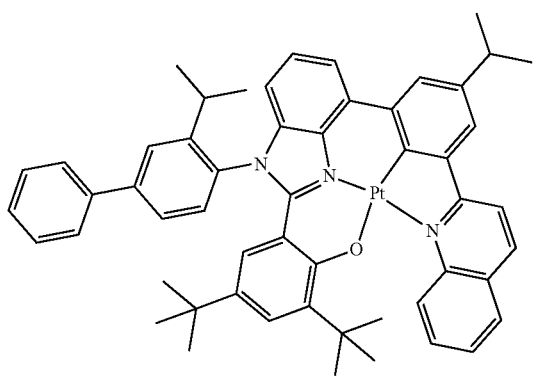
3-545
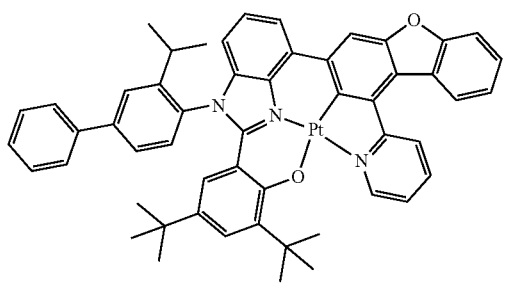
3-546
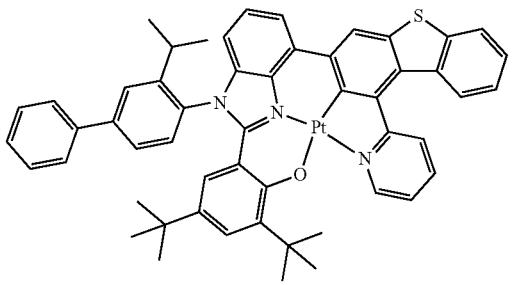
3-547
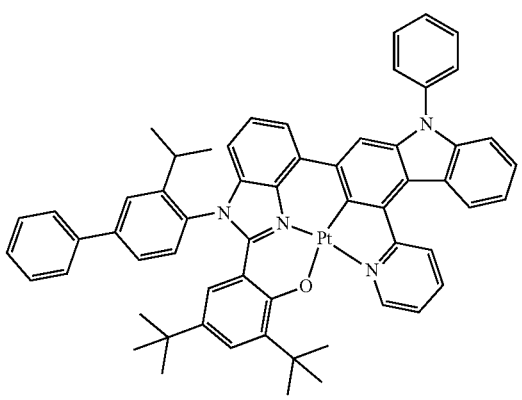
3-548
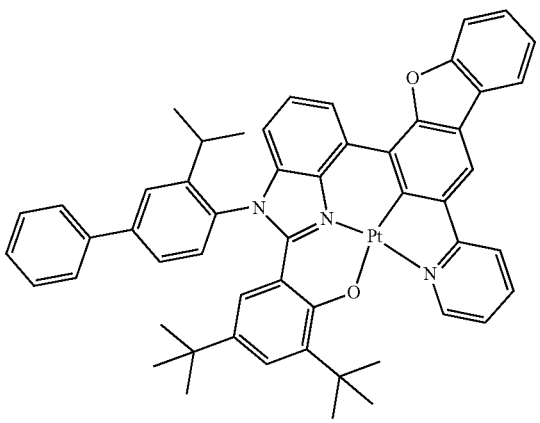
3-549
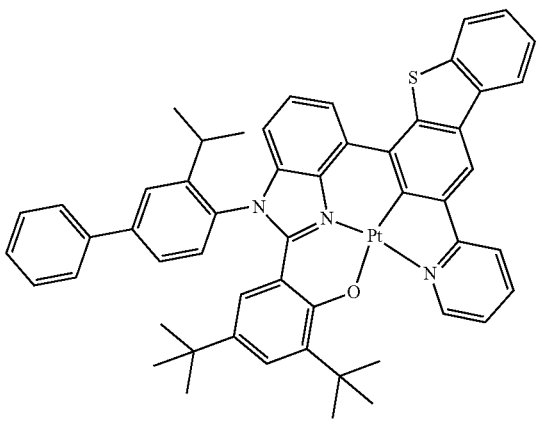

3-550
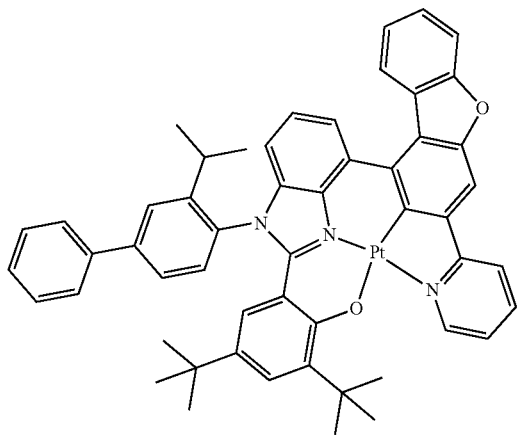
3-551
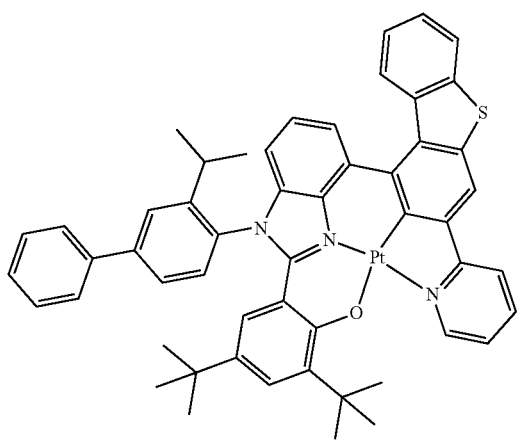
3-552
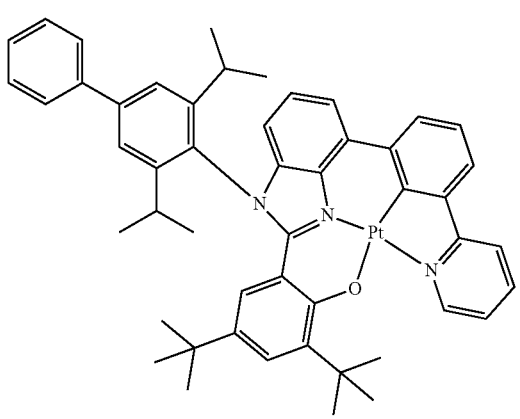
3-553
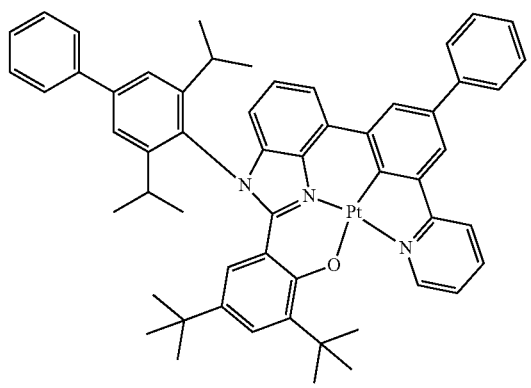
3-554
3-555
3-556
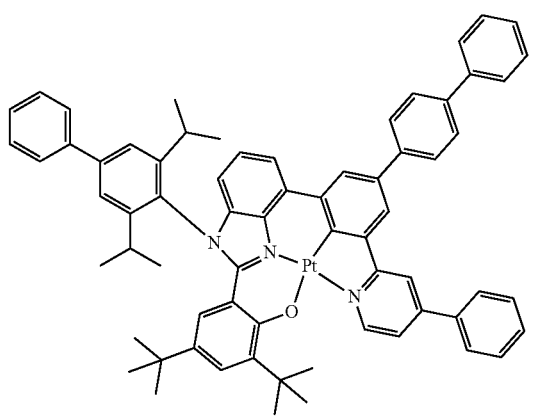

207
-continued
3-557
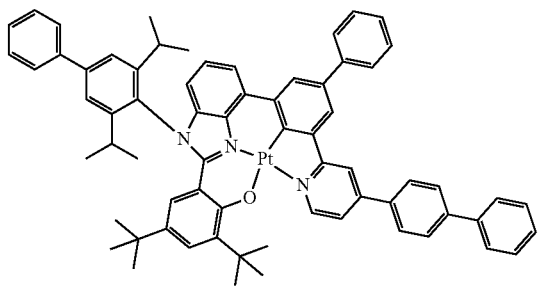
3-558
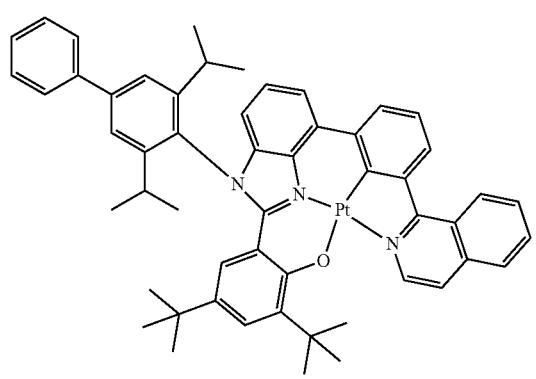
3-559
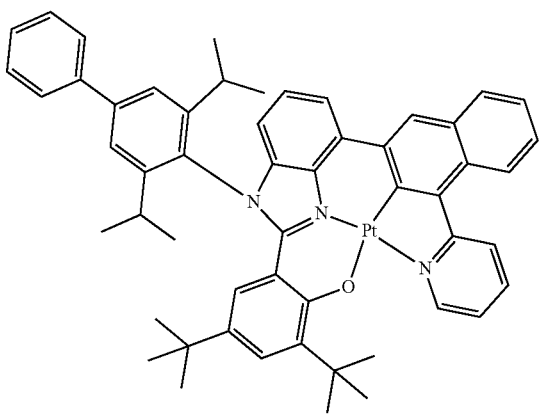
3-560
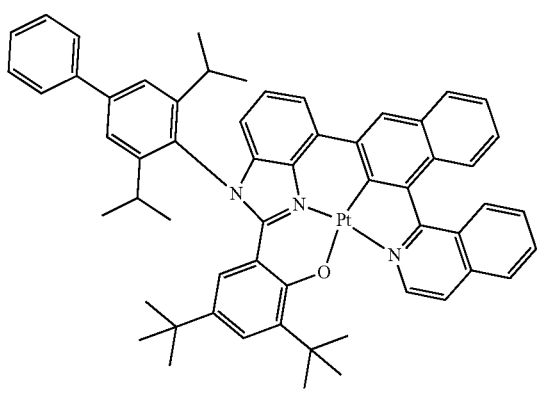
208
-continued
3-561
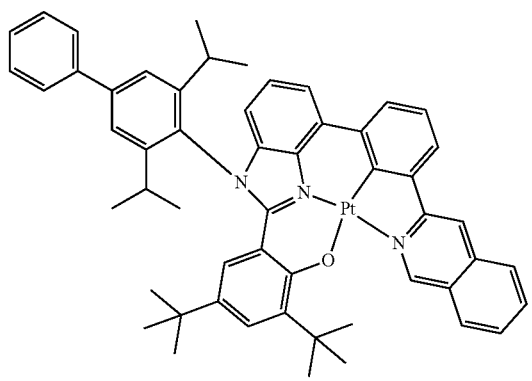
3-562
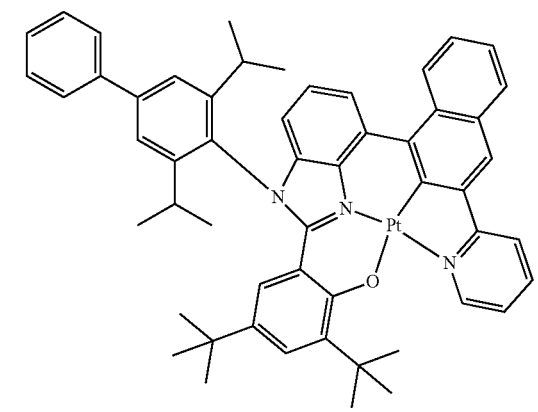
3-563
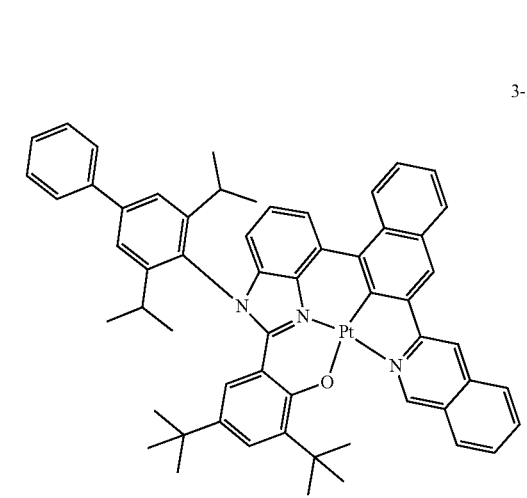

3-564
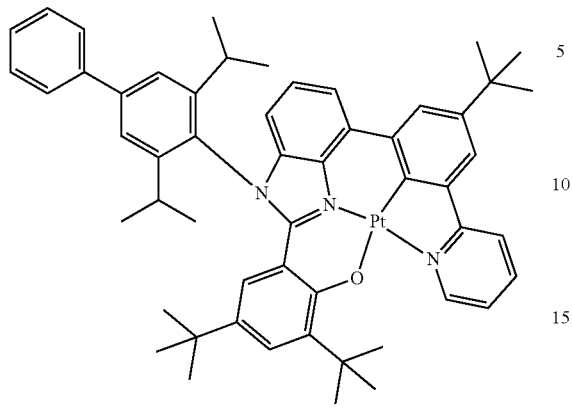
3-565
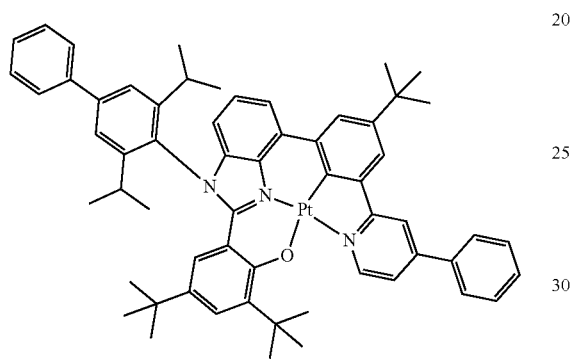
3-566
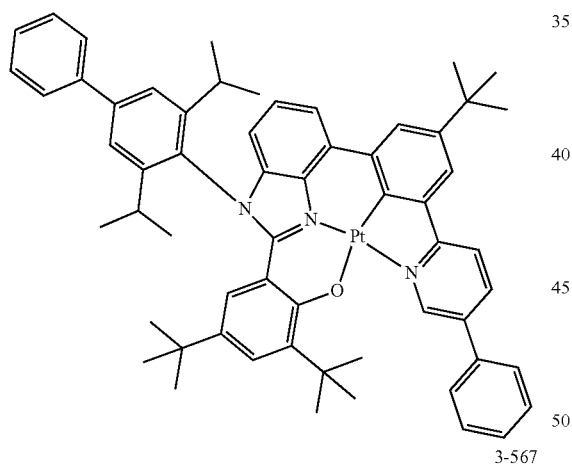
3-567
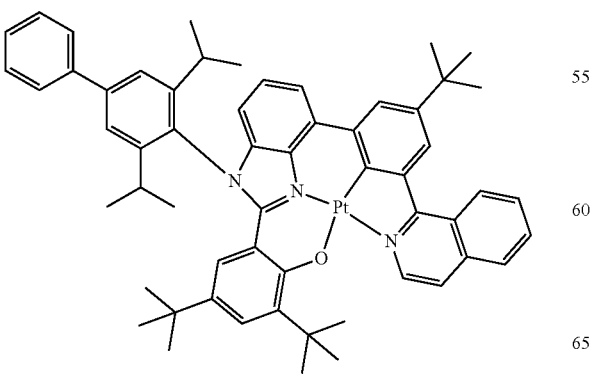
3-568
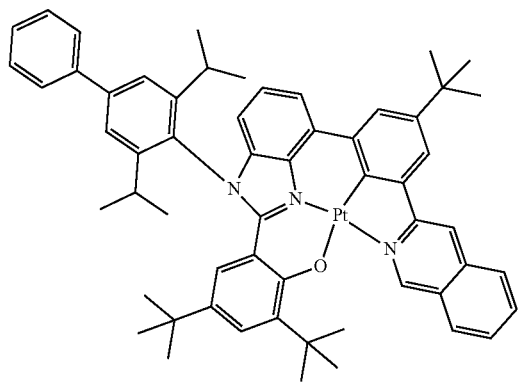
3-569
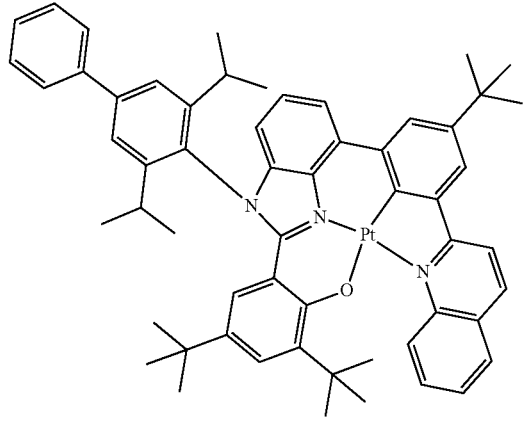
3-570
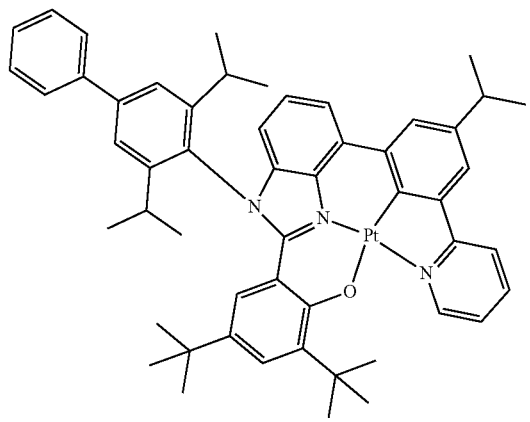
3-571
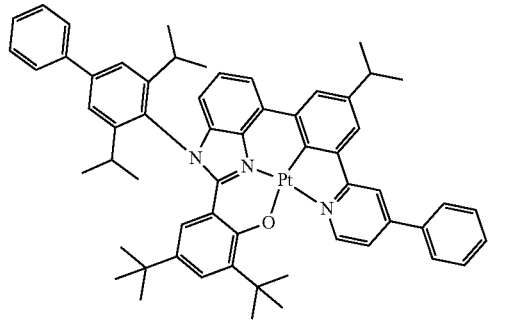

3-572
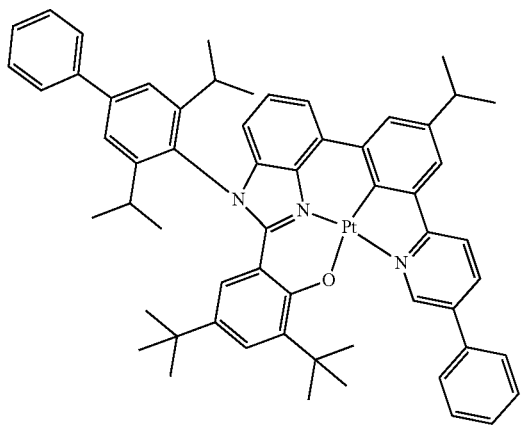
3-573
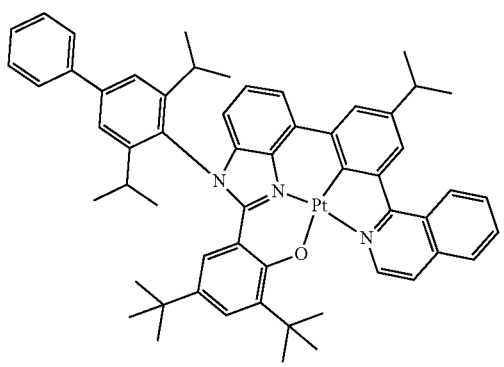
3-574
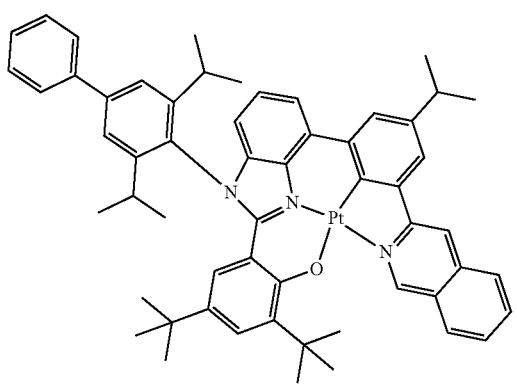
3-575
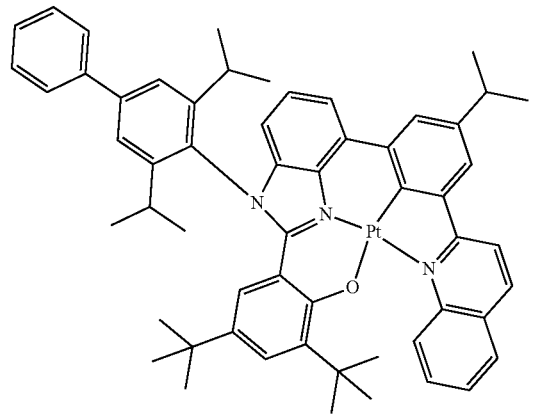
3-576
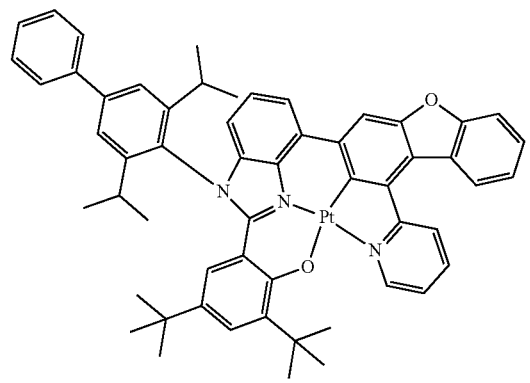
3-577
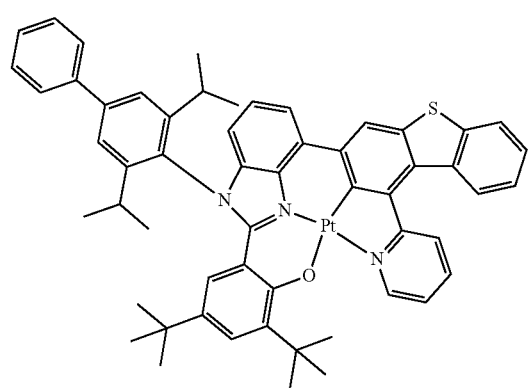

3-578

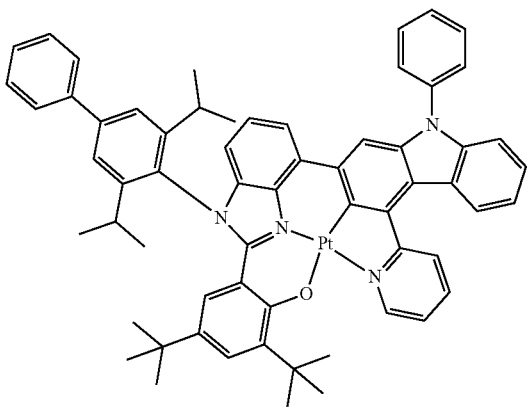

3-579

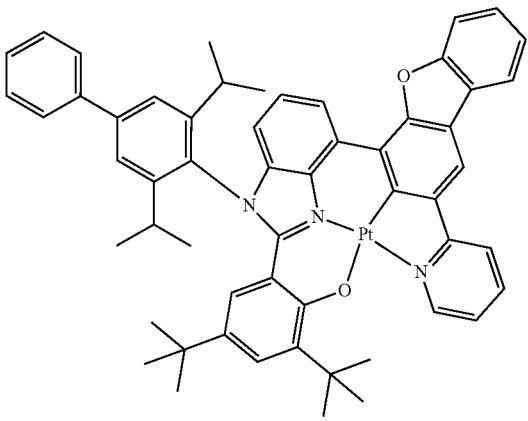

3-580

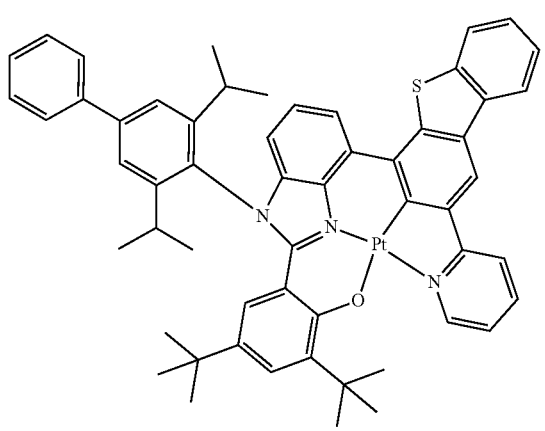

3-581

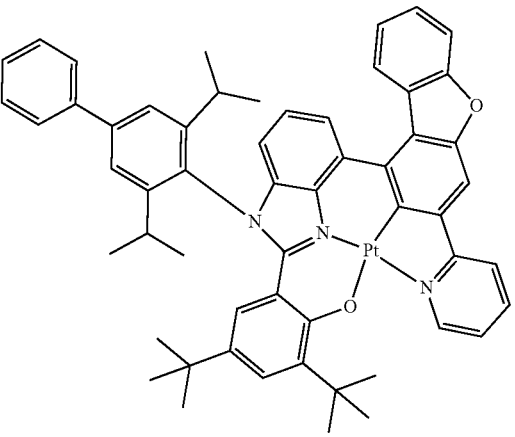

3-582

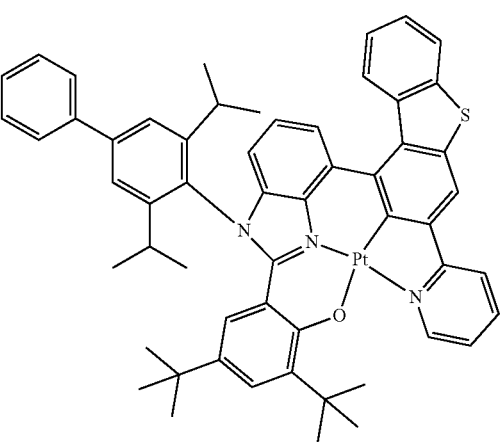

A light emitting-layer of the green light-emitting unit (green organic light emitting device) 12 includes a phosphorescent light-emitting material has been described, but the present embodiment is not limited thereto. The light-emitting layer of the green light-emitting unit (green organic light-emitting device) 12 may include a thermally activated delayed fluorescence (TADF) dopant. The TADF dopant may also be referred to as a thermally assisted delayed fluorescence dopant. In this case, it is possible to emit highly efficient delayed fluorescence.

The light-emitting layer of the green light-emitting unit (green organic light emitting device) 12 may include the phosphorescent light emitting material described above, but the present embodiment is not limited thereto. The light-emitting layer may include a phosphorescent material other than the phosphorescent light-emitting material described above. Also, the light-emitting layer of the green light-emitting unit 12 may include a fluorescent light-emitting material. Any green fluorescent material used in the OLED related art may be applied as the green light-emitting layer material of the present embodiment. A fluorescent light-emitting material for emitting green light are well known to a person of ordinary skill, and thus, detailed descriptions of such materials are omitted.

In the present embodiment, the light-emitting layer of the blue light-emitting units 11 and 13 may include a fluorescent light-emitting material and/or a phosphorescent light-emitting material that emits blue light. Any blue fluorescent/ phosphorescent materials used in the OLED related art may be applied as the blue light-emitting layer material of the present embodiment. A fluorescent light-emitting material for emitting blue light are well known to a person of ordinary skill, and thus, detailed descriptions of such materials are omitted.

As described above, the OLED structure 10 according to an embodiment may include the first blue light-emitting unit 11, the second blue light-emitting unit 13, and the green light-emitting unit 12. Since the green light-emitting units 12 as well as the blue light-emitting units 11 and 13 are included in the OLED structure 10, it is possible to achieve higher current efficiency than when an OLED designed to emit white light is used. However, because an emission spectrum of the green incident light Ig generated from the green light-emitting unit 12 is typically broader than an emission spectrum of the quantum dots QD included in the second color conversion layer 21G, it is necessary to improve the characteristics of incident green light Ig in order to improve color purity and efficiency.

Figure 7:
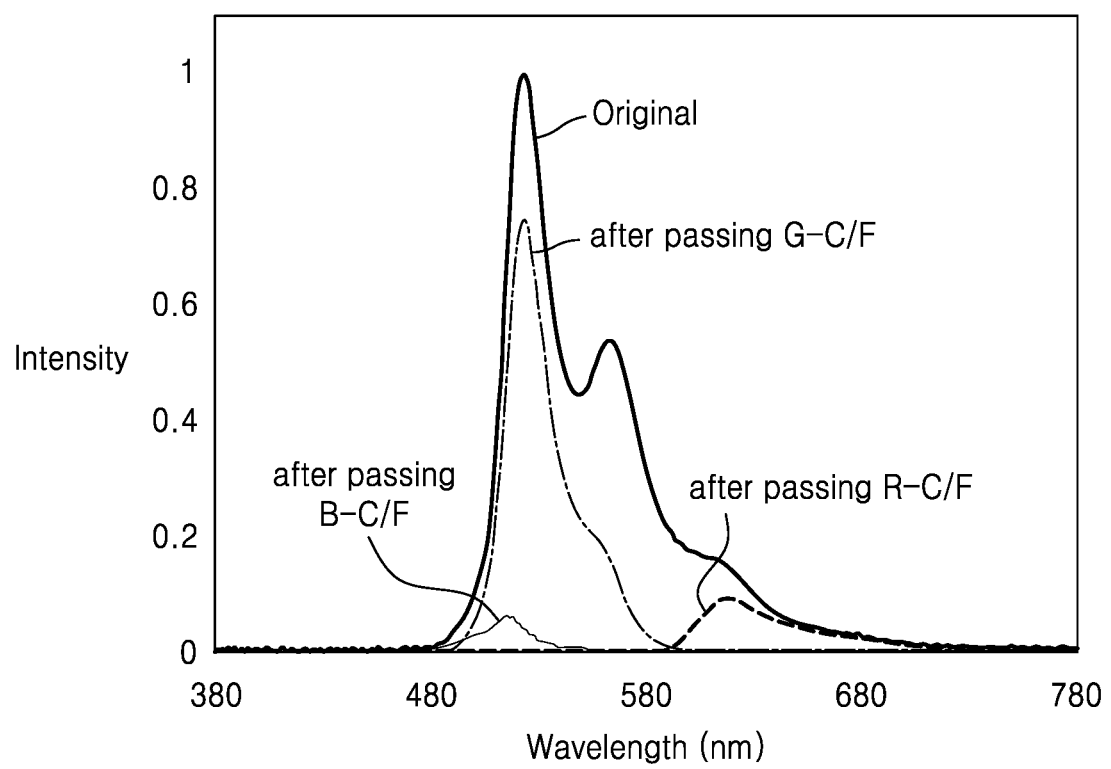
FIG. 7 is a graph showing emission spectra of incident green light generated from a green light-emitting unit according to an embodiment and green incident light output after passing through first to third color filters.
Figure 8A:
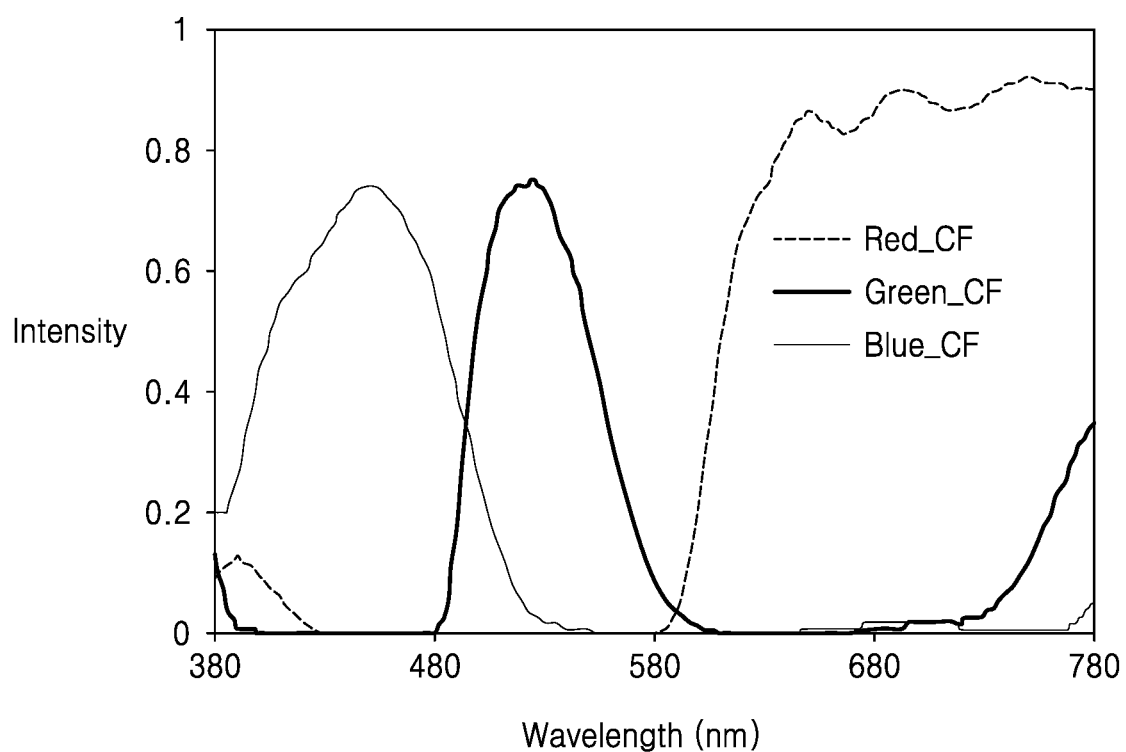
FIG. 8A is a graph showing transmittance change according to wavelengths of first to third color filters according to an embodiment.
Figure 8B:
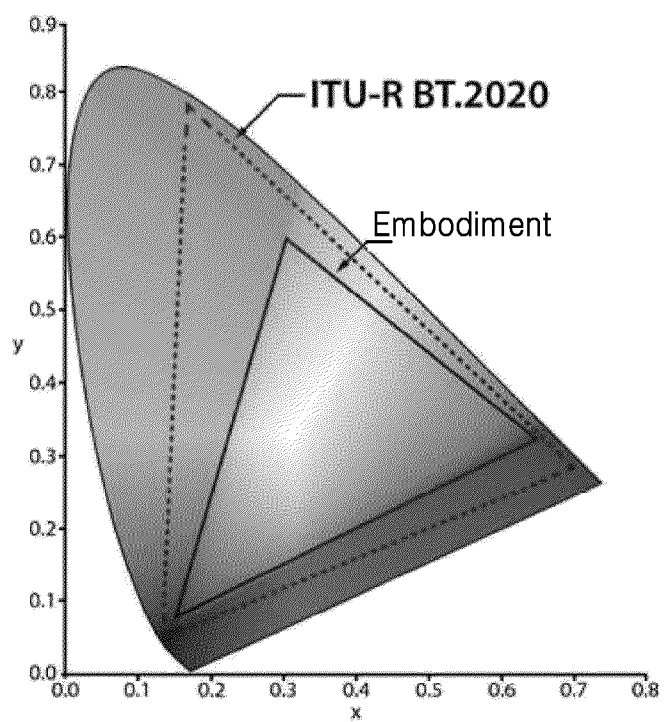
FIG. 8B is a graph showing a UHD (4K) color standard established by the International Telecommunication Union (ITU) in the CIE1931 chromaticity diagram.

FIG. 7 is a graph showing emission spectra of incident green light generated from a green light-emitting unit according to an embodiment and output light of the green incident light after passing through first to third color filters. FIG. 8A is a graph showing transmittance changes according to wavelengths of first to third color filters according to an embodiment. FIG. 8B is a graph showing a UHD (4K) color standard established by the International Telecommunication Union (ITU) in the CIE1931 chromaticity diagram.

Referring to FIGS. 5 and 7, the green incident light $I_g$ generated from the green light emitting unit 12 according to an exemplary embodiment passes through the first color filters 20R to the third color filters 20B. It can be seen that the color and the transmittance of the green incident light $I_g$ may be changed. As shown in FIG. 8A, the transmittances of the first color filter 20R to the third color filter 20B are different according to wavelengths, and accordingly, the color and transmittance of the green incident light $I_g$ passing through the first to third color filters 20R to 20B may be changed.

According to an embodiment, when the transmittance of the second color filter 20G, that is, the green color filter with respect to the green incident light $I_g$ generated from the green light-emitting unit 12 is high, the current efficiency for the second color light Lg may be improved.

Also, in order to improve color purity of the second color light Lg, it is necessary to improve a match rate to the UHD (4K) color standard (hereinafter, referred to as BT2020) established by the ITU. As shown in FIG. 8B, in the CIE1931 chromaticity diagram with respect to the green incident light ($I_g$) passing through the second color filter 20G, when the CIEx color coordinate of the green area is low and the CIEy of the green area is high, a high match rate for BT2020 may be secured.

In addition, as the transmittance of the first color filter 20R and the third color filter 20B with respect to the green incident light $I_g$ generated from the green light-emitting unit 12 is lower, the color purity of the first color light Lr and the third color light Lb may be improved. Accordingly, the current efficiency and color purity improvement may be determined according to the spectral shape of the green incident light $I_g$ generated from the green light-emitting unit 12.

Figure 9A:
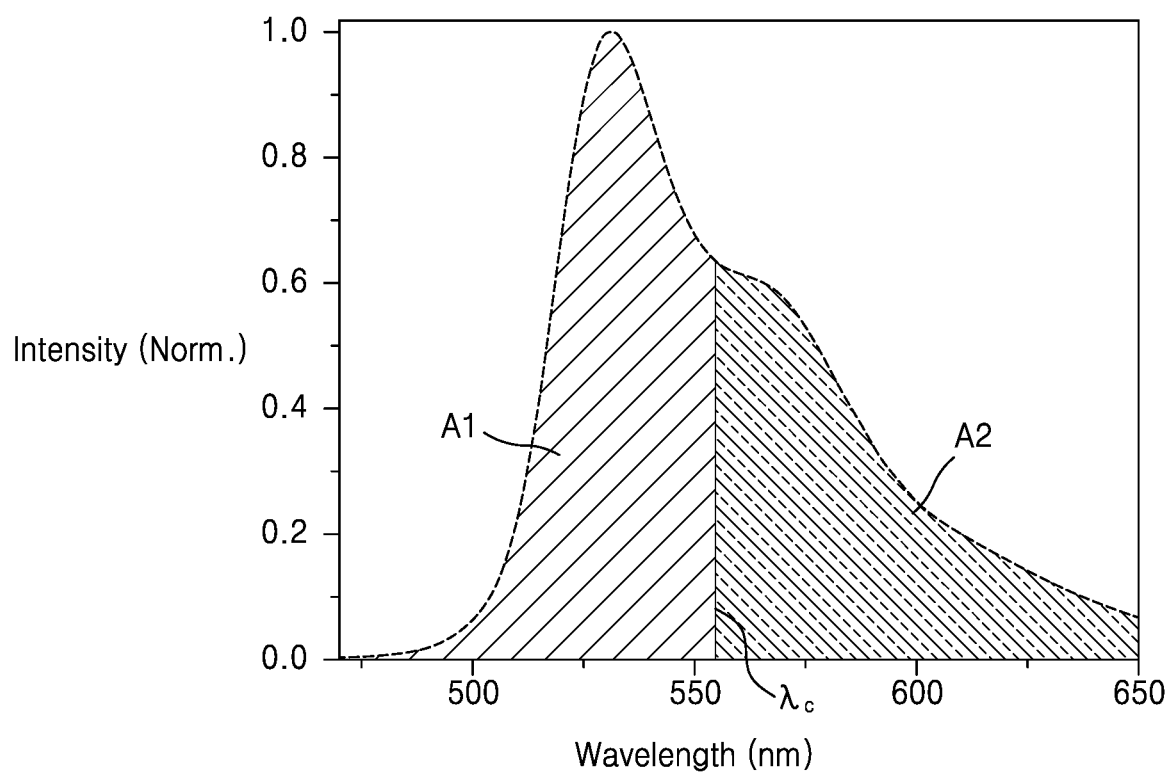
FIG. 9A is a graph showing a spectrum shape and the medial wavelength (Ac) of incident green light according to an embodiment.
Figure 9B:
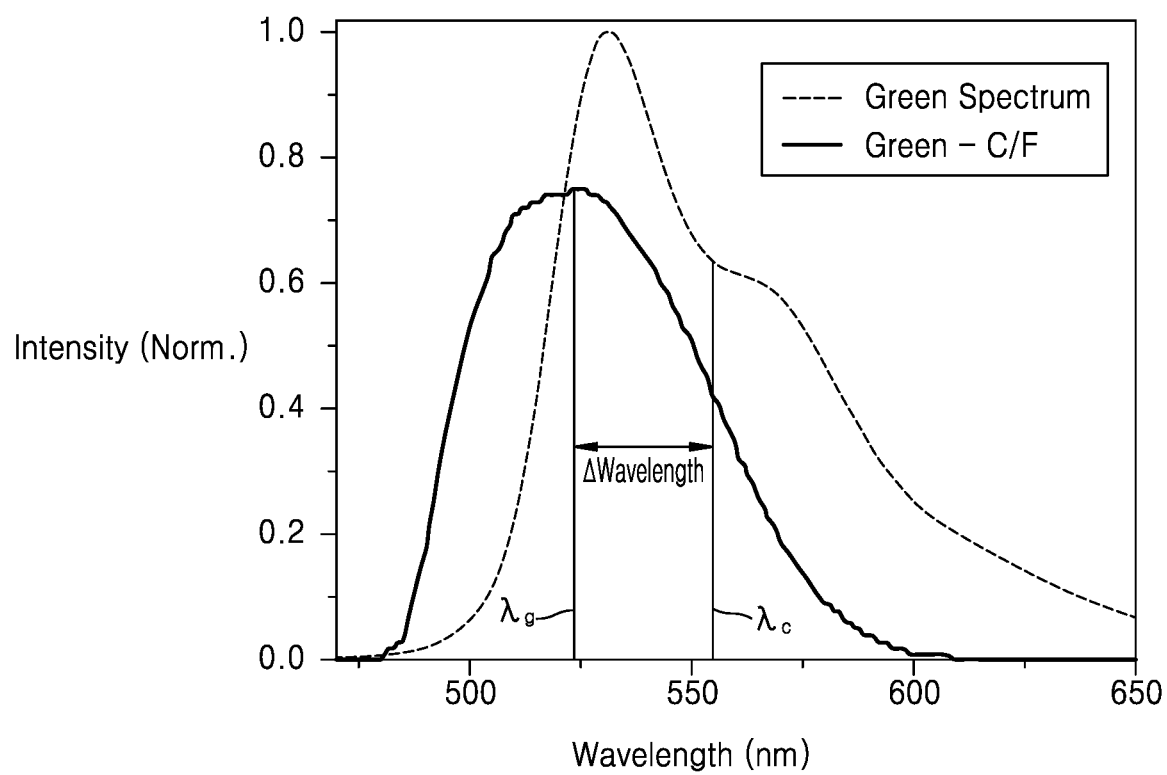
FIG. 9B is a graph including a change in transmittance according to a wavelength of a second color filter which is added to the graph of FIG. 9A.
Figure 9C:
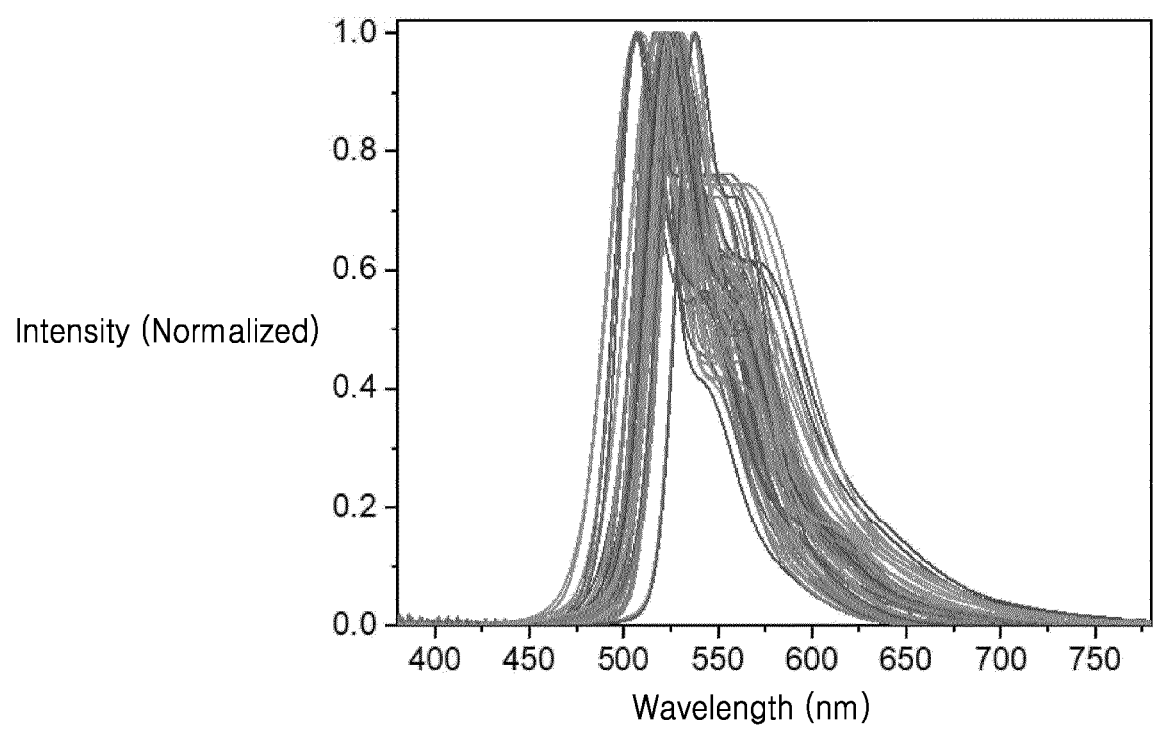
FIG. 9C is a graph showing spectral shapes of incident green lights according to an embodiment.
Figure 9D:
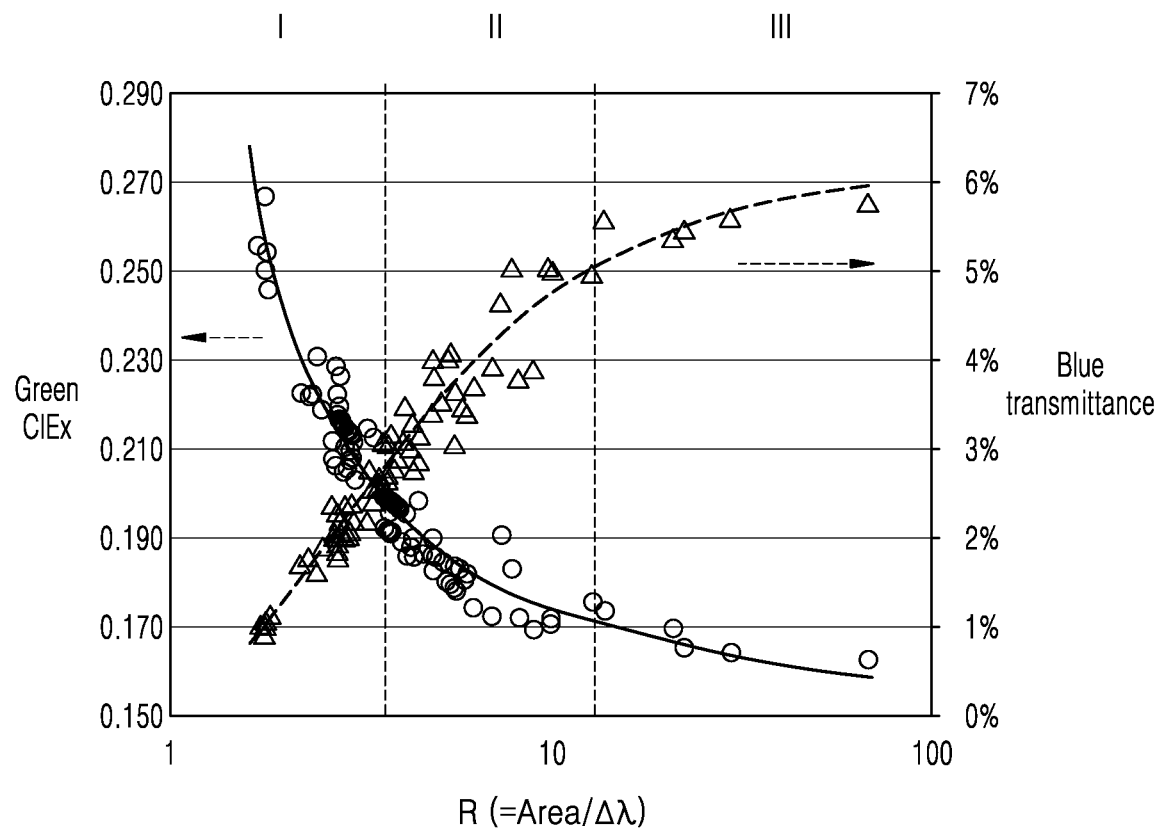
FIG. 9D is a graph showing a relationship between a converted value, a color coordinate of a green area, and a transmittance of blue incident light according to an embodiment.

FIG. 9A is a graph showing a spectrum shape and the medial wavelength ($\lambda_c$) of incident green light according to an embodiment. FIG. 9B is a graph that shows a change in both transmittance shape and wavelength when a second color filter is added to the graph of FIG. 9A. FIG. 9C is a graph showing spectral shapes of incident green lights according to an embodiment. FIG. 9D is a graph showing a relationship between a converted value, a color coordinate of a green area, and a transmittance of blue incident light according to an embodiment. Referring to FIG. 9A, a spectrum of incident green light $I_g$ generated from the green light-emitting unit 12 according to an embodiment may be identified at a wavelength of 380 nm to 780 nm. In this case, an area of the spectrum of the incident green light Ig in the wavelength region of 380 nm to 780 nm may be determined by Equation 1.

$$\text{Area} = \int_{380}^{780} f(x)\,dx \approx \sum_{n=1}^{n-1} \frac{1}{2}(x_{n+1} - x_n)[f(x_{n+1}) + f(x_n)] \quad \text{Equation 1}$$

$(x_1 = 380 \text{ nm}, x_n = 780 \text{ nm})$

The spectrum of green incident light Ig shown in FIG. 9A is a normalized graph in which the maximum value of light intensity is set to 1. In Equation 1, f(x) denotes the spectrum of the green incident light $I_g$ shown in FIG. 9A. As an example, when wavelengths are arranged at equal intervals of 1 nm, the area of the spectrum of the incident green light Ig may be determined according to Equation 2.

$$\text{Area} = \sum_{n=380}^{779} \frac{1}{2}[f(n+1) + f(n)] \quad \text{Equation 2}$$

According to an embodiment, the spectral shape of the green incident light $I_g$ may be controlled so that the area of the spectrum is 64 or less in a wavelength region of 380 nm to 780 nm.

In the present specification, the medial wavelength λc is defined as a wavelength that divides the area of the spectrum of the incident green light Ig into two equal halves. According to an embodiment, the area of the spectrum of the green incident light Ig may be determined by Equation 1, and it may be seen that an area of the first area A1 disposed on the left side and an area of the second area A2 disposed on the right side are the same based on the medial wavelength λc.

Referring to FIG. 9B, the spectral shape of the incident green light $I_g$ according to an embodiment may be controlled so that a distance between the maximum transmittance wavelength Ag of the second color filter 20G and the medial wavelength λc is within a predetermined range. For example, the spectral shape of the green incident light Ig may be controlled so that a difference between the maximum transmittance wavelength λg and the medial wavelength λc of the second color filter 20G according to an embodiment is 18 nm or less.

Referring to FIG. 9C, spectrum of 82 incident green lights $I_g$ controlled to various shapes may be confirmed. By comparing the transmittance change of the second color filter 20G shown in FIG. 8A and the spectrum of the green incident light Ig shown in FIG. 9C, a difference Δλ between the maximum transmittance wavelength λg and the medial wavelength λc of the second color filter 20G and an area of the spectrum in the wavelength region of 380 nm to 780 nm of incident green light Ig may be measured. Also, a conversion value R of the area of the spectrum in the wavelength region of 380 nm to 780 nm of green incident light Ig with respect to the difference Δλ between the maximum transmittance wavelength λg and the medial wavelength λc may be calculated. The conversion value R may be defined by the Equation 3 below.

$$R = Area/\Delta\lambda \quad \text{Equation 3}$$

Also, in the CIE1931 chromaticity diagram shown in FIG. 8B, a color coordinate Green CIEx of a green area for the green incident light Ig that has passed through the second color filter 20G is measured. At this point, a red color coordinate is set to (0.702, 0.295), and a blue color coordinate is fixed to (0.135, 0.051). Also, the transmittance (Blue transmittance) of the blue incident light $I_b$ with respect to the second color filter 20G is measured.

| No. | Δλ | Area | R | Green CIEx | blue transmittance |
|---|---|---|---|---|---|
| 1 | 27 | 46 | 1.7 | 0.256 | 1.0% |
| 2 | 28 | 50 | 1.8 | 0.267 | 0.9% |
| 3 | 26 | 45 | 1.8 | 0.255 | 1.1% |
| 4 | 25 | 44 | 1.8 | 0.250 | 1.1% |
| 5 | 22 | 40 | 1.8 | 0.246 | 1.2% |
| 6 | 26 | 56 | 2.2 | 0.223 | 1.7% |
| 7 | 26 | 60 | 2.3 | 0.222 | 1.8% |
| 8 | 24 | 56 | 2.4 | 0.223 | 1.8% |
| 9 | 28 | 67 | 2.4 | 0.231 | 1.6% |
| 10 | 24 | 59 | 2.5 | 0.219 | 1.9% |
| 11 | 17 | 46 | 2.7 | 0.212 | 2.0% |
| 12 | 22 | 59 | 2.7 | 0.208 | 2.4% |
| 13 | 25 | 69 | 2.7 | 0.229 | 1.8% |
| 14 | 19 | 51 | 2.7 | 0.218 | 1.9% |
| 15 | 21 | 56 | 2.7 | 0.206 | 2.3% |
| 16 | 18 | 50 | 2.7 | 0.223 | 1.8% |
| 17 | 23 | 63 | 2.7 | 0.220 | 2.0% |
| 18 | 23 | 63 | 2.8 | 0.218 | 2.0% |
| 19 | 23 | 65 | 2.8 | 0.217 | 2.0% |
| 20 | 32 | 88 | 2.8 | 0.226 | 2.0% |
| 21 | 31 | 86 | 2.8 | 0.217 | 2.2% |
| 22 | 22 | 62 | 2.8 | 0.216 | 2.0% |
| 23 | 21 | 60 | 2.9 | 0.206 | 2.4% |
| 24 | 16 | 45 | 2.9 | 0.210 | 2.0% |
| 25 | 21 | 61 | 2.9 | 0.214 | 2.1% |
| 26 | 23 | 67 | 3.0 | 0.214 | 2.2% |
| 27 | 15 | 44 | 3.0 | 0.206 | 2.1% |
| 28 | 22 | 65 | 3.0 | 0.212 | 2.2% |
| 29 | 26 | 76 | 3.0 | 0.208 | 2.4% |
| 30 | 20 | 61 | 3.0 | 0.213 | 2.2% |
| 31 | 18 | 55 | 3.1 | 0.203 | 2.3% |
| 32 | 27 | 88 | 3.3 | 0.215 | 2.6% |
| 33 | 12 | 40 | 3.3 | 0.200 | 2.2% |
| 34 | 26 | 86 | 3.3 | 0.205 | 2.8% |
| 35 | 20 | 69 | 3.4 | 0.213 | 2.4% |
| 36 | 18 | 63 | 3.5 | 0.204 | 2.6% |
| 37 | 18 | 63 | 3.5 | 0.201 | 2.6% |
| 38 | 16 | 56 | 3.6 | 0.192 | 3.1% |
| 39 | 16 | 56 | 3.6 | 0.192 | 3.1% |
| 40 | 17 | 62 | 3.6 | 0.199 | 2.7% |
| 41 | 16 | 58 | 3.7 | 0.200 | 2.7% |
| 42 | 14 | 51 | 3.7 | 0.199 | 2.6% |
| 43 | 21 | 76 | 3.7 | 0.196 | 3.1% |
| 44 | 12 | 46 | 3.7 | 0.192 | 2.7% |
| 45 | 16 | 60 | 3.8 | 0.191 | 3.2% |
| 46 | 16 | 60 | 3.8 | 0.191 | 3.2% |
| 47 | 18 | 67 | 3.8 | 0.199 | 2.9% |
| 48 | 16 | 61 | 3.8 | 0.198 | 2.8% |
| 49 | 16 | 63 | 3.9 | 0.197 | 2.9% |
| 50 | 14 | 56 | 4.0 | 0.190 | 3.1% |
| 51 | 21 | 86 | 4.1 | 0.195 | 3.5% |
| 52 | 13 | 55 | 4.3 | 0.187 | 3.0% |
| 53 | 14 | 59 | 4.3 | 0.188 | 3.3% |
| 54 | 11 | 45 | 4.3 | 0.190 | 2.8% |
| 55 | 10 | 44 | 4.5 | 0.187 | 2.9% |
| 56 | 15 | 69 | 4.5 | 0.199 | 3.2% |
| 57 | 13 | 63 | 4.9 | 0.190 | 3.4% |
| 58 | 12 | 59 | 4.9 | 0.183 | 4.0% |
| 59 | 13 | 63 | 4.9 | 0.187 | 3.4% |
| 60 | 16 | 76 | 4.9 | 0.186 | 3.8% |
| 61 | 12 | 62 | 5.1 | 0.185 | 3.5% |

-continued

| No. | Δλ | Area | R | Green CIEx | blue transmittance |
|---|---|---|---|---|---|
| 62 | 11 | 56 | 5.3 | 0.181 | 4.0% |
| 63 | 11 | 60 | 5.4 | 0.180 | 4.1% |
| 64 | 7 | 40 | 5.6 | 0.179 | 3.1% |
| 65 | 11 | 61 | 5.6 | 0.184 | 3.7% |
| 66 | 9 | 51 | 5.9 | 0.181 | 3.5% |
| 67 | 8 | 50 | 6.0 | 0.182 | 3.4% |
| 68 | 7 | 46 | 6.3 | 0.175 | 3.7% |
| 69 | 8 | 55 | 7.0 | 0.173 | 3.9% |
| 70 | 12 | 88 | 7.4 | 0.191 | 4.7% |
| 71 | 11 | 86 | 7.9 | 0.184 | 5.0% |
| 72 | 6 | 45 | 8.2 | 0.172 | 3.8% |
| 73 | 5 | 44 | 9.0 | 0.170 | 3.9% |
| 74 | 6 | 60 | 9.9 | 0.171 | 5.0% |
| 75 | 6 | 60 | 9.9 | 0.171 | 5.0% |
| 76 | 6 | 56 | 10.0 | 0.172 | 5.0% |
| 77 | 5 | 69 | 12.9 | 0.176 | 5.0% |
| 78 | 6 | 76 | 13.9 | 0.174 | 5.6% |
| 79 | 3 | 63 | 21.1 | 0.170 | 5.4% |
| 80 | 3 | 63 | 22.4 | 0.166 | 5.5% |
| 81 | 2 | 62 | 29.7 | 0.165 | 5.6% |
| 82 | 1 | 61 | 67.9 | 0.163 | 5.8% |

As indicated in the above Tables and FIG. 9D, the color coordinate Green CIEx of a green area with respect to the green incident light $I_g$ passing through the second color filter 20G and the transmittance of the blue incident light Ib with respect to the filter 20G may be distinguished according to a range of the conversion value R.

As an example, in region I where the conversion value R is less than 3.6, the transmittance (blue transmittance) of the blue incident light $I_b$ with respect to the second color filter 20G may be less than 3%, but the color coordinate Green CIEx of the green area exceeds 0.200, thus, the color reproducibility may be reduced. Also, in region III where the conversion value R exceeds 13, the color coordinate Green CIEx of the green region may be less than 0.180, but the transmittance (blue transmittance) of the incident blue light $I_b$ with respect to the second color filter 20G exceeds 5%, thus, the color purity may be reduced.

On the other hand, in region II where the conversion value R is 3.6 or more and 13 or less, it may be confirmed that the color coordinate Green CIEx of the green area is 0.200 or less and the transmittance (blue transmittance) of the incident blue light $I_b$ with respect to the second color filter 20G is 5% or less. Accordingly, when the conversion value R is 3.6 or more and 13 or less, the color purity of the first to third color lights Lr, Lg, and Lb may be improved, thereby improving the match rate of BT2020 in the CIE1931 chromaticity diagram. Also, the current efficiency of the second color light Lg, that is, green light, may be improved.

Figure 10:
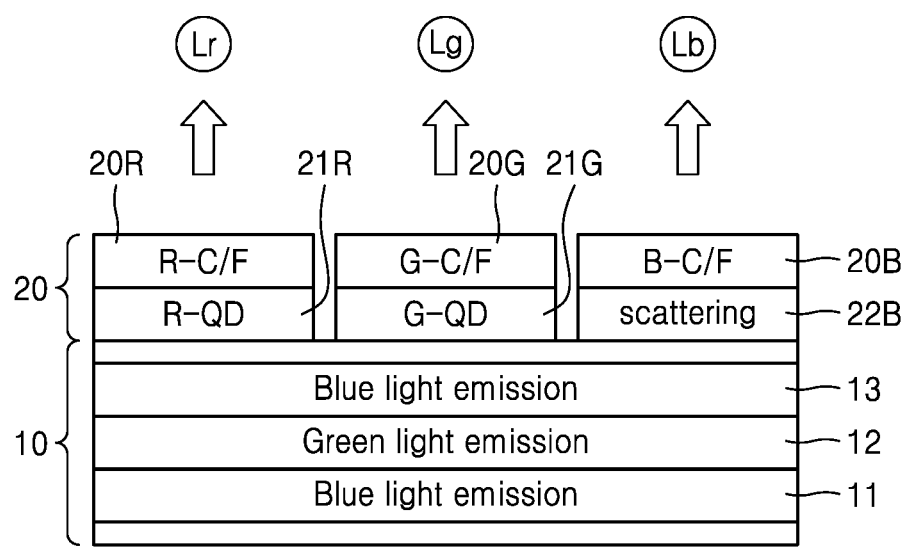
FIG. 10 is a schematic cross-sectional view of an OLED structure and a color conversion unit according to another embodiment.
Figure 11:
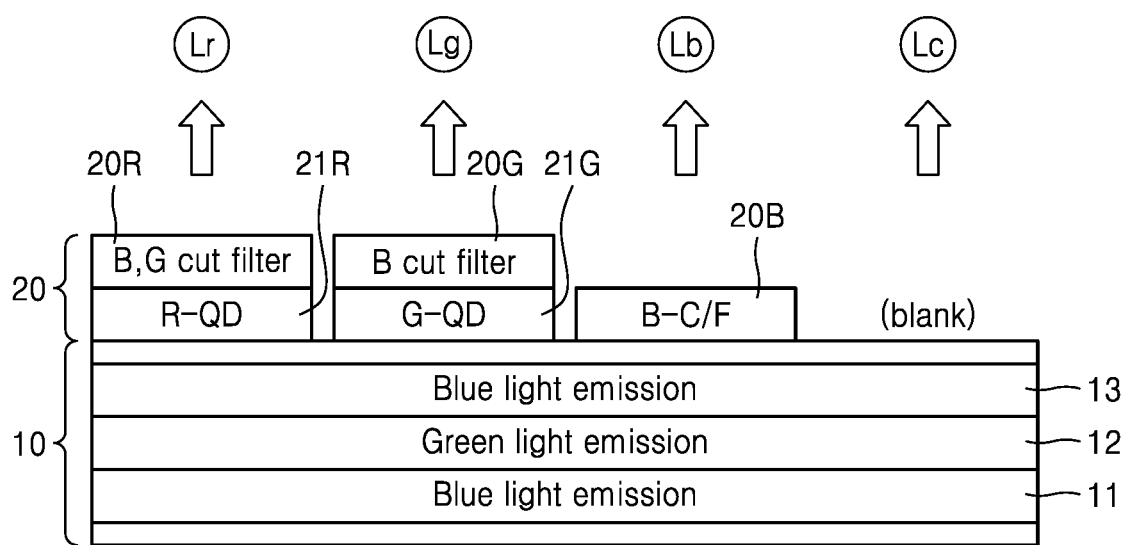
FIG. 11 is a schematic cross-sectional view of an OLED structure and a color conversion unit according to another embodiment.
Figure 12:
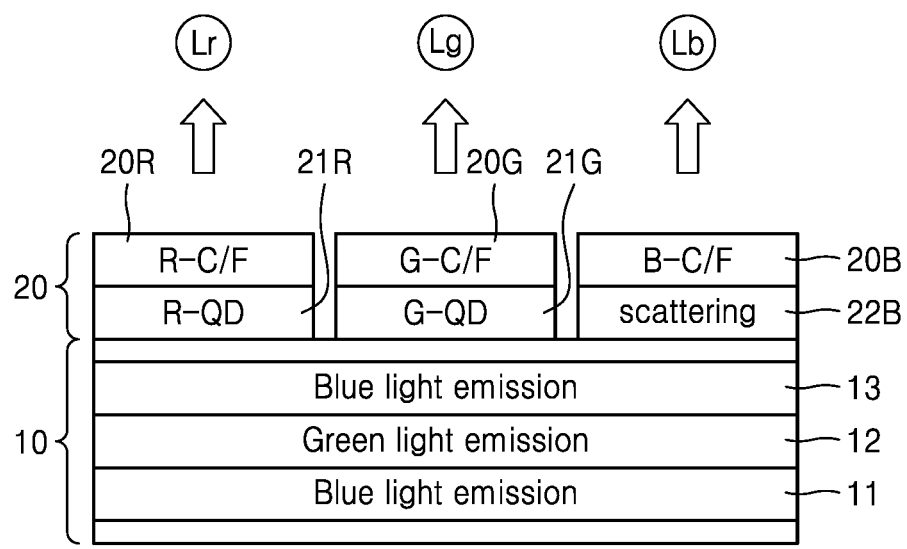
FIG. 12 is a schematic cross-sectional view of an OLED structure and a color conversion unit according to another embodiment.

FIG. 10 is a schematic cross-sectional view of an OLED structure 10 and a color conversion unit 20 according to another embodiment. FIG. 11 is a schematic cross-sectional view of an OLED structure 10 and a color conversion unit 20 according to another embodiment. FIG. 12 is a schematic cross-sectional view of an OLED structure 10 and a color conversion unit 20 according to another embodiment.

Referring to FIG. 10, although it is similar to FIG. 4, a light scattering element 22B may be further provided between the third color filter 20B and the OLED structure 10. In this point, the third color filter 20B may be a blue color filter C/F. The light scattering element 22B may include a resin material and a light scattering agent. Here, the resin material may include a photoresist PR material. The light scattering agent may include, for example, titanium oxide ($TiO_2$), but is not limited thereto. Because each of the first and second color conversion layers 21R and 21G may include a light scattering agent, the provision of the light scattering element 22B under the third color filter 20B may balance the color sense. In other words, it is possible to minimize the change in visibility between RGB regions.

Referring to FIG. 11, a display apparatus according to another embodiment may further include a fourth subpixel region in addition to the R-subpixel (first subpixel), G-subpixel (second subpixel), and B-subpixel (third subpixel) regions. The fourth subpixel may be configured to display a color (fourth color) other than R, G, and B. The other color (fourth color) may be, for example, cyan C, but is not limited thereto.

Referring to FIG. 12, an absorption-type green-color filter G-C/F, not a Blue-cut filter, may be used as the second color filter 20G, and an absorption-type red-color filter R—C/F, not a Blue, Green-cut filter, may be used as the first color filter 20R. The second color filter 20G may selectively transmit light in a green wavelength region and absorb light in remaining wavelength regions. Similarly, the first color filter 20R may selectively transmit light in a red wavelength region and absorb light in remaining wavelength regions. The color conversion unit 20 according to the present embodiment may commonly use absorption-type color filters 20R, 20G, and 20B in R-subpixel, G-subpixel, and B-subpixel regions.

In a display apparatus in which green light is applied to a light source OLED, a display apparatus having high efficiency as well as high color reproducibility may be implemented.

A display apparatus having high performance may be implemented by applying green light and blue light to the light source OLED and using a plurality of quantum dot color conversion elements and a plurality of color filter elements.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
an organic light emitting diode (OLED) structure comprising at least one blue light-emitting unit configured to emit blue incident light, and at least one green light-emitting unit configured to emit green incident light, which are stacked and to provide incident light in which the blue incident light and the green incident light are mixed;
a first pixel, a second pixel, and a third pixel disposed on the OLED structure, and respectively configured to emit a first color light, a second color light, and a third color light;
at least two color conversion layers each separately disposed on at least two of the first, the second, or the third pixels, and including quantum dots for converting the incident light from the OLED structure into light of a predetermined color; and
first, second, and third color filters disposed on the first, the second, and the third pixels, respectively, to absorb or block light of a predetermined wavelength band, wherein
a conversion value of an area of a spectrum in a wavelength region of 380 nanometers to 780 nanometers of the green incident light with respect to a difference between a maximum transmittance wavelength of the second color filter and the medial wavelength of the green incident light ($\Delta\lambda$) is about 3.6 or greater and about 13 or less,
wherein the area of the spectrum is determined according to Equation 1 below, $$\text{Area} = \int_{380}^{780} f(x)\,dx \approx \sum_{n=1}^{n-1} \frac{1}{2}(x_{n+1} - x_n)[f(x_{n+1}) + f(x_n)] \qquad \text{Equation 1}$$

$$(x_1 = 380 \text{ nm}, x_n = 780 \text{ nm})$$

wherein in Equation 1, f(x) is a spectrum of the green incident light in which the maximum value of the light intensity is normalized to 1, and the medial wavelength is a wavelength that divides the area of the spectrum of the green incident light into two equal halves, and
the conversion value R is determined according to Equation 3 below.

$$R = \text{Area}/\Delta\lambda \qquad \text{Equation 3}$$

2. The display apparatus of claim 1, wherein the OLED structure has a tandem structure.

3. The display apparatus of claim 1, wherein
the OLED structure comprises a first blue light-emitting unit, a green light-emitting unit, and a second blue light-emitting unit sequentially stacked, wherein
the green light-emitting unit is disposed between the first and second blue light-emitting units.

4. The display apparatus of claim 3, further comprising:
a first charge generation layer disposed between the first blue light-emitting unit and the green light-emitting unit, and
a second charge generation layer disposed between the green light-emitting unit and the second blue light-emitting unit.

5. The display apparatus of claim 1, wherein the green light-emitting unit comprises an organic material-based green light-emitting layer, and the green light-emitting layer comprises a thermally activated delayed fluorescence (TADF) dopant.

6. The display apparatus of claim 1, wherein the green light-emitting unit comprises an organic material-based green light emitting layer, and the green light-emitting layer comprises a phosphorescent dopant, wherein
the phosphorescent dopant satisfies T1(dopant)≤S1(dopant)≤T1(dopant)+0.5 eV, where T1 (dopant) is a triplet energy level in eV and S1 (dopant) is a singlet energy level in eV of the phosphorescent dopant.

7. The display apparatus of claim 6, wherein the phosphorescent dopant is an organometallic compound including iridium Ir.

8. The display apparatus of claim 6, wherein the phosphorescent dopant is an organometallic compound including platinum Pt, osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silver Ag, or gold Au.

9. The display apparatus of claim 6, wherein the phosphorescent dopant is an organometallic compound having a square-planar coordination structure.

10. The display apparatus of claim 6, wherein the phosphorescent dopant comprises a metal and an organic ligand, wherein the metal and the organic ligand form one, two, or three cyclometallated rings.

11. The display apparatus of claim 6, wherein
the phosphorescent dopant comprises a metal and a four-coordinate organic ligand capable of forming 3 or 4 cyclometallated rings,
the metal comprises platinum Pt, osmium Os, titanium Ti, zirconium Zr, hafnium Hf, europium Eu, terbium Tb, thulium Tm, rhodium Rh, ruthenium Ru, rhenium Re, beryllium Be, magnesium Mg, aluminum Al, calcium Ca, manganese Mn, cobalt Co, copper Cu, zinc Zn, gallium Ga, germanium Ge, rhodium Rh, palladium Pd, silverAg, or gold Au, and
the four-coordinate organic ligand includes a benzimidazole group or a pyridine group.

12. The display apparatus of claim 1, wherein the first color filter is a blue and green cut filter, and the second color filter is a blue cut filter.

13. The display apparatus of claim 1, wherein the first color filter is an absorption-type red color filter, and the second color filter is an absorption-type green color filter.

14. The display apparatus of claim 1, wherein the third color filter is a green cut filter or an absorption type blue color filter.

15. The display apparatus of claim 1, wherein the display apparatus further comprises a fourth pixel configured to emit light of a color different from that of the first, second, or third pixels.

16. The display apparatus of claim 15, wherein the fourth pixel is a blank region.

\* \* \* \* \*